US012800639B1

(12) United States Patent
Sahoo et al.

(10) Patent No.: US 12,800,639 B1
(45) Date of Patent: Nov. 17, 2026

(54) SYSTEMS AND METHODS FOR IMPROVED AIRCRAFT ELECTRICAL MODES AND STATES

(71) Applicant: Archer Aviation Inc., San Jose, CA (US)

(72) Inventors: Ashish Sahoo, San Jose, CA (US); Behnam Koushki Foroushani, Santa Clara, CA (US)

(73) Assignee: Archer Aviation Inc., San Jose, CA (US)

( * ) Notice: Subject to any disclaimer, the term of this patent is extended or adjusted under 35 U.S.C. 154(b) by 0 days.

(21) Appl. No.: 19/420,594

(22) Filed: Dec. 15, 2025

(51) Int. Cl.

| | |
|---|---|
| ***G01R 31/00*** | (2006.01) |
| ***B64D 31/18*** | (2024.01) |
| ***B64F 5/60*** | (2017.01) |
| ***B64U 50/19*** | (2023.01) |
| ***G01R 19/165*** | (2006.01) |

(52) U.S. Cl.
CPC .............. *G01R 31/008* (2013.01); *B64F 5/60* (2017.01); *G01R 19/16576* (2013.01); *B64D 31/18* (2024.01); *B64U 50/19* (2023.01)

(58) Field of Classification Search
CPC ... G01R 31/008; G01R 19/16576; B64F 5/60; B64D 31/18; B64U 50/19
See application file for complete search history.

(56) References Cited

U.S. PATENT DOCUMENTS

| | | | |
|---|---|---|---|
| 10,126,353 B2 | 11/2018 | Bacigalupo et al. | |
| 11,112,455 B2 * | 9/2021 | van Oevelen | H02M 1/08 |
| 11,545,969 B1 * | 1/2023 | Murtaza | H03K 17/08122 |
| 12,552,543 B2 | 2/2026 | Gao et al. | |
| 2019/0086463 A1 * | 3/2019 | Herlihy | B64F 5/60 |
| 2021/0021121 A1 * | 1/2021 | Lee | G01R 31/52 |
| 2022/0407308 A1 * | 12/2022 | Song | G01R 31/2621 |
| 2023/0062548 A1 * | 3/2023 | Channegowda | G01R 31/1272 |
| 2024/0183883 A1 * | 6/2024 | Nuebling | G01R 15/181 |

* cited by examiner

*Primary Examiner* — Akm Zakaria
(74) *Attorney, Agent, or Firm* — Finnegan, Henderson, Farabow, Garrett & Dunner, LLP

(57) ABSTRACT

Systems and methods for testing protections of a circuit, comprising: transmitting, on a low-voltage side of a voltage isolation barrier, an input test signal to a power supply controller, wherein: the input test signal causes a power supply to generate, on a high-voltage side of the voltage isolation barrier, a trigger signal, and the trigger signal is input to a gate driver on the high-voltage side of the voltage isolation barrier, at an interface electrically connected to a transistor and associated with receiving fault signals from the transistor; after transmitting the input test signal, receiving on the low-voltage side of the voltage isolation barrier, from the gate driver an indication of whether a signal is received at the interface; and determining, based on the received indication of whether a signal was received at the interface, whether the gate driver is experiencing a fault.

29 Claims, 32 Drawing Sheets

352

SYSTEMS AND METHODS FOR IMPROVED AIRCRAFT ELECTRICAL MODES AND STATES

TECHNICAL FIELD

This disclosure relates generally to the field of powered aerial vehicles. More particularly, and without limitation, the present disclosure relates to innovations in aircraft that use electrical propulsion systems. Certain aspects of the present disclosure generally relate to transitioning between different aircraft modes based on user selections.

BACKGROUND

The inventors have recognized several problems that may be associated with controlling subsystems of an aircraft, including an aircraft that uses electric or hybrid-electric propulsion systems (hereinafter referred to as electric propulsion units or "EPUs"). For example, there is a need to configure aircraft power supply (e.g., battery packs) and circuitry to provide for redundancy, fault tolerance, energy efficiency, and weight efficiency. Further, a user may desire to switch an aircraft's mode or state of operation, and there is a need to promote safety of the aircraft and its components, as well as the operators, passengers, maintenance staff, or other users or individuals in the vicinity of the aircraft when switching to a different mode or state.

SUMMARY

The present disclosure relates generally to configuration and control of aircraft subsystems. More particularly, and without limitation, the present disclosure relates to innovations in aircraft that use electric or hybrid-electric propulsion systems. Additionally, the present disclosure relates to innovations that may enable safe operation of an aircraft, including locally piloted aircraft, remotely piloted aircraft, and autonomous aircraft.

Certain aspects of the present disclosure relate to circuitry and component arrangements that provide for redundancy, fault tolerance, energy efficiency, and weight efficiency. Other aspects of the present disclosure relate to safely controlling an aircraft's subsystems by confirming certain conditions are met prior to enabling or executing an aircraft mode transition, such as performing checks of one or more conditions prior to takeoff. Another aspect of this disclosure may relate to differing conditions for aircraft mode transitions based on a current aircraft mode of operation and a requested aircraft mode of operation. Further aspects of the present disclosure relate to control sequences and circuitry configurations that allow enabling and disabling subsystems while maintaining power to critical subsystems.

One aspect of the present disclosure is directed to a method of controlling power distribution of an aircraft, comprising: receiving a selection of one of at least two aircraft modes of operation from a user input device; determining, using conditional logic, if one or more conditions are met after receiving the selection of the one selected mode, the one or more conditions comprising at least one of: a command and control radio link is functioning as intended, a discharge target of an electric propulsion unit (EPU) is achieved, none of a plurality of particular EPU commands exist, a flight termination radio link is functioning as intended, voltage across the EPU is measured to be less than or equal to a threshold, voltage across a capacitor of the EPU is measured to be less than or equal to a threshold, or an aircraft grounded status is present; and controlling, after determining the one or more conditions are met, power distribution within the aircraft based on the selected mode of operation, wherein controlling power distribution comprises controlling high-voltage power to the EPU or to at least one non-propulsion load. This method of controlling power distribution of an aircraft may comprise that the one or more conditions include at least one of: a radio link is functioning as intended, a discharge target of an electric propulsion unit (EPU) is satisfied, or none of a plurality of particular EPU commands exist.

An additional aspect of the present disclosure is directed to a non-transitory computer-readable medium storing one or more instructions, that when executed by at least one processor, cause the at least one processor to perform operations comprising: receiving a selection of one of at least two aircraft modes of operation from a user input device; determining, using conditional logic, if one or more conditions are met after receiving the selection of the one selected mode, the one or more conditions comprising at least one of: a command and control radio link is functioning as intended, a discharge target of an electric propulsion unit (EPU) is achieved, none of a plurality of particular EPU commands exist, a flight termination radio link is functioning as intended, voltage across the EPU is measured to be less than or equal to a threshold, voltage across a capacitor of the EPU is measured to be less than or equal to a threshold, or an aircraft grounded status is present; and controlling, after determining the one or more conditions are met, power distribution within the aircraft based on the selected mode of operation, wherein controlling power distribution comprises controlling high-voltage power to the EPU or to at least one non-propulsion load. The operations for controlling power distribution of an aircraft may comprise that the one or more conditions include at least one of: a radio link is functioning as intended, a discharge target of an electric propulsion unit (EPU) is satisfied, or none of a plurality of particular EPU commands exist.

A further aspect of the present disclosure is directed to a system for controlling power distribution of an aircraft, comprising: an electric propulsion unit (EPU); an inverter configured to provide power to the EPU; a battery configured to provide power to the inverter, wherein the battery is associated with a battery management unit (BMU); a voting component communicatively coupled to the BMU; a plurality of flight control computers communicatively coupled to the voting component and a CAN link, wherein the CAN line is communicatively coupled to the BMU, and wherein the flight control computers are configured to: receive a selection of one of at least two aircraft modes of operation from a user input device; determine, using conditional logic, if one or more conditions are met after receiving the selection of the one selected mode, the one or more conditions comprising at least one of: a command and control radio link is functioning as intended, a discharge target of an electric propulsion unit (EPU) is achieved, none of a plurality of particular EPU commands exist, a flight termination radio link is functioning as intended, voltage across the EPU is measured to be less than or equal to a threshold, voltage across a capacitor of the EPU is measured to be less than or equal to a threshold, or an aircraft grounded status is present; and control, after determining the one or more conditions are met, power distribution within the aircraft based on the selected mode of operation, wherein controlling power distribution comprises controlling high-voltage power to the EPU or to at least one non-propulsion load. The flight control computers may be further configured such that the one or more conditions include at least one of: a radio link is functioning as intended, a discharge target of an electric propulsion unit (EPU) is satisfied, or none of a plurality of particular EPU commands exist.

One aspect of the present disclosure is directed to a method of controlling aircraft power distribution for safe shutdown of an electric propulsion unit (EPU) of an aircraft, comprising: receiving a selection of one of at least two aircraft modes of operation from a first user input device; determining, using conditional logic, whether one or more conditions are met at the time of or after receiving the selection of the one selected mode and via the control circuit, wherein the one or more conditions comprise disconnection of the EPU; initiating, if the one or more conditions are not met, a process for disconnection, the process comprising: disconnecting high-voltage power to the EPU, the high-voltage power supplied by a high-voltage power system; confirming disconnection of the high-voltage power to the EPU; initiating, at the time of or after confirming disconnection, discharge of a capacitor of the EPU; performing a discharge operation including at least one of: confirming the discharge of the capacitor of the EPU; or waiting for a predetermined designated discharge time.

An additional aspect of the present disclosure is directed to a non-transitory computer-readable medium storing one or more instructions, that when executed by at least one processor, cause the at least one processor to perform operations comprising: receiving a selection of one of at least two aircraft modes of operation from a first user input device; determining, using conditional logic, whether one or more conditions are met at the time of or after receiving the selection of the one selected mode and via the control circuit, wherein the one or more conditions comprise disconnection of the EPU; initiating, if the one or more conditions are not met, a process for disconnection, the process comprising: disconnecting high-voltage power to the EPU, the high-voltage power supplied by a high-voltage power system; confirming disconnection of the high-voltage power to the EPU; initiating, at the time of or after confirming disconnection, discharge of a capacitor of the EPU; performing a discharge operation including at least one of: confirming the discharge of the capacitor of the EPU; or waiting for a predetermined designated discharge time.

A further aspect of the present disclosure is directed to a system for controlling aircraft power distribution for safe shutdown of an electric propulsion unit (EPU) of an aircraft, the system comprising: the EPU; a first user input device; a high-voltage power system; a control circuit in the aircraft, wherein the control circuit is configured to: receive a selection of one of at least two aircraft modes of operation from a first user input device; determine, using conditional logic, whether one or more conditions are met at the time of or after receiving the selection of the one selected mode and via the control circuit, wherein the one or more conditions comprise disconnection of the EPU; initiate, if the one or more conditions are not met, a process for disconnection, the process comprising: disconnecting high-voltage power to the EPU, the high-voltage power supplied by a high-voltage power system; confirming disconnection of the high-voltage power to the EPU; initiating, at the time of or after confirming disconnection, discharge of a capacitor of the EPU; performing a discharge operation including at least one of: confirming the discharge of the capacitor of the EPU; or waiting for a predetermined designated discharge time.

One aspect of the present disclosure is directed to a method of controlling aircraft power distribution, comprising: receiving a selection of one of at least two aircraft modes of operation from a first user input device; measuring an output of a control circuit based on an input, wherein the input is transmitted from a second user input device; determining, using conditional logic, whether one or more conditions are met at the time of or after receiving the selection of the one selected mode, wherein the one or more conditions comprise the measured output corresponding to an expected output; and controlling, at the time of or after determining the one or more conditions are met, power distribution within the aircraft based on the selected mode of operation, wherein controlling power distribution comprises controlling high-voltage power to an electric propulsion unit, an actuator, or a non-propulsion load.

An additional aspect of the present disclosure is directed to a non-transitory computer-readable medium storing one or more instructions, that when executed by at least one processor, cause the at least one processor to perform operations comprising: receiving a selection of one of at least two aircraft modes of operation from a first user input device; measuring an output of a control circuit based on an input, wherein the input is transmitted from a second user input device; determining, using conditional logic, whether one or more conditions are met at the time of or after receiving the selection of the one selected mode, wherein the one or more conditions comprise the measured output corresponding to an expected output; and controlling, at the time of or after determining the one or more conditions are met, power distribution within the aircraft based on the selected mode of operation, wherein controlling power distribution comprises controlling high-voltage power to an electric propulsion unit, an actuator, or a non-propulsion load.

A further aspect of the present disclosure is directed to a system for controlling aircraft power distribution, the system comprising: a first user input device; a second user input device; a control circuit responsive based on an input from the second user input device; and wherein the control circuit for controlling aircraft power distribution is configured to: receive a selection of one of at least two aircraft modes of operation from a first user input device; measure an output of a control circuit based on an input, wherein the input is transmitted from a second user input device; determine, using conditional logic, whether one or more conditions are met at the time of or after receiving the selection of the one selected mode, wherein the one or more conditions comprise the measured output corresponding to an expected output; and control, at the time of or after determining the one or more conditions are met, power distribution within the aircraft based on the selected mode of operation, wherein controlling power distribution comprises controlling high-voltage power to an electric propulsion unit, an actuator, or a non-propulsion load.

One aspect of the present disclosure is directed to method of controlling aircraft power distribution, comprising: receiving a selection of one of at least two aircraft modes of operation from a user input device; preventing user control of at least one of an electric propulsion unit (EPU), a control actuator, or a non-propulsion load of the aircraft; enabling high-voltage power to at least one component of the aircraft, the at least one component including at least one of the EPU, the control actuator, or the non-propulsion load; automatically controlling the at least one component; measuring an output of the at least one component to the automatic control; determining, using conditional logic, whether one or more conditions are met at the time of or after receiving the selection of the one selected mode, wherein the one or more conditions comprise the measured output corresponding to an expected output; and at the time of or after determining the one or more conditions are met, enabling user control of the EPU, the control actuator, or the non-propulsion load or controlling power distribution within the aircraft based on the selected mode of operation, wherein controlling power distribution comprises controlling high-voltage power to the EPU or the control actuator.

An additional aspect of the present disclosure is directed to a non-transitory computer-readable medium storing one or more instructions, that when executed by at least one processor, cause the at least one processor to perform operations comprising: receiving a selection of one of at least two aircraft modes of operation from a user input device; preventing user control of at least one of an electric propulsion unit (EPU), a control actuator, or a non-propulsion load of the aircraft; enabling high-voltage power to at least one component of the aircraft, the at least one component including at least one of the EPU, the control actuator, or the non-propulsion load; automatically controlling the at least one component; measuring an output of the at least one component to the automatic control; determining, using conditional logic, whether one or more conditions are met at the time of or after receiving the selection of the one selected mode, wherein the one or more conditions comprise the measured output corresponding to an expected output; and at the time of or after determining the one or more conditions are met, enabling user control of the EPU, the control actuator, or the non-propulsion load or controlling power distribution within the aircraft based on the selected mode of operation, wherein controlling power distribution comprises controlling high-voltage power to the EPU or the control actuator.

A further aspect of the present disclosure is directed to a system for controlling aircraft power distribution, the system comprising: a first user input device; at least one of an electric propulsion unit (EPU), a control actuator, or a non-propulsive load; a control circuit for controlling aircraft power distribution; and wherein the control circuit for controlling aircraft power distribution is configured to: receive a selection of one of at least two aircraft modes of operation from a user input device; prevent user control of at least one of an electric propulsion unit (EPU), a control actuator, or a non-propulsion load of the aircraft; enable high-voltage power to at least one component of the aircraft, the at least one component including at least one of the EPU, the control actuator, or the non-propulsion load; automatically control the at least one component; measure an output of the at least one component to the automatic control; determine, using conditional logic, whether one or more conditions are met at the time of or after receiving the selection of the one selected mode, wherein the one or more conditions comprise the measured output corresponding to an expected output; and at the time of or after determining the one or more conditions are met, enable user control of the EPU, the control actuator, or the non-propulsion load or controlling power distribution within the aircraft based on the selected mode of operation, wherein controlling power distribution comprises controlling high-voltage power to the EPU or the control actuator.

One aspect of the present disclosure is directed to a method of controlling aircraft power distribution for propulsive operation of an electric propulsion unit (EPU), comprising: receiving a selection of one of at least two aircraft modes of operation from a user input device; determining, using conditional logic, if one or more conditions are met at the time of or after receiving the selection of the one selected mode, wherein the one or more conditions comprise at least one temperature of the EPU being within an associated temperature range; and controlling, at the time of or after determining the one or more conditions are met, power distribution within the aircraft based on the selected mode of operation, wherein controlling power distribution based on the selected mode of operation comprises controlling power distribution to enable propulsion by the EPU.

An additional aspect of the present disclosure is directed to a non-transitory computer readable medium storing one or more instructions, that when executed by at least one processor cause the at least one processor to perform operations comprising: receiving a selection of one of at least two aircraft modes of operation from a user input device; determining, using conditional logic, if one or more conditions are met at the time of or after receiving the selection of the one selected mode, wherein the one or more conditions comprise at least one temperature of the EPU being within an associated temperature range; and controlling, at the time of or after determining the one or more conditions are met, power distribution within the aircraft based on the selected mode of operation, wherein controlling power distribution based on the selected mode of operation comprises controlling power distribution to enable propulsion by the EPU.

A further aspect of the present disclosure is directed to a system for controlling aircraft power distribution for propulsive operation of an electric propulsion unit (EPU), the system comprising: at least one EPU; a user input device configured to receive an input indicating a mode of operation; a power switching device; a controller configured to control power to one or more subsystems of the aircraft for propulsive of the at least one EPU; and wherein the controller is configured to: receive a selection of one of at least two aircraft modes of operation from a user input device; determine, using conditional logic, if one or more conditions are met at the time of or after receiving the selection of the one selected mode, wherein the one or more conditions comprise at least one temperature of the EPU being within an associated temperature range; and control, at the time of or after determining the one or more conditions are met, power distribution within the aircraft based on the selected mode of operation, wherein controlling power distribution based on the selected mode of operation comprises controlling power distribution to enable propulsion by the EPU.

One aspect of the present disclosure is directed to a method of controlling aircraft power distribution for propulsive operation of an electric propulsion unit (EPU), comprising: receiving a selection of one of at least two aircraft modes of operation from a user input device; determining, using conditional logic, if one or more conditions are met at the time of or after receiving the selection of the one selected mode, wherein the one or more conditions comprise at least one temperature of the EPU being within an associated temperature range; and controlling, at the time of or after determining that the temperature of the EPU is not within the range, power to a temperature modification system to bring the temperature of the EPU within the range; and based on determining that the temperature of the EPU is in the range, enabling the EPU for propulsive operation.

An additional aspect of the present disclosure is directed to a non-transitory computer readable medium storing one or more instructions, that when executed by at least one processor cause the at least one processor to perform operations comprising: receiving a selection of one of at least two aircraft modes of operation from a user input device; determining, using conditional logic, if one or more conditions are met at the time of or after receiving the selection of the one selected mode, wherein the one or more conditions comprise at least one temperature of the EPU being within an associated temperature range; and controlling, at the time of or after determining that the temperature of the EPU is not within the range, power to a temperature modification system to bring the temperature of the EPU within the range; and based on determining that the temperature of the EPU is in the range, enabling the EPU for propulsive operation.

A further aspect of the present disclosure is directed to a system for controlling aircraft power distribution for propulsive operation of an electric propulsion unit (EPU), the system comprising: at least one EPU; a user input device configured to receive an input indicating a mode of operation; a power switching device configured to provide power to a controller to a controller upon receiving a signal from the user input device; a controller configured to control power to one or more subsystems of the aircraft for propulsive operation of the at least one EPU; and wherein the controller is configured to: receive a selection of one of at least two aircraft modes of operation from a user input device; determine, using conditional logic, if one or more conditions are met at the time of or after receiving the selection of the one selected mode, wherein the one or more conditions comprise at least one temperature of the EPU being within an associated temperature range; and control, at the time of or after determining that the temperature of the EPU is not within the range, power to a temperature modification system to bring the temperature of the EPU within the range; and based on determining that the temperature of the EPU is in the range, enable the EPU for propulsive operation.

One aspect of the present disclosure is directed to a method for testing protections of a circuit, the method comprising: transmitting, on a low-voltage side of a voltage isolation barrier, an input test signal to a power supply controller, wherein: the input test signal causes a power supply to generate, on a high-voltage side of the voltage isolation barrier, a trigger signal, and the trigger signal is input to a gate driver on the high-voltage side of the voltage isolation barrier, at an interface electrically connected to a transistor and associated with receiving fault signals from the transistor; after transmitting the input test signal, receiving on the low-voltage side of the voltage isolation barrier, from the gate driver, an indication of whether a signal is received at the interface; and determining, based on the received indication of whether a signal was received at the interface, whether the gate driver is experiencing a fault.

Another aspect of the present disclosure is a non-transitory computer-readable medium storing one or more instructions, that when executed by at least one processor cause the at least one processor to perform operations comprising: transmitting, on a low-voltage side of a voltage isolation barrier, an input test signal to a power supply controller, wherein: the input test signal causes a power supply to generate, on a high-voltage side of the voltage isolation barrier, a trigger signal, and the trigger signal is input to a gate driver on the high-voltage side of the voltage isolation barrier, at an interface electrically connected to a transistor and associated with receiving fault signals from the transistor; after transmitting the input test signal, receiving on the low-voltage side of the voltage isolation barrier, from the gate driver, an indication of whether a signal is received at the interface; and determining, based on the received indication of whether a signal was received at the interface, whether the gate driver is experiencing a fault.

A further aspect of the present disclosure is a system for testing protections of a circuit, the system comprising: a voltage isolation barrier, configured to isolate circuitry on a high-voltage side and a low-voltage side; a power supply controller; a power supply communicatively coupled to the power supply controller and configured to generate a trigger signal; a gate driver configured to be powered by the power supply; a transistor configured to be driven by the gate driver and to transmit fault signals to the gate driver and a processor configured to: transmit, on a low-voltage side of a voltage isolation barrier, an input test signal to a power supply controller, wherein: the input test signal causes a power supply to generate, on a high-voltage side of the voltage isolation barrier, a trigger signal, and the trigger signal is input to a gate driver on the high-voltage side of the voltage isolation barrier, at an interface electrically connected to a transistor and associated with receiving fault signals from the transistor; after transmitting the input test signal, receive on the low-voltage side of the voltage isolation barrier, from the gate driver, an indication of whether a signal is received at the interface; and determine, based on the received indication of whether a signal was received at the interface, whether the gate driver is experiencing a fault.

BRIEF DESCRIPTIONS OF THE FIGURES

FIGS. 2A, 2B, 2C, 2D, 2E, 2F, and 2G illustrate exemplary top plan view of aircraft, consistent with disclosed embodiments.

Figure 3A:
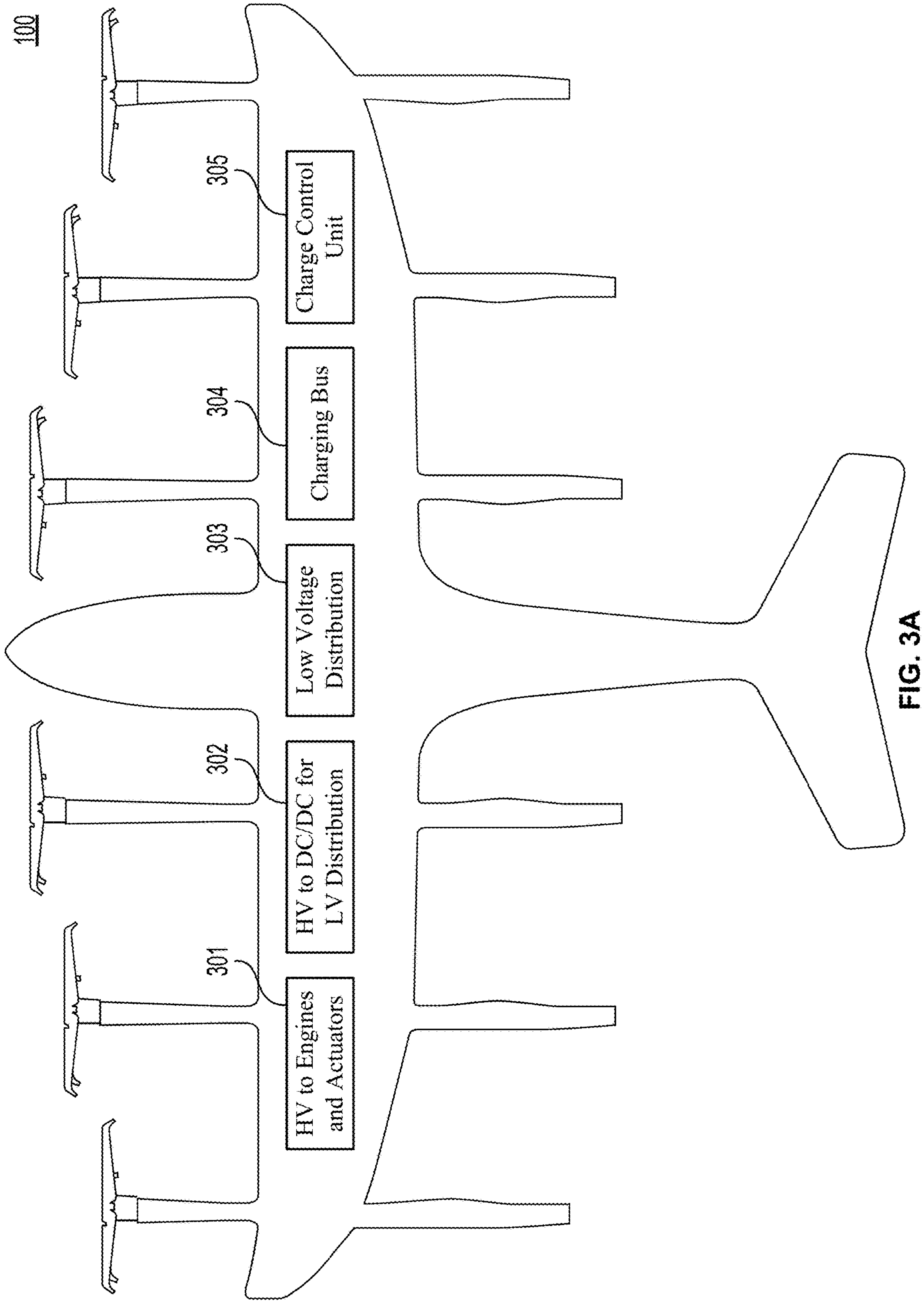

FIG. 3A illustrates and example eVTOL aircraft and associated subsystems, consistent with embodiments of the present disclosure.

Figure 3B:
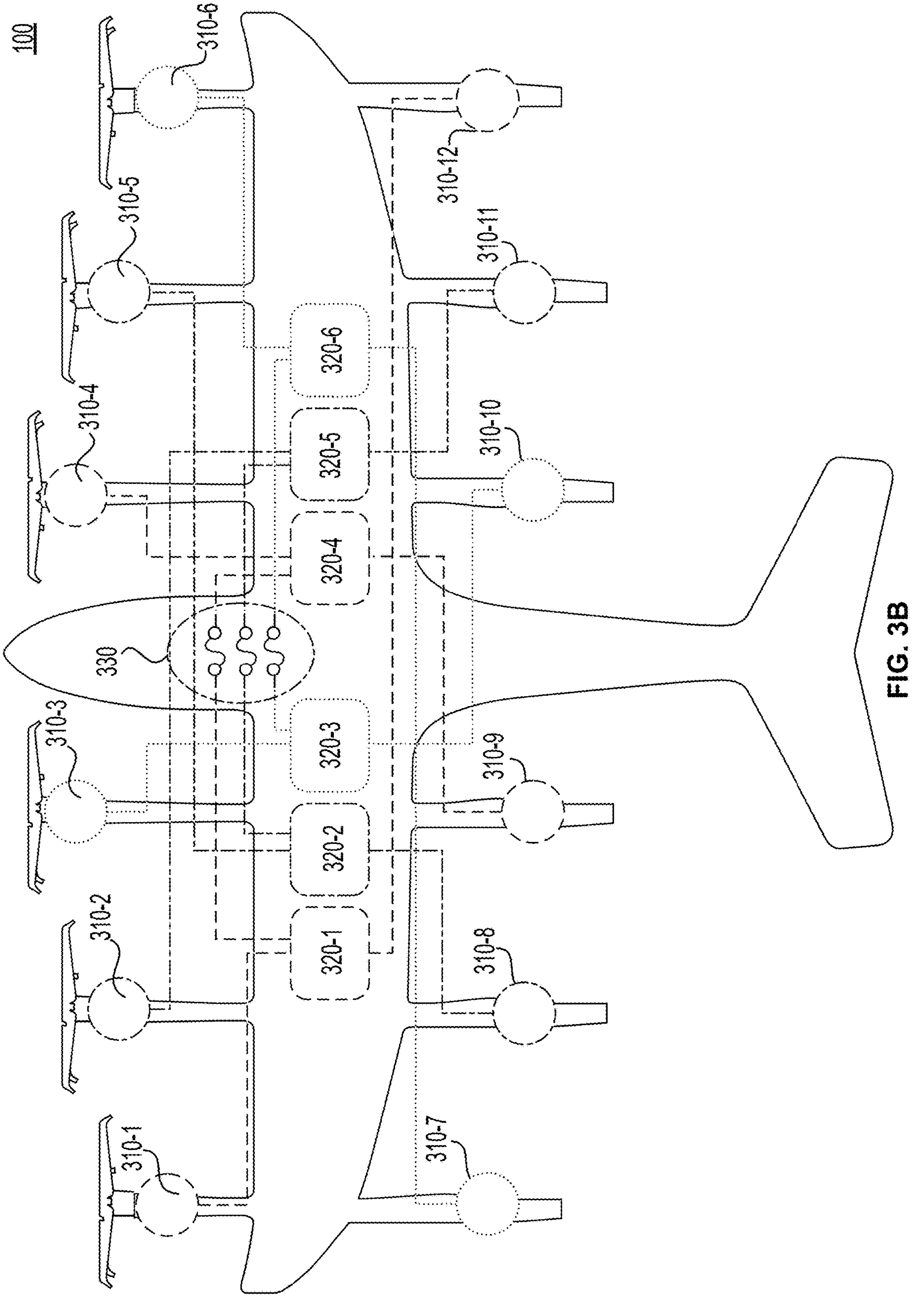
Figure 3C:
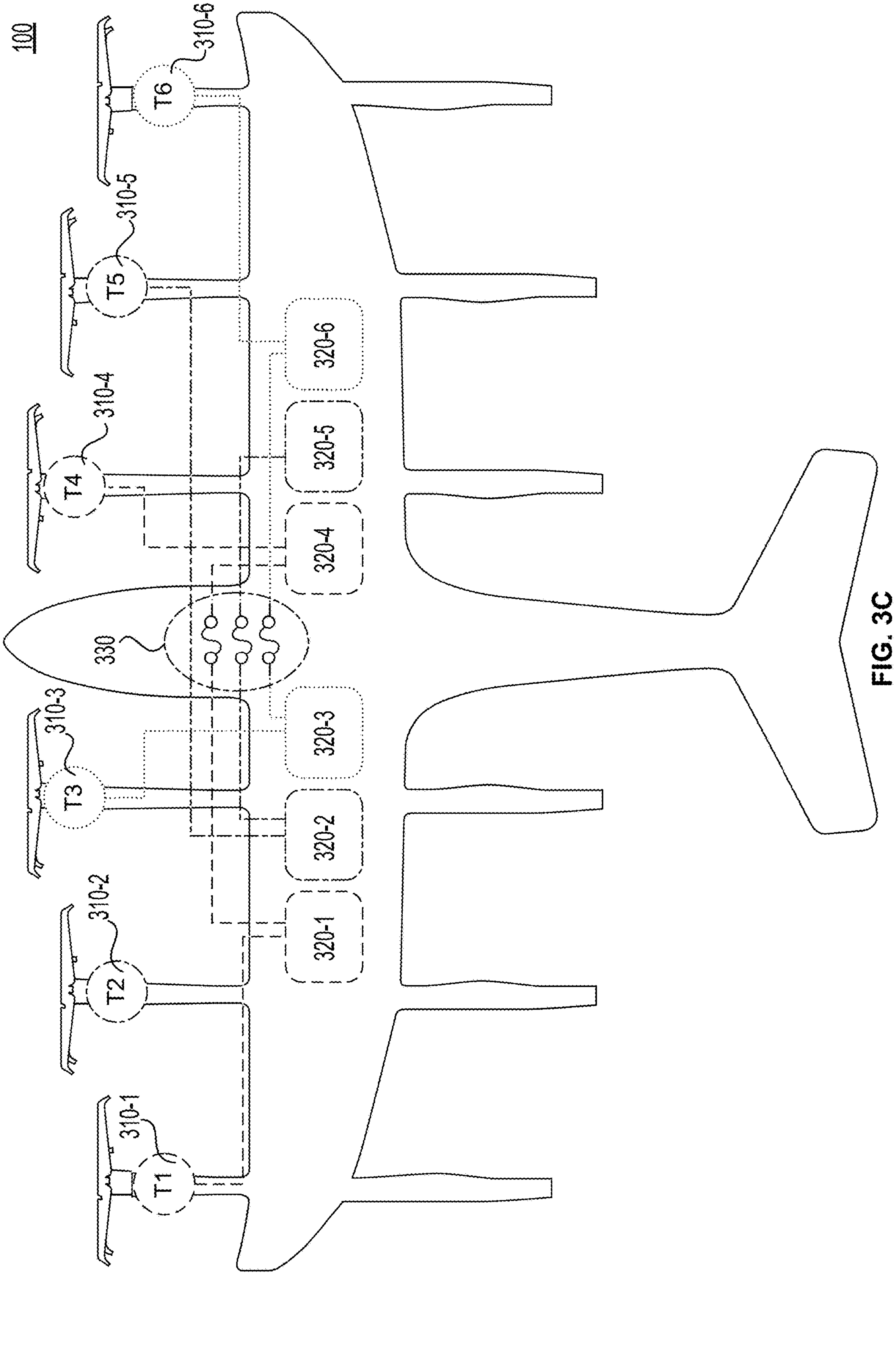
Figure 3D:
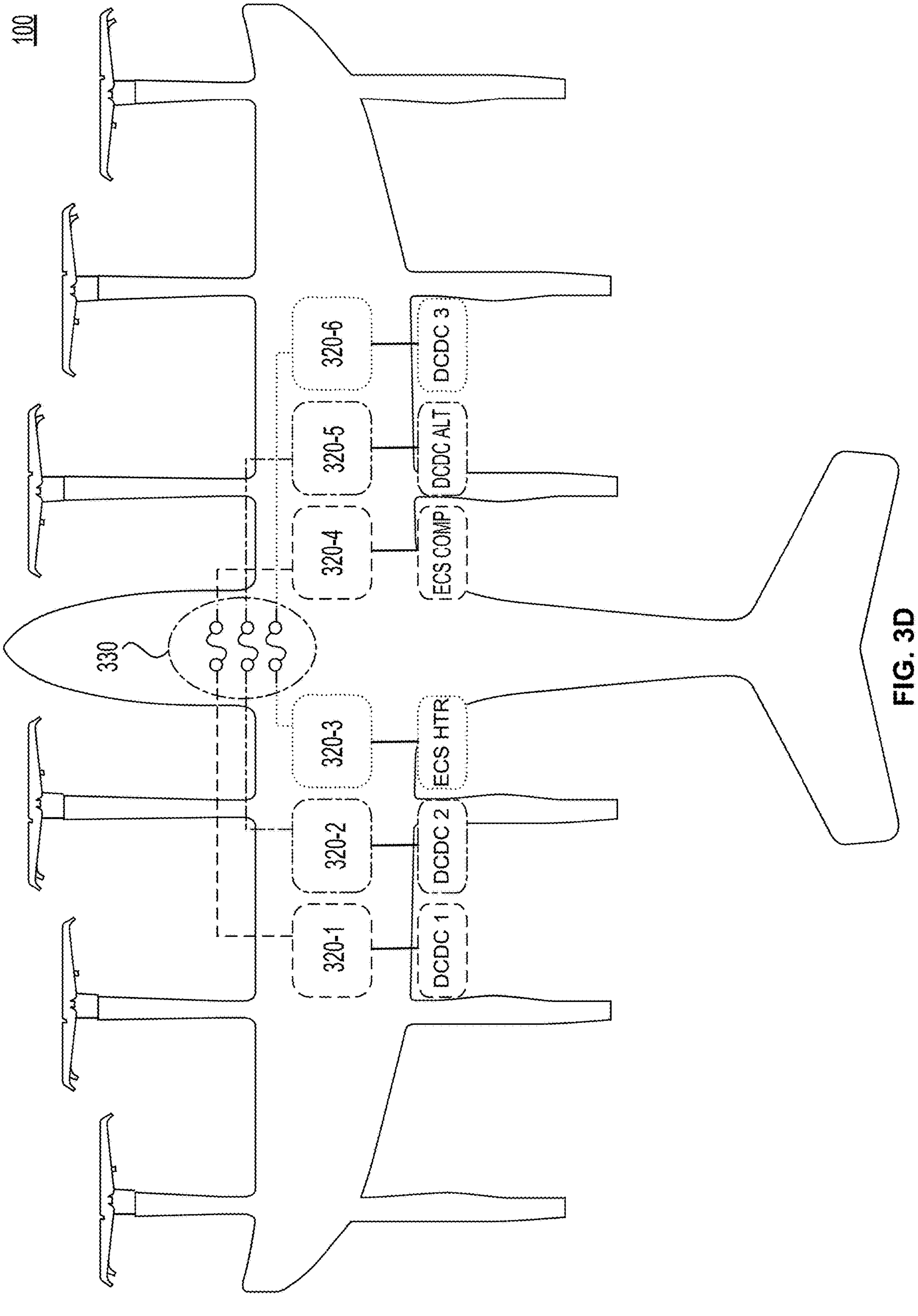

FIGS. 3B, 3C, and 3D illustrate exemplary connections to subsystems, consistent with embodiments of the present disclosure.

Figure 3E:
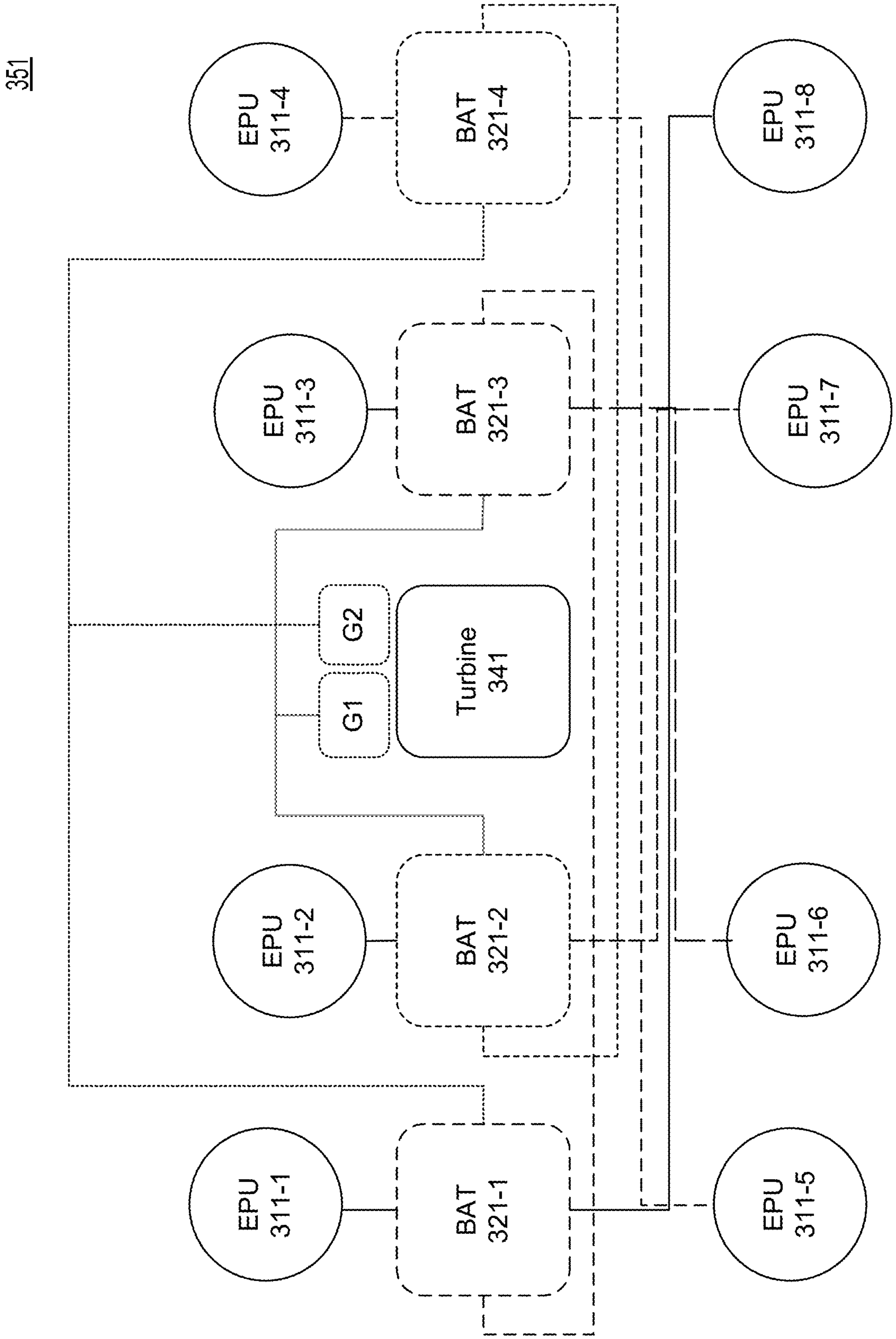
Figure 3F:
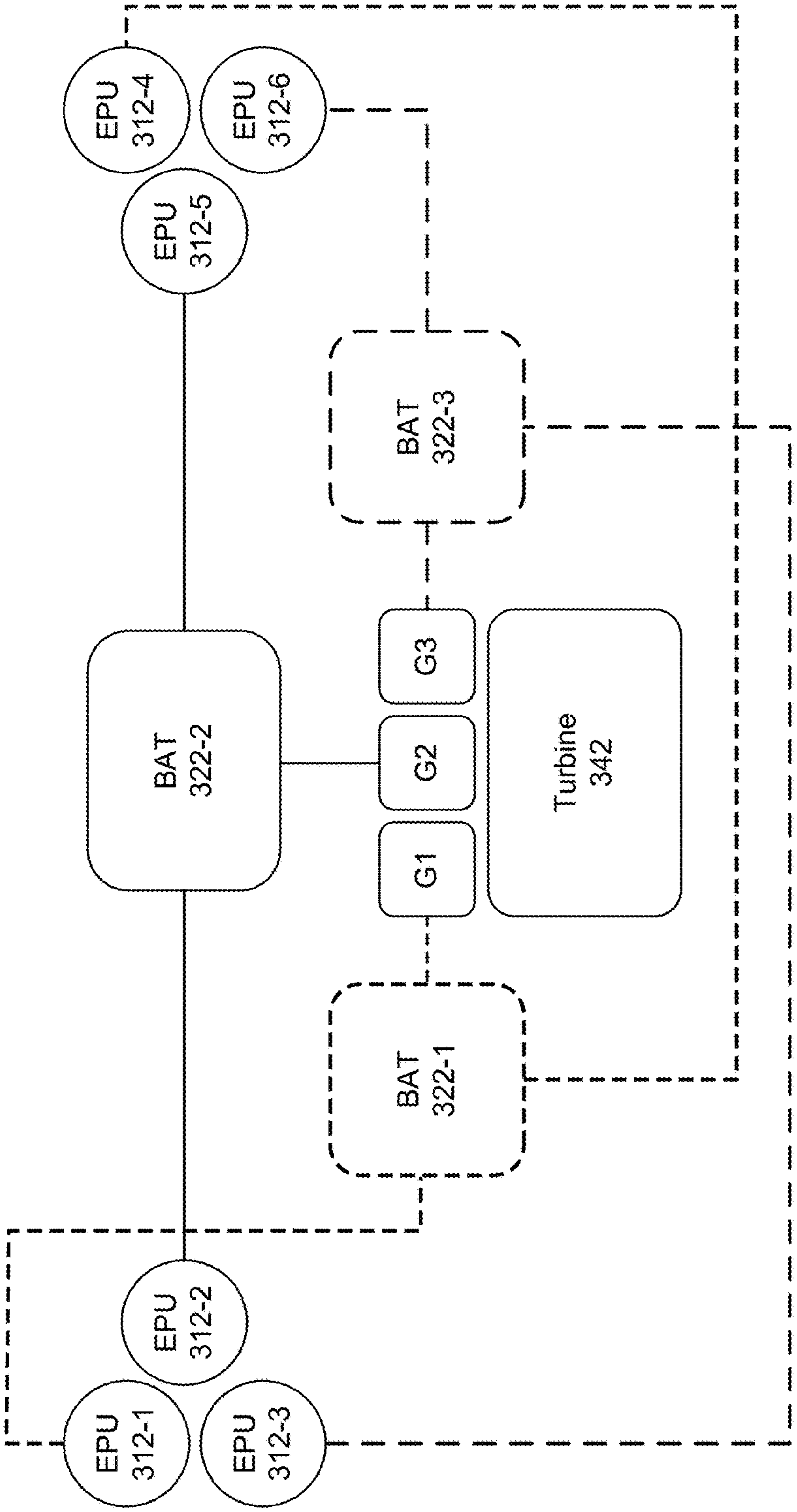
Figure 3G:
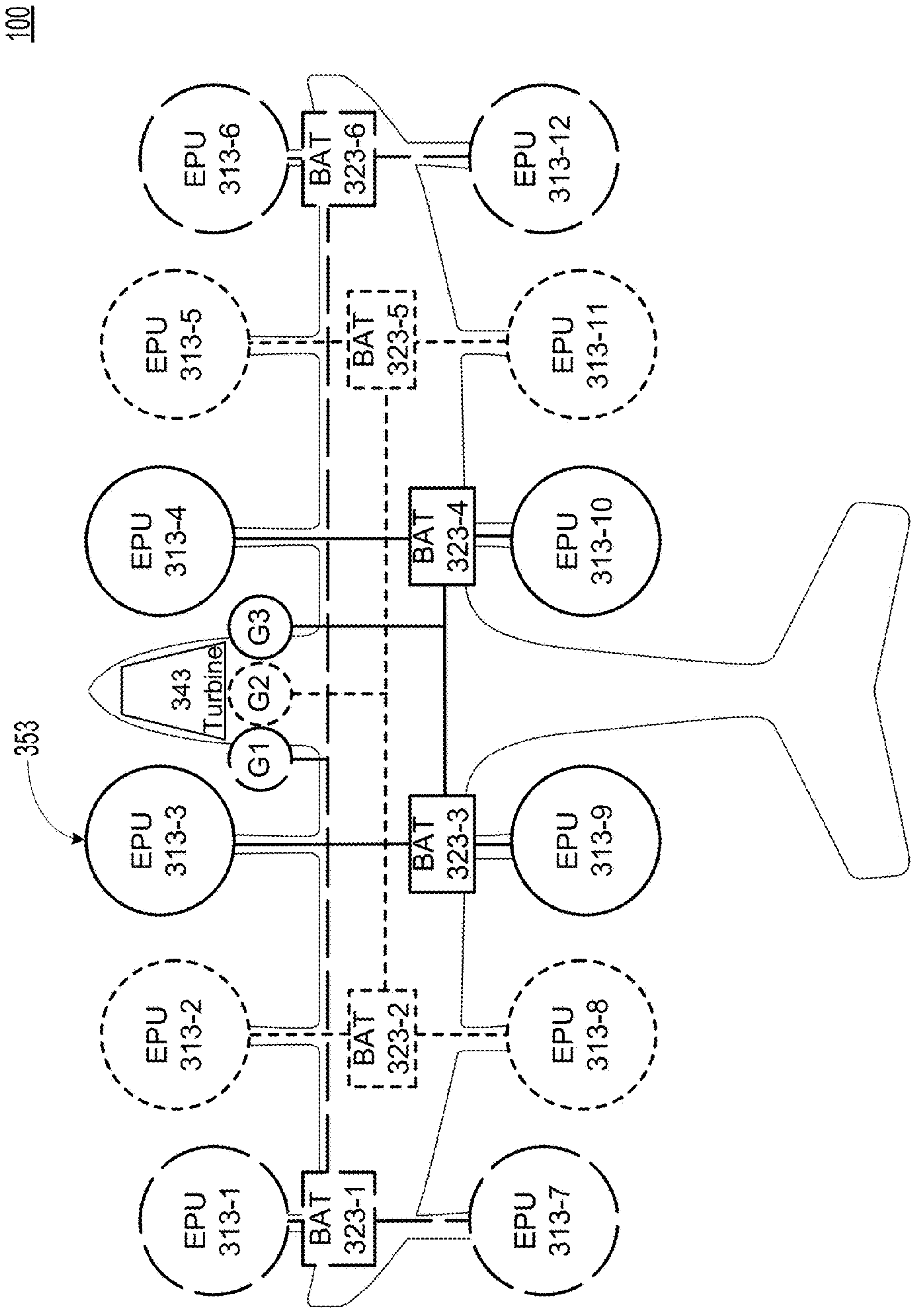

FIGS. 3E, 3F, and 3G illustrate functional block diagrams of exemplary power systems of a hybrid electric VTOL aircraft, consistent with disclosed embodiments.

Figure 4A:
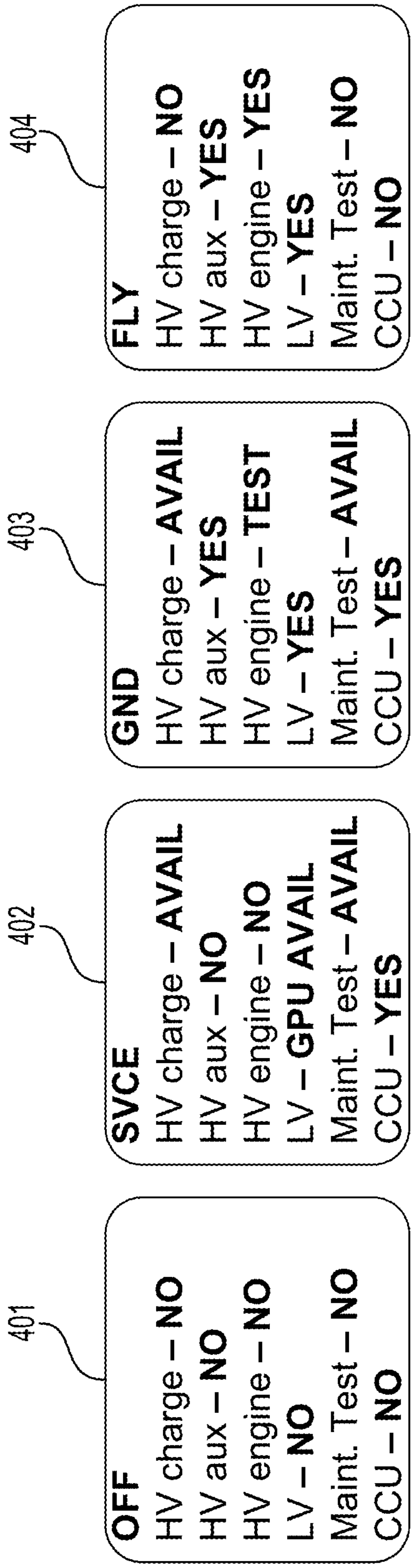

FIG. 4A illustrates exemplary modes of an aircraft, consistent with embodiments of the present disclosure.

Figure 4B:
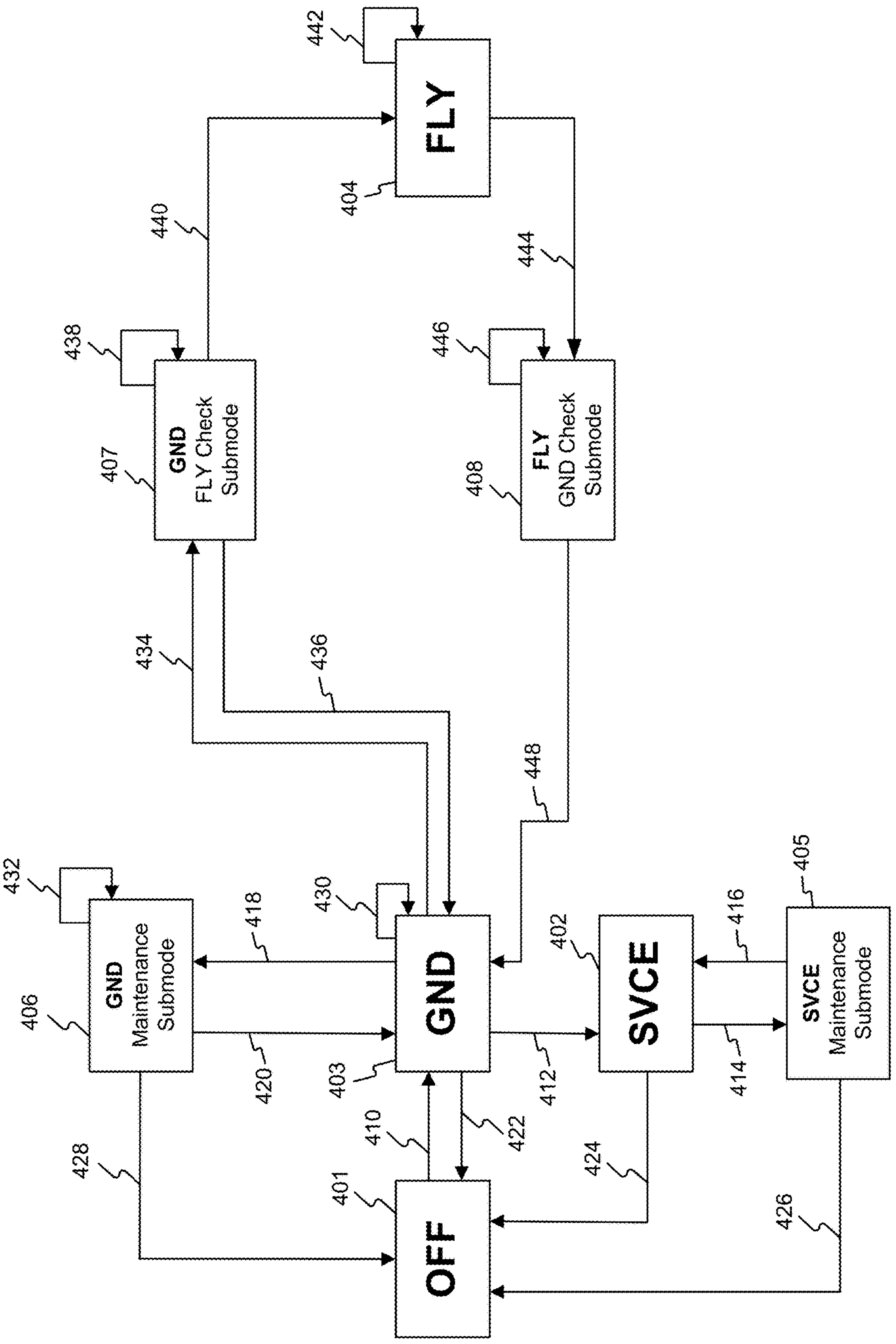

FIG. 4B illustrates a control diagram for exemplary mode transitions of an aircraft, consistent with embodiments of the present disclosure.

FIGS. 5A, 5B, 5C, and 5D illustrate exemplary power connections associated with modes of an aircraft, consistent with embodiments of the present disclosure.

Figure 6A:
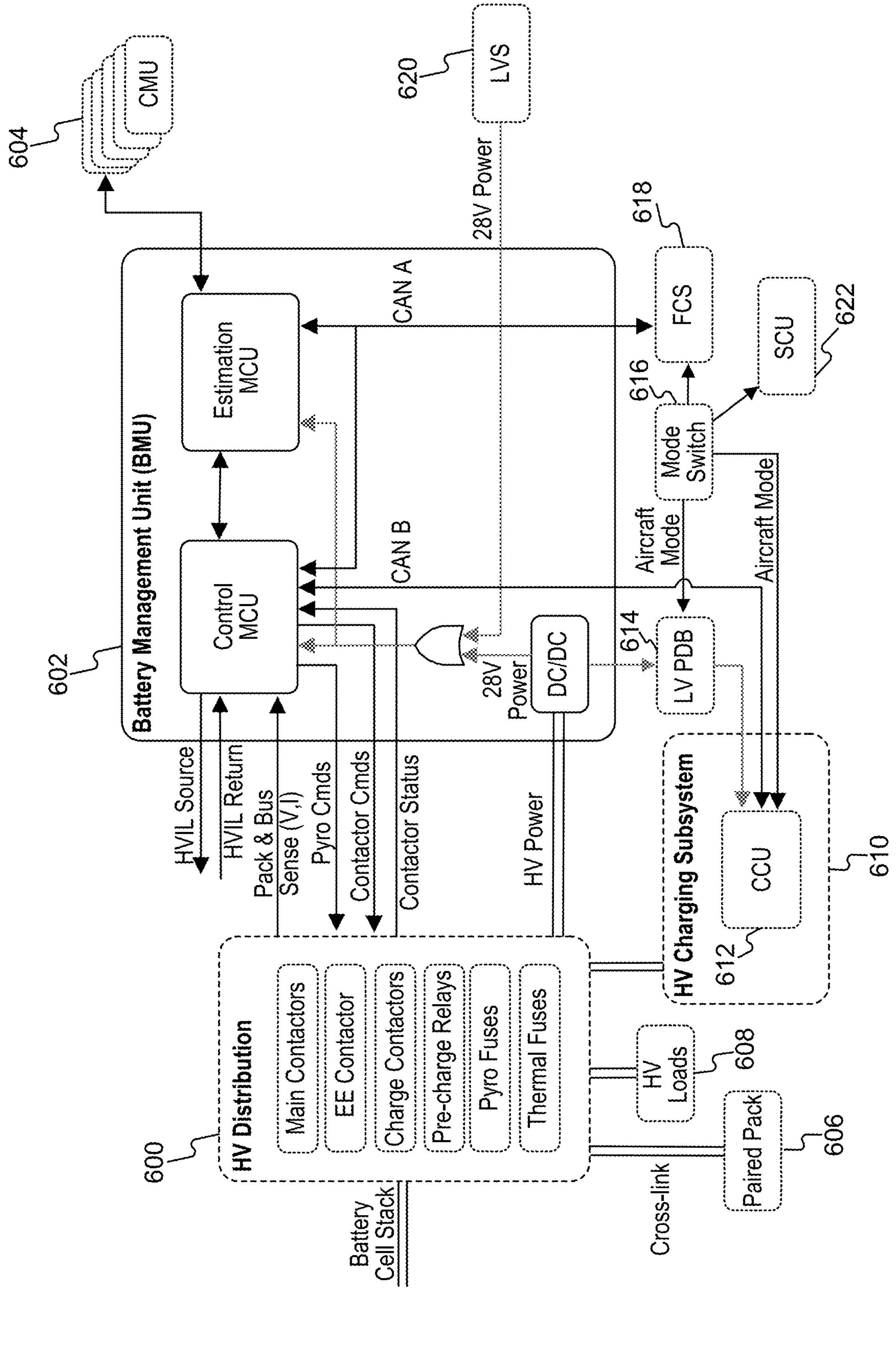
Figure 6B:
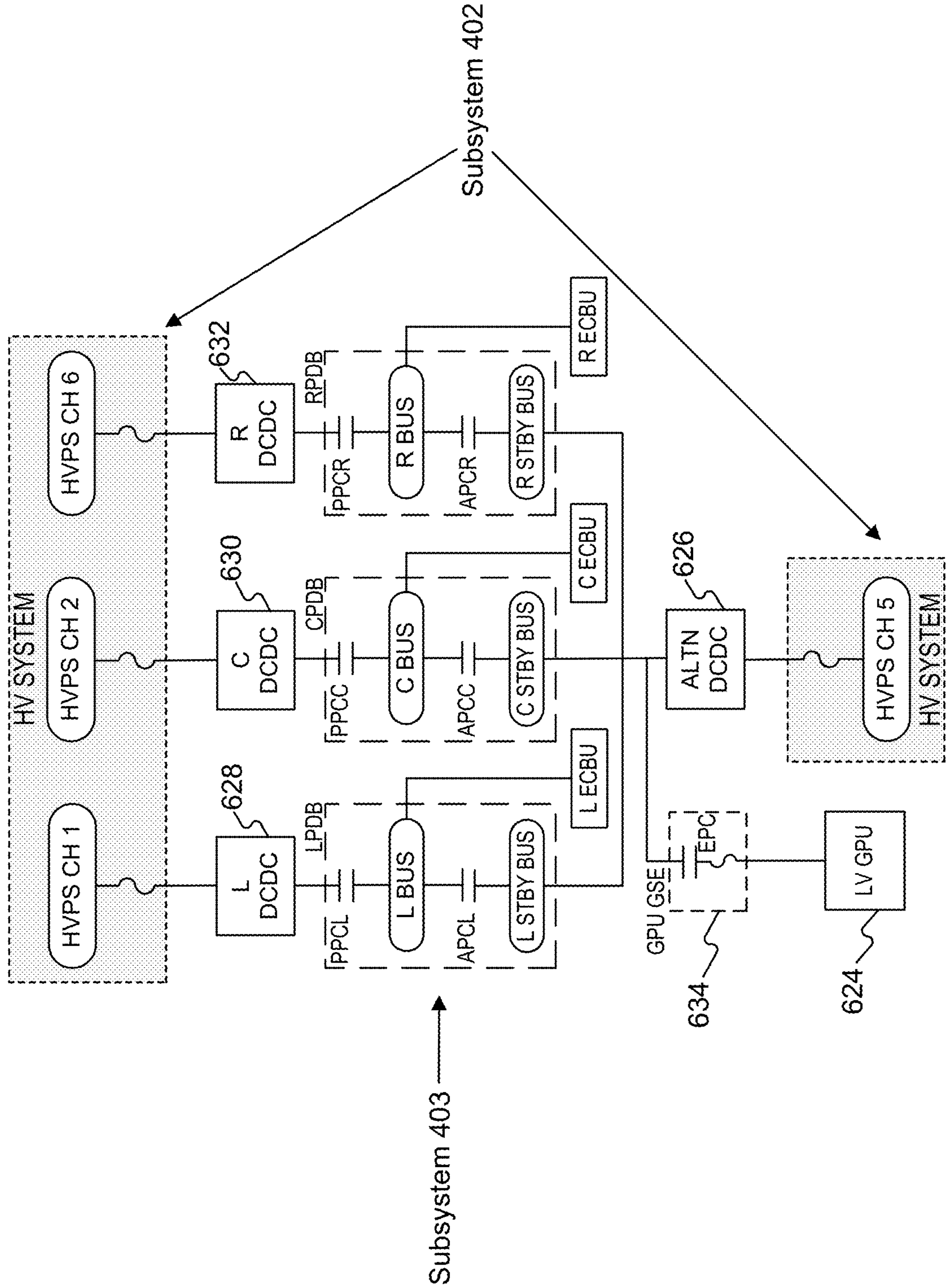

FIGS. 6A and 6B illustrate diagrams of exemplary aircraft circuitry, consistent with embodiments of the present disclosure.

Figure 6C:
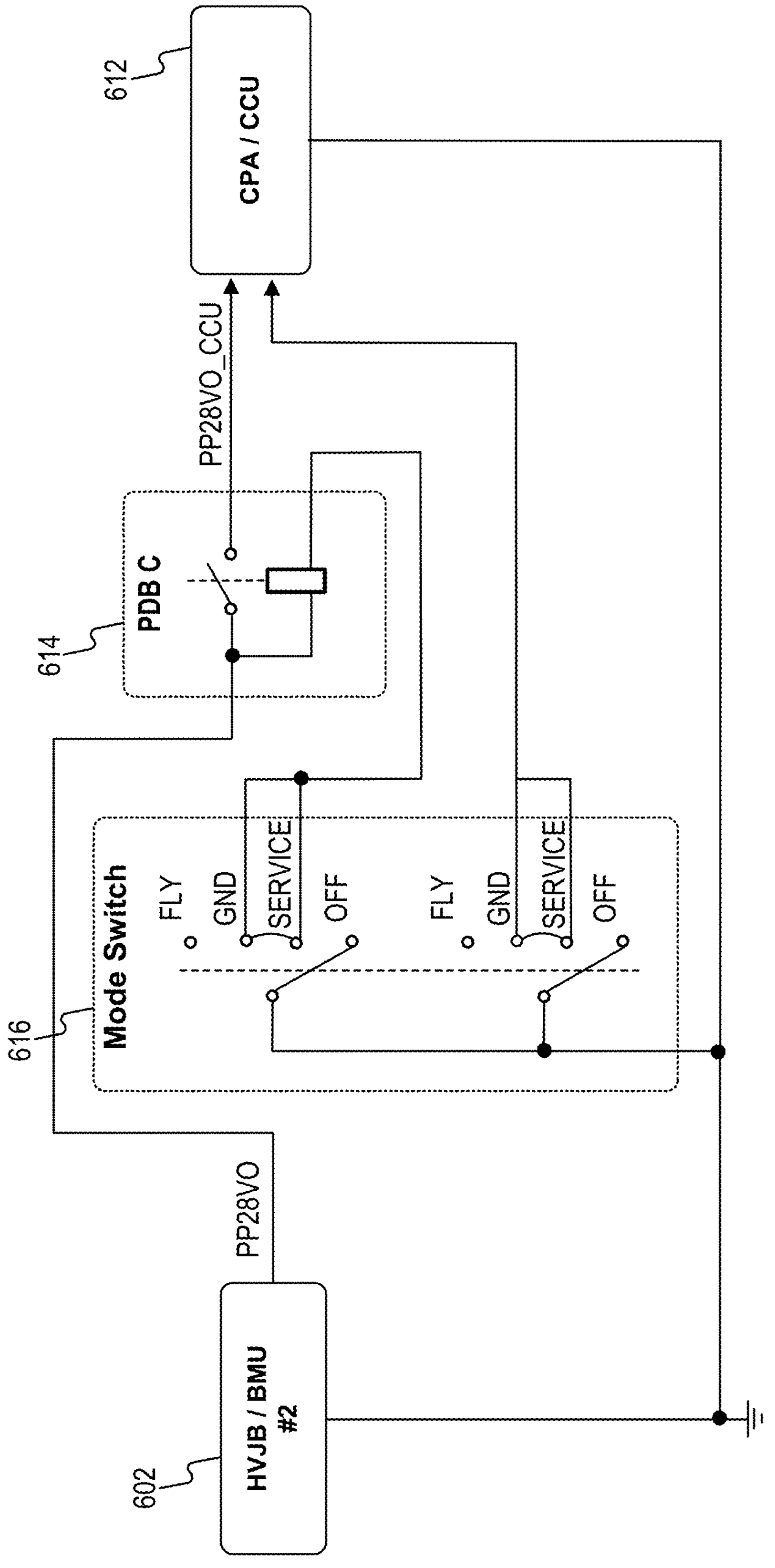
Figure 6D:
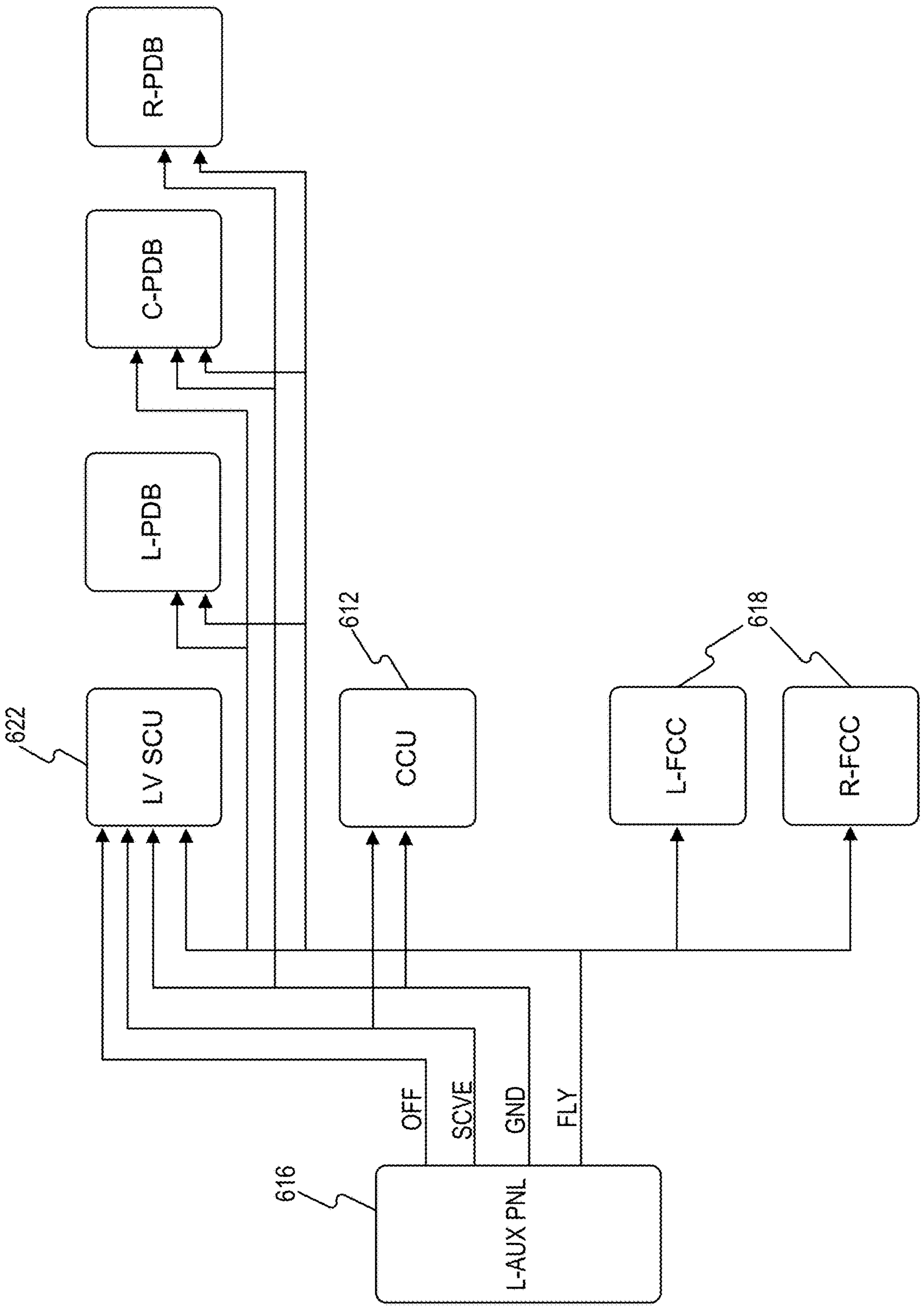

FIGS. 6C and 6D illustrate diagrams of exemplary mode switch architectures, consistent with embodiments of the present disclosure.

Figure 7:
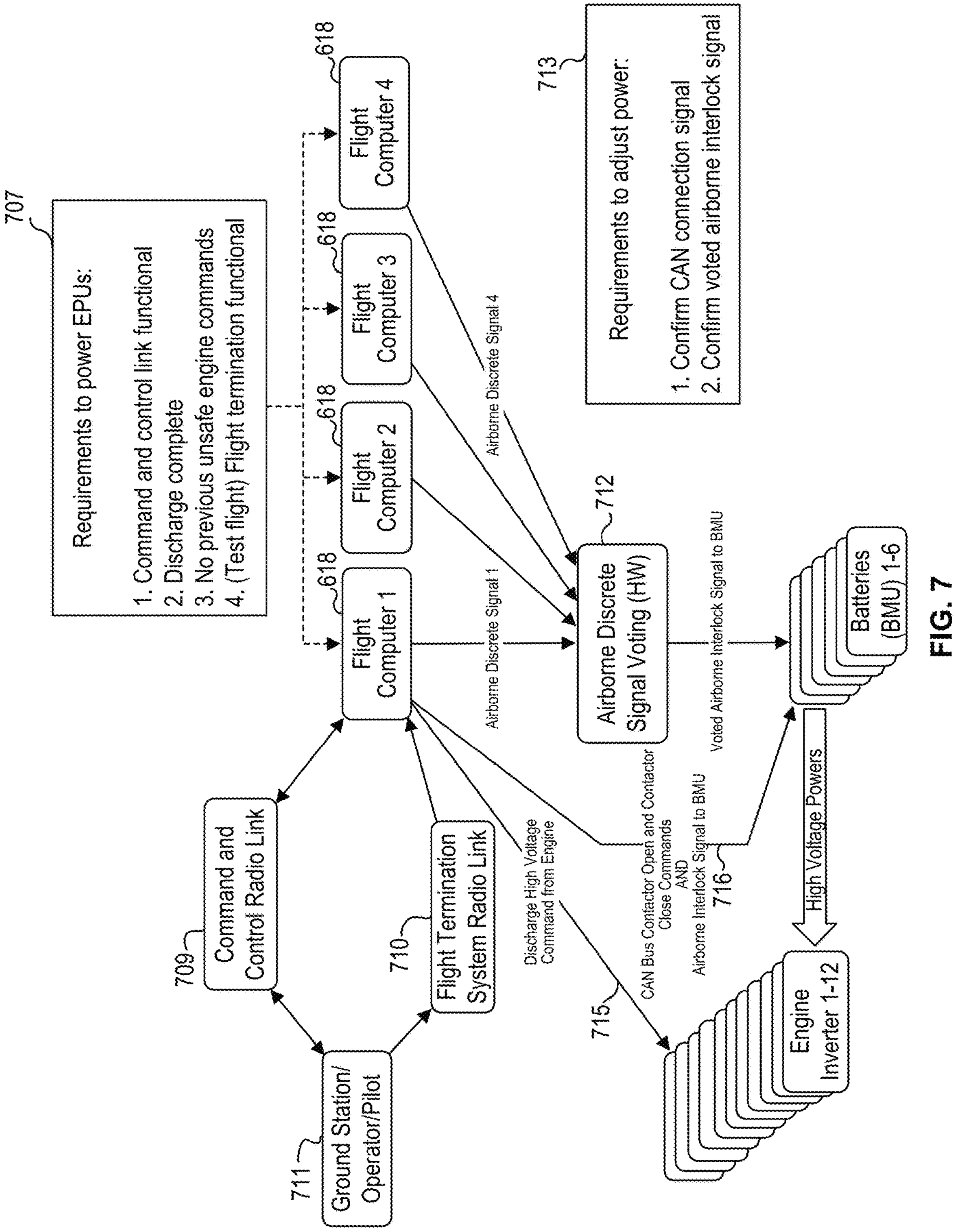

FIG. 7 illustrates exemplary checks for switching between aircraft modes that enable and disable electric propulsion units, consistent with embodiments of the present disclosure.

Figure 8:
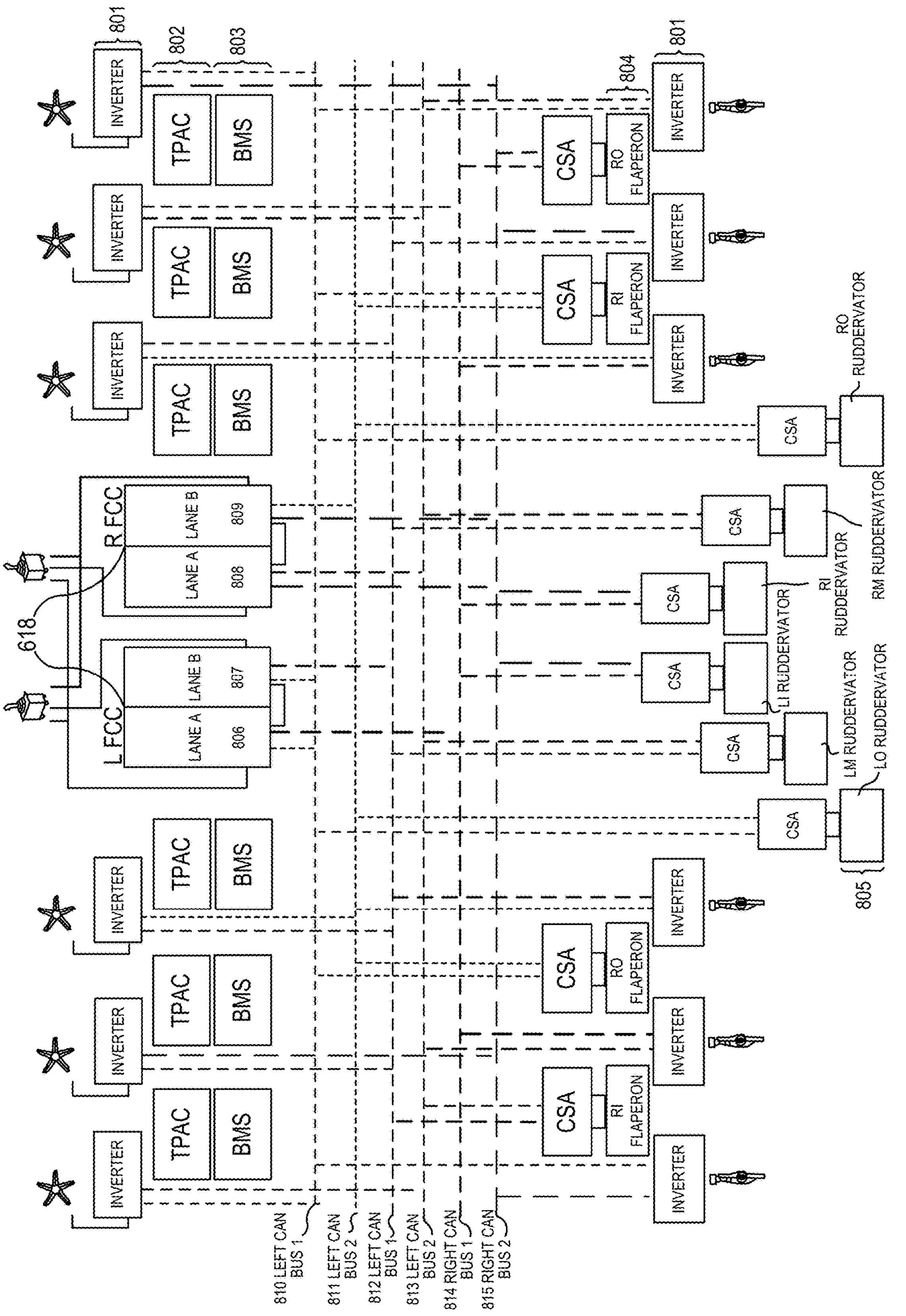

FIG. 8 illustrates an exemplary flight control architecture, consistent with embodiments of the present disclosure.

Figure 9A:
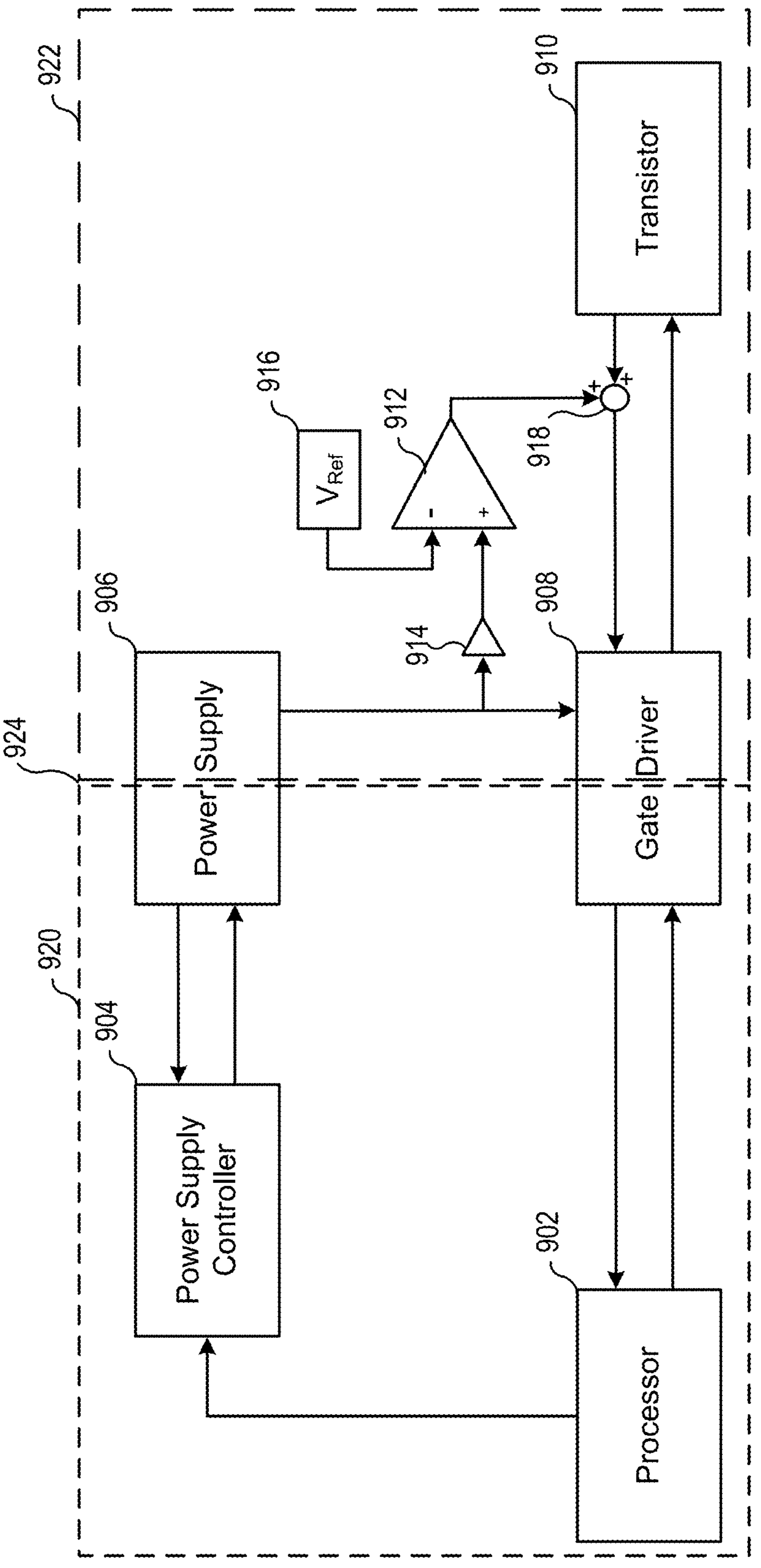

FIG. 9A illustrates a block diagram of an exemplary system for testing protections of a circuit, consistent with disclosed embodiments.

Figure 9B:
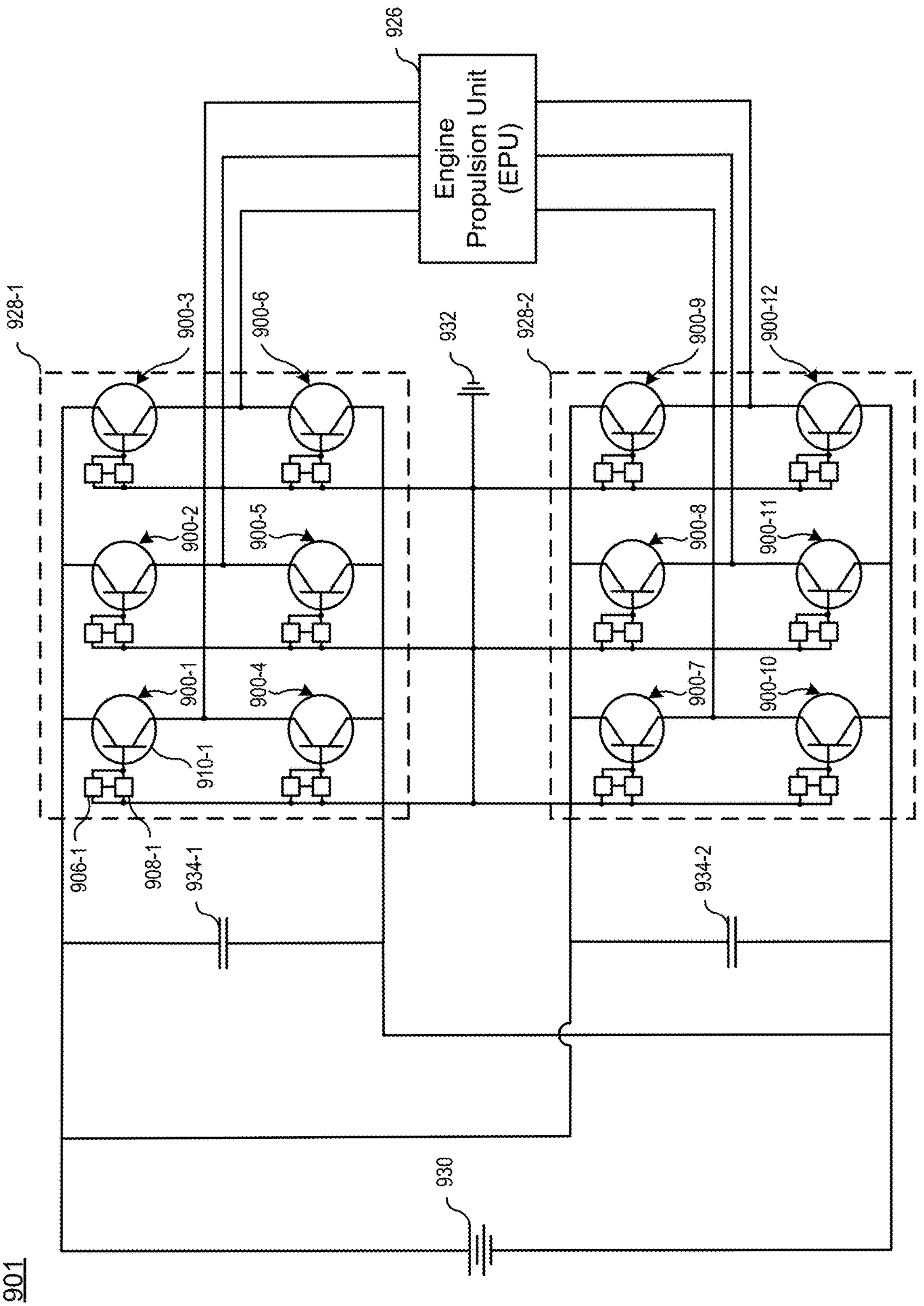

FIG. 9B illustrates a block diagram of an exemplary system for testing protections of a circuit for a plurality of gate drivers associated with an EPU, consistent with disclosed embodiments.

Figure 10:
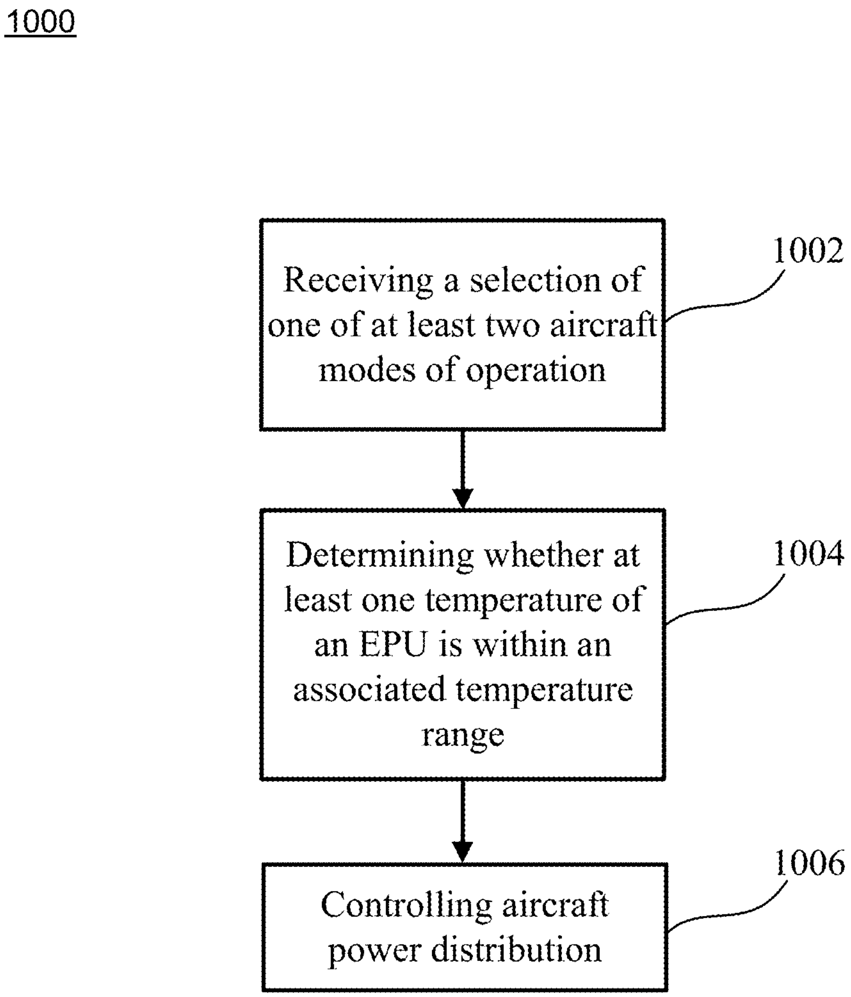

FIG. 10 is an exemplary flowchart illustrating the control of aircraft power distribution based on a temperature of an engine propulsion unit (EPU), consistent with embodiments of the present disclosure.

Figure 11:
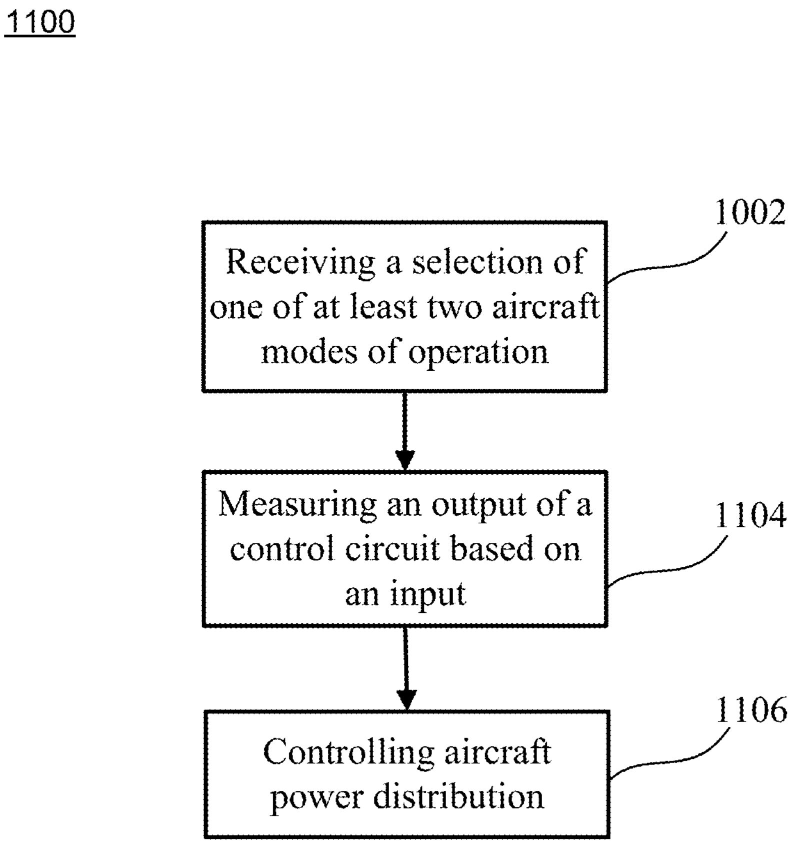

FIG. 11 is an exemplary flowchart illustrating the control of aircraft power distribution based on a measured output of a control circuit based on an input, consistent with embodiments of the present disclosure.

Figure 12:
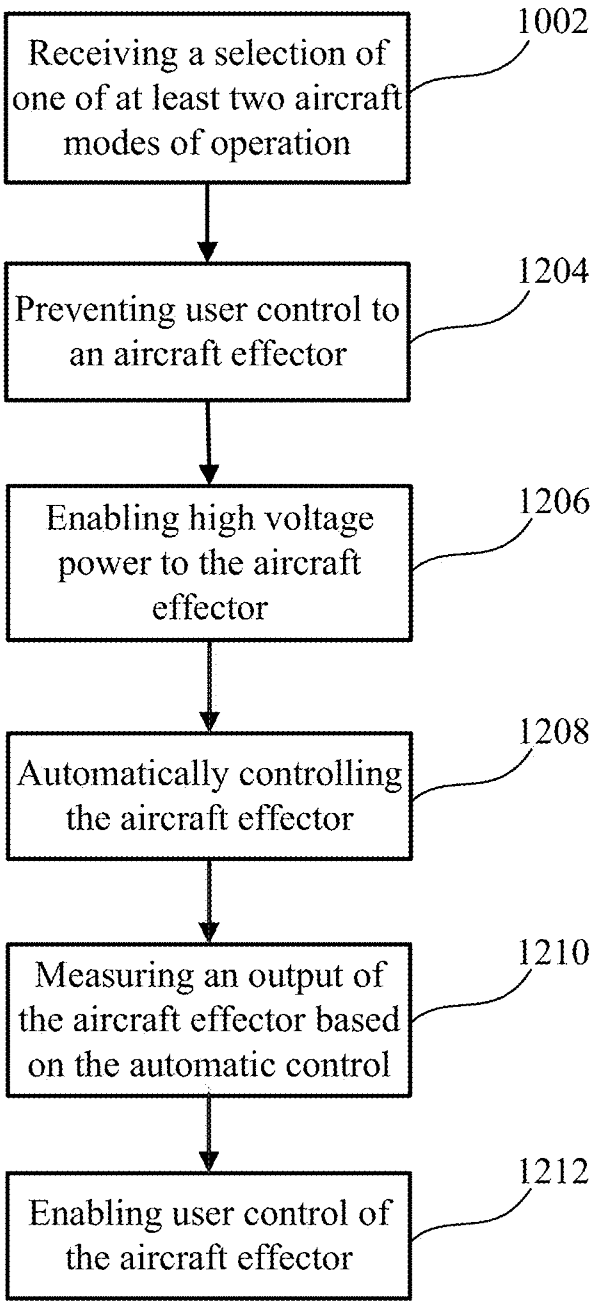

FIG. 12 is an exemplary flowchart illustrating the control of aircraft power distribution based on a measured output to automatic control of an aircraft effector, consistent with embodiments of the present disclosure.

Figure 13:
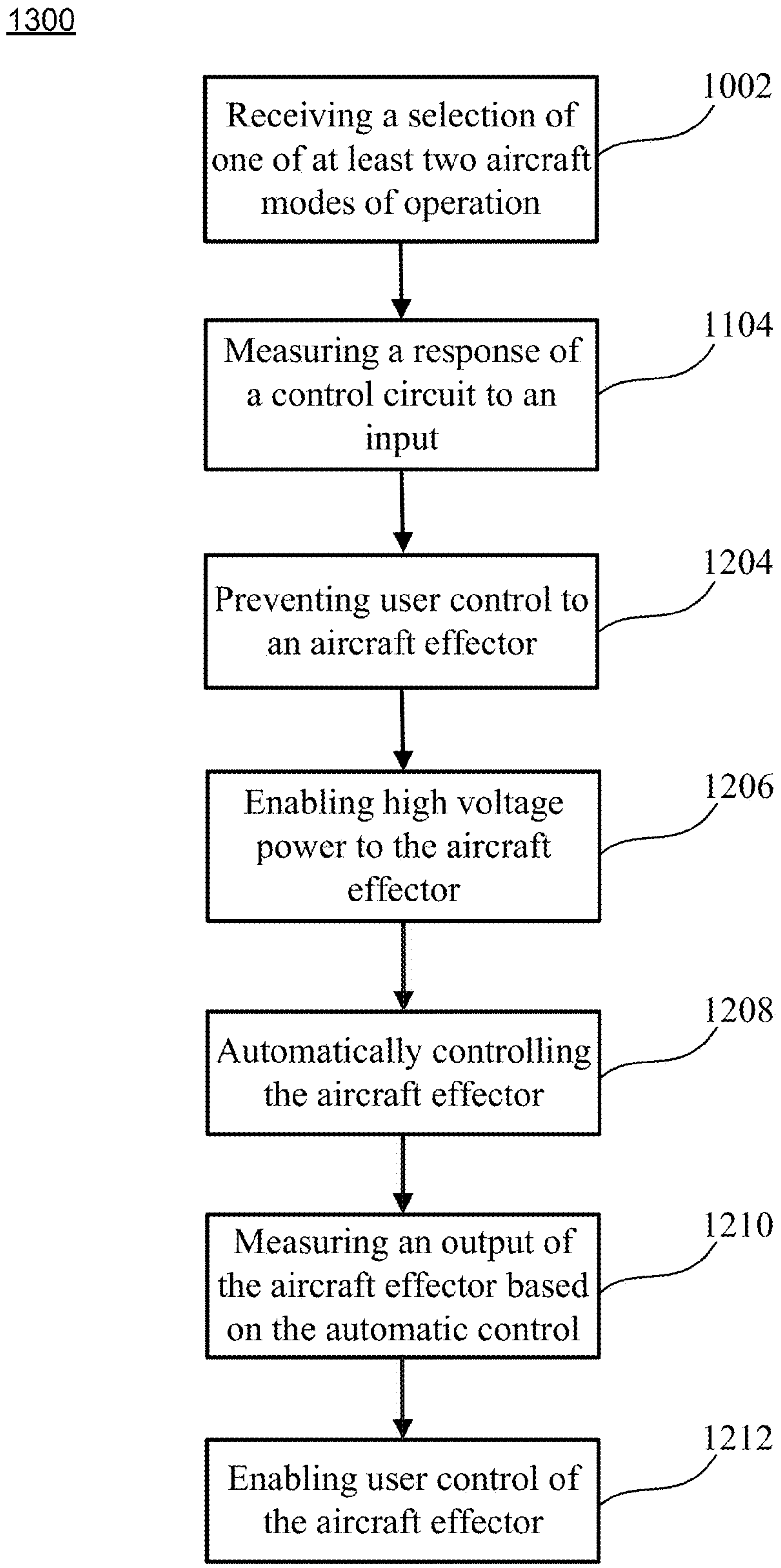

FIG. 13 is an exemplary flowchart illustrating the control of aircraft power distribution based on a measured output of a control circuit based on an input and a measured output to automatic control of an aircraft effector, consistent with embodiments of the present disclosure.

Figure 14:
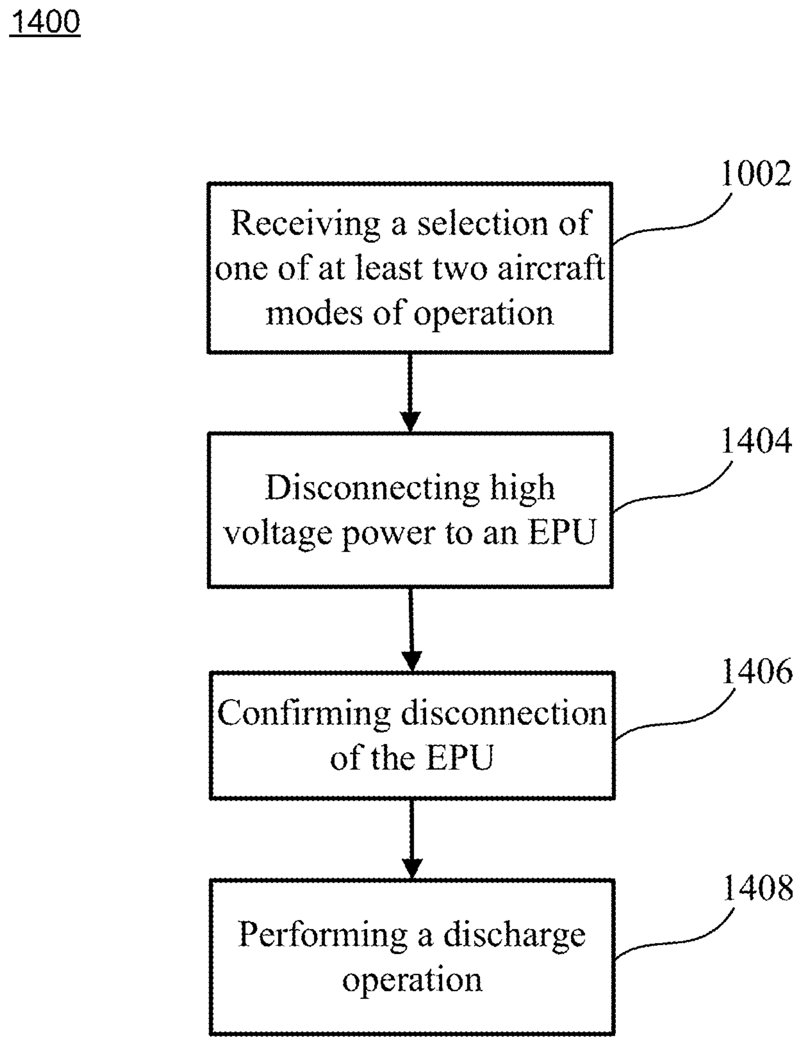

FIG. 14 is an exemplary flowchart illustrating an EPU disconnection operation based on a selection of an aircraft mode of operation, consistent with embodiments of the present disclosure.

Figure 15:
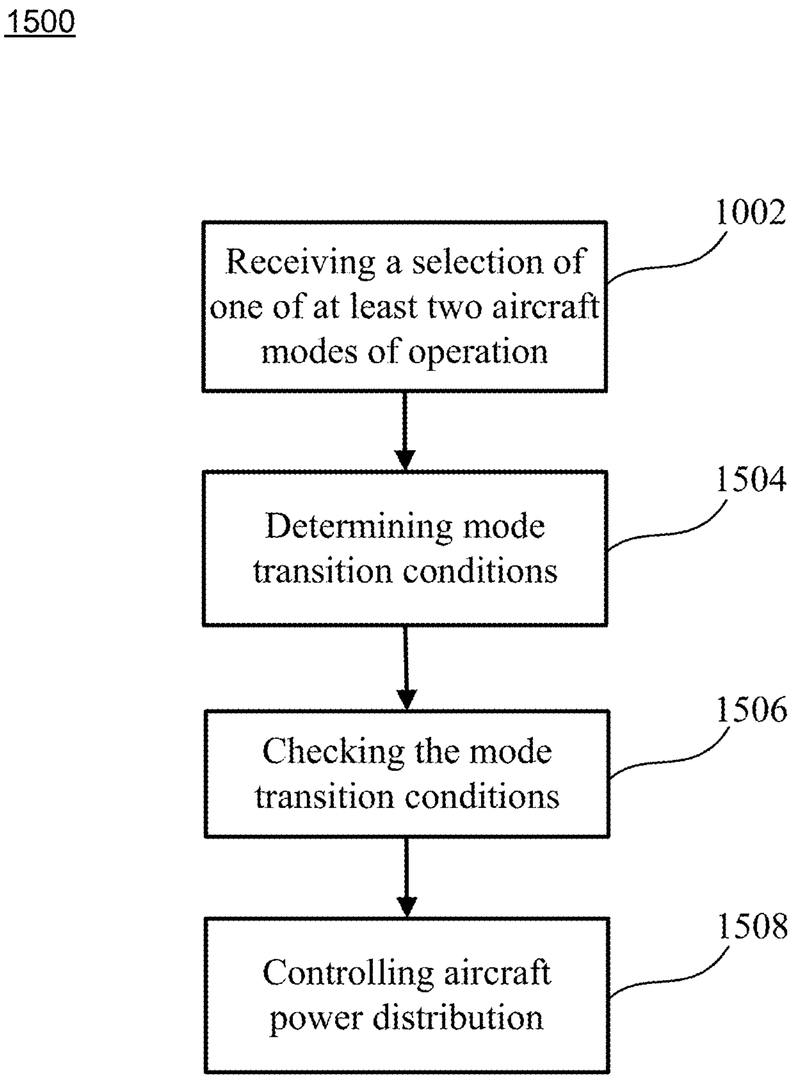

FIG. 15 is an exemplary flowchart illustrating the control of aircraft power distribution based on mode transition conditions, consistent with embodiments of the present disclosure.

Figure 16:
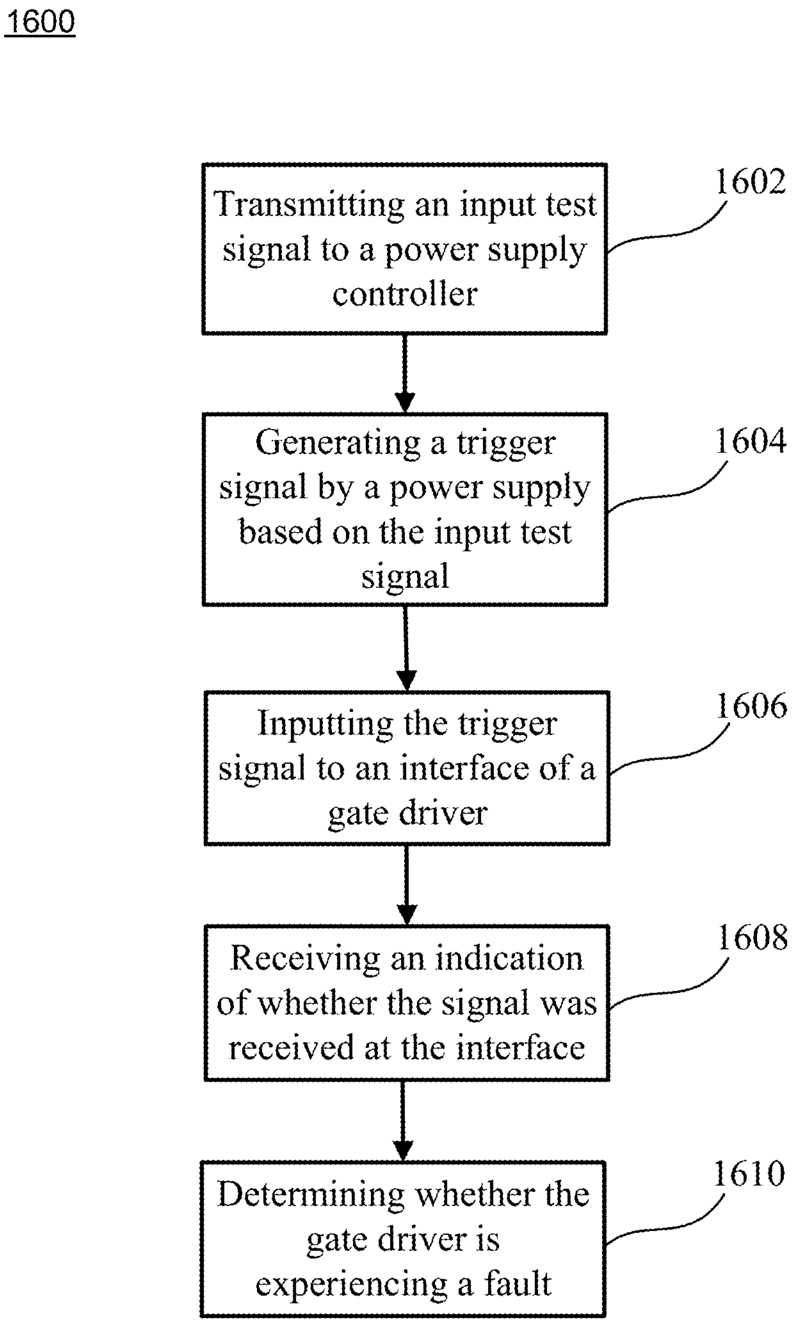

FIG. 16 is an exemplary flowchart illustrating the testing of circuit protections, consistent with embodiments of the present disclosure.

DETAILED DESCRIPTION

The present disclosure addresses systems, components, and techniques primarily for use in an aircraft. The aircraft may be an aircraft with a pilot, an aircraft without a pilot (e.g., a UAV), a drone, a helicopter, and/or an airplane. An aircraft includes a physical body and one or more components (e.g., a wing, a tail, a propeller) configured to allow the aircraft to fly. The aircraft may include any configuration that requires power to one or more subsystems of the aircraft.

Disclosed embodiments provide new and improved configurations of aircraft components, some of which are not observed in conventional aircraft, and/or identified design criteria for components that differ from those of conventional aircraft. Such alternate configurations and design criteria, addressing drawbacks and challenges with conventional components, yielded the embodiments disclosed herein for various configurations and designs of components for an aircraft (e.g., electric aircraft or hybrid-electric aircraft) driven by a propulsion system.

Embodiments may include an electric propulsion unit (EPU), including an electric engine connected to an onboard electrical power source. A power source may include a device capable of storing energy such as a battery or capacitor and may optionally include one or more systems for harnessing or generating electricity such as a fuel powered generator or solar panel array. In some embodiments, the aircraft may comprise a hybrid aircraft using at least one of an electric-based energy source or a fuel-based energy source to power the distributed propulsion system. In some embodiments, the aircraft may be powered by one or more batteries, internal combustion engines (ICE), generators, turbine engines, or ducted fans.

In some embodiments, an EPU as described herein may generate thrust by supplying high-voltage (HV) electric power to an electric engine, which in turn converts HV power into mechanical shaft power which is used to rotate a propeller. The aircraft as described herein may possess multiple electric engines. The amount of thrust each engine generates may be governed by a torque command from the Flight Control System (FCS) over a digital communication interface to each electric engine.

Embodiments of the present disclosure implement improved system redundancy in the case of a failure, to minimize any single points of failure in the aircraft propulsion system. Some disclosed embodiments also provide new and improved approaches to satisfying aviation and transportation laws and regulations.

Aircraft need to be lightweight enough to meet their performance goals. Extra weight on an aircraft may impact its ability to generate enough lift (e.g., through static and/or powered lift elements) to fly safely. Further, extra weight can negatively affect an aircraft's maneuverability, speed, climb rate, and range. It is particularly important that electric aircraft avoid extra weight. Unlike a conventional aircraft, electric aircraft are unable to store extra fuel. Instead, an electric aircraft's energy supply is limited to the energy capacity of its battery packs.

Battery packs are one of the main contributors to the weight of an electric aircraft. An electric aircraft may include multiple HV battery packs to power one or more electric engines and/or tilt actuators. For example, an electric aircraft may include four, six, eight, ten, or twelve, or any number of battery packs to power the aircraft's electric engines and/or tilt actuators. One or more additional battery packs (e.g., low-voltage battery packs) may power low-voltage (LV) systems, such as the flight control system, charging control equipment, environmental conditioning systems, and/or other auxiliary loads. However, these additional battery packs add weight and take up space within an aircraft.

Embodiments of the present disclosure help to solve this problem, and others, by powering the LV distribution system with the one or more HV battery packs which also power the electric engines and/or tilt actuators. In some embodiments, one or more DC/DC converters are configured to step down the HV power to feed the LV distribution system. Therefore, the number of battery packs may be reduced and/or the need for LV battery packs may be eliminated.

Further, embodiments of the present disclosure provide for arrangements of components and circuitry that allow for separate control of power to different loads (e.g., LV system, electric engines, etc.), improving energy efficiency. Embodiments of the present disclosure also provide for redundancy and fault tolerance by balancing backup power and electrical separation between critical components.

Further, embodiments of the present disclosure allow a pilot to control an aircraft in different modes and submodes with certain subsystems enabled or disabled, which may improve aircraft safety or reduce pilot workload. For example, a pilot may want to control an aircraft in different modes, such as an "off" mode, a "service" mode, a "ground" mode, and/or a "fly" mode, with different subsystems enabled (e.g., for each mode), as well as maintenance, test, or check submodes. However, it may be difficult for the pilot to switch on and off different subsystems. The present disclosure solves this problem, and others, by providing a mode switch that automatically enables and/or disables different subsystems based on the selected mode. Further, within each mode, an aircraft may be automatically controlled into different states based on detecting an event.

Further, embodiments of the present disclosure help to limit the operational hours of an aircraft's critical systems, such as the flight control system (FCS). Limiting operational hours of the FCS may help to preserve the integrity of the FCS and/or comply with regulatory requirements. The present disclosure solves this problem, and others, by disabling the FCS in certain modes and/or states and relying on other controller(s) (e.g., a charge control unit) to communicate with various subsystems. For example, in some embodiments, the FCS may be disabled in an "off" mode and "service" mode, unless a maintenance state is selected and/or a ground unit provides power to the LV distribution system. Limiting usage of the FCS may also reduce unnecessary power consumption.

The present disclosure further allows for charging in certain modes with the FCS and/or other LV components disabled. For example, in some embodiments, the FCS and/or other LV components may be disabled in an "off" mode and a "service" mode and a charging state may be allowed in these modes. Therefore, aircraft charging may occur (e.g., overnight) without adding additional operational hours on the FCS and/or other LV components).

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims.

Figure 1A:
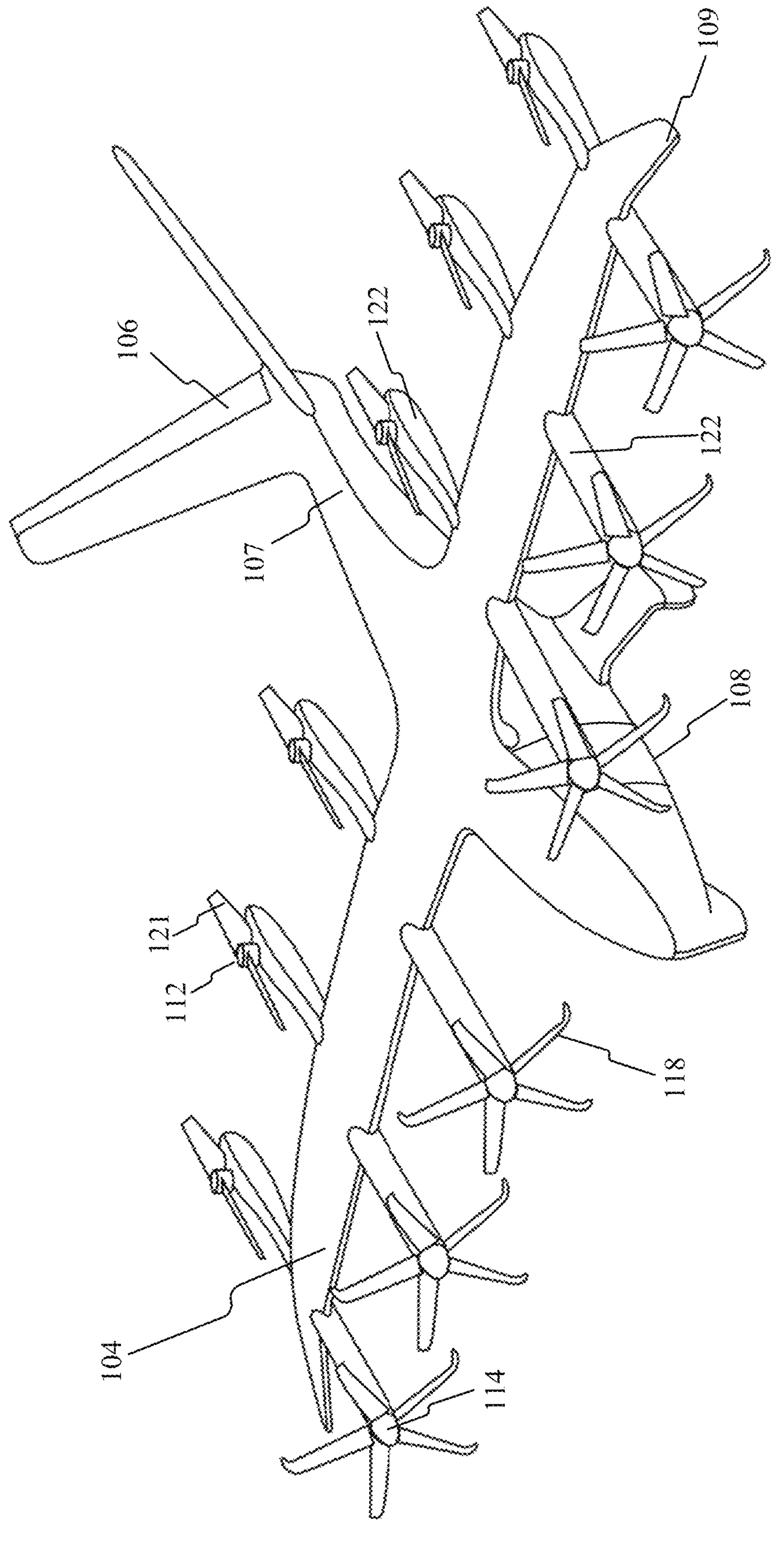
FIG. 1A illustrates an example VTOL aircraft in a cruise configuration, consistent with embodiments of the present disclosure.
Figure 1B:
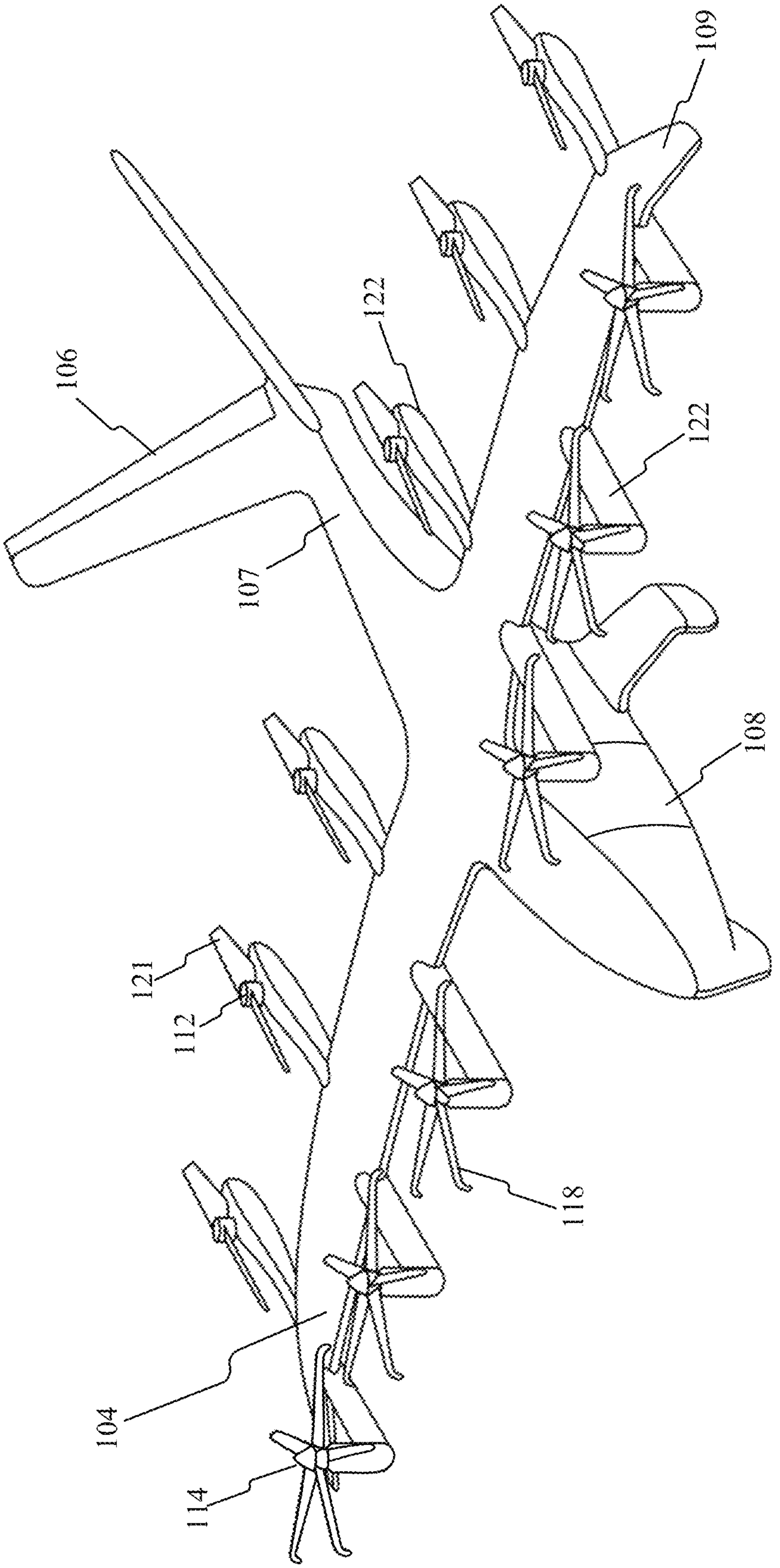
FIG. 1B illustrates an example VTOL aircraft in a lift configuration, consistent with embodiments of the present disclosure.

FIGS. 1A-B illustrate a VTOL aircraft 100 in a cruise configuration and a vertical take-off, landing and hover configuration (also referred to herein as a "lift" configuration), respectively, consistent with embodiments of the present disclosure. The aircraft 100 may include a fuselage 108, wings 109 mounted to the fuselage 108, tail 107, and one or more rear stabilizers 106 mounted to the tail 107 or the rear of the fuselage 108. A plurality of lift propellers 112 may be mounted to wings 109 and configured to provide lift for vertical take-off, landing and hover. A plurality of tilt propellers 114 may be mounted to wings 109 and may be tiltable between the cruise configuration in which they provide forward thrust to aircraft 100 for horizontal flight, as shown in FIG. 1A, and the lift configuration in which they provide a portion of the lift required for vertical take-off, landing and hovering, as shown in FIG. 1B. As used herein, a lift configuration may refer to a tilt propeller orientation in which the tilt propeller thrust is providing primarily lift to the aircraft. A cruise configuration may refer to a tilt propeller orientation in which the tilt propeller thrust is providing primarily forward thrust to the aircraft. Alternatively, a cruise configuration may refer to a configuration in which a lift propeller is stowed.

In some embodiments, lift propellers 112 may be configured for providing lift only, with all propulsion being provided by the tilt propellers. Accordingly, lift propellers 112 may be in fixed positions and may only generate thrust during take-off, landing and hover. Meanwhile, tilt propellers 114 may be tilted to lift configurations in which their thrust is directed downwardly for providing additional lift.

For forward flight, tilt propellers 114 may tilt from their lift configurations to their cruise configurations. In other words, the pitch and tilt angle of tilt propellers 114 may be varied from an orientation in which the tilt propeller thrust is directed downward (to provide lift during vertical take-off, landing and hover) to an orientation in which the tilt propeller thrust is directed rearward (to provide forward thrust to aircraft 100). The tilt propellers may tilt about axes that may be perpendicular to the forward direction of the aircraft 100. When the aircraft 100 is in full forward flight during the cruise configuration, lift may be provided entirely by wings 109. Meanwhile, lift propellers 112 may be shut off. The blades 121 of lift propellers 112 may be locked in low-drag positions for aircraft cruising. In some embodiments, lift propellers 112 may each have two blades 121 that may be locked for cruising in minimum drag positions in which one blade is directly in front of the other blade as illustrated in FIG. 1A. In some embodiments, lift propellers 112 have more than two blades. In some embodiments, tilt propellers 114 include more blades 118 than lift propellers 112. For example, as illustrated in FIGS. 1A-B, lift propellers 112 may each include, e.g., two blades and tilt propellers 114 may each include, e.g., five blades. In some embodiments, tilt propellers 114 may have, e.g., from 2 to 5 blades.

In some embodiments, the aircraft may include only one wing 104 on each side of fuselage 108 (or a single wing that extends across the entire aircraft) and at least a portion of lift propellers 112 may be located rearward of wings 109 and at least a portion of tilt propellers 114 may be located forward of wings 109. In some embodiments, all of lift propellers 112 may be located rearward of wings 109 and all of tilt propellers 114 may be located forward of wings 109. According to some embodiments, all lift propellers 112 and tilt propellers 114 may be mounted to the wings—i.e., no lift propellers or tilt propellers may be mounted to the fuselage. In some embodiments, lift propellers 112 may be all located rearwardly of wings 109 and tilt propellers 114 may be all located forward of wings 109. According to some embodiments, all lift propellers 112 and tilt propellers 114 may be positioned inwardly of the wing tips 109.

In some embodiments, lift propellers 112 and tilt propellers 114 may be mounted to wings 109 by booms 122. Booms 122 may be mounted beneath wings 109, on top of the wings, and/or may be integrated into the wing profile. In some embodiments, one lift propeller 112 and one tilt propeller 114 may be mounted to each boom 122. Lift propeller 112 may be mounted at a rear end of boom 122 and tilt propeller 114 may be mounted at a front end of boom 122. In some embodiments, lift propeller 112 may be mounted in a fixed position on boom 122. In some embodiments, tilt propeller 114 may mounted to a front end of boom 122 via a hinge. Tilt propeller 114 may be mounted to boom 122 such that tilt propeller 114 is aligned with the body of boom 122 when in the cruise configuration, forming a continuous extension of the front end of boom 122 that minimizes drag for forward flight.

In some embodiments, aircraft 100 may include, e.g., one wing on each side of fuselage 108 or a single wing that extends across the aircraft. According to some embodiments, the at least one wing 104 is a high wing mounted to an upper side of fuselage 108. According to some embodiments, the wings include control surfaces, such as flaps, ailerons or flaperons. Further discussion of VTOL aircraft may be found in U.S. Patent Publication No. 2021/0362849, which is incorporated by reference in its entirety.

FIGS. 2A, 2B, 2C, 2D, 2E, 2F, and 2G illustrate exemplary top plan views of aircraft, consistent with disclosed embodiments. There may be a number of design considerations (cost, weight, size, performance capability, etc.) that may influence the number and/or combination of tilt (e.g., tiltable) and lift (e.g., nontiltable) propellers in an aircraft. The number and orientation of propulsion units may affect the number of battery packs and connections between battery packs (e.g., to achieve controllability and/or stability upon electric failure).

Figure 2B:
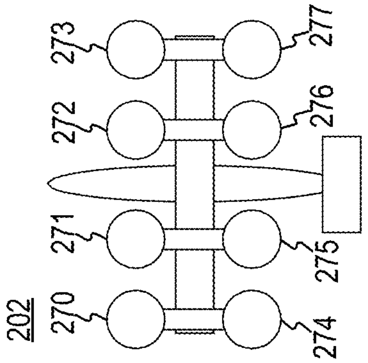
Figure 2A:
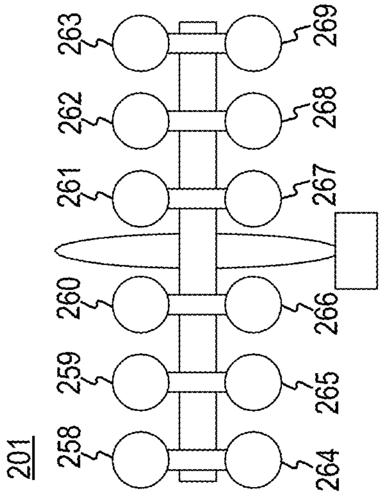

FIG. 2A illustrates an arrangement of electric propulsion units (EPUs), consistent with embodiments of the present disclosure. Referring to FIG. 2A, the aircraft shown in the figure may be a top plan view of an exemplary aircraft 201. The aircraft may include twelve EPUs distributed across the aircraft. In some embodiments, a distribution of EPUs may include six forward EPUs (258, 259, 260, 261, 262, and 263) and six aft EPUs (264, 265, 266, 267, 268, and 269). In some embodiments, the six forward EPUs may be operatively connected to tilt propellers, and the six aft EPUs may be operatively connected to lift propellers. In other embodiments, the six forward EPUs and a number of aft EPUs may be operatively connected to tilt propellers and the remaining aft EPUs may be operatively connected to lift propellers. In other embodiments, all forward and aft EPUs may be operatively coupled to tilt propellers.

FIG. 2B illustrates an alternate arrangement of electric propulsion units (EPUs), consistent with embodiments of the present disclosure. Referring to FIG. 2B, the aircraft shown in the figure may be a top plan view of an exemplary aircraft 202. The aircraft may include eight EPUs distributed across the aircraft. In some embodiments, a distribution of EPUs may include four forward EPUs (270, 271, 272, and 273) and four aft EPUs (274, 275, 276, and 277). In some embodiments, the four forward EPUs may be operatively connected to tilt propellers, and the four aft EPUs may be operatively connected to lift propellers. In other embodiments, the four forward EPUs and a number of aft EPUs may be operatively connected to tilt propellers and the remaining aft EPUs may be operatively connected to lift propellers. In other embodiments, all forward and aft EPUs may be operatively coupled to tilt propellers.

Figure 2C:
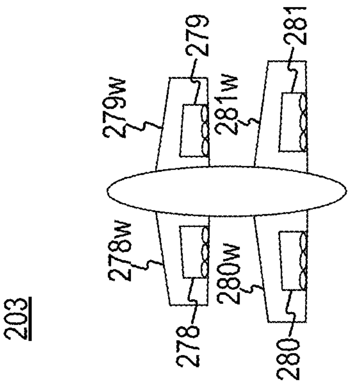

FIG. 2C illustrates an alternate arrangement of electric propulsion units (EPUs), consistent with the embodiments of the present disclosure. Referring to FIG. 2C, the aircraft may be a top plan view of an exemplary aircraft 203. In some embodiments, the aircraft may include ducted fans operably connected to EPUs 278, 279, 280, and 281. In some embodiments the aircraft may include a bank of ducted fans (e.g., EPUs 278, 279, 280, and 281) on each wing of the aircraft (e.g., wing 278*w*, 279*w*, 280*w*, and 281*w*) and the bank of ducted fans may be connected to tilt together (e.g., between lift and forward thrust configuration). In some embodiments the aircraft includes a left front wing 278*w* and right front wing 279*w* and a left rear wing 280*w* and right rear wing 281*w*. In some embodiments, each wing of the aircraft includes a bank of connected ducted fans. In some embodiments, each bank of connected ducted fans is tiltable (e.g., between lift and forward thrust), while in other embodiments only the bank of fans on the front wing(s) is tiltable.

Figure 2D:
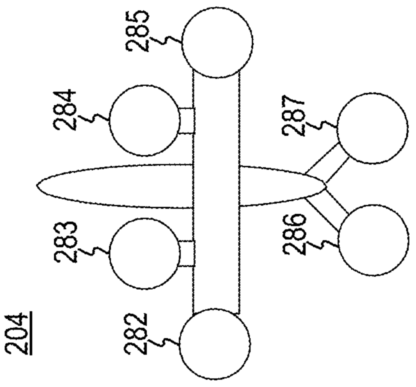

FIG. 2D illustrates an alternate arrangement of electric propulsion units (EPUs), consistent with embodiments of the present disclosure. Referring to FIG. 2D, the aircraft shown in the figure may be a top plan view of an exemplary aircraft 204. The aircraft may include six EPUs distributed across the aircraft. In some embodiments, a distribution of EPUs may include a first set of four EPUs 282, 283, 284, and 285 coplanar in a first plane and a second set of two EPUs 286 and 287 coplanar in a second plane. In some embodiments, the first set of EPUs 282, 283, 284, and 285 may be operatively connected to tilt propellers and second set of EPUs 286 and 287 may be operatively connected to lift propellers. In other embodiments, the first set of EPUs 282, 283, 284, and 285 and the second set of aft EPUs 286 and 287 may all be operatively connected to tilt propellers.

Figure 2E:
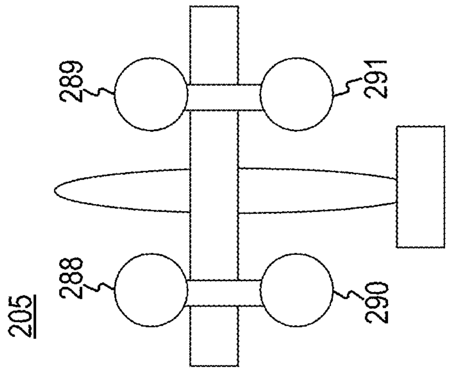

FIG. 2E illustrates an alternate arrangement of electric propulsion units (EPUs), consistent with embodiments of the present disclosure. Referring to FIG. 2E, the aircraft shown in the figure may be a top plan view of an exemplary aircraft 205. The aircraft may include four EPUs distributed across the aircraft. In some embodiments, a distribution of EPUs may include four coplanar EPUs 288, 289, 290, and 291. In some embodiments, all of the EPUs may be operatively connected to tilt propellers.

Figure 2F:
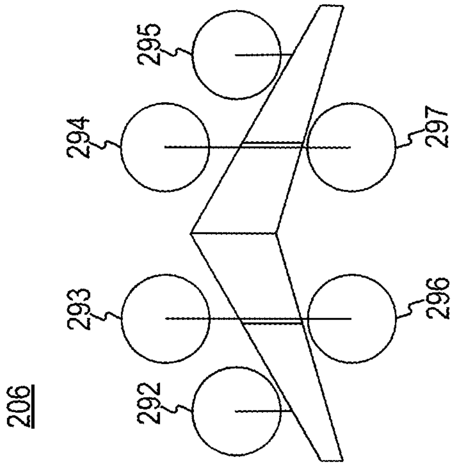

FIG. 2F illustrates an alternate arrangement of electric propulsion units (EPUs), consistent with embodiments of the present disclosure. Referring to FIG. 2F, the aircraft shown in the figure may be a top plan view of an exemplary aircraft 206 (e.g., a VTOL aircraft). The aircraft may include six EPUs distributed across the aircraft. For example, in some embodiments, the aircraft may include four forward EPUs 292, 293, 294, and 295 operatively connected to tilt propellers and the two aft EPUs 296 and 297 operatively connected to lift propellers. In some embodiments, the aircraft may include ten EPUs distributed across the aircraft. For example, in some embodiments, the aircraft may include six forward EPUs operatively connected to tilt propellers and the four aft EPUs operatively connected to lift propellers. In some embodiments, some or all of the aft EPUs may operatively connected to tilt propellers.

As shown in FIG. 2F, in some embodiments, the aircraft may have a flying wing configuration, such as a tailless fixed-wing aircraft with no definite fuselage. In some embodiments, the aircraft may have a flying wing configuration with the fuselage integrated into the wing. In some embodiments, the tilt propellers may rotate in a plane above the body of the aircraft when the tilt propellers operate in a lift configuration.

Figure 2G:
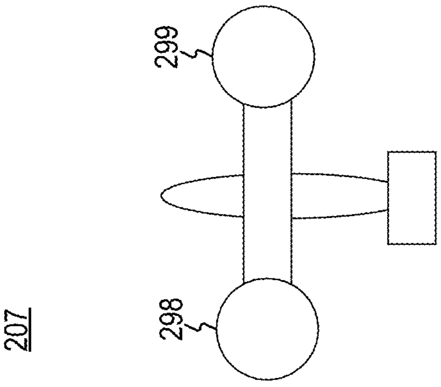

FIG. 2G illustrates an alternate arrangement of electric propulsion units (EPUs), consistent with embodiments of the present disclosure. Referring to FIG. 2G, the aircraft shown in the figure may be a top plan view of an exemplary aircraft 207. The aircraft may include two EPUs distributed across the aircraft. In some embodiments, a distribution of EPUs may include two coplanar EPUs 298 and 299. In some embodiments, all of the EPUs may be operatively connected to tilt propellers.

FIG. 3A illustrates an example eVTOL aircraft 100 and associated subsystems, consistent with embodiments of the present disclosure. Subsystem 301 may include HV electrical circuitry and associated devices powering the electric engines and tilt actuators. Subsystem 302 may include HV electrical circuitry and associated devices connected to DC/DC converters which step down the power to feed the LV distribution system. In some embodiments, each battery pack in an aircraft may provide power to both Subsystem 301 and Subsystem 302. In some embodiments, an arrangement of switching devices provides for separate control of power flow to Subsystem 301 and Subsystem 302.

Subsystem 303 is an LV power distribution system and associated devices. The LV power distribution system may be fed from Subsystem 302 through the DC/DC converters, as described above. For example, primary and/or alternate DC/DC converter(s) may perform the voltage conversion. In some embodiments, one alternate converter may provide LV power during power up of an aircraft and/or in the event of a failure of one or more primary DC/DC converters. Further, Subsystem 303 may be configured to accept power via a ground power unit. In some embodiments, only one of Subsystem 303 or Subsystem 304 may be configured to accept power from a ground unit at a time. In other embodiments, both subsystems may be configured to accept power from one or more ground units simultaneously.

The LV power distribution system, subsystem 303, may include a combination of power distribution boxes (PDBs) to manage and distribute LV power to different aircraft components. In some embodiments, the LV power distribution system may power all LV aircraft components. For example, the LV distribution system may power avionics, flight control computers, aircraft flight control surfaces, motor controllers, battery management systems for the battery packs, environmental control systems, sensors, medical equipment, and/or any other system on the aircraft requiring LV power. "High-voltage," (abbreviated as HV) as used herein, refers to a voltage greater than 110 volts. "Low-voltage," (abbreviated as LV) as used herein, refers to a voltage less than or equal to 110 volts "Low-voltage direct current (DC)," as used herein, refers to 33 VDC or lower. In some embodiments, "low-voltage" (abbreviated as LV) refers to 28 VDC.

Subsystem 304 is a HV charging bus and associated devices connecting a charging port to one or more battery packs to allow the battery packs to be charged. In some embodiments, the HV charging bus may be electrically separate from other HV distribution. For example, the charging bus may be electrically separate from HV power to electric engines and actuators (Subsystem 301) and HV power to converters for LV distribution (Subsystem 302).

Subsystem 305 is a charge control unit (CCU). The CCU may control the battery packs during the charging process. For example, in some embodiments, the CCU may receive status updates from battery packs and provides commands to battery packs to control their charge level by opening and closing battery pack charge contactors. Further, in some embodiments, the CCU may send commands to one or more ground units, communicating the electrical charging requirements and/or cooling requirements of the battery packs.

Further, in some embodiments, the CCU may receive a selected mode and communicate with one or more components of the aircraft. For example, in some embodiments, the CCU may communicate the selected mode to one or more battery packs and control the battery packs as needed. In some embodiments, the communication lines between the CCU and battery packs may be used for both mode switch control and charge control. Therefore, the amount of wiring in the aircraft may be reduced. In other embodiments, a controller other than a CCU may receive the selected mode and perform the communications with the components of the aircraft. For example, in some embodiments the aircraft may include a central battery management unit and/or central battery management system that controls operations of all aircraft battery packs (e.g., sends contactor commands, monitors battery pack status etc.). The central battery management unit and/or battery management system may receive the selected mode and perform the communications detailed above. Further, a separate controller (e.g., a central battery management unit, or BMS) may control charging operations.

FIGS. 3B, 3C, and 3D illustrate exemplary connections to subsystems, consistent with embodiments of the present disclosure. FIG. 3A illustrates battery packs configured to power electric propulsion units and provide backup power for other battery packs. The configuration and control of the electric engines and propellers may match that of the aircraft described in FIGS. 1A-1B. The aircraft may include a high-voltage power supply (HVPS) system to supply the high-voltage (HV) electric power. The HVPS system is the source of power on the aircraft and configured to distribute the stored electrical energy to other systems on the aircraft, including the electrical propulsion system (EPS) for converting electrical power into mechanical rotational shaft power to generate thrust. As shown, the HVPS system of the aircraft may include six battery packs 320 (which are numbered 320-1, 320-2, 320-3, 320-4, 320-5, and 320-6 from left to right) installed within the battery bays in the wing of the aircraft. The battery packs may power one or more electric engines 310 (e.g., 310-1, 310-2, 310-3, 310-4, 310-5, 310-6, 310-7, 310-8, 310-9, 310-10, 310-11, 310-12). While six battery packs are shown, the aircraft 100 may have any number of battery packs.

In some embodiments, a single battery pack 320 may be electrically connected to, and power, multiple electric engines. For example, in some embodiments, a battery pack 320 may power an electric engine 310 on either side of a longitudinal axis. In some embodiments a battery pack 320 may power an electric engine on either side of a horizontal axis. In some embodiments, as shown, a battery pack 320 may power two diagonally opposing electric engines 310.

Further, the HVPS system includes a cross-link 330 (e.g., electrical connection between battery packs) possessing at least one fuse, allowing for pairing of two or more battery packs 320. Through the cross-link 330, power for the electric engines 310 can be shared among the paired battery packs 320. Therefore, multiple battery packs 320 can simultaneously power multiple electric engines 310. This arrangement provides for redundancy and avoids a single point of failure because each paired battery pack 320 may act as a backup for the other(s). Upon failure of a battery pack, one or more connected battery packs 320 may continue powering the failed battery pack's connected electric engines 310. In some embodiments, as shown, two battery packs 320 may be paired together, powering a total of four electric engines 310. However, the aircraft may include a different combination of electric engine and battery pack pairings.

Alternate Battery Pack Arrangements:

The above configuration is provided as an example, but a different number and configuration of battery packs, electric engines, battery pack to electric engine connections, and battery pack cross-link combinations may be used. In some embodiments, each battery pack may power an individual electric engine. For example, an aircraft may have four, six, eight, ten, twelve, or any number of electric engines and the number of battery packs may match the number of electric engines. In some embodiments, each battery pack may power only one electric engine and may be electrically separate from all other battery packs. In some embodiments, each battery pack may power one or more partial motors, and each electric engine may include two or more partial motors. Therefore, each electric engine may have a backup power source, but the battery packs may still be electrically separate.

In some embodiments, each battery pack may power multiple electric engines. As described above, battery packs may power sets of electric engines that are symmetrical across one or more axes of symmetry. In some embodiments, a battery pack may power electric engines that are symmetrical across an aircraft's longitudinal axis, lateral axis, or both. For example, as described above, in some embodiments, different battery packs may power diagonally symmetric electric engines.

In some embodiments, a battery pack may power more than two electric engines. In some embodiments, a battery pack may power two or more sets of diagonally symmetric electric engines. In some embodiments, the set of electric engines powered by a battery pack may include an inboard diagonally symmetric pair of electric engines and an outboard diagonally symmetric pair of electric engines. In some embodiments, a battery pack may power four or more electric engines in a configuration that is symmetrical across the longitudinal axis of symmetry.

In some embodiments, some or all of the battery packs are interconnected. As described above, a cross-link may allow each battery pack to act as backup power for another. For example, in some embodiments, a first battery pack may directly power a first number of electric engines and a second battery pack may directly power a second number of electric engines. The first and second battery packs may be cross-linked together to form a battery pack unit. Therefore, each battery pack in the unit may act as a backup for the other. Upon failure of a battery pack in the unit, the failing battery pack may be disconnected, and electric engines will be powered by one or more non-failing battery packs in the unit. The battery packs in a battery pack unit may be electrically separate from other battery pack units.

In some embodiments, a battery pack unit may comprise three battery packs, wherein each battery pack powers a number of electric engines. For example, in some embodiments, each battery pack may power two diagonally symmetric electric engines. Therefore, each battery pack unit may power a total of six electric engines and each electric engine has two battery pack backups. In some embodiments, each battery pack in the battery pack unit may power four electric engines, comprising two sets of diagonally symmetric electric engines. Therefore, each battery pack unit may power a total of twelve electric engines and each electric engine has two battery pack backups.

In some embodiments, a battery pack unit may comprise four battery packs, wherein each battery pack powers a number of electric engines. For example, in some embodiments, each battery pack may power two diagonally symmetric electric engines. Therefore, each battery pack unit may power a total of eight electric engines and each electric engine has three battery pack backups. In other embodiments, each battery pack in the battery pack unit may power four electric engines, comprising two sets of diagonally symmetric electric engines. Therefore, each battery pack unit may power sixteen electric engines and each electric engine has three battery pack backups.

In some embodiments, all battery packs are cross linked to their neighbors, forming a circular power supply for the battery packs. In some embodiments, all battery packs are connected to a common bus. In some embodiments, the common bus may form a circular power supply, providing for additional redundancy in connections, while in other embodiments the common bus may not form a circular power supply.

In some embodiments, electric engines comprise a single motor that is powered by the one or more battery packs. In some embodiments, each electric engine may include two or more partial motors and the battery packs may power partial motors. In some embodiments, any of the electric engine powering configurations described above may include powering partial motor(s) of battery pack(s).

Different configurations of battery packs, electric engines, battery pack to electric engine connections, and battery pack cross link combinations may be chosen to best balance aircraft power needs, system redundancy, and fault tolerance. For example, different configurations may be used to accommodate the specifics of aircraft shown in FIGS. 2A-2G, above.

FIG. 3C illustrates that the battery packs (e.g., 320-1, 320-2, 320-3, 320-4, 320-5, 320-6) may also power a tilt propeller system of the electric propulsion units (EPUs) (e.g., 310-1, 310-2, 310-3, 310-4, 310-5, 310-6). Through the cross-link 330, power for the electric engines 310 can be shared among the paired battery packs 320. For example, the battery packs may power linear and/or rotary actuators to change the orientation of a propulsion system (e.g., tilt angles of one or more tilt propellers) during operation (e.g., represented by T1, T2, T3, T4, T5, T6). In some embodiments, a rotary actuator may include a motor, inverter, and gearbox. In some embodiments, as shown, each battery pack powers a tilt propeller system that corresponds to an electric engine being powered by the battery pack. As described above, the aircraft may include a different number and/or combination of battery pack and propulsion system arrangements (with corresponding tilt propeller systems). In some embodiments, each of the arrangements described with reference to FIG. 3B may further include the battery pack configured to provide power to a tilt actuator in addition to the EPU (e.g., electric engine) whose tilt is controlled.

FIG. 3D illustrates that the battery packs (e.g., 320-1, 320-2, 320-3, 320-4, 320-5, 320-6), which may be cross-linked through cross-link 330, as previously described, may also have power running to one or more DC/DC converters to supply LV power to the LV components of the aircraft. Further, one or more of the battery packs may power environmental conditioning equipment (e.g., a compressor, fan, or other equipment requiring HV power). In some embodiments the LV system is powered without a separate LV battery, while in other embodiments one or more LV components may be powered by a separate LV battery.

FIG. 3E illustrates an arrangement 351 of a hybrid power generation and distribution system, consistent with embodiments of the present disclosure. Hybrid power generation and distribution may refer to any architecture, system, or method in which electrical power may be produced from two or more distinct power sources or energy-conversion mechanisms. For hybrid power generation and distribution, power resulting from the two or more distinct power sources or energy-conversion mechanisms may be combined, managed, conditions, routed, or otherwise delivered to one or more loads through a power distribution network. Hybrid power generation and distribution may include controllers, switching elements, protection devices, power conversion hardware, or energy-storage interfaces, which may enable efficiency of operations, reliability, redundancy, or performance in modes of operation (e.g., aircraft modes of operation).

Hybrid power generation and distribution may be enabled with a turbine power source (e.g., turbine 341, generator G1, generator G2) and a battery power source (e.g., BAT 321-1, BAT 321-2, BAT 321-3, BAT 321-4, which may be the same or similar to batteries 320 as described in reference to FIGS. 3B-3D). A turbine power source may convert mechanical energy from a rotating turbine into electrical power, which may be enabled by one or more generators (e.g., generators integrated with the turbine). A battery power source may store electrical energy, where the stored electrical energy may be supplied to the system as needed. An arrangement of a turbine power source and a battery for hybrid power generation and distribution may include a parallel power distribution architecture (e.g., two power sources directly supply power to a load without an intervening power source) or a series power distribution architecture (e.g., a first power source provides power to a second power source and the second power source provides power to the load, a turbine charges a battery and the battery provides power to the EPU).

In some embodiments, the sizing of a turbine or a battery (e.g., batteries) may be determined such that the turbine is the primary power source (e.g., provides the majority of power to an EPU of an aircraft), or the battery is the primary power source. For instance, for a turbine that is the primary power source, the battery may provide supplemental power or peak power (e.g., when needed, for aircraft operations, peak power for takeoff or landing, dependent on an aircraft mode of operation). Additionally, for a battery that is the primary source of power, the battery may supply a load (e.g., in an aircraft mode of operation, and a turbine may engage to charge the battery or increase power delivered to the load.

For instance, as illustrated in FIG. 3E, arrangement 351 may include a turbine power source and a battery power source. Arrangement 351 may include turbine 341 coupled to two generators G1 and G2. As may be appreciated, turbine 341 may spin a rotor coupled to generators G1 and G2, which may cause generators G1 and G2 to generate AC power.

Arrangement 351 may include four batteries (e.g., BAT 321-1, BAT 321-2, BAT 321-3, BAT 321-4), where generator G1 may be coupled to BAT 321-2 and BAT 321-3, and generator G2 may be coupled to BAT 321-1 and BAT 321-4. Additionally, BAT 321-1 and BAT 321-4 may be coupled, and BAT 321-2 and BAT 321-3 may be coupled. Arrangement 351 may include eight EPUs (e.g., EPU 311-1, EPU 311-2, EPU 311-3, EPU 311-4, EPU 311-5, EPU 311-6, EPU 311-7, EPU 311-8, which may be the same or similar to EPUs as described and exemplified in relation to FIGS. 1A-3D), where each battery of arrangement 351 may be coupled to two EPUs. For instance, BAT 321-1 may be coupled to EPU 311-1 and EPU 311-8, BAT 321-2 may be coupled to EPU 311-2 and EPU 311-7, BAT 321-3 may be coupled to EPU 311-3 and EPU 311-6, and BAT 321-4 may be coupled to EPU 311-4 and EPU 311-5.

While no wings or aircraft structure are depicted in FIG. 3E, it is appreciated that EPU 311-1, EPU 311-2, EPU 311-3, and EPU 311-4 may be predominantly towards the front portion of one or more wings, as shown in other embodiments. It is also appreciated that EPU 311-5, EPU 311-6, EPU 311-7, and EPU 311-8 may be predominantly towards the back portion of one or more wings, as shown in other embodiments. For example, arrangement 351 for hybrid power generation and distribution may be integrated into an aircraft with a layout of EPUs, such as the layout illustrated and described in reference FIG. 2B.

A turbine (e.g., turbine 341) may refer to a system, device, or assembly that may receive a fluid (e.g., working fluid) and convert at least a portion of the fluid's energy into rotational motion of a rotatable element. The fluid (e.g., working fluid) may include a gas, vapor, air, combustible fluid, steam, liquid, or any other fluid that may possess kinetic energy, pressure energy, thermal energy, or potential energy that may be converted into mechanical energy (e.g., rotational energy) of the turbine. The turbine may include a rotatable element (e.g., a rotor, wheel, shaft, blade structure) that may interact with the fluid (e.g., working fluid, flowing fluid), such that the energy of the fluid (e.g., motion, pressure differential) may impart torque to the rotatable element.

A turbine may include a gas or combustion turbine or any other type of turbine as described that may be sized to enable aircraft operations (e.g., for an eVTOL, VTOL, propeller-based aircraft, rotor-based aircraft) in conjunction with one or more battery power sources. A turbine sized, designed, or selected to enable the satisfaction of.

1) power requirements (e.g., power demands in combination with another power source, power demands for various aircraft modes of operation, efficiency, redundancy, or margin of safety for output power),
2) weight and volume requirements (e.g., balancing changes in weight and power due to change in size, packaging requirements, integration with other aircraft components),
3) thermal management requirements (e.g., components or systems to prevent overheating of turbine or thermally coupled components of the aircraft, conditions of aircraft operational environment),
4) fuel or energy source compatibility requirements (e.g., the mass or volume requirements imposed by the fuel used by the turbine, power production requirements needed to charge a battery),
5) control or response requirements (e.g., ability to respond to rapid load changes or aircraft maneuvers, a turbine may have slower response times to control inputs than batteries so the relative sizing or power production by a turbine and a battery may be determined based on required response times to controls of an aircraft),
6) reliability or redundancy (e.g., an aircraft should minimize single point of failure, so turbine may be determined to satisfy aircraft operational environment requirements, to ensure that a power source of the aircraft does not create a single point of failure, to enable maintenance or testing of the turbine, or to enable multiple turbines to be integrated into an arrangement for hybrid power generation and distribution),
7) safety or certification (e.g., turbine containment due to a fire or emergency, reductions of vibrational or resonant interactions with the aircraft structure for safety or mission requirements, reductions of noise or emission for regulatory or mission requirements, or use of multiple batteries or turbines to ensure redundancy for powering critical loads),
8) integration with other elements of hybrid power generation and distribution arrangement (e.g., coordination with an electrical bus, mode switch, or electrical systems of the aircraft (as illustrated in FIGS. 6A-6D); integration with a battery pack or HV junction box (as illustrated in FIGS. 5A-5D); presence of serial or parallel load paths in hybrid system arrangement or architecture; enabling aircraft modes and submodes of operation; enabling supply of HV and LV power to components of the aircraft; enabling integration with a power management system to coordinate power supply to a load by multiple, different power sources),
9) environmental or operational constraints (e.g., altitude impact on turbine performance due to changing air density, temperature, or weather extremes of aircraft operational environment; protection from debris ingestion by a turbine, stealth or noise or vibration considerations), or
10) any other consideration or requirement that impact the design, selection, or sizing of a turbine for an aircraft that includes hybrid power generation or distribution, which may include at least a turbine (e.g., a turbine and a battery, at least one turbine and at least one battery).

To enable the conversion of mechanical energy of a turbine into electrical energy (e.g., to integrate a turbine power source with a battery source for enabling aircraft operations), a generator may be included in a hybrid power generation and distribution architecture. A generator (e.g., generator G1, generator G2) may refer to a device, system, or assembly configured to convert mechanical energy into electrical energy. The mechanical energy may be derived from a source, such as a rotatable element (e.g., driven by a turbine, engine, or other prime mover) or another input of mechanical energy. A generator may include a rotor or armature coupled to the energy source (e.g., a rotor coupled to the turbine or coupled to the rotor of the turbine), a stator or field winding configured to interact with the rotor of the generator, or a configuration that enables an electric potential to be induced across one or more terminals for delivery of electric power to a load (e.g., a load of an aircraft, an EPU of an aircraft).

Additionally, a generator may produce AC or DC electrical power and may include or be coupled to power conditioning components. The components may be internal or external to the generator and may include rectifiers, inverters, voltage regulators, power converters (e.g., AC/AC converter, AD/DC converter), or any other power conditioning component that enables or improves efficiency of integration with a hybrid power generation and distribution arrangement (e.g., arrangement 351, integration with other components of arrangement 351). The design or selection of a generator (e.g., for coupling to a turbine of a hybrid power generation and distribution system) may be based on:

1) voltage or current output capabilities of the generator (e.g., a generator may have one or more operational modes with varying voltage or current output capabilities),
2) signal output characteristics (e.g., frequency for AC power), phase configuration (e.g., single-phase versus multi-phase power generation),
3) compatibility with components of a hybrid power generation and distribution system (e.g., bus voltage, load requirements, battery specifications, AC or DC power requirements),
4) coupling method to a mechanical input (e.g., direct coupling, geared coupling, or belt or pully coupling to a rotor of a turbine),
5) integration with energy storage systems (e.g., one or more batteries, one or more capacitors),
6) transient load handling or support capabilities (e.g., transient loads due to an EPU, tilt propeller system (TPS), rotor system, actuator, aircraft effector, avionics system, controls system, or non-propulsion load),
7) redundancy or fault tolerance (e.g., reducing single points of failure due to loss of a generator or loss of a component of a generator), or
8) any other consideration that may impact the design or selection of a generator for a hybrid power generation or distribution system.

A generator may be coupled to a turbine, such that rotational mechanical energy of the turbine (e.g., rotational energy of the rotor of the turbine) may drive the generator (e.g., drive a rotor or armature of the generator) and enable the production of electrical energy. Methods for coupling a generator to a turbine may include direct mechanical coupling (e.g., directly connected to a shaft associated with a rotor of a turbine), geared coupling (e.g., a shaft associated with a rotor of a turbine may drive the generator through a gearing or transmission system, which may allow for adjustment of rotational speed, torque, or alignment to reduce stress on generator or support multiple generator outputs), belt or pulley coupling (e.g., mechanical energy is transmitted from a turbine to a generator through a belt or pulley for vibration isolation), or any other method of coupling one or more generators to a turbine that enables integration with a hybrid power generation and distribution system (e.g., arrangement 351).

Coupling may refer to an interaction between two or more physical systems or subsystems, such that energy may be transferred between the two or more physical systems or subsystems. Coupling may include a change in motion or energy in one system resulting or inducing a response in another system (e.g., a transfer of energy, moment, or information between the two systems). Coupling may be linear or non-linear, and coupling may be strong or weak coupling (e.g., strongly coupled, weakly coupled). Coupling may produce phenomena, such as synchronized behavior, resonance, damping, or interference between two or more systems. Coupling may include mechanical coupling, electrical coupling, electromagnetic coupling, thermal coupling, fluid coupling, thermomechanical coupling, communicative coupling, vibrational or resonant coupling, or any other type of interaction that enables energy transfer between two or more physical systems or subsystems.

For example, as illustrated in FIG. 3E, in arrangement 351, turbine 341 may be coupled to generator G1. Additionally, generator G1 may be coupled to BAT 321-2 and BAT 321-3, and BAT 321-2 and BAT 321-3 may be coupled to each other. BAT 321-2 may—in turn—be coupled to EPU 311-2 and EPU 311-7, and BAT 321-3 may—in turn—be coupled to EPU 311-3 and EPU 311-6. Further, BAT 321-2 may be coupled to BAT 321-4, and BAT 321-3 may be coupled to BAT 321-1, where these couplings may be enabled by a cross-link (e.g., cross-link 330 as described and exemplified in reference to FIGS. 3B-3D). Thus, and for example, power flow may be possible from generator G2 to BAT 321-1 and from BAT 321-1 to BAT 321-3, and correspondingly, power flow may be possible from generator G1 to BAT 321-3 and from BAT 321-3 to BAT 321-1.

In FIG. 3E, although the couplings are shown as series couplings, the couplings are merely illustrative and indicate that power flow is possible, in whichever suitable and desired manner, between the coupled elements. For example, parallel electrical connections may be used instead of series connections.

Also, it is appreciated that anywhere coupling or a connection is shown between two electrical power sources, where only one power source is directly connected to a load (e.g., series architecture or coupling), the other power source may also be directly connected to that load (e.g., parallel architecture or coupling with the power source already shown with a direct connection). For example, while generator G1 is shown as connected to BAT 321-2 and BAT 321-3, and BAT 321-2 is illustrated as connected to EPU 311-2, generator G1 may also be connected directly to EPU 311-2 (e.g., in parallel with BAT 321-2).

By coupling the generators and batteries as illustrated in FIG. 3E, and as described above, multiple layers of redundancy of power sources may be provided for a particular EPU. For example, if generator G1 were to develop a fault and was no longer able to generate power to power BAT 321-2 and BAT 321-3, BAT 321-2 and BAT 321-3 would still be able to provide power to, and thus drive, the EPUs coupled to them. This is because BAT 321-2 is coupled to BAT 321-4 (e.g., via a cross-link, which can be optionally variably activated and which may be similar to cross-link 330, as illustrated and described in reference to FIGS. 3B-3D), and would thus, by way of this coupling, receive power from generator G2 which is still generating power.

Correspondingly, BAT 321-3 would still receive power from generator G2 by way of its coupling with BAT 321-1.

By way of further example, based on or after a fault with a generator being detected (e.g., generator G1, generator G2), a processing component may cause a cross-link between batteries to activate, which may allow for power transmission from a generator to a battery through another battery (e.g., the another battery may be a battery with a direct connection to the generator), as exemplified above.

As another example, in some embodiments, including in any of the topologies described herein (e.g., FIGS. 3F-3G), one generator may be linked to another generator, such as in a manner similar to the cross-linking of batteries. Such a linkage may be variable and may only be activated in response to a fault situation, such as a fault with a generator.

Thus, BAT 321-2 would still be able to power EPU 311-2 and EPU 311-7 when generator G2 develops a fault (or, equivalently, if the coupling between generator G2 and BAT 321-2 develops a fault), and correspondingly, BAT 321-3 would still be able to power EPU 311-3 and EPU 311-6 when generator G2 develops a fault (or, equivalently, if the coupling between generator G2 and BAT 321-3 develops a fault), because BAT 321-2 and BAT 321-3 are coupled to BAT 321-4 and BAT 321-1, respectively.

In some cases, if a battery develops a fault and is no longer able to power EPUs coupled to it, the EPUs coupled to the battery associated with the fault may still be able to be powered by the generators or a battery coupled to the battery associated with the fault. For instance, if BAT 321-1 develops a fault which means it was no longer able to supply power to EPU 311-1 and EPU 311-8, BAT 321-4 may still be able to power EPU 311-1 and EPU 311-8 by way of its coupling with 321-1. Additionally, or alternatively, arrangement 351 may include a coupling (e.g., a power "pass-through") that may enable a generator of arrangement 351 to deliver power directly to the EPUs from generator G2. This may enable generator G2 to power EPU 311-1 and EPU 311-8.

A fault associated with the systems or components of an arrangement for hybrid power generation and distribution (e.g., arrangement 351) may be detected or determined by a processor of the aircraft. A processor that may detect the fault may include a processor included in or associated with a power controller, flight control computer, flight control system, a battery management system (BMS), or another controller associated with hybrid power generation and distribution.

Arrangement 351 may include a controller (e.g., a power controller) that may transmit signals to control the hybrid power generation and distribution system. These signals may include signals to isolate components or systems of a hybrid power generation and distribution system based on a detected or determined fault (e.g., detected or determined by the controller). The controller may be configured to control components or systems of the hybrid power generation and distribution system to generate signals to modify or control the coupling between the components or systems in response to a fault. Further, the controller may be configured to determine whether an EPU receives power from a generator alone (e.g., generator G1 or generator G2 associated with turbine 341), a battery alone (e.g., BAT 321-1, BAT 321-2, BAT 321-3, BAT 321-4), both a generator and a battery, and whether the battery is to be charged by a generator.

The controller (e.g., a power controller) of a hybrid power generation and distribution system may receive—as an input—operational information of the aircraft or flight information of the aircraft (e.g., information associated with flight operations or with an upcoming flight of the aircraft). Operational information of the aircraft may include information associated with an aircraft mode of operation, an aircraft submode of operation, or a mode transition (e.g., a transition from an initial aircraft mode or submode of operation to a selected aircraft mode or submode of operation, described later in reference to FIGS. 4A-4B).

Outputs of the controller associated with a hybrid power generation and distribution system (e.g., control signals transmitted from the power controller) may depend on the operational or flight information of the aircraft. For instance, in cases where an aircraft is in fly mode (e.g., Fly Mode 404 as described in reference to FIG. 4A) and a controller receives a signal that indicates power demands of the aircraft or otherwise determines power demands of the aircraft, the controller may determine how to distribute power to systems and components of the hybrid power generation and distribution system. As an example, within a threshold range or above a threshold indicating a high demand of power (e.g., full thrust to execute a maneuver), the controller may direct the generator (e.g., generator G2 coupled to turbine 341) and a battery (e.g., BAT 321-1) of the aircraft to provide power to an EPU (e.g., EPU 311-1 receives power from both generator G2 and BAT 321-1). As an additional example, within a threshold range or below a threshold indicating a low demand of power (e.g., low thrust to execute a maneuver), the controller may direct the generator (e.g., generator G2 coupled to turbine 341) to provide power to a battery (e.g., charging BAT 321-1 by generator G2) and to provide power to an EPU (e.g., EPU 311-1 receives power from generator G2), which may include the generator simultaneously charging the battery and powering the EPU.

The controller may receive operational or flight information that indicates a changing demand in power, where—due to a transition from low to high power demand—the controller may transmit a signal to cause a generator and a battery of the aircraft to power (e.g., simultaneously power) a load of the aircraft (e.g., an EPU). As the power demand increases, the controller may transmit a signal or otherwise direct the battery to increase the power it delivers to the load of the aircraft.

Additionally, the controller may receive operational or flight information that indicates a changing demand in power, where—due to a transition from high to low power demand—the controller may transmit a signal or otherwise direct a battery to reduce its power delivered to a load of the aircraft. While reducing power to the load, once the battery is not delivering power to the load, the controller may transmit a signal or otherwise direct a turbine to reduce its power delivered to the load, which may include the turbine delivering power the battery (e.g., instead of the load, in order to charge the battery).

As an example, flight operations of an aircraft (e.g., an eVTOL, a VTOL) may include phases of flight, such as a hover phase of flight, a cruise phase of flight, and a transition phase of flight (e.g., where a VTOL or eVTOL may be transitioning from a hover phase to a cruise phase, or vice versa). In a hover phase, the power demand for the aircraft (e.g., an EPU of the aircraft) may be high. In a cruise phase, the power demand for the aircraft (e.g., an EPU of the aircraft) may be low. In a transition phase from hover to cruise, the power demand for the aircraft (e.g., an EPU of the aircraft) may be a transition from a high power demand to a low power demand. In a transition phase from cruise to hover, the power demand for the aircraft (e.g., an EPU of the aircraft) may be a transition from a low power demand to a high power demand.

While terms such as "high" and "low" are used herein, it is appreciated that these may correspond to particular respective thresholds, such as a high and a low threshold, where the high threshold is higher than the low threshold.

Operational or flight information of the aircraft may be determined (e.g., by at least one processing component or system, such as a flight control computer (FCC)) using information from one or more sensors (e.g., accelerometers, gyros, altimeters, pitot tubes, weight sensors) or other information sources (e.g., a transponder, flight information stored in an electronic storage device), consistent with embodiments of the present disclosure.

As may be appreciated, therefore, FIG. 3E presents a coupling between hybrid power sources (e.g., a turbine power source and a battery power source) that ensures a supply of power to motors with redundancy and—correspondingly—increased safety. As may be further appreciated, a controller may be configured to transmit signals to control a hybrid power generation and distribution system, such as the arrangements illustrated and described in reference to FIGS. 3E-3G.

Arrangement 351 of FIG. 3E may be integrated into an aircraft with electrical systems or components, propulsion systems, or control actuators that are the same as or similar to those illustrated and described in reference to FIGS. 3A-3D. For example, arrangement 351 for hybrid power generation and distribution may include HV electrical circuit and associated devices for powering EPUs or actuators (e.g., tilt actuators) of an aircraft (e.g., similar to subsystem 301 as described in reference to FIG. 3A, similar to the electrical systems and components illustrated in FIGS. 3B-3C). Arrangement 351 may further include HV circuitry and associated devices connected to power converters (e.g., DC/DC converters), which may step down power to feed an LV distribution system (e.g., similar to subsystem 302 as described in reference to FIG. 3A, similar to the electrical systems and components illustrated in FIG. 3D). Arrangement 351 may include an LV power distribution system and associated devices (e.g., similar to subsystem 303 as described in reference to FIG. 3A), which may be fed by the power converters (e.g., DC/DC converters). Arrangement 351 may include an HV charging bus and associated device, which may connect a charging port of the aircraft to one or more battery pack of the aircraft so that the one or more batteries may be charged (e.g., similar to subsystem 304 as described in reference to FIG. 3A). Arrangement 351 may include a charge control unit (CCU), which may control the battery packs during the charging process (e.g., similar to subsystem 305 as described in reference to FIG. 3A).

FIG. 3F illustrates an arrangement 352 of a hybrid power generation and distribution system, consistent with embodiments of the present disclosure. Arrangement 352 may include turbine 342 coupled to three generators G1, G2, and G3. As may be appreciated, turbine 342 may spin a rotor coupled to generators G1, G2 and G3, which may cause generators G1, G2, and G3 to generate AC power. Arrangement 352 may include three batteries (e.g., BAT 322-1, BAT 322-2, BAT 322-3, which may be the same or similar to batteries 320 as described in reference to FIGS. 3B-3D), where generator G1 may be coupled to BAT 322-1, generator G2 may be coupled to BAT 322-2, and generator G3 may be coupled to BAT 322-3. Arrangement 352 may include six EPUs (e.g., EPU 312-1, EPU 312-2, EPU 312-3, EPU 312-4, EPU 312-5, EPU 312-6, which may be the same or similar to EPUs as described and exemplified in relation to FIGS. 1A-3D), where each battery may be coupled to two electric propulsion units (EPUs). For example, BAT 322-1 may be coupled to EPU 312-1 and EPU 312-4, BAT 322-2 may be coupled to EPU 312-2 and EPU 312-5, and BAT 322-3 may be coupled to EPU 312-3 and EPU 312-6.

In FIG. 3F, EPU 312-1, EPU 312-2, and EPU 312-3 may be coupled (e.g., mechanically, electrically, or electromechanically), such that driving one EPU may result in driving all three coupled EPUs (e.g., EPU 312-1, EPU 312-2, and EPU 312-3 may all drive the same rotor shaft). Correspondingly, EPU 312-4, EPU 312-5, and EPU 312-6 may be coupled in a similar manner. Additionally, or alternatively, multiple EPUs (e.g., two or more EPUs, four or more EPUs, six or more EPUs) may be coupled to one another through a gearbox or another mechanism for translating mechanical motion.

EPU 312-1, EPU 312-2, and EPU 312-3 may be considered partial motors or partial engines for a single propulsive system (e.g., single shaft, single rotor, and/or single propeller). Similarly, EPU 312-4, EPU 312-5, and EPU 312-6 may be considered partial motors or partial engines for a single propulsive system (e.g., single shaft, single rotor, and/or single propeller). For example, EPU 312-1, EPU 312-2, and EPU 312-3, as well as EPU 312-4, EPU 312-5, and EPU 312-6, may be considered parts of a same a same propulsion system, where each propulsion system may be tiltable (e.g., using a tilt actuator, consistent with disclosed embodiments).

As illustrated in FIG. 3F, arrangement 352 (e.g., system for hybrid power generation and distribution) may be considered to have three levels of redundancy for each EPU. These three levels of redundancy may refer to if any one battery, generator, or EPU of arrangement 352 fails, then a particular EPU of arrangement 352 may still be powered and driven by another battery, generator, or EPU that is operational and coupled to the particular EPU. Thus, FIG. 3F may illustrate a way of powering EPUs in a hybrid power system (e.g., hybrid power generation and distribution system) that is redundant, which may improve safety of aircraft operations.

FIG. 3G may illustrate an arrangement 353 of a hybrid power generation and distribution system, consistent with embodiments of the present disclosure. Arrangement 353 may include turbine 343 coupled to three generators G1, G2, and G3. As may be appreciated, turbine 343 may spin a rotor coupled to generators G1, G2, and G3, which may cause generators G1, G2, and G3 to generate AC power. Arrangement 353 may include six batteries (e.g., BAT 323-1, BAT 323-2, BAT 323-3, BAT 323-4, BAT 323-5, BAT 323-6, which may be the same or similar to batteries 320 as described in reference to FIGS. 3B-3D), where generator G1 may be coupled to BAT 323-1 and BAT 323-6, generator G2 may be coupled to BAT 323-2 and BAT 323-5, and generator G3 may be coupled to BAT 323-3 and BAT 323-4. Arrangement 353 may include twelve EPUs (e.g., EPU 313-1, EPU 313-2, EPU 313-3, EPU 313-4, EPU 313-5, EPU 313-6, EPU 313-7, EPU 313-8, EPU 313-9, EPU 313-10, EPU 313-11, EPU 313-12, which may be the same or similar to EPUs as described and exemplified in relation to FIGS. 1A-3D), where each battery may be coupled to two electric propulsion units (EPUs). For example, BAT 323-1 may be coupled to EPU 313-1 and EPU 313-7, BAT 323-2 may be coupled to EPU 313-2 and EPU 323-8, BAT 323-3 may be coupled to EPU 313-3 and EPU 313-9, BAT 323-4 may be coupled to EPU 313-4 and EPU 313-10, BAT 323-5 may be coupled to EPU 313-5 and EPU 313-11, and BAT 323-6 may be coupled to EPU 313-6 and EPU 313-12.

Additionally, as illustrated in FIG. 3G, each battery may be indirectly coupled to two batteries through another battery. For example, BAT 323-1 may be indirectly coupled to EPU 313-6 and EPU 313-12 through BAT 323-6. BAT 323-2 may be indirectly coupled to EPU 313-5 and EPU 313-11 through BAT 323-5. BAT 323-3 may be indirectly coupled to EPU 313-4 and EPU 313-10 through BAT 323-4. BAT 323-4 may be indirectly coupled to EPU 313-3 and EPU 313-9 through BAT 323-3. BAT 323-5 may be indirectly coupled to EPU 313-2 and EPU 313-8 through BAT 323-2. BAT 323-6 may be indirectly coupled to EPU 313-1 and EPU 313-7 through BAT 323-1. In this way, redundancy of power delivery to an EPU may be achieved, which may improve aircraft safety or safety or aircraft operations.

For example, if BAT 323-1 were to develop a fault and was no longer able to supply power to EPU 313-1 and EPU 313-7, then EPU 313-1 and EPU 313-7 may still receive power from BAT 323-6 by way of its coupling to BAT 323-1, and additionally, or alternatively, EPU 313-1 and EPU 313-7 may also receive power from generator G1. As may be appreciated, other EPUs or batteries (e.g., of arrangement 353) may operate in a corresponding, redundant manner.

FIGS. 3E-3G therefore show different implementations of hybrid power generation and distribution system. These implementations of hybrid power generation and distribution systems may be configured for an aircraft, particularly for an eVTOL. As will be appreciated, the figures are schematic, and the couplings may include additional features such as power converters or other features to improve the safety, performance, or redundancy of the components, devices, or systems of the aircraft. Additionally, the couplings may be any suitable or desired electrical connection. Thus, many variants of FIGS. 3E-3G are possible.

It may be appreciated that any of the exemplary embodiments of aircraft described and illustrated in reference to FIGS. 1A-3G may include a fly-by-wire (FBW) control system. A fly-by-wire control system may refer to a control system in which control of aircraft effectors includes sending electrical signals to modify aircraft effectors (e.g., not through mechanical linkages of a pilot input device to aircraft effectors). As further described in reference to FCS 618 of FIG. 6A and FIGS. 6D-8, these electrical signals may include input commands from a pilot or operator at an input device (e.g., a side stick, an inceptor), feedback signals, sensor measurements, or other computations. Transmitting electrical signals output from a flight computer or control system of an aircraft to an aircraft effector may result in a modification of the position or state of the aircraft effector.

As discussed above, it may be difficult for the pilot to switch on and off different subsystems from a safety perspective or due to the associated pilot workload. The present disclosure solves these problems, and others, by providing systems and methods including a mode switch that enables a pilot to control an aircraft in different modes and submodes with certain systems enabled or disabled to improve aircraft safety or reduce pilot workload. Additionally, these systems and methods may enable a pilot to safely transition between different modes and submodes, based on checking or monitoring various conditions of the aircraft and its subsystems, which may further increase aircraft safety or reduce pilot workload. Within each mode, an aircraft may be automatically controlled into different states based on detecting an event. Further, embodiments of the present disclosure help to limit the operational hours of an aircraft's critical systems, such as the flight control system (FCS). Limiting operational hours of the FCS may help to preserve the integrity of the FCS and/or comply with regulatory requirements. The present disclosure solves this problem, and others, by disabling the FCS in certain modes and/or states and relying on other controller(s) (e.g., a charge control unit) to communicate with various subsystems.

FIG. 4A illustrates modes of an aircraft (e.g., as described and illustrated in reference to FIGS. 1-3G), consistent with embodiments of the present disclosure. As discussed further herein, at least one aircraft component (e.g., at least one controller, at least one processor, at least at battery management unit, at least one mode switch (e.g., as illustrated and described in reference to FIGS. 6A-6D), or any combination thereof), connected to one or more electrical systems of the aircraft, may control power distribution to one or more components and/or subsystems, consistent with disclosed embodiments. In some embodiments, a mode switch (or other component) may distribute power based on (e.g., in response to, limited by) a selected mode (e.g., selected by a user at an interface, such as a graphical user interface or a physical moving part, consistent with disclosed embodiments). Additionally, a mode switch may also distribute power based on a state among a plurality of possible states being present in a particular mode, consistent with disclosed embodiments.

In some embodiments, a mode switch may be configured to cause power to be distributed (e.g., flow or not flow) in different configurations (e.g., with each configuration being associated with a respective mode). In some embodiments, one selectable mode may be associated with connecting power (or maintaining a connection of power) to one set of components (e.g., at least one subsystem, at least one LV subsystem, at least one HV subsystem, at least one charging subsystem, at least one bus, or any combination thereof) while disconnecting (or maintaining a disconnection of power) to another set of components. In some embodiments, another selectable mode may be associated with connecting power to multiple subsystems (e.g., all systems needed for flight of an aircraft). In some embodiments, a mode switch may be configured to implement one or more of the modes described herein.

In Off Mode 401, Subsystem 301 is disabled and no HV power will run to the electric engines and tilt actuators. Subsystem 302 is disabled and no HV power will flow from the battery packs to the DC/DC converters to feed the LV distribution system. Subsystem 303 is disabled and no LV power will be distributed through the LV distribution system. Subsystem 304 is disabled and no charge will be applied to the battery packs. Subsystem 305 is disabled and the CCU will remain unpowered. In Off Mode 401, maintenance testing of the aircraft is not available (e.g., in reference to FIG. 4B, Service Maintenance Submode 405 and Ground Maintenance Submode 406 are not available).

In Service Mode 402, Subsystem 301 is disabled and no HV power will run to the electric engines and tilt actuators. Subsystem 302 is disabled and no HV power will flow from the battery packs to the DC/DC converters to feed the LV distribution system. Subsystem 303 is enabled but LV power may only be sourced through a ground power unit, not through Subsystem 302. Subsystem 304 is enabled and battery packs may be charged. Subsystem 305 is enabled and the CCU will be powered.

Further, in Service Mode 402, service mode maintenance (e.g., Service Maintenance Submode 405 illustrated in FIG. 4B) is available when the LV distribution system (i.e., Subsystem 303) is powered through a ground unit. An aircraft component, such as a System Control Unit (SCU) used to control LV power distribution, may receive a signal indicating Service Mode 402 and may enable service mode maintenance. For example, the SCU and/or one or more other aircraft components, may enable software loading. In Service Mode 402, software may be loaded onto one or more battery management units. Further, the SCU and/or one or more other aircraft components, may enable testing of the LV equipment. LV equipment testing may include testing the avionics, flight control computers, aircraft flight control surfaces, motors controllers, pitch actuators, tilt actuators, battery management systems for the battery packs, environmental control systems, sensors, and/or any other system on the aircraft requiring LV power.

In Ground Mode 403, Subsystem 301, including HV power to the electric engines and tilt actuators, is enabled when maintenance testing is performed. Subsystem 302 is enabled and power will flow from the battery packs to the DC/DC converters to feed the LV distribution system. Subsystem 303 is enabled and LV power will be distributed through the LV distribution system. LV power may be sourced through the DC/DC converters (e.g., through Subsystem 302) or through one or more ground units. Subsystem 304 is enabled and the battery packs may be charged. Subsystem 305 is enabled and the CCU will be powered.

Further, in Ground Mode 403, ground mode maintenance is available (e.g., Ground Maintenance Submode 406 illustrated in FIG. 4B). An aircraft component, such as a System Control Unit (SCU) used to control LV power distribution, may receive a signal indicating Ground Mode 403 and may enable ground mode maintenance (e.g., Ground Maintenance Submode 406 as discussed in reference to FIG. 4B). Ground mode maintenance may include software loading to different aircraft systems. In some embodiments, ground mode maintenance may prohibit software loading to the battery management units (BMUs). The SCU and/or one or more aircraft components may allow testing of the LV equipment. LV equipment testing may include testing the avionics, flight control computers, aircraft flight control surfaces, motors controllers, pitch actuators, tilt actuators, battery management systems for the battery packs, environmental control systems, sensors, and/or any other system on the aircraft requiring LV power.

In some embodiments, maintenance mode may be selected through a user input device. For example, maintenance mode may be selected through a physical switch, button, lever, and/or display element. The user input device may be mounted on the body of the aircraft and/or in the pilot cockpit. In some embodiments, maintenance mode may be selected through the mode switch. As further described below, the selection of a maintenance mode may be communicated to the CCU.

Further, the FCS and/or other components may receive a signal indicating ground mode maintenance testing and may allow testing of HV equipment. The FCS and/or other components may facilitate testing of the electric engines and associated electric propulsion units, such as the rotors, proprotors, and/or propellers. The FCS and/or other components may facilitate testing of the tilt propeller system, including linear and/or rotary actuators.

In Fly Mode 404, Subsystem 301 is enabled and HV power will run to the electric engines and tilt actuators. Subsystem 302 is enabled and power will flow from the battery packs to the DC/DC converters to feed the LV distribution system. Subsystem 303 is enabled and LV power will be sourced through the DC/DC converters and associated battery packs. Subsystem 304 is disabled and no charge will be applied to the battery packs. Subsystem 305 CCU is disabled and the CCU will remain unpowered. In Fly Mode 404, maintenance testing of the aircraft is not available (e.g., in reference to FIG. 4B, Service Maintenance Submode 405 and Ground Maintenance Submode 406 are not available).

In some embodiments, the aircraft will be prohibited from flying in an off mode, service mode, and/or ground mode, such as Off Mode 401, Service Mode 402, and Ground Mode 403. Additionally, the aircraft may be prohibited from flying or transitioning to a fly mode (e.g., Fly Mode 404) from service mode maintenance (e.g., Service Maintenance Submode 405) or ground mode maintenance (e.g., Ground Maintenance Submode 406). For example, a flight control system may prevent the aircraft from being controlled in a manner that allows for takeoff.

While four modes are provided as an example, the aircraft may include a different number of modes. For example, an aircraft may include two modes including an off mode and fly mode or a service and fly mode. For example, an aircraft may include three modes including an off mode, a ground mode, and a fly mode. For example, an aircraft may include five modes, including a charging mode in addition to the modes shown in FIG. 4A. For example, an aircraft may include additional modes based on an intended type of flight. For example, one mode may provide HV power required for a conventional takeoff and landing mission, while another may provide power for a powered lift mission (e.g., including power to lifters). In some embodiments, when a different number of modes are employed, different conditions may need to be checked prior to allowing transition been the modes. For example, an aircraft with a service mode and fly mode may check the continuity of the DC/DC converters prior to allowing transition to fly mode. An aircraft with different modes depending on a type of flight may check the continuity of the electric propulsion units and/or tilt actuators being employed for that flight type.

As shown, based on the mode selection, power can be controlled to different subsystems. For example, in some embodiments, HV is controlled differently (e.g., different HV circuits are connected to a power source) in at least three modes of operation (e.g., off, ground, and fly). In some embodiments, LV is controlled differently (e.g., different LV circuits are connected to a power source) in at least two modes of operation (e.g., standby and ground). In some embodiments, LV is controlled in the same manner (e.g., substantially the same LV distribution lines are connected to a power source) in at least two modes of operation (e.g., ground and fly).

FIG. 4B illustrates a control diagram 400 for exemplary mode transitions of an aircraft (e.g., as described and illustrated in reference to FIGS. 1-3G), consistent with embodiments of the present disclosure. Control diagram 400 may include Off Mode 401 (e.g., as previously described and exemplified), Service Mode 402 (e.g., as previously described and exemplified), Ground Mode 403 (e.g., as previously described and exemplified), and Fly Mode 404 (e.g., as previously described and exemplified). Additionally, control diagram 400 may include Service Maintenance Submode 405, Ground Maintenance Submode 406, Ground Fly Check Submode 407, and Fly Ground Check Submode 408.

Control diagram 400 may include transitions between modes (e.g., between modes of operation for an aircraft, such as those illustrated in FIGS. 1A-3D). A transition may refer to a process initiated by a request to change from one operational mode to another (e.g., one aircraft mode of operation to another aircraft mode of operation). A transition may result in a system (e.g., the aircraft) entering a new mode of operation or remaining in the current mode, which may depend on whether one or more conditions for a mode transition are satisfied or may result in a modification of power distribution of the system (e.g., power distribution of the aircraft, such as those illustrated in FIGS. 1A-3D). For example, a transition may refer to a change from one aircraft mode of operation to another aircraft mode of operation, which may occur automatically based on a request to transition to another aircraft mode of operation or based on determining that one or more conditions for the mode transition are satisfied. The mode transition may occur at the time of or after the request to transition to another mode or at the time of or after the determination that one or more conditions for the mode transition are satisfied.

Some transitions of control diagram 400 may include a transition from an aircraft mode of operation to an aircraft submode of operation (e.g., a submode of the aircraft mode of operation). A submode may refer to an operational state of the aircraft that may exist within an aircraft mode of operation or as part of a requested or selection of a mode transition that defines a particular system behavior or configuration (e.g., the selection of Fly Mode 404 at a mode switch while an aircraft is in Ground Mode 403).

A transition to another mode (e.g., from an initial aircraft mode of operation to another aircraft mode of operation) may be requested by any entity or signal that is configured to initiate a change from a current operational mode to a different operational mode. This may include initiating a transition to another mode of operation based on user input (e.g., a pilot or operator command), automated system logic (e.g., autopilot or flight management system decision), or external signals or events (e.g., environmental conditions, safety interlocks, or sensor inputs). For instance, as discussed in reference to FIG. 6A-6D, a pilot input may include a selection of a new mode of operation by a mode switch (e.g., mode switch 616), which may result in modifying or otherwise controlling power distribution within an aircraft.

A transition to an aircraft mode of operation, discussed in many embodiments below, may include checking that one or more conditions are satisfied, where conditional logic may enable the checking of the one or more conditions. The selection of one of at least two aircraft modes of operation may initiate the checking of the one or more conditions by the conditional logic. This initiation of checking the one or more conditions may occur at the time of or after receiving the one selected mode of operation.

The conditional logic (e.g., to check one or more conditions for a mode transition) may include software, hardware, or a combination of both, that is configured to determine whether the one or more conditions are satisfied. Conditional logic may include a set of rules or operations (e.g., instructions stored in a memory or non-transitory computer-readable medium) that may, when executed (e.g., by a processor of the aircraft), cause the aircraft to behave differently depending on whether one or more conditions are met. Based on this set of rules or operations, conditional logic may execute a decision-making process in which an output (e.g., an action or decision resulting from the checking of conditions by conditional logic, a mode transition, controlling aircraft power distribution) is based on whether one or more conditions are satisfied. For example, at least one processor of an aircraft may be configured to check one or more conditions associated with a mode transition. At the time of or after determining that the one or more conditions are satisfied, the at least one processor may transmit a signal that indicates that the one or more conditions are satisfied. This signal may be configured to enable or execute the mode transition (e.g., control or modify the power distribution of an aircraft).

A condition may be considered "satisfied," if it is determined as having the state needed for a dependent state to change. For example, if a mode transition occurs if condition A=0, then condition A may be considered satisfied if it equals 0. In some embodiments, conditions may be represented by conditional logic as having variable Boolean states with values of TRUE or FALSE (e.g., where particular combinations of Boolean state values permit and/or cause a mode transition, consistent with disclosed embodiments).

A transition may result in the modification of power distribution to a system. For instance, transitioning from one aircraft mode of operation to another aircraft mode of operation may include a modification of power distribution to one or more systems or subsystems of an aircraft (e.g., as described in reference to FIGS. 1A-3D). This modification to the power distribution may include any combination of charging or discharging one or more systems or subsystems of the aircraft, enabling or disabling one or more systems or subsystems of the aircraft, or providing power to or removing power from one or more systems or subsystem of the aircraft. The modification of power distribution to the aircraft (e.g., power distribution in different aircraft modes of operation) may be further illustrated, described, and exemplified in reference to FIGS. 5A-5D. Additionally, a mode switch and circuitry associated with power distribution of the aircraft may be further illustrated, described, and exemplified in reference to FIGS. 6A-6D.

A transition may be accompanied by one or more Crew Alerting System (CAS) messages based on the checked conditions or the mode of operation. A Crew Alerting System (CAS) may refer to an integrated system on an aircraft (e.g., as described in reference to FIGS. 1A-3D) that monitors or is configured to monitor one or more systems or subsystems of the aircraft, such that the CAS may transmit alerts to a crew of the aircraft. A CAS may transmit alerts related to abnormal, cautionary, or informational conditions of the aircraft based on the one or more systems or subsystems of the aircraft. A CAS may consolidate messages from various subsystems of the aircraft (e.g., hydraulics, EPUs, flight controls, electrical systems). A CAS may present messages or alerts in a prioritized or standardized way. CAS messages may include individual alerts or notifications displayed by a Crew Alerting System, where each message may communicate a system condition to one or more crew members (e.g., pilot, remote pilot, maintenance technician, or other human user or operator of an aircraft) for crew member awareness (e.g., awareness of critical failures or routine status updates).

Exemplary transitions are illustrated in FIG. 4B in reference to Off Mode 401, Service Mode 402, Ground Mode 403, Fly Mode 404, Service Maintenance Submode 405, Ground Maintenance Submode 406, Ground Fly Check Submode 407, and Fly Ground Check Submode 408.

Service Maintenance Submode 405 may refer to service mode maintenance, e.g., as previously described and exemplified. For instance, Service Maintenance Submode 405 may be available for selection or mode transition when an LV distribution system (e.g., Subsystem 303) is powered through a ground unit, where an aircraft component, such as a System Control Unit (SCU) may be used to control LV power distribution. The aircraft component or SCU may receive or be configured to receive a signal that indicates Service Mode 402 and may enable Service Maintenance Submode 405. Additionally, Service Maintenance Submode

405 may be selected by a mode switch of the aircraft, e.g., as illustrated, described, and exemplified in FIGS. 6A-6D. Service Maintenance Submode 405 may be configured for testing LV equipment including avionics, flight control computers (FCCs), aircraft flight control surfaces, motor controllers or motors controllers, pitch actuators, tilt actuators, battery management systems for battery packs of the aircraft, environmental control systems, sensors, or any other system on the aircraft that may require LV power (e.g., systems and subsystems illustrated in FIGS. 7-8).

Ground Maintenance Submode 406 may refer to ground mode maintenance, e.g., as previously described and exemplified. For instance, Ground Maintenance Submode 406 may be available for selection or mode transition from Ground Mode 403. When an aircraft component, such as a System Control Unit (SCU) is connected or used to control LV power distribution of the aircraft, the aircraft component may receive a signal (e.g., from a mode switch of the aircraft as illustrated and described in reference to FIGS. 6A-6D) indicating Ground Mode 403 and may enable Ground Maintenance Submode 406 or may receive a signal indicating Ground Maintenance Submode 406. Ground Maintenance Submode 406 may be configured for testing LV equipment including avionics, flight control computers (FCCs), aircraft flight control surfaces, motor controllers or motors controllers, pitch actuators, tilt actuators, battery management systems for battery packs of the aircraft, environmental control systems, sensors, or any other system on the aircraft that may require LV power. Additionally, an FCS of the aircraft or another aircraft component may receive a signal indicating Ground Maintenance Submode 406 and Ground Maintenance Submode 406 may be configured for testing HV equipment. Ground Maintenance Submode 406 may be configured to enable testing of EPUs, electric engines, tilt propeller systems, rotors, proprotors, propellers, linear actuators, or rotary actuators.

Ground Fly Check Submode 407 may refer to an intermediate mode for the transition from a ground mode to a fly mode (e.g., from Ground Mode 403 to Fly Mode 404) of the aircraft. Ground Fly Check Submode 407 may include HV power enabled to one or more EPUs, electric engines, or tilt propeller systems (TPSs), where a tilt propeller system may include one or more EPUs, propellers or rotors, linear or rotary actuators, tilt mechanism, propeller drive system, control system, or any other components that may enable a tilting propeller system to provide propulsion. In Ground Fly Check Submode 407, one or more conditions may be checked at the time of or after enabling HV power to the one or more EPUs, electric engines, or TPSs. These checked conditions may include a selected mode of a mode switch of the aircraft, a temperature of the one or more EPUs, a position or status of pilot controls, or a pre-flight check of aircraft effectors. While checking these conditions, the aircraft may remain in Ground Fly Check Submode 407. Based on termination of the pre-flight processes or determining that at least one of the conditions is not satisfied, the aircraft may transition to Ground Mode 403. Based on successful completion of the pre-flight processes and determining that all of the conditions are satisfied, the aircraft may transition to Fly Mode 404.

Fly Ground Check Submode 408 may refer to an intermediate mode for the transition from a fly mode to a ground mode (e.g., from Fly Mode 404 to Ground Mode 403) of the aircraft. Fly Ground Check Submode 408 may be entered—for example—based on selecting a transition from Fly Mode 404 to Ground Mode 403, while the aircraft is on the ground. The aircraft may remain in Fly Ground Check Submode 408 until one or more conditions are satisfied or one or more post-flight processes are successfully completed. These one or more conditions or post-flight processes may include the alignment of the nacelles of the aircraft (e.g., nacelles of the tiltrotors, TPSs, EPUs, electric engines), the disabling and discharging of HV power to an EPU or electric engine (e.g., all the EPUs of the aircraft), or the disabling and discharging of HV power to a tilt propeller system (TPS) of the aircraft (e.g., all the TPSs of the aircraft). Based on successful completion of all the post-flight processes or determining that each of the one or more conditions are satisfied, while a mode switch of the aircraft indicates Ground Mode 403, the aircraft may transition from Fly Ground Check Submode 408 to Ground Mode 403.

Transition 410 may represent the mode transition from Off Mode 401 to Ground Mode 403. Transition 410 may occur based on (e.g., in response to) powering up a Flight Control System (FCS) of an aircraft, which may include transitioning upon, at the time of, or after powering up the FCS.

Transition 412 may represent the mode transition from Ground Mode 403 to Service Mode 402. Transition 412 may occur based on powering up an FCS of an aircraft if one or more conditions are satisfied upon or at the time of powering up the FCS. Transition 412 may occur based on a selection of Service Mode 402 while in Ground Mode 403 if one or more conditions are satisfied at the time of or after receiving a selection of Service Mode 402. The one or more conditions may include a mode switch commanding or selecting an aircraft mode of operation that is not a fly mode (e.g., Fly Mode 404), a mode switch (e.g., mode switch 616) indicating a service mode or an unavailable mode switch (e.g., switch not accessible or offline, switch not powered or receiving power), and an on-ground status (OGS) of the aircraft.

Transition 414 may represent the mode transition from Service Mode 402 to Service Maintenance Submode 405. Transition 414 may occur based on the selection of a maintenance test mode or Service Maintenance Submode 405 while the aircraft is in Service Mode 402.

Further, transition 416 may represent the mode transition from Service Maintenance Submode 405 to Service Mode 402. Transition 416 may occur based on the deselection of a maintenance test mode or the selection of Service Mode 402 while in Service Maintenance Submode 405.

Transition 418 may represent the mode transition from Ground Mode 403 to Ground Maintenance Submode 406. Transition 418 may occur based on the selection of a maintenance test mode or Ground Maintenance Submode 406, while in Ground Mode 403 and when one or more conditions are satisfied. The one or more conditions associated with transition 418 may include a mode switch not indicating a fly mode (e.g., Fly Mode 404) and an on-ground status of the aircraft.

Transition 420 may represent the mode transition from Ground Maintenance Submode 406 to Ground Mode 403. Transition 420 may occur based on the deselection of a maintenance test mode or selection of Ground Mode 403, while in Ground Maintenance Submode 406.

Transition 422 may represent the mode transition from Ground Mode 403 to Off Mode 401. Transition 424 may represent the mode transition from Service Mode 402 to Off Mode 401. Transition 426 may represent the mode transition from Service Maintenance Submode 405 to Off Mode 401. Transition 428 may represent the mode transition from Ground Maintenance Submode 406 to Off Mode 401. Transition 422, transition 424, transition 426, or transition 428 may occur based on the selection of an off mode of the aircraft (e.g., Off Mode 401) from Ground Mode 403, Service Mode 402, Service Maintenance Submode 405, or Ground Maintenance Submode 406, respectively.

Transition 430 may represent staying in Ground Mode 403. Transition 430 may occur based on the selection of a mode (e.g., at a mode switch while in Ground Mode 403) other than Ground Mode 403 that does not satisfy one or more conditions for transitioning to the selected mode. For example, transition 430 may include the selection of a fly mode of operation (e.g., Fly Mode 404), where one or more conditions are checked after or at the time of the selection of the fly mode of operation, and at least one of the conditions is not satisfied. At least one of the one or more conditions may not be satisfied if a charger is connected to the aircraft (e.g., at a charge port of the aircraft), if coolant or a coolant line is connected to the aircraft (e.g., at a charge port, at a coolant port), if a pre-flight check is not completed (e.g., a preflight check of the aircraft controls, input devices, or control systems), or if a battery pack temperature is not within a threshold range for takeoff. If any one of the checked conditions is not satisfied at the time of or after the requested mode transition from Ground Mode 403, the aircraft mode of operation may stay in Ground Mode 403.

In Ground Mode 403, CAS messages may be displayed before, during, or after a selection of another aircraft mode of operation (e.g., a selection of Fly Mode 404). These CAS messages may be associated with conditions for transition 430 or transition 434 (as described later). For example, while in Ground Mode 403, any combination of CAS messages (e.g., pre-existing CAS messages) indicating the connection of a charger, the connection of coolant or a coolant line, or a battery pack temperature (e.g., overheat, high temperature, a temperature reading of the battery pack) may be displayed. Additionally, at the time of or after selecting Fly Mode 404, CAS messages may be driven based on the checking of the one or more conditions associated with transition 430 or transition 434, such as any combination of CAS messages including a requested mode of operation (e.g., Fly Mode 404, aircraft mode disagreement), a connection to a charger, a connection to a coolant or coolant line, a failure of a pre-flight check (e.g., of the pilot controls, side sticks, inceptor), or a battery pack temperature (e.g., overheat, high temperature, temperature reading of the battery pack).

Transition 430 may include a condition of passing a pre-flight check of pilot inputs (e.g., pilot controls, pilot controllers). This condition may be checked when a fly mode is selected from ground mode (e.g., selecting Fly Mode 404 at a mode switch of the aircraft while in Ground Mode 403, selecting a fly mode from ground mode in a fly-by-wire aircraft). Successfully completing or passing this condition may be a condition for transition from a ground mode to a fly mode (e.g., from Ground Mode 403 to Ground Fly Check Submode 407 or Ground Mode 403 to Fly Mode 404).

A mode may be selected at a mode switch (e.g., as illustrated and described in reference to FIGS. 6A-6D), a switch, a button, a lever, a display screen element, a voice receiver, or any other device or system configured to receive a mode selection. A pilot input may be received at a flight controller (e.g., a pilot input device in a fly-by-wire aircraft, a primary flight controller, a stick, a side stick, a yoke, an inceptor, or another pilot input device), which may include a switch, a knob, a button, a lever, a display screen element, a voice receiver, or any other device or system configured to receive a pilot input or control command.

The pilot input command may result in sending a signal to a control circuit of an aircraft or a circuit of a control system of an aircraft, which may be a signal that is interpretable by a system of the aircraft (e.g., by a flight control system (FCS) or other control circuit for controlling an EPU, TPS, electric engine, actuator, or other aircraft effector). The pre-flight check of pilot inputs may include determining that one or more measured outputs based on pilot inputs correspond to expected outputs to the one or more pilot inputs (e.g., signals resulting from a pilot input equal or approximately equal to the expected signal for the pilot input, where the signals may be electrical, analog, digital, or in any other form interpretable by the FCS or a control circuit). The pre-flight check of pilot inputs may include that one or more measured outputs to pilot inputs correspond to expected outputs due to the one or more pilot inputs over a period of time. An expected output may include a signal (e.g., electrical, analog, digital), a figure of merit, or any other type of output that may be derived or determined for comparison of the measured pilot input to the expected pilot input.

A pre-flight check may be used to ensure safety, accuracy, or validity of pilot controls inputs while the aircraft is on the ground (e.g., the on-ground status of the aircraft indicates that the aircraft is on the ground). The pre-flight check may include a set of tests to determine pilot control authority, aircraft operating capability, or other metric for aircraft or flight safety based on the controls of the aircraft. For example, the pre-flight check may test or determine a pilot's ability to control an EPU of the aircraft, an actuator of the aircraft, or a non-propulsion load of the aircraft. Additionally, the pre-flight check may include a sequence of tests, completed in a specific order. The set of tests or the sequence of tests included in a pre-flight check may be predetermined or may be loaded into a memory of the aircraft, such that the same pre-flight check may be conducted from flight-to-flight (e.g., each time the aircraft enters a flight mode, Flight Mode 404). Further, the pre-flight check may include an adaptive sequence of tests, where the order of tests is determined based on a prior output or several prior outputs.

In some embodiments, the pre-flight check may include transmitting a request for an input to the pilot, such that a pilot may be guided through the pre-flight check process or otherwise complete each test (e.g., each required test, each predetermined test) for transitioning into Ground Fly Check Submode 407 or Fly Mode 404.

In a condition where the pre-flight check of pilot controls is not passed or is interrupted, the system may stay in Ground Mode 403. In a condition where the pre-flight check of pilot controls is passed, the system may transition to Ground Fly Check Submode 407 or may continue a transition toward Fly Mode 404.

Transition 432 may represent staying in Ground Maintenance Submode 406. Transition 432 may occur based on the selection of a mode (e.g., at a mode switch while in Ground Maintenance Submode 406) other than Ground Maintenance Submode 406 that is unavailable or not selectable. For example, a fly mode (e.g., Fly Mode 404) may not be available for selection from ground mode maintenance or Ground Maintenance Submode 406, and transition 432 may include for a selection of a fly mode of operation (e.g., Fly Mode 404), staying in Ground Maintenance Submode 406. In Ground Maintenance Submode 406, a CAS message may be displayed at the time of or after changing a mode switch of an aircraft to select a fly mode of operation (e.g., Fly Mode 404), where the CAS message may indicate the selection of a fly mode or disagreement of an aircraft mode selection (e.g., due to Fly Mode 404 being unavailable in a maintenance mode, such as Ground Maintenance Submode 406).

Transition 434 may represent a mode transition from Ground Mode 403 to Ground Fly Check Submode 407. Transition 434 may occur based on the selection of a fly mode of operation (e.g., Fly Mode 404) while in Ground Mode 403, where one or more conditions are checked, and the one or more checked conditions are satisfied. For example, based on the selection of Fly Mode 404 from Ground Mode 403, one or more conditions may be checked, which may include checking that a charger is not connected to the aircraft, checking that a coolant or coolant line is not connected to the aircraft, conducting a pre-flight check and checking the pre-flight test is passed (e.g., a preflight check of the aircraft controls, input devices, or control systems), or checking that a battery pack temperature is within a threshold range for takeoff. At the time of or after determining that each of the one or more conditions are satisfied, the aircraft may transition from Ground Mode 403 to Ground Fly Check Submode 407, which may involve modifying or otherwise controlling power distribution of the aircraft to enable HV power to electric propulsion units (EPUs), electric engines (EEs) or a tilt propulsion systems (TPSs) of the aircraft.

Transition 434 may include one or more conditions that may be checked to ensure the safety of the aircraft or passengers of the aircraft before enabling or disabling an EPU, an electric engine, or a TPS. Additionally, this may include checking the one or more conditions to determine the safety of enabling or disabling HV power to the EPU, electric engine, or TPS. Further, this may include enabling or disabling one or more EPUs, electric engines, or TPSs (e.g., enabling or disabling HV power to one or more EPUs, electric engines, or TPSs).

The one or more conditions that may be checked before enabling or disabling an EPU, electric engine, or TPS may include any combination of a command and control radio link is functioning as intended, a discharge target of an electric propulsion unit (EPU) is achieved, none of a plurality of particular EPU commands exist, a flight termination radio link is functioning as intended, voltage across the EPU is measured to be less than or equal to a threshold, voltage across a capacitor of the EPU is measured to be less than or equal to a threshold, or an aircraft grounded status is present. For instance, in some embodiments, the one or more conditions may include a radio link is functioning as intended, a discharge target of an EPU is satisfied, and no EPU warning indicators are present.

The radio link functioning as intended may include a command and control radio link is functioning as intended or a flight termination system radio link is functioning as intended. This may include the verification of reception or transmission of a radio signal or may include determining a performance metric of a radio link (e.g., a signal-to-noise ratio (SNR), latency, signal strength, signal integrity, signal distortion).

The EPU discharge target being achieved may include active or passive discharge methods of a voltage of the EPU or a voltage of a capacitor of the EPU (e.g., a voltage differential measured between two points in the EPU or across a capacitor of the EPU). Active discharge methods may include intentionally modifying a power distribution to discharge the voltage and confirming the discharge of the voltage (e.g., satisfaction of discharge by a measured or monitored discharge status). Passive discharge methods may include waiting for at least one predetermined amount of time (e.g., the expiration of one or more times). The EPU discharge target may further include detecting a fault of a discharge operation, an electrical fault, or a degraded discharge operation).

Determining that a particular EPU command does not exist or is not present may include commands based on the selected mode of operation, the current mode of operation, or the transition from the current mode of operation to the selected mode of operation. A particular EPU command may be any command that is not 'off' or 'standby.' For example, a particular EPU command may be any command that drives an EPU.

An EPU warning indicator may include visual, audible, tactile, or electronic alerts that inform a pilot, operator, FCS, or control circuit that an abnormal, degraded, unsafe, or otherwise restricted condition exists (e.g., associated with the EPU). An EPU warning indicator may be triggered due to a monitoring system of the aircraft detecting a fault, a value exceeding a limit or threshold, a failure condition, or a restricted condition that is abnormal or not allowed in a current mode of operation, a commanded or selected mode, or a transition between modes. For instance, an EPU warning indicator may be present if a particular EPU command exists (e.g., not off or standby).

Transition 436 may represent a mode transition from Ground Fly Check Submode 407 to Ground Mode 403. Transition 436 may occur when a mode switch of the aircraft is changed from indicating a fly mode (e.g., Fly Mode 404) to indicating a ground mode (e.g., Ground Mode 403), while the aircraft is in Ground Fly Check Submode 407. Transition 436 may occur when a mode switch of the aircraft is indicating a fly mode (e.g., Fly Mode 404) and at least one of a set of one or more conditions are not satisfied. For example, when the mode switch is indicating Fly Mode 404, checking the one or more conditions may include checking that a charger is not connected, a coolant or coolant line is not connected, a pre-flight check of the aircraft effectors is interrupted, or a battery pack temperature is outside a threshold range for takeoff. If at least one of the one or more conditions is not satisfied, the aircraft may transition from Ground Fly Check Submode 407 to Ground Mode 403, where HV power to the EPUs or TPS of the aircraft may be disabled in Ground Mode 403 (e.g., HV power may be disabled at the time of or after transitioning from Ground Fly Check Submode 407 to Ground Mode 403).

In Ground Fly Check Submode 407, one or more CAS messages may be displayed at the time of or after determining that at least one of the set of one or more conditions are not satisfied, where a CAS message may correspond to a condition of the set of one or more conditions. At the time of or after determining that a condition is not satisfied, a CAS message may appear. Additionally, a CAS message may display while checking conditions or may be resolved or disappear when a checked condition is determined to be satisfied. For example, in Ground Fly Check Submode 407, a CAS message may be displayed to indicate that a certain aircraft mode is or has been selected (e.g., Fly Mode 404 selected, but current aircraft mode is in Ground Fly Check Submode 407 and not Fly Mode 404), a charger is connected to the aircraft, a coolant or coolant line is connected to the aircraft, a pre-flight check of aircraft effectors is failed or interrupted (e.g., did not pass pre-flight check), or a battery pack temperature is not within a threshold range (e.g., overheat, high temperature, a current reading of battery pack temperature).

Transition 436 may include a condition of passing a pre-flight check of aircraft effectors. Aircraft effectors may refer to devices, mechanisms, or systems that may physically act on an aircraft or the aircraft's environment to produce changes in the aircraft's motion, attitude, configuration, or aerodynamic state. Effectors may be the elements that execute commands generated by a pilot or a control system of the aircraft (e.g., an FCS, a control circuit), which may convert control inputs into actual forces, torques, or configuration changes.

The pre-flight check of aircraft effectors may include enabling or distributing high-voltage power to a system or subsystem of an aircraft, such as an EPU, electric engine, TPS, control actuator, non-propulsion load, or other aircraft effector. The pre-flight check of aircraft effectors may include disabling pilot, operator, or otherwise user control of at least one aircraft effector that is being investigated as part of the pre-flight check or during the pre-flight check. The pre-flight check of aircraft effectors may include a control system of the aircraft (e.g., an FCS, a control circuit) automatically controlling at least one component of the aircraft, e.g., to determine whether the at least one component is operating as expected, non-operative, or operating in a degraded state, where the at least one component may not be controllable via pilot or operator inputs during the automatic controlling. Based on the at least one component operating as expected, the aircraft power distribution may be controlled to enable HV power to the at least one component or user control of the at least one component (e.g., enabling an EPU for propulsive operation, enabling an aircraft effector for flight operations).

Limiting user control of the at least one component (e.g., an aircraft effector) during pre-flight testing of the aircraft effectors may include disabling power to a user input device or controller, disregarding signals originating from a user input device or controller, electrical isolation of a user input device or controller, or removing user control commands from a signal. This may enable the aircraft (e.g., control systems of the aircraft) control the component automatically and without user input, such that the operation of a system of the aircraft may determine an aircraft operating capability or a pilot authority of the aircraft before flight. The automatic control of aircraft effectors may allow for precise testing of operating capabilities or pilot authority of the aircraft.

The pre-flight check of aircraft effectors may determine whether an aircraft effector can operate to certain limits, such as pre-flight limits (e.g., the limits that may be available to the pilot during flight) or test limits (e.g., limits that may go beyond what is available to the pilot during flight or may be restricted more than what is available to the pilot during post-testing or post-deployment flight). A specified operating limit (e.g., for a pre-flight check or test) may be different from an operating limit for flight (e.g., a flight operating limit). The limits of operation of an aircraft effector that are determined during a pre-flight check of aircraft effectors may inform the determined pilot authority or aircraft operating capabilities, and the determined or measured limits of operation may be used to determine whether a pre-flight check is passed.

The pre-flight check of aircraft effectors may include control instructions, where the control instructions may be used to automatically control at least one component of the aircraft (e.g., a control effector) under test during the pre-flight check, and the control instructions may not include user input. The control instructions may be from a set of predetermined control instructions or sequence of predetermined control instructions, which may be directed to control an EPU, control actuator, or non-propulsion load. Additionally, the control instructions may be applied in an adaptive sequence or with adaptive parameters, based on a result from a prior check of an aircraft effector. For instance, a next applied control instruction (e.g., applied to a component of the aircraft, such as an aircraft effector) may be chosen based on a successful or unsuccessful application of a control instruction to a component, or a determined operating limit of the component.

Based on an applied control instruction, an output of an aircraft effector may be measured or determined, which may include a measured or determined electrical parameter, analog signal, or digital signal. The measured output may additionally include a measured output over time or a figure of merit (e.g., a measured or derived figure of merit). The measured output may be compared to an expected output to determine whether the measured output is equal to or approximately equal to the expected output. For a measured output corresponding to an expected output, a test or a check (e.g., at least a portion of a pre-flight check) may be passed.

A processor of the aircraft (e.g., an FCS, an FCC) may be configured to determine at least part of a pilot control authority or aircraft operating capability, based on the comparison of a measured output to an expected output. In some embodiments, a processor (e.g., an FCS, an FCC) may be configured to determine a pilot control authority or an aircraft operating capability based on one or more measured outputs over a sequence or set of tests (e.g., a predetermined sequence or set of tests, an adaptive sequence of tests).

Transition 438 may represent staying in Ground Fly Check Submode 407. Transition 438 may occur while a mode switch of the aircraft indicates a fly mode of operation (e.g., Fly Mode 404) and while a set of one or more conditions are not satisfied. The one or more conditions may include completing and passing a pre-flight check of the aircraft effectors, determining that a temperature of an EPU (e.g., a temperature of all EPUs of the aircraft) is within a threshold range for takeoff, or no pilot input (e.g., side sticks in neutral, inceptor in neutral). As an example, when a mode switch of the aircraft indicates Fly Mode 404 and one of these conditions is not satisfied, the aircraft may remain in Ground Fly Check Submode 407. Additionally, for a selection at a mode switch of the aircraft of Fly Mode 404, the aircraft may remain in Ground Fly Check Submode 407 while a pre-flight check of the aircraft effectors is being conducted.

In Ground Fly Check Submode 407, one or more CAS messages may be displayed while checking conditions for transitioning to Fly Mode 404 or while preparing the aircraft to transition to Fly Mode 404 (e.g., while in Ground Fly Check Submode 407 and while Fly Mode 404 is selected). The one or more CAS messages may be based on one or more conditions or processes that are checked or executed after enabling HV power to an EPU, electric engine, or TPS, and checked or executed before transitioning to Fly Mode 404. The one or more CAS messages may include indications that a pre-flight check of aircraft effectors is underway (e.g., an active pre-flight check of the aircraft effectors), indications of an engine temperature or that an engine is warming up or cooling down to bring the engine temperature within a threshold range for takeoff, or an indication that a pilot control is not centered or not in a neutral position (e.g., side sticks, inceptor not centered or not in a neutral position).

Transition 438 may include a condition of an EPU temperature being within a threshold range for takeoff. A temperature of an EPU may include a temperature of a component of the EPU, a heat transfer fluid of the EPU, an ambient temperature of the EPU, winding of the EPU, a housing of the EPU, a bearing of the EPU, an inverter or a component of an inverter, a capacitor, a transistor or switching device, a heat sink, a thermal management system, a coolant or oil, or other component of an EPU. In some embodiments, the temperature of the EPU may include multiple temperatures associated with a same component or element of the EPU (e.g., multiple temperatures measured or estimated at a heat transfer fluid or component of the EPU or multiple measured or estimated ambient temperatures at differing locations around the EPU). This may include measuring or estimating temperatures at multiple locations around the EPU or multiple locations on the same component or element of the EPU. Any temperature, location, component, or element of the EPU may be associated with a separate threshold range (e.g., temperature range acceptable for takeoff). A threshold range may be based on a minimum and maximum operating temperature, or a threshold range may be based on a minimum and maximum rated temperature.

In some embodiments, a temperature of the EPU may be measured by a temperature sensor within the EPU or thermomechanically coupled to the EPU (e.g., thermomechanically coupled to a specific component of the EPU to measure a temperature of the specific component). In some embodiments, a temperature of the EPU may be estimated by a thermal model (e.g., based on networks of coupled heat capacities, finite-element-derived models, or other methods of modeling temperatures of the EPU), by measuring electrical characteristics of the EPU (e.g., resistance of an electrical component of the EPU or a motor winding, switching characteristics or voltage drop associated with a switching device of the EPU), indirect thermal sensing with flow rates or surface temperatures, or computing loses of the EPU. In some embodiments, a temperature of an EPU may be measured and a temperature of the EPU may be estimated. Additionally, a temperature of an EPU that is both estimated and measured may be used to cross-validate the measured and estimated temperatures, such that a system of the aircraft (e.g., an FCS, a processor) may determine a faulty temperature measurement or estimation.

In some embodiments, the temperature of the EPU being within a threshold range for takeoff may include a composite temperature (e.g., an aggregation, calculation, or consolidation of multiple temperatures being within a range), each of a set of temperatures being in an associated threshold range, a most-limiting temperature being within a range (e.g., the temperature that places the strictest operational constraint on the EPU). A composite temperature may refer to an aggregated or calculated temperature that represents an overall thermal state of a system (e.g., an EPU), which may be derived from multiple sensor measurements, multiple estimated temperatures, or a combination of both. A composite temperature may be determined by a thermally most-limiting temperature, or temperatures of a composite temperature may be weighted by the degree of operational limitations that a temperature places on the system (e.g., the EPU). A thermally most-limiting temperature may refer to a single temperature value, which may be drawn from a set of measured or estimated temperatures, that places the strictest operational constraint on a system (e.g., an EPU).

While determining whether an EPU is within a threshold range for takeoff, HV power to the EPU may be enabled, and the EPU may not be enabled for propulsive operation. This may prevent the aircraft from taking off or entering a state of flight while the temperature of the EPU is not within the threshold range for takeoff or before the temperature of the EPU is within the threshold range for takeoff.

Based on the temperature of the EPU not being within the threshold range, a temperature modification system may be used to modify the temperature of the EPU such that it is brought within the threshold range (e.g., the temperature of the EPU is acceptable for takeoff). In some embodiments, a temperature modification system may include a heater thermomechanically coupled to the EPU or a heat exchanger thermomechanically coupled to the EPU. In some embodiments, the EPU may be the temperature modification system, where an operational parameter of the EPU may be modified such that the EPU may be heated up or cooled down based on varying the operational parameter. For example, while propulsive operation of the EPU is not enabled, the EPU may be spun in a manner that does not generate propulsion but does move a heat transfer fluid around a heat transfer loop, such that the EPU is cooled, which may be accomplished by sending a current to the EPU. Additionally, while propulsive operation of the EPU is not enabled, current may be sent to the EPU in such a manner that the EPU does not spin and the heat transfer fluid does not move around the heat transfer loop, which may heat the engine (e.g., through resistances interacting with the current and generating heat. Further, the EPU may be run in an efficient mode to cool the EPU and in an inefficient mode to heat the EPU, while the EPU is not enabled for propulsion or producing any propulsion for the aircraft.

Transition 440 may represent the mode transition from Ground Fly Check Submode 407 to Fly Mode 404. Transition 440 may occur while a mode switch of the aircraft indicates a fly mode of operation (e.g., Fly Mode 404), when the aircraft is in Ground Fly Check Submode 407, and based on determining that one or more conditions for transitioning to Fly Mode 404 are satisfied. The one or more conditions may include completing and passing a pre-flight check of the aircraft effectors, determining that a charger is not connected to the aircraft, determining that a coolant or coolant line is not connected to the aircraft, determining that a temperature of an EPU (e.g., all EPUs of the aircraft) is within a threshold range for takeoff, determining that a temperature of a battery pack (e.g., all battery packs of the aircraft) is within a threshold range for takeoff, and determining no pilot input is present (e.g., side sticks in neutral, inceptor in neutral position). In Ground Fly Check Submode 407 and while a mode switch of the aircraft is indicating Fly Mode 404, at the time of or after determining that the one or more conditions are satisfied, the aircraft may transition from Ground Fly Check Submode 407 and into Fly Mode 404.

Transition 442 may represent staying in Fly Mode 404. Transition 442 may occur while an aircraft is in a fly mode (e.g., Fly Mode 404) and when a mode switch of the aircraft is switched to indicate an aircraft mode of operation that is not the fly mode, when the aircraft's on-ground status does not indicate that the aircraft is on the ground. For example, if the aircraft is in Fly Mode 404 and not on the ground (e.g., the aircraft is in the air or flying), and an input to a mode switch of the aircraft is moved to indicate a mode other than Fly Mode 404, the aircraft will remain in Fly Mode 404. While in Fly Mode 404, at the time of or after a non-fly mode is selected at a mode switch of the aircraft and the on-ground status of the aircraft indicates that the aircraft is not grounded, a CAS message may indicate the aircraft mode of operation or a disagreement between the selected mode and the current operational mode.

Transition 444 may represent the mode transition from Fly Mode 404 to Fly Ground Check Submode 408. Transition 444 may occur when an aircraft is in Fly Mode 404 and a mode switch is switched to indicate an aircraft mode of operation other than Fly Mode 404 (e.g., switched to indicate Ground Mode 403), while the on-ground status of the aircraft indicates that the aircraft is on the ground. For example, while in Fly Mode 404, at the time of or after receiving a selection of Ground Mode 403 and the aircraft on-ground status indicates that the aircraft is grounded, the aircraft transitions from Fly Mode 404 to Fly Ground Check Submode 408.

Transition 446 may represent staying in Fly Ground Check Submode 408. Transition 446 may occur while a mode switch of the aircraft is not indicating Fly Mode 404 (e.g., while the mode switch is indicating Ground Mode 403), and after transition 444 occurs. The aircraft may remain in Fly Ground Check Submode 408 while the mode switch does not indicate Fly Mode 404 and while at least one of a set of one or more conditions is not satisfied. For example, while a mode switch is indicating Ground Mode 403, the aircraft may be aligning a nacelle of a tiltrotor of the aircraft (e.g., aligning the nacelles of each tiltrotor of the aircraft), disabling HV power to an EPU (e.g., all EPUs of the aircraft) or a TPS of the aircraft, or discharging an EPU (e.g., all the EPUs of the aircraft) or a TPS of the aircraft. While any of these actions are occurring, the one or more conditions may not be satisfied, and the aircraft may remain in Fly Ground Check Submode 408.

Transition 446 may include a condition of an EPU, electric engine, or TPS being disabled and discharged. This may include disconnecting HV power to the EPU, electric engine, or TPS (e.g., by toggling or opening a switching device), and confirming the disconnection from HV power (e.g., confirming loss of continuity). Based on confirmation of the disconnection, a discharge operation may be initiated to discharge a capacitor of the EPU, electric engine, or TPS. The discharging of the capacitor may include confirming a discharge of the capacitor (e.g., by measuring a voltage) or waiting for one or more predetermined discharge times. In some embodiments, the discharging of the capacitor may be an active discharge process or a passive discharge process. An active discharge process may include toggling a switching device and using the switching losses to discharge the capacitor. A passive discharge process may include waiting a certain amount of time and using the intrinsic losses of power distribution circuitry to discharge the capacitor.

Transition 448 may represent the Fly Ground Check Submode 408 to Ground Mode 403. Transition 448 may occur while a mode switch of the aircraft is not indicating a fly mode of operation (e.g., indicating Ground Mode 403) and at the time of or after completing ground transition checks (e.g., determining one or more conditions are met for transitioning from Fly Ground Check Submode 408 to Ground Mode 403). The ground transition checks may include a nacelle of a tiltrotor of the aircraft is aligned (e.g., all nacelles of the tiltrotors of the aircraft are aligned), HV power to an EPU is disabled and discharged (e.g., all EPUs of the aircraft), and HV power to a TPS is disabled and discharged.

In addition to the above-described conditions for mode transitions illustrated in FIG. 4B, the functionality of circuit protections of an integrated circuit may be tested in certain conditions and mode transitions illustrated in FIG. 4B. For example, as described in reference to FIGS. 9A-9B and FIG. 16, the circuit protections of one or more gate drivers may be tested to determine functionality of the circuit protections (e.g., gate driver circuit protections functioning as expected or intended). In some embodiments, the gate driver may be associated with an inverter of an aircraft, where the inverter may be associated with controlling or driving an EPU of the aircraft. Additionally, in some embodiments, an EPU may be associated with two inverters (e.g., as illustrated in FIG. 9B) or an aircraft may have multiple EPUs. Gate drivers of differing inverters (e.g., associated with the same or different EPUs) may be tested to verify the functionality of circuit protections of the gate driver.

For example, in any of off mode 401, service mode 402, ground mode 403, service maintenance submode 405, ground maintenance submode 406, ground fly check submode 407, fly ground check submode or for any transitions between any of these modes, circuit protections for one or more gate drivers of the aircraft may be tested to ensure functionality of the one or more gate drivers (e.g., based on power from a power source of the aircraft or a power source external to the aircraft that is connected to an electrical system of the aircraft). Additionally, for transitions between any of these modes, circuit protections for the one or more gate drivers may be tested to ensure functionality of the one or more gate drivers, where the mode transition may be enabled or executed at the time of or after determining that the circuit protections of the one or more gate drivers are functioning as expected or intended. Further, in any of these modes and where the initial and final mode of the transition are the same, circuit protections of the gate driver may be tested (e.g., transition 430, transition 432, transition 438, transition 446). Additional transitions where circuit protections may be tested include transition 410 and transition 440.

While FIG. 4B illustrates certain modes, submodes, and transitions, it should be appreciated that there may be other modes, submodes, or transitions or a different number of modes, submodes, or transitions. It may be appreciated that certain conditions may be included based on the modified modes, submodes, or transitions (e.g., different from illustrated in FIG. 4B).

FIGS. 5A, 5B, 5C, and 5D illustrate power associated with modes of an aircraft, consistent with embodiments of the present disclosure. In some embodiments, the mode selection is communicated to a battery management unit (BMU) of each battery pack, which is configured to respond by opening and/or closing one or more switching devices. A BMU may include one or more computers, processors, microprocessors, controllers, and/or associated circuitry. One or more mode selections may be communicated to the BMU by a central charge control unit, flight control system, and/or a different component(s) of the aircraft. Further, in some embodiments, the BMU, FCS, and/or another component may confirm one or more conditions are met prior to switching into a selected mode. After confirmation, the BMU may control one or more switching devices to enable and/or disable certain subsystems. Switching device(s) K1-K7 may include contactor(s), relay(s), transistor(s), controller(s), and/or any other device capable of switching on and off electricity. In some embodiments, K1, K2, K3, K4, K5, K6, and K7 are all contactors. As detailed below, switching devices K2-K7 may control whether battery pack(s) receive a charge from Subsystem 304 including the charging bus. Switching devices K1-K5 may control whether HV power flows to the electric engines, tilt actuators, and/or DC/DC converters. Therefore, the switching devices may enable and/or disable Subsystem 301 including the HV power to electric engines and tilt actuators. Further, the contactors may enable and/or disable Subsystem 302 including the HV power to DC/DC converters for LV distribution.

Further, as shown, each battery pack may include a HV junction box (HVJB) which is electrically connected to the HV loads to provide HV power. Specifically, the power storage element BT1 (e.g., the battery cells connected in parallel and in series) can be used to provide the HV power. The power storage element BT1 is connected to each of the HV loads through pre-charge resistor(s) (e.g., resistor R1 and R7) or current sensing resistor(s) (e.g., resistors R2, R3, R4, R5, R6), switching devices K1-K5 (e.g., HV contactors), and a combination of active and passive fuses (e.g., F1, F2, F3, F4.1, F4.2, F5, F6 F7) to protect against various failure conditions (e.g., overcurrent, short-circuit etc.). In some embodiments, a different configuration of active and passive fuses may protect against failure conditions. For example, a single active fuse may be included on the cross link between battery packs.

Figure 5A:
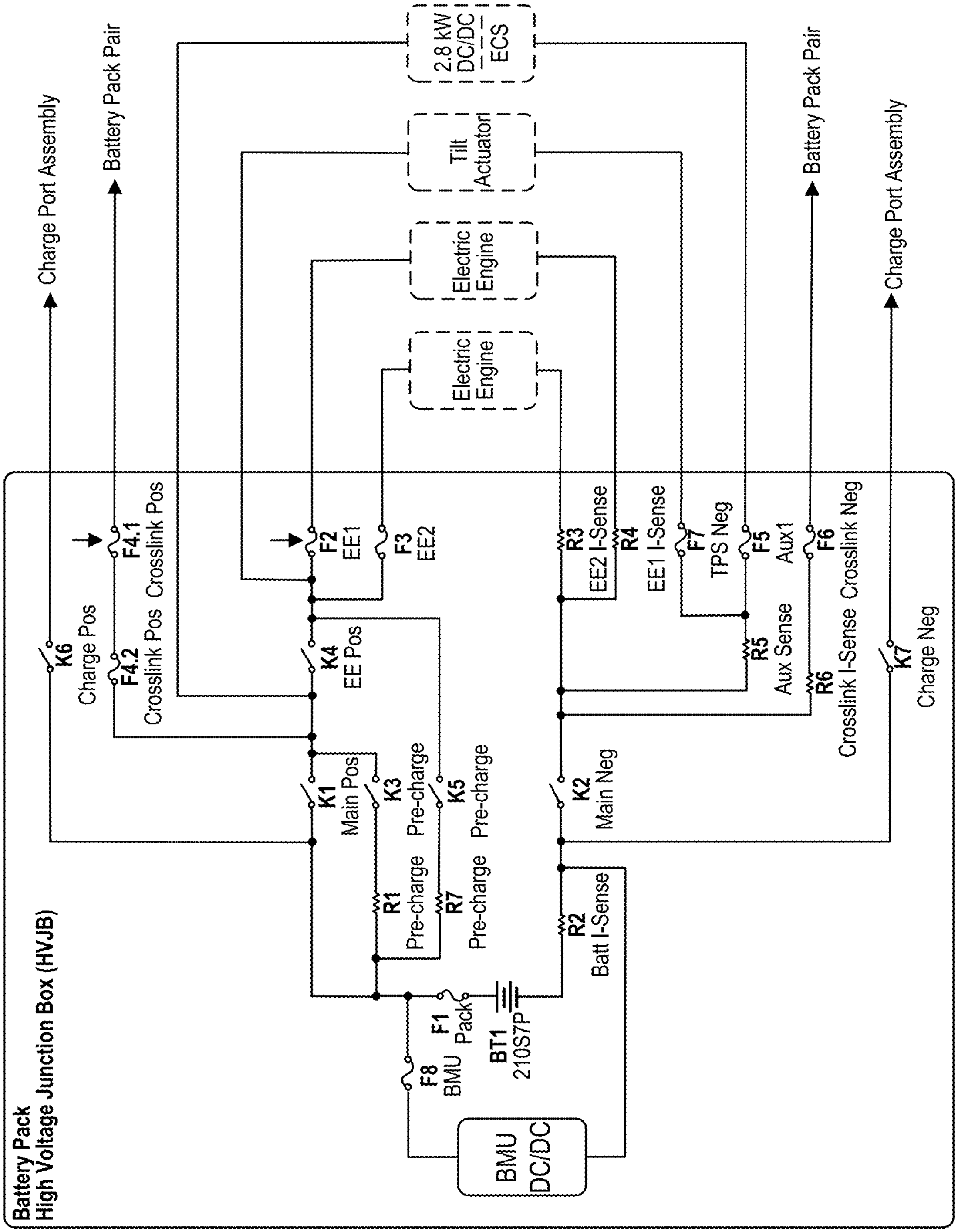
Figure 5B:
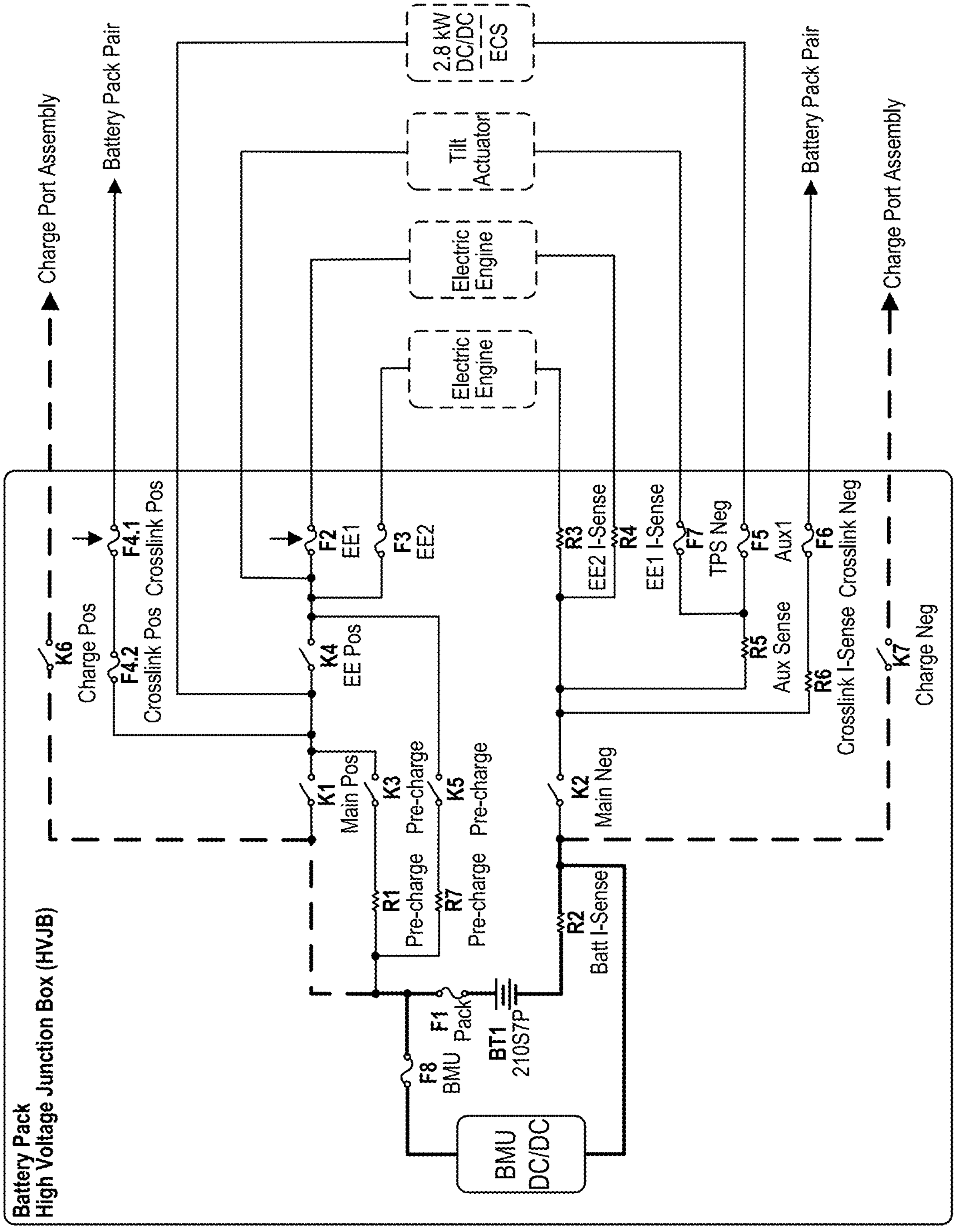

In FIG. 5A, showing an "off" mode (e.g., Off Mode 401 as described in reference to FIGS. 4A-4B), no HV power is provided to the aircraft components. The BMU may command switches K1-K7 open (e.g., active). Further, the BMU is powered by a BMU DC/DC converter, allowing it to periodically wake and monitor cells (V, T, I), estimate HV isolation, perform balancing, and/or detect latch faults. As further described below, FIG. 5A also shows a "service" mode, except that a CCU (not shown) is powered in the service mode through the internal DC/DC converter. FIG. 5B, illustrates that in a "service" mode (e.g., Service Mode 402 as described in reference to FIGS. 4A-4B), charging may be enabled.

Figure 5C:
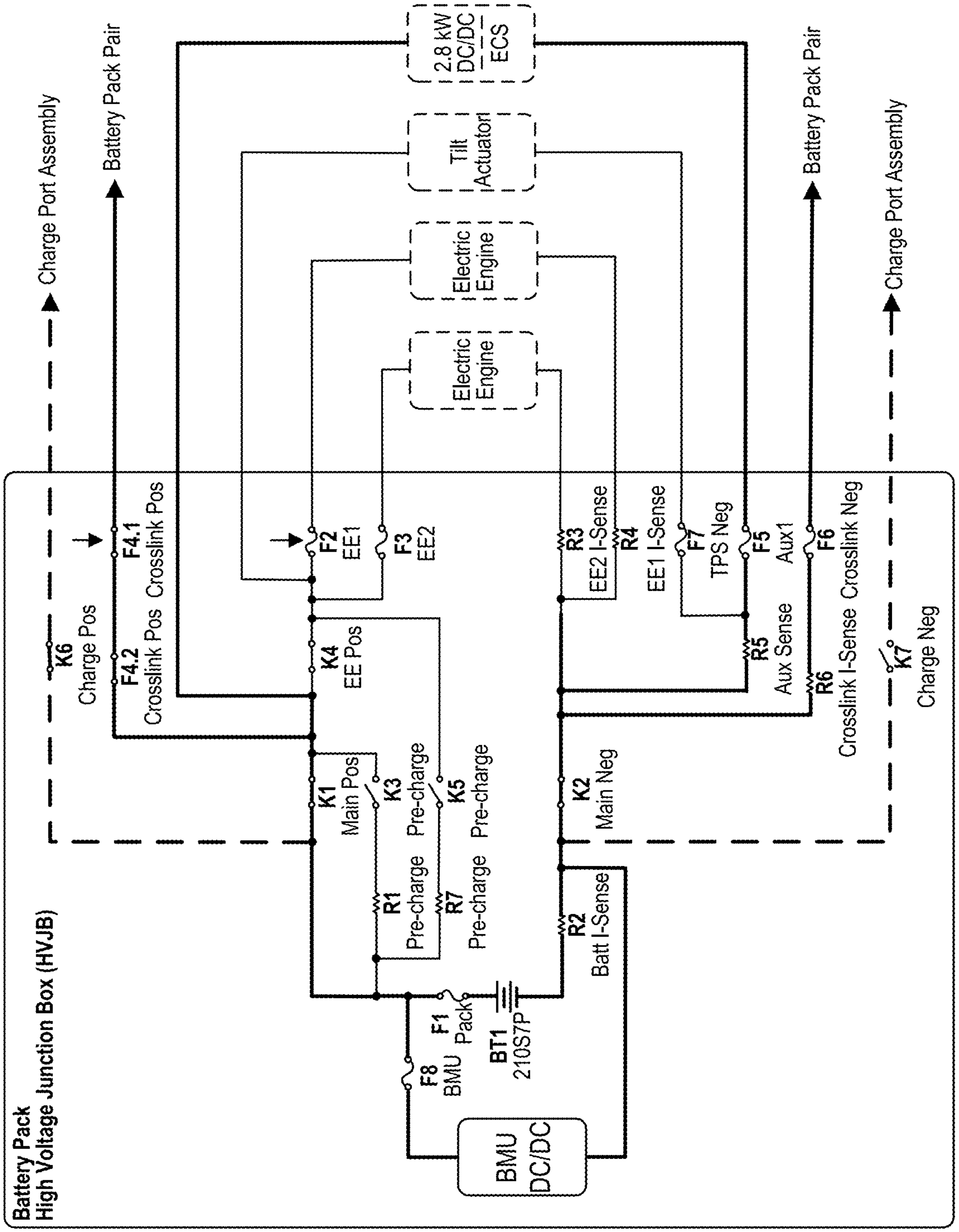

In FIG. 5C, showing a "ground" mode (e.g., Ground Mode 403 as described in reference to FIGS. 4A-4B), HV power is provided to the DC/DC converters and ECS system, allowing for powering of the LV system and environmental control equipment. The BMU may command switching device K3 closed (e.g., deactivated) to allow for pre-charging of the circuit and limit in rush current to DC/DC converters and ECS equipment circuitry. Once the BMU determines that pre-charging is complete (e.g., a set time has elapsed or voltage or stored charge has risen to a threshold level), the BMU will open K3 and close K1 and K2, allowing HV power from the battery pack to feed the DC/DC converter and/or ECS equipment. In some embodiments, by closing K1 and K2, power is also supplied to a cross-link (e.g., cross-link 330) to one or more connected battery packs, thereby providing a backup power supply. Further, the BMU may estimate a HV isolation, publish pack status to the FCS, and/or detect and react to faults in the circuitry.

FIGS. 5B and 5C detail how an exemplary arrangement of circuitry and switches provides flexibility in charging by allowing for auxiliary loads and/or electric engines and actuators to be energized or de-energized in the charging process. For example, as shown in FIG. 5B, in one switch open/closed arrangement, the battery pack may be charged while the remaining HVPS circuitry remains disconnected. Charging switching devices K6 positive and K7 negative may be closed to allow the battery pack to charge. Meanwhile, main switching devices K1 and K2 and pre-charge switching devices K3 and K5 may be open to prevent energizing the remaining HVPS circuitry. Further, as shown in FIG. 5C, in one switch open/closed arrangement, the battery pack may be charged while the auxiliary loads are connected but electric engines and actuators remain disconnected. Charging switching devices K6 positive and K7 negative may be closed to allow the battery pack 320 to charge. Further, main switching devices K1 and K2 may remain closed (after pre-charge) and K4 may remain open. In some embodiments, the BMU may coordinate with a charge control unit (detailed below) to open and close charging switching devices (e.g., K6 positive and/or K7 negative) based on the detected charge level of the battery pack and a desired charge level.

Figure 5D:
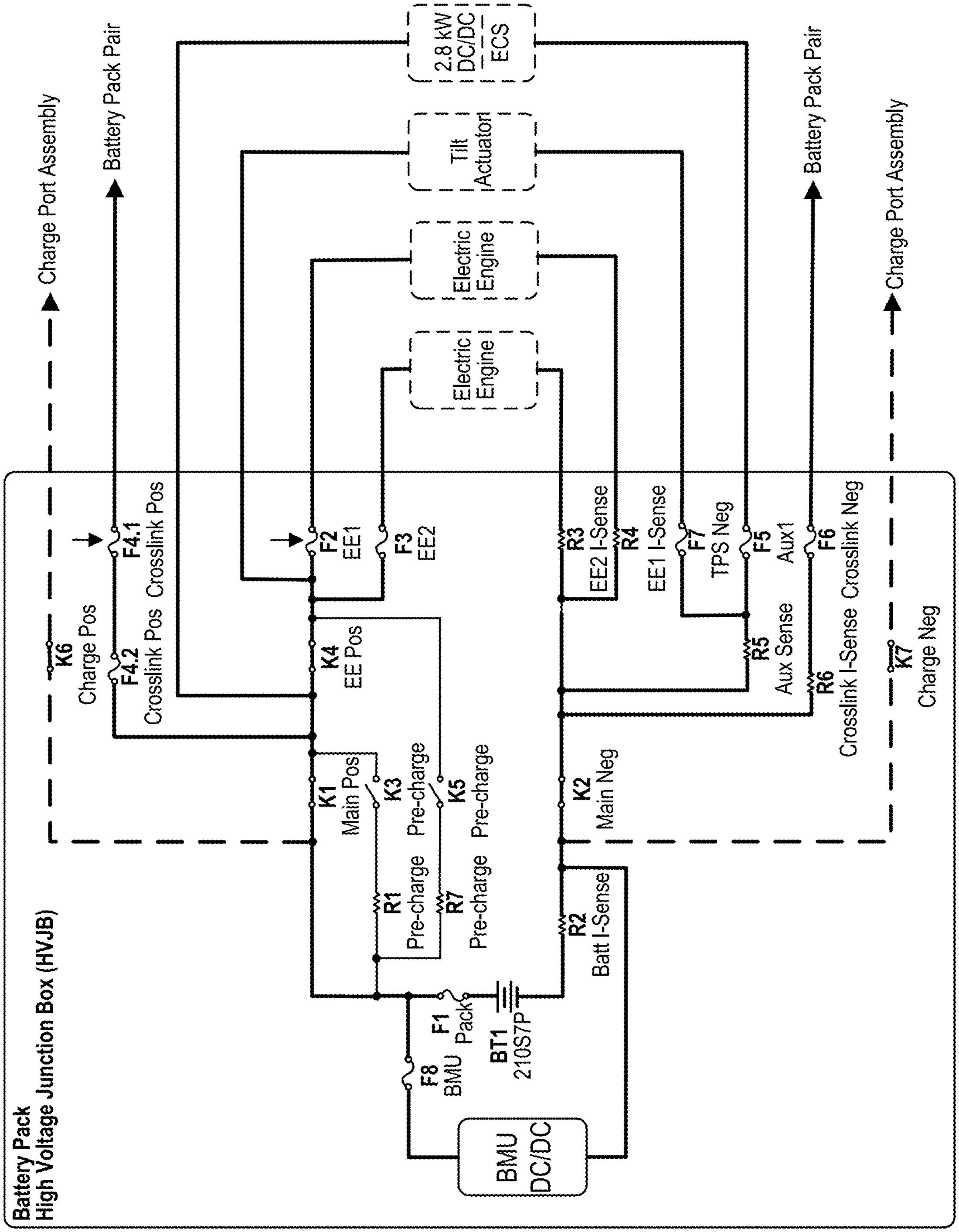

In FIG. 5D, showing a "fly" mode (e.g., Fly Mode 404 as described in reference to FIGS. 4A-4B), HV power is provided to the electric engines and/or tilt actuators. The BMU may command switching device K5 closed, allowing for pre-charging of the electric engines and/or tilt actuators. In some embodiments, once the BMU determines that pre-charging is complete (e.g., a set time has elapsed or voltage or stored charge has risen to a threshold level), the BMU may open K5 and close K4, allowing HV power to feed the electric engines and/or tilt actuators. Further, the BMU may manage the main bus (e.g., detect measurements and react accordingly), estimate HV isolation, and detect faults. In some embodiments, certain fault reactions are inhibited in fly mode. For example, even if a fault is detected (e.g., isolation monitor detects current to ground), switching device(s) will remain closed and power will remain connected.

FIG. 6A illustrates a diagram of aircraft circuitry, consistent with embodiments of the present disclosure. A person (e.g., pilot, technician) may select a desired mode through the mode switch 616. In some embodiments, the mode switch 616 is located on a pilot dashboard and/or panel. In some embodiments, the mode switch 616 may be a device remote from the aircraft. For example, the mode switch 616 may include a transmitter to send a mode selection to the aircraft via a wireless link (e.g., radio link). In some embodiments, mode switch 616 may be a physical switch, knob, button, lever, and/or any mechanical part configured to be moved by a user. In some embodiments, the mode switch 616 requires a force to unlock the lever before changing modes to avoid accidental mode changes. In some embodiments, mode switch 616 may be a user interface element provided on a pilot's display screen or control panel. In some embodiments, mode switch 616 may be a processor that may receive a pilot's manual selection and/or voice command requesting a mode switch. The mode switch 616 may include any means that allows the pilot to select a desired mode of operation. In some embodiments, the mode switch 616 and/or an associated panel (e.g., controller(s), processor(s) etc.) for the mode switch 616 may include physical restraints or logic that provide limits on the mode transition. For example, in some embodiments, the mode switch 616 may include one or more of the following limits: only allow transitions from Off Mode 401 to Service Mode 402, Service Mode 402 to Ground Mode 403, Ground Mode 403 to Fly Mode 404, Fly Mode 404 to Ground Mode 403, Ground Mode 403 to Service Mode 402, and Service Mode 402 to Off Mode 401. Additionally, a mode switch (e.g., mode switch 616, a similar mode switch to mode switch 616, or a separate mode switch) may allow transitions from Service Mode 402 to Service Maintenance Submode 405, Service Maintenance Submode 405 to Service Mode 402, Ground Mode 403 to Ground Maintenance Submode 406, Ground Maintenance Submode 406 to Ground Mode 403, Ground Mode 403 to Ground Fly Check Submode 407, Ground Fly Check Submode 407 to Ground Mode 403, Ground Fly Check Submode 407 to Fly Mode 404, Fly Mode 404 to Fly Ground Check Submode 408, and Fly Ground Check Submode 408 to Ground Mode 403.

In some embodiments, the selected mode is communicated to a switching device in an LV power distribution box 614 (LV PDB). In some embodiments, the switching device is separate from the LV PDB 614. The switching device may be a relay (e.g., single pole, single throw relay), transistor, contractor, controller, or any other device capable of switching power on and off. The switching device may allow power to flow from the battery pack to the CCU 612 (e.g., part of HV Charging Subsystem 610) in Service Mode 402 and Ground Mode 403. In some embodiments, the selected mode is communicated to a System Control Unit (SCU) 622 used to control LV power distribution. For example, in some embodiments, the selected mode may be communicated to the SCU 622 to control LV distribution in Fly Mode 404, in Ground Mode 403, and/or in Service Mode 402 when a ground unit is providing LV power. In some embodiments, the selected mode may also be communicated to FCS 618. In some embodiments, the mode selection is communicated to FCS 618 directly from the mode switch 616. For example, in some embodiments, when the selected mode is Fly Mode 404 the mode switch 616 sends the selected mode to FCS 618 and/or one or more flight control computers. In some embodiments, the mode and/or state selection is communicated to the FCS 618 through the CCU 612 and/or other components. For example, in some embodiments, the CCU 612 and/or other components may communicate the mode and/or state when the aircraft is in Ground Mode 403, LV power is provided by a ground unit, and/or the aircraft is in a maintenance state. In other embodiments, the mode switch 616 sends a signal directly to FCS 618 in all aircraft modes and/or states.

As detailed above with reference to FIGS. 5A-5D, HV distribution 600 may include a combination of switching devices and/or fuses. For example, HV distribution 600 may include main contactors, electric engine contactors, charge contactors, pre-charge relays, pyro-fuses, and thermal fuses. Further, as shown, HV distribution 600 may power a variety of HV loads 608 (e.g., electric engines, LV systems, equipment) and may provide power to one or more paired battery packs 606 (e.g., through a cross-link 330 shown above in FIGS. 3B-3D).

Battery Management Unit (BMU) 602 may monitor the conditions of one or more battery packs and may communicate with various systems within and outside the battery pack. For example, the BMU 602 may receive voltage, current, resistance, and temperature sensing signals from the cell stack assembly (and CMUs 604) and/or HV Distribution 600. In some embodiments, the BMU 602 performs computation of the state of charge (SOC), state of health (SOH), failure condition (e.g., short circuit or overcurrent), state of power (SOP), state of energy (SOE) and state of temperature (SOT) of the battery pack. The BMU 602 also controls and monitors bus pre-charging, provides fuse and contactor commands, and communicates with various systems within and outside the battery pack. In some embodiments, the BMU 602 may communicate with the Flight Control System 618. In some embodiments, the BMU 602 may receive power from the LV System 620, included in Subsystem 303. In some embodiments, BMU 602 may receive power from one or more battery pack cell stacks (e.g., as shown above with reference to FIGS. 5A-5D).

In some embodiments, one or more HV battery packs may power the charge control unit (CCU) 612. In some embodiments, only one HV battery pack may power the CCU 612. In some embodiments, the CCU 612 may have dedicated HV circuitry and a DC/DC converter, separate from the HV circuitry in Subsystem 302 and Subsystem 301. In some embodiments, power may be available for the LV PDB 614, regardless of the aircraft mode. In these embodiments, for example, the CCU 612 may be enabled in Ground Mode 403 and Service Mode 402, even when Subsystem 302, including HV to converters for LV distribution, and Subsystem 303, including the LV distribution system, are disabled. As described above, in some embodiments, instead of CCU 612 a separate controller (e.g., a central battery management unit and/or battery management system) may be powered through the switching device in LV PDB 614 and receive the selected mode. In some embodiments, the separate controller may include multiple controllers for redundancy. The controller(s) may include one or more power connections through switching devices. The controller(s) may perform the communication with and/or control of different components of the aircraft. In some embodiments, the controller(s) may perform any of the functions disclosed as being performed by the CCU and/or BMU.

FIG. 6B illustrates another diagram of aircraft circuitry, consistent with embodiments of the present disclosure. As shown, Subsystem 302 provides HV power to one or more DC/DC converters (e.g., L DCDC 628, C DCDC 630, R DCDC 632, ALTN DCDC 626) to feed Subsystem 303, including LV distribution circuitry and/or components. In some embodiments, one or more of the DC/DC converters may be an alternate DC/DC converter (e.g., 626) which allows for power-up of the aircraft and/or acts as a backup to the other DC/DC converters. In some embodiments, in Ground Mode 403, the one or more alternate DC/DC converter(s) may feed Subsystem 303, including LV distribution circuitry and/or components.

Further, the aircraft may include an LV port assembly 634 allowing for connection between Subsystem 303 and an LV ground power unit (LV GPU 624). In some embodiments, LV port assembly 634 may include one or more switching devices (e.g., relay, contactors, transistors, etc.) that allow for connection of the LV power to Subsystem 303, including LV distribution circuitry and/or components. In some embodiments, LV port assembly 634 may communicate with one or more components (e.g., SCU 632, CCU 612 etc.) upon connection of LV power from LV GPU 624. In some embodiments, the LV GPU 624 may be connected in Service Mode 402 to allow for maintenance of the aircraft (e.g., testing, software loading etc.).

FIG. 6C illustrates a diagram of the mode switch 616, consistent with embodiments of the present disclosure. As described above, the selected mode is communicated to a switching device (e.g., a relay and/or a transistor) in Power Distribution Box 614 and CCU 612. In Ground Mode 403 and Service Mode 402, the switching device in Power Distribution Box 614 is closed. Once the switching device is closed, power may flow from the battery pack and DC/DC converter, powering the CCU 612. Once powered, the CCU 612 receives the selected mode, Ground Mode 403 or Service Mode 402, and communicates with the Battery Management Units 602 according to the selected mode. As described above, in some embodiments, instead of CCU 612 a separate controller (e.g., a central battery management unit and/or battery management system) may be powered through the switching device in LV PDB 614 and receive the selected mode.

FIG. 6D illustrates another diagram of a mode switch 616, consistent with embodiments of the present disclosure. As described above with reference to FIG. 6A, in different modes, different subsystems may be enabled and/or disabled. FIG. 6A schematically illustrates some of the different components that may be communicated with and/or controlled in certain modes. In some embodiments, one or more of these subsystems may be directly enabled and/or disabled by the mode switch 616. In some embodiments, one or more of these subsystems may be enabled and/or disabled by the mode switch 616 communicating with one or more other components. When Off Mode 401 is selected on mode switch 616, the mode switch 616 may communicate with and/or control LV SCU 622 (e.g., directly or through other components) to disable subsystems as described above with reference to FIG. 4A. When Service Mode 402 is selected on mode switch 616, the mode switch 616 may communicate with and/or control LV SCU 622 and/or CCU 612 (e.g., directly or through other components) to enable and/or disable subsystems as described above with reference to FIG. 4A. When Ground Mode 403 is selected on mode switch 616, the mode switch 616 may communicate with and/or control LV SCU 622, CCU 612, and/or power distribution box(es) (e.g. directly or through other components) to enable and/or disable subsystems as described above with reference to FIG. 4A. When Fly Mode 404 is selected on mode switch 616, the mode switch 616 may communicate with and/or control LV SCU 622, FCS 618 and/or power distribution box(es) (e.g. directly or through other components) to enable and/or disable subsystems as described above with reference to FIG. 4A. As described above, in some embodiments, instead of CCU 612, a separate controller (e.g., a central battery management unit and/or battery management system) may receive the selected mode.

FIG. 7 illustrates exemplary checks for switching between aircraft modes that enable and disable electric propulsion units (EPUs), consistent with embodiments of the present disclosure. As further detailed below, in some mode and/or state transitions controlling subsystems to transition to the new mode or state may only be permitted after (e.g., based on) certain conditions being met. These checks may be particularly important when the transition causes power to be enabled or disabled to EPUs, such as electric engines and/or tilt actuators. For example, EPUs may be enabled when a user selects a transition to a Fly Mode 404 and/or when a user selects testing in Ground Mode 403 (e.g., commanding testing of electric engines and/or tilt actuators).

Box 707 includes exemplary predefined conditions for powering EPUs (e.g., electric engines and/or tilt actuators), such as when transitioning to fly mode and/or performing testing in ground mode. For example, in some embodiments, flight control system (FCS) 618 (or another system) may receive a selection of “fly mode” from mode switch 616 (e.g., as detailed above with reference to FIG. 3A). Similarly, in some embodiments, flight control system (FCS) 618 (or another system) may receive an indication that the aircraft is performing testing (e.g., in Ground Mode 403). For example, a testing state may be indicated from (e.g., received from, requested from) a ground station 711 through command and control link 709 and/or through a separate maintenance device (e.g., maintenance switch or panel). The maintenance device may include a user interface element provided to the pilot on a display screen or control panel. In some embodiments, the maintenance device allows for a selection of which EPUs (e.g., electric engines) are to be tested.

In some embodiments, FCS 618 may not send a signal to close contactors to EPUs until it has determined certain conditions are met (e.g., one or more of the four conditions shown in box 707). For example, FCS 618 may determine certain conditions are met before sending a signal (e.g., airborne discrete signal and/or airborne interlock signal) to close contactors to electric engines and/or tilt actuators.

A first condition may include determining that a command and control radio link 709 is functioning as intended (e.g., is functional and/or satisfies one or more predetermined performance metrics). A command and control radio link 709 may be a communicative link that provides flight information to the aircraft and/or receives information from the aircraft. For example, command and control radio link 709 may provide a flight plan and/or flight control commands to the aircraft (e.g., a flight path, maneuver commands, command to return to landing pad, etc.). Further, command and control radio link 709 may provide aircraft status information to ground station 711, which may include one or more computers, processors, receivers, and/or transmitters. For example, command and control radio link 709 may provide an aircraft location, phase of flight, energy status, and/or aircraft issues (e.g., one or more indications of at least one aircraft component malfunctioning or functioning below an expected operational threshold) to ground station 711. Determining that the command and control radio link 709 is functioning as intended may involve verifying that a radio signal is received (e.g., a test signal) from ground station 711 and/or verifying that a ground station 711 receives a signal from FCS 618.

Additionally, or alternatively, FCS 618 may determine if a link is functioning as intended based on at least one of a latency, signal strength, signal distortion, and/or noise level. In some embodiments, such as when the aircraft is switched to a testing state, FCS 618 will determine that the first condition is not required via one or more flight control computers.

A second condition may include determining that a discharge requirement of EPUs (e.g., electric engines) is complete and/or the discharge is complete. For example, a discharge HV command 715 may be issued based on a transition from a mode or state where electric engines are powered by HV battery packs to a different mode or state where the electric engines are unpowered. For example, a discharge HV command 715 may issue (e.g., from a flight control computer) based on a transition from fly mode to ground mode. A discharge HV command 715 may also be issued (e.g., from a flight control computer) on the completion of EPU testing in ground mode. The discharge HV command 715 may instruct the EPUs (e.g., electric engines) to discharge associated capacitors. In some embodiments, such as after issuing the command, FCS 618 may start a timer set for a time associated with a length of discharge (e.g., determined through modeling or experimentation). FCS 618 may prohibit powering of EPUs until the time has expired, indicating the discharge of EPUs (e.g., electric engines) is complete.

Additionally, or alternatively, after issuing the discharge HV command 715, FCS 618 may monitor the discharge status of the EPUs to determine when discharge is complete and/or when a discharge requirement is met. For example, FCS 618 may receive a voltage level associated with the capacitor(s) of each electric engine (e.g., a voltage level measured across two points of circuitry of an engine) and monitor whether the discharge has dropped to the capacitor(s) voltage to zero and/or below a threshold voltage level requirement. FCS 618 may prohibit powering of EPUs until the discharge status indicates that each EPU has completed discharge.

Further, FCS 618 may monitor a fault status of the discharge operation. For example, a controller and/or a battery management unit of an associated battery pack may provide a notice to FCS 618 upon detecting an electrical issue and/or detecting that the discharge is not proceeding as expected (e.g., voltage is not dropping). FCS 618 (or another system) may provide a notice indicating the issue to a ground control station (e.g., ground station 711), flight avionics, and/or a display device on or communicably connected to the aircraft.

In some embodiments, all EPUs (e.g., electric engines) must be determined to have completed discharge prior to powering EPUs. In some embodiments, a testing state selection on a maintenance device may indicate which EPUs are being tested and require power. Therefore, in some embodiments, FCS 618 may determine discharge is completed when the EPUs associated with an active testing process have completed discharge.

A third condition may include determining that no particular EPU (e.g., electric engine) commands exist (e.g., are active). In some embodiments, the FCS 618 may determine a particular command (e.g., a command of a plurality of particular commands) exists if the FCS 618 is providing (e.g., has activated) a command (e.g., by searching code, by searching executed or queued commands) to any EPUs other than off or standby. A particular command may be associated with an EPU warning indicator. For example, a particular command (e.g., during a particular mode) may include any command that drives the EPUs (e.g., a torque command, run engine command etc.). In some embodiments, FCS 618 confirms no existing EPUs have particular commands prior to providing power to EPUs. In some embodiments, a testing state selection on a maintenance device may indicate which EPUs are being tested and require power. Therefore, in some embodiments, FCS 618 may determine there are no particular commands when there are no particular commands to the EPUs associated with an active testing process.

A fourth condition may include determining whether a flight termination system radio link 710 is functioning as intended (e.g., is functional and/or satisfies one or more predetermined performance metrics). A flight termination system radio link 710 may be a communication link that provides a signal to the aircraft, where the signal is configured to terminate a flight (e.g., a signal that disables power or initiates a landing procedure for the aircraft). For example, the flight termination system radio link 710 may act as an emergency communication link for the aircraft. In some embodiments, a separate transmitter and/or receiver may be used for each of the flight termination system radio link 710 and the command and control radio link 709. In some embodiments, a separate ground station 711 may be used for each of the flight termination system radio link 710 and the command and control radio link 709. Further, the radio signals transmitted on the flight termination system radio link 710 may use a different frequency than those transmitted on command and control radio link 709. The flight termination system radio link 710 may allow an operator to land the aircraft and/or shut off power to the aircraft (e.g., in case of an emergency). For example, an operator may issue a command to land the aircraft and/or shut off power to the aircraft when an aircraft stops responding to control commands and/or begins to fly outside of a designated testing area. Determining that the flight termination system radio link 710 is functioning as intended may involve verifying that FCS 618 receives a radio signal (e.g., a test signal) from ground station 711. Additionally, or alternatively, FCS 618 may determine the link is functioning as intended based on at least one of a latency, signal strength, signal distortion, and/or noise level. In some embodiments, this fourth condition may not be required. For example, a user may make a selection on ground station 711 and/or via another user device communicably connected to FCS 618 indicating that the flight termination system radio link 710 is not necessary (e.g., in regular unrestricted flight).

In some embodiments, each flight control computer (e.g., flight control computers 1-4) may determine whether the conditions for powering EPUs are met. Based on (e.g., in response to or after) the conditions being met, each flight control computer (FCC) may send a signal (e.g., airborne discrete signals 1-4) to a voting component (e.g., airborne discrete voting component) and/or BMU(s). In some embodiments, airborne discrete signal voting component 712 may determine the requirements for powering the EPUs are satisfied based on determining that each flight control computer verifies the conditions of box 707 are met. In some embodiments, a monitoring system may monitor one or more flight control computers. In some embodiments, flight control computers may monitor each other. Monitoring may involve detecting an issue when the computer and/or associated control logic is malfunctioning (e.g., is not transmitting valid commands or executions, is not satisfying one or more predetermined performance metrics, is not functioning). If an issue is detected in monitoring, the faulty flight control computer may be disabled (e.g., by the monitoring system) from sending a command to airborne discrete signal voting component 712 (e.g., disabling via hardware or software). Therefore, airborne discrete signal voting component 712 may determine conditions for powering EPUs are met when the remaining non-faulty flight control computers provide a fly mode signal (e.g., airborne discrete signal).

In some embodiments, airborne discrete signal voting component 712 may provide a signal to battery management units (BMUs) indicating EPUs may be powered (e.g., voted airborne interlock signal). In some embodiments, this signal may be provided to a central battery management unit and/or battery management system that controls multiple or all battery packs of the aircraft. In some embodiments, this signal may be provided to each battery management unit associated with an individual battery packs (e.g., battery management units 1-4), such as the battery management units associated with the EPUs being tested.

The battery management unit(s) may receive a signal indicating EPUs may be powered (e.g., airborne interlock signal) over CAN line 716. For example, one or more flight control computers may determine the box 707 conditions are satisfied. In some embodiments, a single flight control computer determines whether the conditions are satisfied and provides the signal. As described above, the flight control computer(s) may be monitored for faults and signals from faulty computers may be disabled.

The battery management unit(s) may determine EPUs may be powered based on detecting both the signal over CAN line 716 and the signal from airborne discrete voting component 712 indicate EPUs may be powered. The battery management unit(s) may close switching devices and provide power to the EPUs (e.g., via electric engine inverters).

In some embodiments, based on determining the EPUs may be powered and closing the switching devices, BMU(s) may prohibit commands that disable power to EPUs (e.g., electric engines). For example, the battery management unit(s) will prohibit opening associated engine contactors until a non-airborne signal is received over CAN line 716 and/or from airborne discrete voting component 712. In some embodiments, as shown in Step 713, the BMU(s) will not allow power to be removed from EPUs (e.g., via opening switching devices) unless both the signal over CAN line 716 and airborne discrete voting component 712 indicate power may be removed from EPUs.

As described above, each flight control computer may send a signal indicating the flight mode requires de-powering of the EPUs based on a user selection. For example, a mode selection may switch from a Fly Mode 404 to a Ground Mode 403 or a testing selection (e.g., on a maintenance device) may indicate one or more EPUs are no longer being tested. Each flight control computer may send a signal (e.g., airborne discrete signals 1-4) indicating EPUs may be (e.g., should be) de-powered to a voting component (e.g., airborne discrete voting component 712) and/or BMU(s) based on the selection. Additionally, one or more flight control computers send a signal over CAN line 716 based on the selection. In some embodiments, as described above, a monitoring system detects whether there is an issue and prevents faulty commands. Further, in some embodiments, the flight control computers may determine whether other conditions are met prior to providing signals over CAN line 716 and/or to airborne discrete voting component 712 indicating EPUs are to be de-powered. For example, the flight control computers may determine whether aircraft sensor information indicates the aircraft is on the ground (e.g., wheel pressure sensor indicates the aircraft is on the ground).

In some embodiments, FCS 618 may determine that a switch to power or de-power one or more EPUs may not be made. For example, FCS 618 may determine that certain conditions are not met and/or there is a discrepancy between flight control computers on whether one or more conditions are met. In response to this determination, FCS 618 may provide a notice indicating the switch may not be made. In some embodiments, FCS 618 may indicate the conditions that are not met and/or the flight control computers that are in disagreement. In some embodiments, FCS 618 may provide the notice to a device that requested the selection. For example, the notice may be provided to the maintenance device when a testing selection cannot be made, and the notice may be provided to a display panel associated with the mode switch 616 when a mode switch selection cannot be made.

FIG. 8 illustrates an exemplary flight control architecture, consistent with embodiments of the present disclosure. The flight control architecture may be configured for controlling EPUs, control surfaces, and associated actuators (e.g., configured for controlling aircraft effectors). Although FIG. 8 illustrates twelve EPU inverters 801 and associated propeller blades, six tilt propeller actuators (TPACs) 802, six battery management systems (BMSs) 803, four flaperons 804 and associated control surface actuators (CSAs), and six ruddervators 805 and associated CSAs, aircraft according to various embodiments can have any suitable number of these various elements. As shown in FIG. 8, control surfaces and actuators may be controlled by a combination of four flight control computers (FCCs)—Left FCC, Lane A (L FCC-A) 806, Left FCC, Lane B (L FCC-B) 807, Right FCC, Lane A (R FCC-A) 808, and Right FCC, Lane A (R FCC-B) 809, although any other suitable number of FCCs may be utilized. The FCCs may each individually control all control surfaces and actuators or may do so in any combination with each other. In some embodiments, each FCC may include one or more hardware computing processors. In some embodiments, each FCC may utilize a single-threaded computing process or a multi-threaded computing process to perform the computations required to control the control surfaces and actuators. In some embodiments, all computing process required to control the control surfaces and actuators may be performed on a single computing thread by a single flight control computer.

The FCCs 806-809 may provide control signals to the control surface actuators, including the EPU inverters 801, TPACs 802, BMSs 803, flaperon CSAs 804, and ruddervator CSAs 805, via one or more bus systems. For different control surface actuators, the FCC may provide control signals, such as voltage or current control signals, and control information may be encoded in the control signals in binary, digital, or analog form. In some embodiments, the bus systems may each be a CAN bus system, e.g., Left CAN bus 1 810, Left CAN bus 2 811, Right CAN bus 1 814, Right CAN bus 2 815, Center CAN bus 1 812, Center CAN bus 2 813 (see FIG. 8). In some embodiments, multiple FCCs (e.g., FCCs 806, 807, 808, and/or 809) may be configured to provide control signals via each CAN bus system (CAN Buses 810-815), and each FCC (FCCs 806-809) may be configured to provide control signals via multiple CAN bus systems (CAN Bus 810, 811, 812, 813, 814, and/or 815). In the exemplary architecture illustrated in FIG. 8, for example, L FCC-A 806 may provide control signals via Left CAN bus 1 810 and Right CAN bus 1 814, L FCC-B 807 may provide control signals via Left CAN bus 1 810 and Center CAN bus 1 812, R FCC-A 808 may provide control signals via Center CAN bus 2 813 and Right CAN bus 2 815, and R FCC-B 809 may provide control signals via Left CAN bus 2 811 and Right CAN bus 2 815.

FIG. 8 may illustrate an exemplary flight control architecture that may implement modes and states (e.g., as illustrated and described in reference to FIG. 4A). Additionally, FIG. 8 may illustrate an exemplary flight control architecture that may implement transitions between modes and states, where transitions may be based on one or more conditions (e.g., as illustrated and described in reference to FIG. 4B).

FIG. 8 may illustrate an exemplary flight control architecture that may be configured to implement a process for controlling aircraft power distribution based on mode transitions (e.g., as further described in reference to FIG. 14). For example, FIG. 8 may be configured to check one or more conditions or transition between modes based on determining that one or more conditions are satisfied (e.g., as described in reference to FIG. 4B and FIG. 7, as further described in reference to FIG. 14).

FIG. 8 may illustrate an exemplary flight control architecture that may be configured to implement a process for controlling aircraft power distribution based on a temperature of an EPU (e.g., as further described in reference to FIG. 10). Additionally, the exemplary flight control architecture may be configured to modify the temperature of the EPU (e.g., as further described in reference to FIG. 10).

FIG. 8 may illustrate an exemplary flight control architecture that may be configured to implement a process for controlling aircraft power based on a measured output of a control circuit based on (e.g., responsive to) an input or automatic control of an aircraft effector (e.g., as further described in reference to FIG. 11 and FIG. 12). For example, a pilot or operator may manually input control commands into a user input device (e.g., a pilot input device, sticks, or inceptor) as part of a pre-flight check of an aircraft control system (e.g., while aircraft effectors are disabled), and at the time of or after satisfying the pre-flight check, the aircraft power may be controlled or modified (e.g., as further described in reference to FIG. 11). As another example, pilot or operator control of aircraft effectors may be disabled while automatic control commands may control the aircraft effectors as part of a pre-flight check of the aircraft effectors, and at the time of or after satisfying the pre-flight check, the aircraft power may be controlled or modified (e.g., as further described in reference to FIG. 12).

As a further example (e.g., as further described in reference to FIGS. 11-12), the pre-flight check of the aircraft control system based on pilot or operator manual inputs may be conducted while the aircraft effectors are disabled (e.g., HV power to aircraft effectors disabled), and at the time of or after satisfying the pre-flight check pilot or operator input may be disabled and aircraft effectors may be enabled (e.g., HV power to aircraft effectors enabled). At the time of or after disabling pilot or operator input and enabling the aircraft effectors, the pre-flight check of aircraft effectors may be conducted, and at the time of or after satisfying the pre-flight check of aircraft actuators, the aircraft effectors may be enabled for flight operations (e.g., propulsive operation, takeoff, flight).

FIG. 8 may illustrate an exemplary flight control architecture that may be configured to implement a process for disconnecting an EPU based on a selection of an aircraft mode of operation (e.g., as further described in reference to FIG. 13). For example, the exemplary flight control architecture may be configured to control the disconnection of an HV electrical component and the discharge of an HV electrical component, where the discharge may be based on active discharge or passive discharge methods.

FIG. 9A illustrates a block diagram of an exemplary system 900 for testing protections of a circuit, consistent with disclosed embodiments. System 900 may include at least one processor (e.g., at least one microprocessor-based controller, processor 902) configured to execute software code stored in a storage medium (e.g., a computer-readable medium, a non-transitory computer readable medium) to implement the processes described herein (e.g., process for testing protections of a circuit, process 1600 as described in reference to FIG. 16).

System 900 may include power supply controller (PSC) 904, which may be configured to receive signals transmitted from processor 902. System 900 may include power supply 906, which may be communicatively coupled to PSC 904. System 900 may include gate driver 908 and transistor 910, which may be communicatively coupled to each other. For example, gate driver 908 may be configured to determine and transmit a signal to control the gate of transistor 910. Additionally, gate driver 908 may be communicatively coupled to processor 902 and may receive power from power supply 906. Transistor 910 may be a field-effect transistor (FET), such as a metal-oxide-semiconductor field-effect transistor (MOSFET), an insulated-gate bipolar transistor (IGBT), or any solid-state switching device.

In addition to supplying power to gate driver 908, power supply 906 may generate a trigger signal, which may be directed to a node associated with fault signals transmitted from transistor 910 and received by gate driver 908. The trigger signal may be modified by signal conditioning or processing components. For example, as illustrated in FIG. 9A, system 900 may include comparator 912 or amplifier 914, where the trigger signal generated by power supply 906 may be modified by amplifier 914, and the modified trigger signal may be compared to reference voltage source 916 by comparator 912. The modified trigger signal output from comparator 912 may be combined with one or more fault signals output from transistor 910 at node 918, such that the modified trigger signal and the one or more fault signals may be received by gate driver 908.

System 900 may include low-voltage (LV) side 920 and high-voltage (HV) side 922, which may be isolated by voltage isolation barrier 924. As illustrated in FIG. 9A, processor 902 and PSC 904 may be included on LV side 920. Power supply 906 and gate driver 908 may cross over voltage isolation barrier 924 and be included on both LV side 920 and HV side 922. Transistor 910, comparator 912, amplifier 914, and reference voltage source 916 may be included on HV side 922.

As further described in reference to FIG. 9B, in some embodiments, system 900 may be included as part of or connected to an inverter of an aircraft (e.g., an inverter associated with an EPU of the aircraft). Additionally, multiple of system 900 may be included in an inverter of an aircraft (e.g., an inverter associated with an EPU of the aircraft). Further, an aircraft may include multiple EPUs, where each EPU may be associated with at least one inverter (e.g., one inverter, two inverters), and each of these inverters may include one or more of system 900. For example, an inverter may include multiple transistors 910, which may be tested using the methods and components discussed herein.

System 900 may be configured for testing protections of a circuit, which may include testing protections of an integrated circuit. The testing of circuit protections may be conducted based on the selection of an aircraft mode of operation (e.g., by mode switch 616 as described in reference to FIGS. 6A-6D, step 1002 receiving a selection of one of at least two aircraft modes of operation as described in reference to FIGS. 10-15). The selection of an aircraft mode of operation may cause a mode transition, which may be associated with one or more conditions for transitioning (e.g., from a current aircraft mode of operation to a selected aircraft mode of operation, as described in reference to FIGS. 4A-4B).

Testing protections of a circuit (e.g., as described in reference to FIGS. 9A-9B and FIG. 16) may be conducted in an aircraft mode of operation in which the components illustrated and described in reference to FIG. 9A may receive power (e.g., from a power source of the aircraft, from a ground-based power source or a power source outside of the aircraft). The testing of circuit protection may not be conducted in a fly mode of operation (e.g., fly mode 404 of FIGS. 4A-4B) or while the aircraft is not on-ground (e.g., does not indicate an on-ground status). The testing of circuit protections may occur in certain aircraft modes of operation and/or during particular transitions between aircraft modes of operation, such as a charging mode, an off mode (e.g., off mode 401 of FIGS. 4A-4B), a service mode (e.g., service mode 402 of FIGS. 4A-4B), a ground mode (e.g., ground mode 403 of FIGS. 4A-4B), a maintenance or testing mode (e.g., service maintenance submode 405, ground maintenance submode 406 of FIG. 4B), or check mode (e.g., ground fly check submode 407, fly ground check submode 408 of FIG. 4B). Additionally, passing one or more tests of circuit protections may be a condition for transitioning between any of these modes. The testing of circuit protections may occur at aircraft start-up (e.g., transition from off mode 401 to another mode, such as transition 410 to ground mode 403 as described and illustrated in reference to FIG. 4B) or in transition to a fly mode of operation (e.g., transition 440 from ground fly check submode 407 to fly mode 404 as described and illustrated in reference to FIG. 4B).

A condition associated with testing circuit protection within an aircraft mode of operation or as a check for a transition between aircraft modes of operation may involve determining that circuit protections of an integrated circuit, such as a gate driver, are functioning as expected or intended (e.g., an indication of a fault signal does not exist before transmitting an input test signal to probe circuit protections, transmitting an input test signal to probe circuit protections results in an indication of a fault signal). A process for testing these circuit protections may be further described in reference to FIG. 16. These circuit protections may be tested for a single gate driver (e.g., gate driver 908) or for multiple gate drivers (e.g., as described and illustrated in reference to FIG. 9B). For example, an inverter (e.g., of an EPU) may be associated with (e.g., include) at least one gate driver, and the at least one gate driver may be tested to ensure the circuit protections of the gate driver are operating as expected or intended. Additionally, an inverter may include multiple gate drivers, and a subset of, or all of, these gate drivers may be tested to ensure functionality of the circuit protections of each gate driver of the subset.

In some embodiments, a processor of the aircraft (e.g., processor 902) may determine whether a gate driver is not experiencing a fault and/or whether a gate driver reports a fault when a fault (e.g., an artificial fault) is injected by an input test signal. For the testing of circuit protections for multiple gate drivers, one or more processors of the aircraft (e.g., processor 902, multiple of processor 902 and system 900) may determine whether each of the multiple gate drivers is not experiencing a fault and/or whether each of the multiple gate drivers reports a fault when a fault is injected by an input test signal. Determining that a gate driver (or multiple gate drivers) is not experiencing a fault and/or that a gate driver (or multiple gate drivers) reports a fault when a fault is injected by an input test signal may be a condition associated with testing protections of a circuit (e.g., a prerequisite before transitioning to/from one or more modes, consistent with disclosed embodiments).

System 900 may be configured for testing protections of a circuit, which may include testing protections of an integrated circuit (e.g., a gate driver). An integrated circuit may refer to a circuit formed on a semiconductor substrate, which may include passive or active electronic components. An integrated circuit may include a specific configuration of, arrangement of, or couplings between electronic components, such that the integrated circuit may perform a certain operation or set of operations (e.g., analog functions, digital logic, memory, power management, RF operations, mixed-signal processing, or any other operations may be executed by an integrated circuit).

An integrated circuit may support communication, control, or other functionality across a voltage isolation barrier (e.g., across voltage isolation barrier 924, between LV side 920 and HV 922). A voltage isolation barrier (e.g., voltage isolation barrier 924) may refer to an electrical or physical boundary (e.g., galvanic isolation, air gap, etc.) that may prevent direct conduction of current between two circuit domains that operate at different voltages. While voltage isolation barrier 924 is depicted as a single barrier, it is appreciated that it may be implemented as multiple individual barriers associated with (e.g., within) different components. The voltage isolation barrier (e.g., voltage isolation barrier 924) may be crossed by certain electrical components (e.g., a controllable coupling mechanism between isolated regions, an integrated circuit, gate driver 908, a power supply, power supply 906), which may allow for signals or power to be transferred in a controlled manner.

"Crossing" an isolation barrier may refer to a component that is configured to engage in electrical activity on both sides of the isolation barrier, such as by receiving a voltage, transmitting a signal, providing current, providing voltage, sensing information, or the like. For an electrical device that crosses over a voltage isolation barrier, such as gate driver 908 or power supply 906 crossing over voltage isolation barrier 924, the electrical device may enable signals, power, or control information to be communicated between two electrically isolated domains, such as LV side 920 and HV side 922. The integrated circuit or electrical system may maintain isolation between the two electrically isolated domains with capacitive isolation barriers (e.g., capacitors), magnetic isolation barriers (e.g., transformers, inductive couplers), packaging features, or any other method of maintaining isolation between the two electrically isolated domains, while enabling controllable communication or coupling across the voltage isolation barrier.

A gate driver (e.g., gate driver 908) may refer to an electronic circuit or integrated circuit that may provide a controlled voltage or current to the gate of a switching device (e.g., a transistor 910), such that the switching device may be turned on and off. A gate driver may serve as or include an interface, which may enable the coupling of control signals (e.g., generated or transmitted by processor 902) to the gate of the switching device (e.g., transistor 910). A gate driver (e.g., gate driver 908) may be configured to perform functionalities, such as voltage or current amplification (e.g., to convert control signals to gate voltage levels for switching a switching device, which may have different voltage requirements or characteristics), a switching time (e.g., the time or frequency for switching the switching device between an on-state and an off-state and/or an associated waveform), an isolation capability (e.g., crossing over a voltage isolation barrier, a maximum voltage differential that an isolation barrier can sustain), protection functions (e.g., undervoltage protections, desaturation protections, overcurrent limits, thermal shutdown, overvoltage protections), or any other functionality that enables providing a controlled voltage or current to a switching device.

For example, as illustrated in FIG. 9A, gate driver 908 may be configured to receive control signals from processor 902, which may be received at an interface of gate driver 908 on LV side 920 of voltage isolation barrier 924. The control signals received from processor 902 may include digital signals or pulse-width modulation (PWM) signals. Additionally, gate driver 908 may receive power from power supply 906, and gate driver 908 may transmit signals to transistor 910 (e.g., for modifying the gate of the switching device or the behavior of the switching device). Gate driver 908 may receive signals from power supply 906 or transmit signals to transistor 910 on HV side 922 of voltage isolation barrier 924.

Gate driver 908 may be further configured to receive fault signals (e.g., an indication of whether a fault has occurred), which may originate from transistor 910 (e.g., transmitted from transistor 910 and passes through node 918) or may be a trigger signal that originates from power supply 906 (e.g., trigger signal may be transmitted from power supply 906 to node 918, trigger signal may be transmitted from power supply 906 to amplifier 914 and then be modified by amplifier 914 or comparator 912 before reaching node 918). Gate driver 908 may be configured to receive fault signals on HV side 922 of voltage isolation barrier 924.

A fault signal may refer to an electrical signal generated by a device, circuit, or monitoring system that indicates whether an abnormal or threshold-exceeding condition is present for a component, device, or system. A fault signal may be used to trigger a protective action, such as a shutdown, a voltage limit, a current limit, a temperature limit, a power limit, a prevention of a mode transition, or an alert to a processor, controller, system (e.g., FCS 618 of FIGS. 6A, 6D-8), or user. A fault signal or an indication of a fault signal (e.g., the presence of a fault signal at an interface of gate driver 908) may be communicated across a voltage isolation barrier (e.g., across voltage isolation barrier 924, from HV side 922 to LV side 920). A fault signal may be a digital signal or an analog signal. A fault signal may include an overcurrent or undercurrent fault signal (e.g., a current associated with transistor 910 exceeds a current threshold), a desaturation fault signal (e.g., desaturation, transitioning from the saturation region of transistor 910 to the active region of transistor 910, voltage across terminals of transistor 910 is greater than a threshold), an overvoltage or undervoltage fault signal (e.g., a voltage associated with transistor 910 exceeds a voltage threshold), overtemperature fault signal (e.g., transistor 910 exceeds a temperature threshold), or any other fault that may occur that may impact the operation of transistor 910.

Additionally, a fault signal may originate from power supply 906 (e.g., a trigger signal). For instance, in addition to powering gate driver 908, power supply 906 may generate a signal that is transmitted to an interface (e.g., communication interface, pin, or the like) of gate driver 908 that is associated with receiving fault signals from transistor 910 (e.g., the interface coupled to node 918). Power supply 906 may generate signals based on receiving a command or instruction from PSC 904.

A power supply controller (e.g., PSC 904) may refer to a circuit or device that may regulate, command, or otherwise control the operation of a power supply (e.g., power supply 906), which may include controlling switching elements, regulating output conditions, monitoring faults, or maintaining a stable output (e.g., in presence of varying load or input conditions). PSC 904 may transmit commands or instructions to power supply 906, and PSC 904 may receive indications or information pertaining to the operation of power supply 906 (e.g., for monitoring faults or regulating output power, voltage, or current). PSC 904 may manage start-up or shutdown processes of power supply 906 or components receiving power from power supply 906 (e.g., gate driver 908). PSC 904 may be configured to receive feedback from power supply 906, provide timing or synchronization for signals output by power supply 906, or modulate signals output by power supply 906. PSC 904 may be on LV side 920 of voltage isolation barrier 924. Additionally, PSC 904 may be configured to transmit signals to and receive signals from an interface of power supply 906 on LV side 920.

PSC 904 may receive signals from processor 902 that may include commands or instructions, based on which PSC 904 may transmit commands or instructions to power supply 906 for supplying power to gate driver 908 or generating a trigger signal (e.g., to test circuit protections of gate driver 908). For example, processor 902 may transmit an input test signal to PSC 904, which may cause PSC 904 to instruct power supply 906 to generate a trigger signal. The input test signal may initiate a sequence for testing protections of gate driver 908. In some embodiments, prior to outputting an input test signal, processor 902 may check to determine whether gate driver 908 is reporting a fault signal. In some embodiments, if gate driver 908 is reporting a fault signal, processor 902 may not transmit the input test signal to PSC 904 or initiate the testing of circuit protections. In some embodiments, if gate driver 908 is not reporting a fault signal, processor 902 may transmit the input test signal to PSC 904, which may initiate the testing of circuit protections.

For example, in system 900, processor 902 may transmit an input test signal to PSC 904, based on which PSC 904 may transmit a signal to power supply 906 that may cause power supply 906 to output a trigger signal, which may power gate driver 908 and enable the testing of circuit protections of gate driver 908. The testing of circuit protections of gate driver 908 may include power supply 906 transmitting the same signal to gate driver 908 and to signal modification circuitry (e.g., circuitry configured to modify the signal transmitted from power supply 906). The signal modification circuitry may include amplifier 914, which may be configured to modify (e.g., increase) a magnitude of the input signal (e.g., the signal transmitted from power supply 906), which may include modifying the voltage of the input signal. An amplifier may increase signal magnitude (e.g., by a fixed or variable gain, by a fixed or variable amplification factor) of an input signal (e.g., analog, digital), which may include preserving signal characteristics (e.g., frequency, shape, or information carried by a signal, such as a trigger signal characteristic). The output of the amplifier (e.g., modified signal originating from power supply 906 that has been modified by amplifier 914) may be input to comparator 912.

A comparator may refer to an electronic device that may compare to input electrical signals, where the comparator may be configured to produce an output based on the input signal with the greater voltage. For example, as shown in FIG. 9A, the output of amplifier 914 (e.g., due to the trigger signal originating from power supply 906) may be compared to reference voltage source 916. Reference voltage source 916 may output or be coupled to a reference voltage, such that comparator 912 receives a reference voltage.

In some embodiments, the output of comparator 912 may be configured to indicate or replicate a fault signal (e.g., similar to a fault signal that may be output from transistor 910, a signal that may be interpreted as a fault signal by gate driver 908) when the output voltage of amplifier 914 is greater than the reference voltage of reference voltage source 916. Additionally, in some embodiments, the output of comparator 912 may be configured to not indicate or replicate a fault signal (e.g., such that gate driver 908 does not interpret the output of comparator 912 as a fault signal) when the output voltage of amplifier 914 is less than the reference voltage of reference voltage source 916.

In some embodiments, comparator 912 is configured as a non-inverting comparator, while in other embodiments, comparator 912 may be configured as an inverting comparator or in another comparator configuration (e.g., a configuration with multiple comparators, a window comparator configuration). As illustrated in FIG. 9A, for a non-inverting comparator configuration, when the reference voltage from reference voltage source 916 is higher than the output of amplifier 914, the output of comparator may be low relative to when the reference voltage from reference voltage source 916 is lower than the output of amplifier 914.

The fault signals originating from transistor 910 or the trigger signals originating from power supply 906 (e.g., signals originating from power supply 906 that are modified by amplifier 914 or comparator 912, which may also power gate driver 908) may be transmitted to node 918. At node 918, these signals (e.g., originating from transistor 910 or power supply 906) may be output or transmitted to an interface of gate driver 908 (e.g., the same interface of gate driver 908). This output or transmission may involve summing, mixing, or otherwise combining (e.g., superposition) the signals received at node 918 (e.g., output from transistor 910 or comparator 912, originating from power supply 906). As an example, an output of comparator 912 may be transmitted and pass through node 918, such that the signal may be transmitted to an interface of gate driver 908. This interface may be configured to receive fault signals, and gate driver 908 may interpret the received signal as a fault signal. Additionally, transistor 910 may output a fault signal to node 918, which may pass through node 918, such that the fault signal may be transmitted to an interface of gate driver 908.

Gate driver 908 may be further configured to transmit an indication of whether a fault signal was received at the interface associated with receiving fault signals (e.g., coupled to node 918 and/or dedicated to receiving fault signals). The fault signal or indication that a fault signal was received by the gate driver may cross over a voltage isolation barrier (e.g., voltage isolation barrier 924, from HV side 922 to LV side 920). The transmission of a fault signal or indication associated with a fault signal may include transmission across an isolation element (e.g., a coupler, transformer, capacitive isolator, magnetic isolator). For instance, a digital signal or logical signal may be transmitted from an interface of gate driver 908 on HV side 922 to an interface of gate driver 908 on LV side 920, which may include crossing voltage isolation barrier 924 via an isolation element.

Processor 902 may receive an indication of the presence of a fault signal at an interface of gate driver 908 (e.g., an interface of gate driver 908 on HV side 922). Based on receiving the indication of the presence of a fault signal, processor 902 may determine that a gate driver is experiencing a fault (e.g., processor 902 is configured to determine whether a gate driver is experiencing a fault), determine whether to transmit an input test signal to PSC 904, determine an aircraft response to a fault (e.g., a shutdown, an alert, further testing, reporting fault condition to a system of an aircraft), determine whether a condition is satisfied for a mode transition, and/or transmit information to a memory or system of the aircraft (e.g., indicating a possibility for further processing, testing, or determining aircraft safety or capabilities).

FIG. 9B illustrates a block diagram of an exemplary system 901 for testing protections for a plurality of gate drivers associated with an EPU, consistent with disclosed embodiments. System 901 may be configured for testing protections of a circuit of one or more gate drivers (e.g., a gate driver of a subset of system 900-1 through system 900-12, each gate driver associated with system 900-1 through system 900-12). Each of system 900-1, 900-2, 900-3, 900-4, 900-05, 900-06, 900-07, 900-8, 900-09, 900-10, 900-11, and 900-12 may be similar to system 900 as described and illustrated in reference to FIG. 9A, where the transistor (e.g., transistor 910) may be included in an inverter (e.g., housed inside an inverter) and may be coupled to an EPU (e.g., of an aircraft, configured to drive an EPU). For example, system 900-1 may include power supply 906-1 (e.g., power supply 906 of system 900, as described in reference to FIG. 9A), gate driver 908-1 (e.g., gate driver 908 of system 900, as described in reference to FIG. 9A), and transistor 910-1 (e.g., transistor 910 of system 900, as described in reference to FIG. 9A). Further, system 900-1 may include a processor (e.g., processor 902 of system 900, as described in reference to FIG. 9A) or a power supply controller (e.g., PSC 904 of system 900, as described in reference to FIG. 9A). Additionally, a processor or power supply controller may be outside of the inverter (e.g., not housed within the inverter, communicatively coupled to electronics of the inverter). In some embodiments, one or more processors may be configured to control multiple gate drivers or power supply controllers, and in some embodiments, a power supply controller may be configured to control multiple power supplies.

System 901 may include electric propulsion unit (EPU) 926, which may be driven by inverter 928-1 and inverter 928-2. Power may be supplied to inverter 928-1 and inverter 928-2 by power source 930. Inverter 928-1 and inverter 928-2 may each include a six transistors, where each transistor is coupled to a gate driver (e.g., gate driver 908 as described in reference to FIG. 9A) and a power supply (e.g., power supply 906 as described in reference to FIG. 9B). As illustrated in FIG. 9B, a transistor and its associated gate driver and power supply (e.g., system 900-1 through system 900-12) may be configured for testing protections of the associated gate driver (e.g., the gate driver's functionality for protecting an associated transistor, similarly to system 900 described in reference to FIG. 9A). System 901 may further include a capacitor (e.g., a smoothing capacitor, capacitor 934-1, capacitor 934-2), which may reduce ripple or fluctuations of power delivered to EPU 926 (e.g., via inverter 928-1 and inverter 928-2, increase stability of power supplied to inverter 928-1 or inverter 928-2). While two inverters are depicted in FIG. 9B and described in other embodiments herein, other numbers of inverters (e.g., one, three, etc.) may be configured to drive an EPU.

An inverter may refer to an electronics system that may convert DC power into AC power, which may involve outputting multi-phase AC power. An inverter may be electrically connected with an EPU, such that the inverter may control or transmit signals that control the speed, torque, of direction of the EPU. For instance, power source 932 may output DC power to inverter 928-1 and inverter 928-2, where inverter 928-1 and inverter 928-2 may convert the DC power from power source 932 into output AC power, which may be supplied to EPU 926 for driving the EPU (e.g., for propulsion of the aircraft, for temperature modification of the EPU). In system 901, each of the components of inverter 928-1 and inverter 928-2 (e.g., those included in system 900-1 through system 900-12) that have a ground connection may be connected to a common ground connection, such that the ground reference (e.g., chassis of an aircraft) for each grounded electrical component of inverter 928-1 and inverter 928-2 may be shared. Further, inverter 928-1 and inverter 928-2 may share a common power source (e.g., power source 930). Capacitor 934-1 may be included across the input terminals of inverter 928-1, and capacitor 934-2 may be included across the input terminals of inverter 928-2, e.g., for the stability (e.g., smoothing of) input power to inverter 928-1 and inverter 928-2.

System 901 may enable the testing of circuit protections for multiple gate drivers (e.g., of an inverter, of one or more inverters, of two inverters) or the testing of circuit protections for multiple gate drivers associated with an EPU. As an aircraft may include multiple EPUs, system 901 may be implemented at multiple EPUs of the aircraft (e.g., all the EPUs of the aircraft), such that each of the gate drivers associated with the inverters or EPUs of the aircraft may be tested or testable to determine the functionality of the circuit protections for each of the gate drivers. System 901 may be configured for testing in one or more aircraft modes of operation (e.g., as described in reference to FIG. 9A, which may include any of the modes or submodes described in reference to FIGS. 4A and 4B). Additionally, system 901 may be configured for testing protections of a circuit for transitions between aircraft modes of operation, which may include one or more conditions that are checked before controlling aircraft power distribution or enabling the mode transition (e.g., as described in reference to FIG. 9A, including transition 410 and transition 440 of FIG. 4B, including transitions that result in staying in the same mode or transitions between any of the modes or submodes depicted in FIGS. 4A and 4B).

FIG. 10 illustrates process 1000 of controlling aircraft power distribution based on a temperature of at least one engine propulsion unit (EPU), consistent with embodiments of the present disclosure. Process 1000 may be implemented as software (e.g., in at least one module, at least one program, at least one application, and/or at least one function, etc.), hardware (e.g., at least one processor, such as an FCC, controller, etc.), or a combination of both. Some embodiments may include at least one processor that is configured to execute operations to perform process 1000. Some embodiments may include a computer-readable medium (e.g., a non-transitory computer-readable medium) that stores instructions executable by at least one processor to perform operations that include the steps of process 1000. The steps of process 1000 may be combined, rearranged, performed simultaneously, removed, and/or repeated. Process 1000 may include step 1002, step 1004, and/or step 1006. Process 1000 may be implemented by a control system including any of the systems, subsystems, devices, or configurations illustrated in FIGS. 3A-8. Actions described as being carried out by the process itself may also be carried out by a medium configured to carry out the process (e.g., a processor, a computer-readable medium, a system, etc.). Unless otherwise indicated, a step in process 1000 may be performed based on (e.g., in response to, based on a result of, upon completion of, etc.) a step that precedes it, whether or not the prior step is part of process 1000 (as processes described herein, and/or portions thereof, may be combined).

Step 1002 may include receiving a selection of one of at least two aircraft modes of operation may refer to obtaining an input identifying an aircraft mode of operation to enter or transition to (e.g., based on a pilot, operator, or user request). The input may indicate a choice between multiple modes (e.g., two or more modes of operation).

The selected aircraft mode of operation may be received by or from a user input device, such as a switch, a knob, a button, a lever, a display screen element, a voice receiver, or any other user input device that may be configured to receive a selection of two or more different states (e.g., aircraft modes of operation). For example, receiving a selection of one of at least aircraft modes of operation may include receiving a selection at a mode switch (e.g., mode switch 616, as described, illustrated, and exemplified in FIGS. 6A-6D). In some embodiments, the user input device may be housed within an aircraft, communicatively coupled to an aircraft, or remotely control mode selection for the aircraft (e.g., mode selection at a control circuit or an FCS of the aircraft).

At the time of or after receiving the selection of one of at least two aircraft modes of operation at a processor of the aircraft, the processor may initiate the checking of the one or more conditions by conditional logic. The conditional logic may be configured to determine whether the one or more conditions are satisfied and output a signal. Additionally, based on the conditional logic outputting a signal indicating that the one or more conditions are satisfied, a power switching device may provide power to a controller, which may enable or cause a modification to circuitry or power distribution within the aircraft to result in a transition to a selected mode of operation (e.g., as shown in FIGS. 5A-5B, a transition to a selected mode of operation based on determining that one or more conditions associated with the transition are satisfied).

In some embodiments, the at least two aircraft modes of operation may include an off mode, a service mode, a ground mode, and a fly mode, e.g., as illustrated and described in reference to FIG. 4A (e.g., Off Mode 401, Service Mode 402, Ground Mode 403, Fly Mode 404). Further, the at least two aircraft modes of operation may include maintenance, test, or check modes or submodes, e.g., as illustrated and described in reference to FIGS. 4A and 4B. In some embodiments, the at least two aircraft modes of operation may include exactly two modes (e.g., an off mode and a fly mode, a service mode and a fly mode). In some embodiments, the at least two aircraft modes of operation may include exactly three modes (e.g., an off mode, a ground mode, and a fly mode). In some embodiments, the at least two aircraft modes of operation may include exactly four modes of operation (e.g., an off mode, a service mode, a ground mode, and a fly mode, as illustrated in FIG. 4A). In some embodiments, the at least two aircraft modes of operation may include exactly five modes of operation (e.g., an off mode, a service mode, a ground mode, a fly mode, and a charging mode). Based on the modes available for selection (e.g., number of modes, type of modes), the system may have differing conditions for transitioning between modes.

Step 1004 may include determining whether at least one temperature of an EPU is within an associated temperature range. Determining whether at least one temperature of an EPU is within an associated temperature range may include measuring, estimating, calculating, or assigning one or more temperatures of the EPU and comparing the one or more temperatures to allowable temperatures (e.g., a range of allowable temperatures), nominal temperatures, and/or temperature limits. In some embodiments, high-voltage (HV) power to an EPU may be enabled while determining whether at least one temperature of the EPU is within the associated temperature range. In some embodiments, one or more temperatures of the EPU may be measured and/or one or more temperatures of the EPU may be estimated. A temperature may be measured by a temperature sensor (e.g., a thermocouple, a resistance temperature detector, a thermistor, a semiconductor or integrated temperature sensor, a fiber-optic temperature sensor, or any other device or system for measuring a temperature of an EPU). A temperature may be estimated using a thermal model (e.g., coupled heat capacities), inference based on electrical parameters or other parameters of EPU operation, loss-based estimation of temperature (e.g., based on power consumption), or any other method of estimating a temperature of the EPU. In some embodiments, one or more temperatures may be estimated, and one or more temperatures may be measured. In the case that a measured and estimated temperature correspond to the same temperature of the EPU (e.g., same component or element of the EPU, same location within the EPU), the measured and estimated temperature may be cross-validated to determine an accuracy of a measured or estimated temperature.

A temperature of an EPU may refer to any measured or estimated thermal value that represents a thermal condition of the EPU or a component of the EPU. The temperature of the EPU may correspond to a specific component of the EPU or location within or around the EPU. A location within or around the EPU may include an identifiable physical region, component, surface, interface, or internal volume of the EPU at which temperature may be measured, estimated, monitored, or otherwise evaluated.

For instance, a temperature of an EPU may include a temperature of a component of the EPU (e.g., a physical part, subsystem, or assembly that forms a portion of the EPU and contributes to its mechanical, electrical, thermal management, or control functionality), a heat transfer fluid of the EPU (e.g., a fluid used to remove heat from an EPU or regulate a temperature of the EPU through circulation within a cooling system), or an ambient temperature of the EPU (e.g., a temperature of the environment surrounding the EPU, thermal conditions of air passing through or around an EPU).

A temperature of a component of the EPU may include a temperature of a stator, rotor, winding, bearing, shaft, power electronic component, thermal management element or device (e.g., a heat sink), structural element, control hardware, or gearbox. A temperature of a heat transfer fluid may include a temperature of a liquid coolant or an oil of the EPU. An ambient temperature of the EPU may include temperature of air entering the EPU (e.g., through a cooling duct), external airflow around a nacelle or fuselage, or an outside-air temperature.

The temperature of the EPU may include a derived value, which may represent an overall thermal state of at least a portion of an EPU (e.g., an overall thermal state of the EPU, an overall thermal state of a component, an overall thermal state subset of components, an overall thermal state across multiple locations within the EPU). For instance, a temperature of an EPU may be used to determine a thermally most-limiting temperature.

A thermally most-limiting temperature may refer to a measured or estimated temperature with the closest proximity to a thermal limit or threshold (e.g., a minimum or maximum of a threshold range) associated with the temperature of the EPU. The thermally most-limiting temperature may be the temperature that places the greatest constraint on allowable operations of the EPU or the aircraft. A thermally most-limiting temperature may be determined across multiple components or locations of an EPU (e.g., motor windings, electronics or integrated circuits, coolant, housing, bearings). A thermally most-limiting temperature may be the temperature that is closest to an allowable limit for the temperature of the EPU, the temperature with the smallest remaining thermal margin or time remaining to reach or exceed a thermal limit, or a component that is farthest outside a threshold range. Each temperature of the EPU may be associated with a different temperature range (e.g., a rated or operational limit range for a component or heat transfer fluid), and the determination of the thermally most-limiting component may be determined based on a temperature of the EPU and its respective temperature range (e.g., threshold range). The component that is farthest outside its associated threshold range may include or be the component with a temperature that deviates the most (e.g., by magnitude, by percentage) from the limits of its associated threshold range (e.g., by how much the temperature exceeds the maximum value of the associated threshold range, by how much the temperature falls below the minimum value of the associated threshold range).

In some embodiments, temperatures of an EPU may be consolidated or aggregated into a composite temperature. A composite temperature may be a single temperature value that describes a thermal state of at least a portion of the EPU (e.g., a representative or derived temperature, an overall thermal state of the EPU). A composite temperature may be used for monitoring or control, such as in checking whether a temperature of the EPU is within a temperature range.

A composite temperature may be based on (e.g., determined by) normalizing one or more temperatures of an EPU for the consolidation, aggregation, or comparison of multiple temperatures of the EPU. A composite temperature may be based on (e.g., determined by) averaging multiple temperatures of the EPU (e.g., unweighted average, weighted average), selecting a temperature of the EPU based on a statistical measure (e.g., maximum, minimum, mode, median), filtering across multiple temperatures of the EPU (e.g., a moving average), inputting temperatures of the EPU into a thermal model to find the highest or lowest modeled temperature (e.g., relative to an associated threshold range), computing a synthetic or model-based internal temperature of the EPU (e.g., an empirical model or function, a physics-informed or parametric model), or any using other method of aggregating temperatures of the EPU to describe the overall thermal state of the EPU.

The composite temperature may be based on a thermally most-limiting component (e.g., based entirely or at least in part on the thermally most-limiting component). For instance, a thermally most-limiting component may impact the weighting of the temperature for a weighted average, such that the thermally most-limiting component has the largest contribution to the weighted average. Further, a composite temperature may be a temperature associated with or determined for the thermally most-limiting component.

Additionally, a composite temperature may be determined for a subset of the components of the EPU (e.g., an individual component or element of the EPU, one or more components or elements of the EPU, based on temperature of the EPU associated with a same component or element of the EPU). For instance, an inverter composite temperature may be derived, a heat transfer fluid composite temperature may be derived, or a composite temperature may be derived for any other component or element of the EPU. These multiple composite temperatures may be compared to each other to determine a thermally most-limiting component of the EPU.

A temperature of the EPU may be determined at multiple points in time, such that a rate of change of the measured or estimated temperature may be derived or observed. Additionally, a component or element associated with the temperature of the EPU may include a time constant (e.g., a thermal time constant). Based on the rate of change of the temperature of the EPU, as well as the time constant, a projected thermal state may be determined. This may inform the determination of the thermally most-limiting component, as the thermally most-limiting component may be the component that is most likely to exceed a threshold temperature range. For example, the most-limiting temperature is determined based on a temperature of the EPU and a rate of change of the temperature of the EPU. Additionally, a composite temperature of a component or element of the EPU may be associated with a rate of change of the composite temperature or a time constant of the composite temperature, which may be used to determine a thermally most-limiting component of the EPU.

A thermally most-limiting temperature may be associated with a thermally most-limiting component that may be the component that is most likely to exceed an operational or rated thermal limit of the component. A composite temperature or another derived temperature may be associated with a thermally most-limiting portion of the EPU (e.g., the EPU, at least a portion of the EPU), which may include at least a portion of a component (e.g., at least a portion of one or more components, one or more components) or multiple locations around the EPU that may place the strictest operational constraints on the EPU based a comparison of the composite temperature relative to a thermal limit associated with the composite temperature.

A thermal limit associated with a composite temperature may include or aggregate temperature limit ranges for one or more components or locations of the EPU. This may involve a weighted sum of temperature limit ranges, selecting the highest minimum temperature and lowest maximum temperature, a function-based constrained equation, a model-based limit, a probabilistically determined limit, a time-dependent limit (e.g., a projected thermal state), or any other method of aggregating multiple thermal limits. Further, a thermal limit may include intrinsic material properties or time constants (e.g., thermal time constants) associated with one or more components or locations of the EPU.

Exceeding an operational or rated thermal limit of a component may cause damage to the component (e.g., reduce component lifetime, cause irreversible or irreparable damage, component failure). Exceeding an operational or rated thermal limit may result in a reduction of aircraft safety, user safety, pilot safety, or passenger safety. Consistent with disclosed embodiments, process 1000 may leave propulsive operation of an EPU disabled until temperature is within a safe range, which may reduce these risks.

In some embodiments, a temperature modification system may be used (e.g., instructed by at least one processor) to bring the temperature of the EPU within a temperature range (e.g., heating or cooling the engine at least until the temperature is above a minimum temperature of the temperature range or until the temperature is below a maximum temperature of the temperature range, respectively). The range may be considered one that is safe for operation of the EPU (e.g., based on an operational or rated thermal limit), designated for a flight plan of the aircraft, etc. In some embodiments, process 1000 may include one or more additional steps, which may include—for example—providing power to a temperature modification system, instructing the temperature modification system, monitoring the temperature of the EPU, and/or any action to control an EPU temperature within a temperature range. For example, process 1000 may include instructing the temperature modification system to heat or cool an EPU, monitoring the temperature of the EPU, determining when the temperature of the EPU is within a predetermined range, and instructing the temperature modification system to cease heating or cooling the EPU (e.g., based on determining when the temperature of the EPU is within the predetermined range).

A temperature modification system for an EPU may refer to a system configured to regulate, limit, dissipate, or redistribute heat within the EPU. A temperature modification system may include or be integrated with a combination of hardware, sensors, software, or control logic to bring one or more temperatures of the EPU within allowable limits for operation (e.g., propulsive operation). Further, a temperature modification system may include capabilities for maintaining a temperature within the allowable limits during operation.

In some embodiments, a temperature modification system may be powered by HV power. By powering the temperature modification system and supplying the temperature modification system (e.g., a processor associated with controlling the temperature modification system), the temperature modification system may bring a temperature of the EPU to within the temperature within a temperature limit range (e.g., of a component, of a composite temperature, of a thermally most-limiting component).

In some embodiments, a temperature modification system may include a heater thermomechanically coupled to an EPU for which the temperature modification system is configured to modify the temperature. The heater may be configured to increase the temperature of the coupled EPU, which may include supplying a current, voltage, power, or HV power to the heater.

In some embodiments, a temperature modification system may include a heat exchanger thermomechanically coupled to an EPU for which the temperature modification system is configured to modify the temperature. The heat exchanger may include a thermal load path, which may refer to the route through which heat energy is conducted or radiated from a heat-generating source (e.g., a component, location, or element of the EPU) to a heat-dissipating sink (e.g., which is outside of the EPU or directs heat to dissipate out of the EPU). The heat exchanger may be configured to decrease the temperature of the coupled EPU, which may include removing heat from the EPU or distributing heat from the EPU to other locations away from the EPU. The heat exchanger may include a heat transfer fluid, which may be configured to absorb heat from the EPU (e.g., a component or location of the EPU) and transfer heat to another fluid (e.g., air) or a material, component, or element, which may not be included in the EPU.

In some embodiments, a temperature modification system may include components with normal operational uses aside from temperature modification (e.g., flight operations). For example, inverters, motor windings, other components of an EPU, or the EPU itself, may constitute or be part of a temperature modification system. The temperature modification system may be configured to modify a temperature of the EPU by controlling power (e.g., HV power) to the temperature modification system. Controlling power to the temperature modification may include modifying an operational parameter of the EPU. For example, by controlling power to the temperature modification system or modifying an operational parameter of the EPU, an EPU may be operated in a reduced efficiency mode or an increased efficiency mode (e.g., without propulsive operation enabled, before transitioning to another mode of the aircraft, before allowing the aircraft to take off). As mentioned above, the EPU may be run (e.g., by an FCC, controller, etc.) in an efficient mode (e.g., with alternate waveforms for inverter switches) to cool the EPU and in an inefficient mode to heat the EPU, during which time the EPU may not be enabled for propulsion or producing any propulsion for the aircraft.

The operational parameter may include a current to the EPU, and modifying the operational parameter may include modifying the current to the EPU. The reduced efficiency mode may include supplying the EPU with a current that flows through the EPU without rotating the propeller of the EPU. This may cause heat generation by, e.g., resistive losses of the EPU, which may cause the heating of the EPU (e.g., for increasing a temperature of the EPU to bring the temperature into an allowable range for mode transition or enabling propulsive operation). In some embodiments, when the propeller of the EPU rotates, a heat transfer fluid may flow, which may remove heat from the EPU. As an example, by not rotating the propeller in the reduced efficiency mode, the heat transfer fluid does not flow, so the temperature of the EPU may be increased (e.g., to bring the temperature into an allowable range for mode transition or enabling propulsive operation). Additionally, the high efficiency mode may involve supplying a current to the EPU that causes the propeller to rotate without enabling or allowing for propulsive operation. As an example, this may cause a heat transfer fluid to flow, which may remove heat from the EPU, so the temperature of the EPU may be decreased (e.g., to bring the temperature into an allowable range for mode transition or enabling propulsive operation).

Based on the selected mode (e.g., as described in Step 1002), process 1000 may use a condition of the determined temperature being within the associated temperature range as a prerequisite to allowing a transition to the selected mode. For example, if the selected mode is associated with this condition, process 1000 may determine if a temperature of an EPU is within an associated temperature range, and if this condition is satisfied, permit transition to the selected mode. By way of example, process 1000 may use the following Boolean logic (e.g., which may be implemented using conditional logic, consistent with disclosed embodiments): a temperature of an EPU is within an associated temperature range→permit mode transition. As another non-mutually exclusive example, process 1000 may use the following Boolean logic: temperatures of multiple EPUs are within an associated temperature range→permit mode transition.

This may result in the enabling or execution of a mode transition or the enabling of the EPU for propulsive operation (e.g., as further described in Step 1006). This may ensure safety of the EPU before enabling a mode transition or propulsive operation of the EPU (e.g., takeoff of the aircraft), where ensuring safety of the EPU may include minimizing fatigue or wear on the EPU or that no permanent damage will be caused to the EPU due to the enabled mode transition or propulsive operation.

Additionally, if the determined temperature of the EPU is not within an associated temperature range, the condition of the determined temperature being within the associated temperature range may not be satisfied. If the condition is not satisfied, process 1000 may prohibit a mode transition and/or disable propulsive operation (or maintain disabled propulsive operation) for the EPU. Additionally, if the condition is not satisfied, a temperature modification system may be enabled, used, or receive power to modify a temperature of the EPU to bring the temperature of the EPU within an allowable range for a mode transition or to enable propulsive operation of the EPU. Based on modifying the temperature such that it is within an allowable range for a mode transition or to enable propulsive operation of the EPU, the mode transition or propulsive operation of the EPU may be enabled (e.g., as further described in Step 1006).

Process 1000 may use multiple temperatures of the EPU, which may be associated with different components of an EPU. Each of these temperatures (e.g., temperatures associated with components of the EPU) may be evaluated for the condition of the determined temperature being within the associated temperature range. Based on determining that each of the temperature of the EPU (e.g., each of valid temperatures, where system may disregard faulty temperature readings) are within an associated temperature range, the condition may be satisfied. Process 1000 may, based on the satisfaction of the condition (e.g., of a temperature of the EPU being within an associated temperature range) for all the temperatures of the EPU (e.g., all valid temperatures, all temperatures measured or estimated without an associated fault indication), enable a mode transition or propulsive operation for the EPU.

An aircraft may have multiple EPUs (e.g., as shown in FIGS. 1A-3D). In some embodiments, the condition of the determined temperature being within the associated temperature range may be evaluated for multiple EPUs (e.g., all EPUs of the aircraft). Process 1000 may, based on determining that the condition is satisfied for each of the multiple EPUs, enable a mode transition or propulsive operation of each of the multiple EPUs. Each of the multiple EPUs may be associated with a temperature modification system, which may be used to adjust the temperature of the associated EPU, consistent with disclosed embodiments.

Step 1006 of controlling aircraft power distribution may include managing, regulating, and/or directing electrical power from energy sources to one or more aircraft systems, subsystems, or components. For example, based on the selected mode of operation in step 1002 and the initial or current mode of operation, power may be directed to different systems, subsystems, or components of the aircraft (e.g., as described in reference to FIGS. 4A-6D). In some embodiments, process 1000 may only proceed to step 1006 if one or more temperature conditions are satisfied (e.g., as described with respect to step 1004), and, when at least part of process 1000 is combined with other operations described herein, if one or more temperature conditions are satisfied and other conditions are satisfied.

Additionally, step 1006 may include controlling power distribution to a temperature modification system to bring a temperature of an EPU within an allowable range for mode transition or enabling propulsive operation of the EPU. Based on the condition of the temperature of the EPU being within a temperature range (e.g., the allowable range), propulsive operation of the EPU may be enabled.

FIG. 11 illustrates process 1100 of controlling aircraft power distribution based on a measured output of a control circuit based on an input, consistent with embodiments of the present disclosure. Process 1100 may be implemented as software (e.g., in at least one module, at least one program, at least one application, and/or at least one function, etc.), hardware (e.g., at least one processor, such as an FCC, controller, etc.), or a combination of both. Some embodiments may include at least one processor that is configured to execute operations to perform process 1100. Some embodiments may include a computer-readable medium (e.g., a non-transitory computer-readable medium) that stores instructions executable by at least one processor to perform operations that include the steps of process 1100. The steps of process 1100 may be combined, rearranged, performed simultaneously, removed, and/or repeated. Process 1100 may include step 1002 (e.g., as described above), step 1104, and/or step 1106. Process 1100 may be implemented by a control system including any of the systems, subsystems, devices, or configurations illustrated in FIGS. 3A-8. Actions described as being carried out by the process itself may also be carried out by a medium configured to carry out the process (e.g., a processor, a computer-readable medium, a system, etc.). Unless otherwise indicated, a step in process 1100 may be performed based on (e.g., in response to, based on a result of, upon completion of, etc.) a step that precedes it, whether or not the prior step is part of process 1100 (as processes described herein, and/or portions thereof, may be combined).

Step 1002 may include receiving a selection of one of at least two aircraft modes of operation, for example, by receiving a selection of one of at least two aircraft modes of operation as described in reference to FIG. 10 (e.g., using one or more of the modes described with respect to FIG. 4A, the mode transitions described with respect to FIG. 4B, and/or the circuitry described with respect to any of FIGS. 5A-6D). For example, step 1002 of receiving a selection of one of at least two aircraft modes of operation may include obtaining an input identifying an aircraft mode of operation to enter or transition to (e.g., based on a pilot, operator, or user request). The input may indicate a choice between multiple modes (e.g., two or more modes of operation). A mode selection may be received at an input device (e.g., a first user input device) may include at least one of a switch, a knob, a button, a lever, a display screen element, or a voice receiver.

Step 1104 may include measuring an output of a control circuit. A control circuit refers to an electrical or electronic arrangement configured to generate, process, or transmit control signals for influencing the operation of at least one aircraft effector, without limiting the circuit to any particular architecture, component type, or implementation. In some embodiments, a control circuit may be along a communication pathway between an input device and at least one aircraft effector. For example, a control circuit (e.g., of the aircraft) may be or include an electronic system, subsystem, or component that may receive a signal from the control device of the aircraft, and that is configured to process these signals (e.g., according to control laws or logic, for a control function for the aircraft) and generate outputs that may be input to other control circuits or input to aircraft effectors (e.g., to control the aircraft effectors based on a pilot input). An aircraft effector may include a flap, a flaperon, a rudder, a ruddervator, an elevator, a tilt actuator, an EPU, a swashplate, or any other effectors discussed herein. A control circuit may include one or more of, without limitation:

1) signal conditioning components (e.g., amplifiers, filters, analog-to-digital converters, digital-to-analog converters),
2) processing elements (e.g., a processor, a hardware processor, microcontrollers, FPGAs, flight control computers (FCCs)),
3) signal distribution components (e.g., buses, bus interfaces, multiplexers, relay logic),
4) power management components (e.g., power supply modules, voltage or current monitoring circuits, load distribution and protection circuits, circuit breakers, fuses, relays),
5) actuator drivers or motor drivers (e.g., servo drivers, motor controllers, valve drivers),
6) feedback and monitoring components (e.g., position sensor, velocity sensor, accelerometer, fault detection units, built-in-test (BIT) circuits),
7) safety components (e.g., comparators for multiple redundant circuits, watchdog timers, fail-safe relays or switches, error detection circuits) or
8) any other electronic component that may be present on a circuit that may be configured to control an aircraft effector (e.g., an EPU, actuator, non-propulsion load).

An output of the control circuit may include a signal, electrical activity, mechanical activity, or any other action produceable by the control circuit, which may be configured to influence or control another component, consistent with disclosed embodiments. An output may be based on (e.g., responsive to) an input, as discussed further herein.

Measuring the output of the control circuit may include observing, recording, or analyzing the behavior of a control circuit, such as when the control circuit is subjected to a stimulus or signal driven by an input to a control device of an aircraft (e.g., pilot input, remote input device). In some embodiments, the input from the control device of the aircraft may originate from (e.g., be generated by) a user input device (e.g., a second user input device) that is separate from the user input device for mode selection (e.g., first user input device, mode switch 616, mode switch as described in reference to FIGS. 6A-6D).

An input from a control device of an aircraft (e.g., second user input device) may refer to a signal that originates from any component, subsystem, or mechanism that is configured to accept pilot or operator input. For example, in response to pilot or operator input, the control device of the aircraft may generate a signal that influences, regulates, or contributes to the behavior, performance, or operation of the aircraft or components thereof. The input may be configured to control one or more aircraft effectors (e.g., such that the control effectors affect the motion, stability, or other behavior of the aircraft by physically acting on the aircraft based on the input). For example, the input may cause one or more aircraft effectors to change position.

The control device of an aircraft (e.g., a second user input device) may include at least one of a switch, a knob, a button, a lever, a display screen element, or a voice receiver. For example, the input from the control device of the aircraft may include input received from side sticks or an inceptor. In some embodiments, the control device of the aircraft (e.g., second user input device) may also include a user input device for mode selection (e.g., first user input device), such that an aircraft mode of operation may be selected from the control device of the aircraft (e.g., second user input device comprises the first user input device).

As an example, the first user input device may be a mode switch (e.g., mode switch 616, as illustrated and described in FIGS. 6A-6D), and the second user input device may be a pilot stick or an inceptor (e.g., a stick or inceptor communicably connected to FCS 618 as illustrated in FIG. 8). Additionally, the second user input device or another user input device may be used to input an autopilot command or another type of control command. The second user input device may be configured to receive or transmit continuous commands (e.g., inceptor commands, rate commands) or discrete commands (e.g., beep commands, commands that set a specific altitude, flight path angle (FPA), or other flight parameter for the aircraft to target or adjust to), or both. The second user input device (e.g., a pilot stick or inceptor) may be used or configured to control a fly-by-wire aircraft or an aircraft such as those illustrated and described in reference to FIGS. 1A-3D. The control of an aircraft by the second user input device may include an input (e.g., a control command) to an FCS (e.g., FCS 618) that includes instructions for the FCS to control one or more components of the aircraft, where the instruction may include controlling the one or more components to perform a single action or a sequence of actions, which may include performing these actions (e.g., single action, sequence of actions) repeatedly or based on the input.

A pilot or operator input to the control device of the aircraft (e.g., second user input device) may cause the generation of a signal (e.g., an input signal configured to control an aircraft or components thereof), which may be transmitted to a control circuit of the aircraft. For example, the pilot or operator input to the control device may correspond to a pilot of the aircraft moving a pilot stick, yoke, or inceptor or a pilot of the aircraft pressing a button, flipping a switch, or making a selection on a touchscreen. Based on a physical actuation of or other mode of pilot or operator input (e.g., verbal, automated or automatic, preloaded) to the control device of the aircraft (e.g., by the pilot of the aircraft or executed by the pilot of the aircraft), pilot or operator input may be sensed or transduced into a signal. The signal (e.g., generated based on the pilot or operator input) may be transmitted away from the control device of the aircraft and to other electronic systems or components of the aircraft, such as a control circuit or FCS (e.g., FCS 618).

The signal that is generated based on an input to the control device of the aircraft may be directed to controlling an effector of the aircraft (e.g., an EPU, actuator, non-propulsive load). In some embodiments, the signal may be used to validate the performance of control systems, devices, or circuits (e.g., FCS 618, elements of FCS 618, a control circuit, buses or electrical connections of the aircraft, etc.). Additionally, although the signal may be directed to control an effector of the aircraft, in order to validate the performance of control systems, devices, or circuits, an aircraft effector (e.g., an EPU, actuator, or non-propulsive load) may not be controlled during the testing or validation process (e.g., all aircraft effectors of the aircraft may be disabled or prevented from moving during the testing or validation process, the signal may be prevented from reaching aircraft effectors, or the signal may be modified from an in-flight configuration).

For example, the control circuits associated with aircraft effectors (e.g., configured to control or influence EPUs, actuators, or non-propulsion loads) of an aircraft may be tested. However, the control signals for testing the control circuits may not be transmitted to the aircraft effectors or the aircraft effectors may be disabled from operation (e.g., the aircraft effectors do not receive high-voltage (HV) power), such that the aircraft effectors do not respond to the control circuit tests. For example, preventing control signals from modifying aircraft effectors may include a flight control computer (e.g., FCS 618 of FIGS. 6A, 6D-8) ignoring a control signal, disabling modification of thrust producing elements of the aircraft (e.g., powering non-propulsion loads or actuators but not powering an EPU or other propulsive loads), filtering out control signals that modify aircraft effectors, or decoupling an aircraft effector from a signal communication channel. Preventing control signals from modifying aircraft effectors may enable separate testing of aircraft control systems (e.g., associated with or coupled to FCS 618 of FIGS. 6A, 6D-8) or pilot or operator controls and aircraft effectors or propulsive elements of the aircraft. This separate testing may allow for testing only the aircraft controls systems or pilot or operator controls, testing only the aircraft effectors or propulsive elements of the aircraft, or conducting multiple separate tests in a sequence. For example, a pre-flight check may include testing the aircraft control systems or pilot controls, and upon passing this test, subsequently testing the aircraft effectors. As an additional example, a pre-flight check may include testing the aircraft control systems or pilot controls, and upon passing this test, enabling HV power to the aircraft actuators or non-propulsion loads. Subsequently, the pre-flight check may include testing the aircraft actuators or non-propulsion loads, and upon passing this second test, enabling HV power to the EPUs or propulsive elements of the aircraft. Subsequently, the pre-flight check may include testing EPUs or propulsive elements of the aircraft, and upon passing this test, the pre-flight check may be passed. Upon passing the pre-flight check, the aircraft may transition to a fly mode of operation, where the aircraft may take off.

Preventing control signals from modifying aircraft effectors may prevent the aircraft effectors from moving the aircraft or otherwise controlling or modifying the behavior of the aircraft. This may be important during testing or a pre-flight check so that the aircraft does not exhibit any unsafe behavior. Additionally, for a vertical takeoff and landing (VTOL) aircraft or electric vertical takeoff and landing (eVTOL) aircraft, this may prevent the plane from flipping, taking off, or entering an upset condition during testing or a pre-flight check. For example, in an aircraft with a fly-by-wire control system, preventing control signals from modifying the aircraft effectors (e.g., preventing an EPU from producing thrust or entering a propulsive operation state) may enable testing of the aircraft prior to flight while ensuring avoidance of an inadvertent takeoff or upset condition of the aircraft.

When the aircraft effectors do not respond to inputs to the control device of the aircraft, and a signal is transmitted from the control device of the aircraft to a control circuit of the aircraft, the signal may be processed or relayed by the control circuit. This may occur without causing movement or adjustment of the aircraft effectors, while allowing for the monitoring of an output of the control circuit to the signal.

In some embodiments, the control circuit may generate an output based on the signal (e.g., by processing the signal, by outputting the processed signal). In some embodiments, generating an output based on the signal may refer to the control circuit processing the input signal and producing an output based on designed control laws, control logic, and/or testing logic, such that the output may be interpretable by further control circuits or an aircraft effector (e.g., a thrust command, an actuation command). Generating an output may include receiving a signal (e.g., from a pilot input, sensor, automated system, or external source), computing a signal (e.g., calculating or determining an output based on the input and control law computations, control logic evaluation, safety thresholds, or coordination with other signals), generating an output (e.g., electrical, digital, analog, logical signals to drive aircraft effectors), or performing feedback or monitoring operations (e.g., comparing commanded and actual states, triggering fault detection, updating system logs).

Some aircraft control circuits may be integrated with systems, devices, or mechanisms for monitoring, measuring, or collecting a generated output of the control circuit (e.g., systems, devices, or mechanisms of an FCS or of a control circuit or of a measurement circuit). The systems, devices, or mechanisms may include one or more of, without limitation:

1) feedback loops, which may enable real-time monitoring of a control circuit, or correction or validation of a generated output responsive to an input to the control circuit of the aircraft,
2) internal signal monitoring, such as using registers, comparators, internal bus taps that may track signal amplitude, logic states, timing, or waveform characteristics, and which may allow for anomaly detection, verification of expected signal values, and ensuring output integrity or continuity,
3) built-in-test (BIT) routines, which may continuously or periodically (e.g., upon start up, upon a mode transition, upon receiving a selected mode of operation) verify that generated output signals match expected output signals, where the control circuit can log, flag, or adjust signals internally (e.g., without requiring external measurement tools),
4) data logging and telemetry, which may include an interface or memory (e.g., a memory on-board the aircraft, or a memory off-board the aircraft where data is streamed to the off-board memory), such that generated outputs may be captured for monitoring or future analysis, or
5) any other method of measuring an output of a control circuit, such that the output can be compared to a reference or expected output to verify behavior of the control circuit.

Based on measuring the output of a control circuit with a measurement system, device, or mechanism of the aircraft (e.g., part of an FCS, control circuit, or measurement circuit that is external to the control circuit), the measured output may be compared to an expected output. Comparing a measured output to an expected output may be performed by a computing, electronic, or signal-processing element that is capable of evaluating two or more values. The generated output, measured output, or expected output may include an analog signal, a digital signal, electrical quantities (e.g., electrical parameter, voltage, current, resistance, pulse-width, duty cycle, frequency, phase shift), logical signals (e.g., binary high/low, command acknowledgment flag, status register content, error codes, bus messages), waveforms or time profiles (e.g., rise time, fall time, slew rate, current ramp, voltage ramp, oscillation amplitude), or derived or computed metrics (e.g., power temperature estimate, health metric, figure of merit).

A measured or expected output may include an output over a duration of time, such that the comparison between the measured and expected output checks for alignment between the measured and expected output over time. Additionally, a measured or expected output may include a figure of merit, which may refer to a quantitative metric that may be used to characterize the quality, performance, or integrity of an electrical signal or circuit behavior. A figure of merit may be derived directly from a measured signal or computed from one or more measured parameters. A figure of merit (FOM) may include amplitude-based FOMs (e.g., peak voltage, RMS voltage, average current), timing-based FOMs (e.g., rise/fall time, propagation delay), frequency-domain FOMs (e.g., harmonic distortion, signal-to-noise ratio (SNR), spectral energy distribution), stability/noise FOMs (e.g., jitter, ripple voltage, noise power, drift over time), logical FOMs (e.g., bit-error rate, checksum correctness), composite FOMs (e.g., weighted scoring based on multiple indices, multivariate model residual), or any other method of calculating a figure of merit for a measured output and an expected output, where the figure of merit is derived from the measured output and the expected output.

Process 1100 may use the comparison to determine whether a control circuit, subsystem, or component is functioning within limits (e.g., rated limits, operational limits, predetermined limits). For instance, the comparison may include:

1) a threshold-based comparison, which may include determining that a value does not exceed a threshold or is within a threshold range,
2) a numerical comparison, which may include determining whether two values are equal to each other within a margin-of-error,
3) pattern or signature matching, where a measured voltage, current, or pulse train waveform may be compared to a stored waveform, signature, or profile,
4) state-machine evaluation, which may include referencing a state map based on input conditions to determine that a measured output corresponds to the correct state,
5) table-based evaluation, which may include referencing a lookup table based on input conditions to determine that a measured output corresponds to a correct table entry,
6) model-based estimation, where a controller may generate an expected output based on a mathematical model or estimator, and the measured output may be compared to the expected output,
7) time-domain comparison, where the timing of an output or characteristics of the output may be compared to expected timing characteristics,
8) frequency-domain comparison, where the system may convert a measured signal to the frequency domain for comparison of spectral characteristics of the measured and expected outputs, or
9) any other method for comparing two electrical, analog, or digital signals.

In some embodiments, process 1100 may include testing the functionality of electronic or computational components within a control system of the aircraft, which may validate or quantify the functionality of the electronic or computational components.

In some embodiments, these tests may be part of a pre-flight check (e.g., before transitioning to flight or Fly Mode 404 from Ground Mode 403 or Ground Fly Check Submode 407). These electronic or computational components may include components that generate, process, or transmit commands to aircraft effectors (e.g., EPUs, actuators, non-propulsion loads, control surfaces). The testing of functionality of electronic or computational components may include testing of an FCC or FCS (e.g., FCS 618), testing of the second user input device (e.g., pilot sticks, inceptors). Additionally, process 1100 may include testing (e.g., for a mode transition) one or more of control of aircraft power distribution, modification of aircraft power distribution, and the functionality or outputs of other components or elements of the aircraft (e.g., EPUs, actuators, or non-propulsive loads of the aircraft) may be tested. Such testing may be done, for example, to validate the performance of other control systems, devices, or circuits of the aircraft (e.g., as described in reference to FIG. 12).

Examples of tests may involve a pilot inputting a command at a pilot input device (e.g., second user input device, pilot sticks, inceptors), such that one or more electrical or computational systems of the aircraft (e.g., of FCS 618, connecting systems or subsystems of the aircraft) may be tested. In reference to FIG. 6A, this may include determining connectivity of a mode switch or a can bus (e.g., CAN A), such that the FCS may communicate with the mode switch (e.g., first user input device) or a battery management unit (e.g., BMU 602). In reference to FIG. 7, this may include determining connectivity (e.g., signal transmission or reception) to a radio link (e.g., Command and Control Radio Link 709), transmission of signals to a voting component (e.g., Airborne Discrete Signal Voting (HW) 712), or correct readout of the voting component (e.g., does the voting component indicate on-ground or off-ground status while the aircraft is on the ground). In reference to FIG. 8, this may include testing or determining a continuity of LEFT CAN BUS 1 810, LEFT CAN BUS 2 811, CENTER CAN BUS 1 812, CENTER CAN BUS 2 813, RIGHT CAN BUS 1 814, or RIGHT CAN BUS 2 815. Additionally, components or modules of FCS 618 may be tested to determine continuity or to determine an output responsive to one or more of the components or modules of FCS 618 for comparison to an expected output. For example, sensor readouts (e.g., received by or associated with FCS 618) may be checked to determine validity of the sensor outputs (e.g., before transitioning to Fly Mode 404), or the Bank, Yaw, and Pitch commands may be checked to determine a correct commanded magnitude or direction associated with the pilot input command.

In some embodiments, process 1100 (e.g., step 1104) may include validating the functionality of one or more control circuits of an aircraft (e.g., as part of testing). Validating the functionality of the one or more control circuits may include any operation, process, or evaluation configured to determine whether the one or more control circuits of the aircraft are operating as intended, within acceptable limits, or according to one or more predetermined criteria. Validation may occur continuously, periodically, on-demand, during startup, during maintenance, or based on an aircraft in-flight status (e.g., an indicator that the aircraft is airborne, discussed further with respect to FIG. 14) or on-ground status (e.g., an indicator that the aircraft is grounded or touching the ground, discussed further with respect to FIG. 14). For example, validating the functionality of one or more control circuits of the aircraft may include a pre-flight check of the one or more control circuits. The pre-flight check may include a procedure, operation, assessment, or other automated or partially automated process that is performed prior to flight to confirm a readiness, functionality, integrity, or safety of aircraft systems, which may be performed—at least in part—manually or automatically, electronically, before engine start, during initialization, during taxi, or at any time prior to takeoff.

The validation of one or more control circuits may include a set of tests, which may include pilot input, such as movement, selection, activation, manipulation, or engagement of the control input of the aircraft (e.g., second user input device, pilot sticks, inceptor). A test including pilot input may refer to any validation, diagnostic, or functional check in which a pilot provides an input (e.g., manual, tactile, electronic input) to a control device of the aircraft, where the behavior of an associated control circuit, system, or electronics, based on (e.g., responsive to) the input is monitored, measured, or evaluated.

The validation of one or more control circuits (e.g., as part of step 1104) may include a set of tests, where a set of tests may refer to a collection or sequence of one or more tests (e.g., including pilot or operator input), as previously described, where the set of tests may evaluate the one or more control circuits to validate that one or more aircraft effectors will receive an intended signal once enabled. The set of tests may include, without limitation, one or more of:

1) input verification tests: to ensure all pilot inputs are correctly registered by control circuits (e.g., a direction or magnitude of a pilot movement or actuation of a control input),
2) signal propagation tests: to confirm that analog, digital, or electrical signals propagate between components (e.g., signal continuity, voltage or current levels, pulse distortion),
3) aircraft effector received signal tests: to confirm that an aircraft effector is receiving an intended signal (e.g., corresponding to the effector's function, within an operational or rated range of inputs),
4) redundancy or cross-channel tests: comparing outputs across redundant channels (e.g., to ensure consistency, to allow for voting for control circuit validation),
5) feedback or monitoring tests: to validate that sensor and feedback elements associated with a control circuit have a similar or same measured and expected output,
6) fault detection or built-in tests (BIT): internal checks on a control circuit to detect open or short circuits, continuity, communication errors, or faults,
7) timing or synchronization tests: to ensure that signals are delivered to all effectors with correct timing or sequence, or
8) any other test to validate the functionality of a control circuit or the signal received at an aircraft effector.

The set of tests may further be implemented to determine a pilot control authority of the aircraft or an aircraft operating capability. This may include determining at least a portion of the pilot control authority or the aircraft operating capability associated with the control system of the aircraft (e.g., the at least a portion may be determined without the aircraft effectors enabled). Process 1100 may use the pilot control authority or the aircraft operating capability to inform the pilot of a status of the aircraft before, during, or after a flight. The pilot control authority or the aircraft operating capability may be used to determine a flight readiness of the aircraft (e.g., whether the aircraft safe or operable for flight operations or for flight operations with a crew, passengers, or cargo).

Pilot control authority may refer to the range, magnitude, or rate of effect that a pilot or operator may command an aircraft's state or flight mode, which may be determined by the availability or operating capabilities of control systems, control interfaces, aircraft effectors, or any other element of an aircraft that may impact the pilot's or operator's ability to control the aircraft. Pilot control authority may further include a representation (e.g., a numerical representation, a percentage, a relative percentage, or an absolute value) of how much influence or control the pilot has over the aircraft's motion, configuration, or system behavior at any given time (e.g., during various modes of operation and/or during flight operations). Pilot control authority may include manual input authority (e.g., pilot sticks or inceptor control over actuators or control surfaces), throttle or thrust authority (e.g., idle and max thrust, automatic protections), envelope protections (e.g., fly-by-wire envelope protections of roll, pitch, yaw, speed, or any other type of pilot control objective that may be limited or restricted during flight), control commands (e.g., attitude command, translational rate command, and/or altitude hold), or the control authority of any other aircraft system, subsystem, or device. Pilot control authority may be used by an aircraft control system (e.g., FCS 618 of FIG. 6A, FIG. 6D, FIG. 7, or FIG. 8) to inform or command aircraft operations (e.g., flight operations, takeoff, landing, an aircraft mode of operation).

An aircraft operating capability may refer to a set of aircraft operations, maneuvers, or mission tasks that an aircraft is able to perform at a given time or in a particular mode of operation. The aircraft operating capability may be based on performance limits (e.g., set performance limits, physical performance limits, environmental performance limits), energy or power availability (e.g., total amount of energy available for consumption, rate of available energy consumption), system health (e.g., state of health, state of charge, degradation), environmental constraints (e.g., windspeed, temperature, turbulence, cloud conditions, rain, wake turbulence, geographical features), regulatory constraints (e.g., FAA constraints, air traffic control, other aircraft or airspace operating authority), flight envelope, hover capability, thrust capability, range or endurance capability, maximum climb or descent rate available, or another factor that may determine available operations, maneuvers, or mission tasks for an aircraft.

Aircraft operating capabilities may be determined, e.g., by process 1100, based on a defined flight envelope, performance models or look-up tables, measurements from a sensor (e.g., a measured output of a control circuit based on or responsive to an input), health or status of aircraft systems (e.g., degraded, not degraded, performance relative to a non-degraded output capability or a minimum operational threshold), mission or regulatory constraints, control law or automation constraints (e.g., control law or constraints associated with FCS 618 of FIG. 6A, FIG. 6D, FIG. 7, and FIG. 8), or computational models or predictive algorithms (e.g., based on a planned flight trajectory, flight plan, or projected aircraft operational environment conditions). Determining aircraft operating capabilities may include determining or measuring an output of a control circuit to pre-flight check inputs or tests and comparing it to at least one of an expected output, an operational threshold, or a reference value.

The control circuit (e.g., whose output is measured at step 1104) may be driven or stimulated by a control input from the set of tests (e.g., set of commands), which may include one or more tests (e.g., commands) to validate a control circuit or the signal received at an aircraft effector. The control circuit may be sequentially driven or stimulated by multiple control inputs from the set of tests, and the output of the control circuit (e.g., based on each of the multiple control inputs) may be measured. In some embodiments, the sequentially applied multiple control inputs may be a predetermined sequence of control inputs that are applied to test certain control circuits in a certain order (e.g., testing all control circuits of the aircraft). In some embodiments, the multiple control inputs may be the set of tests, such that each of the commands in the set of tests is implemented to determine validity of one or more control circuits. In some embodiments, the multiple control inputs (e.g., commands) may be inputs for at least a subset of the set of tests and may be used to determine validity of one or more control circuits.

In some embodiments, process 1100 may include (e.g., prior to step 1104 or as part of step 1104) receiving (e.g., based on a pilot interaction with an input device) a sequence of control inputs (e.g., a sequence of commands) to the control circuit and measuring an output based on the sequence (e.g., step 1104). The sequence may be an adaptive sequence, where a next input or test is determined based on a prior input (e.g., the last input, one or more prior inputs). For example, based on a control circuit passing a test, a first control input may be transmitted to the control circuit, and based on a control circuit not passing a test, a second control input may be transmitted to the control circuit.

In some embodiments, the set of tests or commands may be predetermined (e.g., for consistent pre-flight checks, across differing aircraft configurations, flights, or mode transitions). These predetermined tests (e.g., as described in relation to FIGS. 10-16), may be ordered in a sequence that is predetermined or adaptive, as previously described. In some embodiments, a mode transition is enabled based on passing each of a set of tests or commands or each of a sequence of tests or commands.

In some embodiments, process 1100, or any combination of processes discussed herein, may include providing a request to a pilot interface that prompts the pilot to input a certain control command, sequence of commands, or combination of commands, to the control circuit of the aircraft. For instance, the request may be transmitted as a visual indicator (e.g., a request on a display screen, a light indicator), an aural indicator (e.g., a message over a speaker), or a tactile indicator (e.g., communicate to user through sense of touch, vibrating stick or inceptor, additional resistance on stick or inceptor).

In some embodiments, process 1100 may, based on determining that—for one of the tests (e.g., each of the tests, the set of tests, the subset of tests)—a measured output corresponds to an associated expected output, enable a mode transition and/or permit control over aircraft power distribution. This may allow for determining a validity of one or more control circuits of the aircraft (e.g., all control circuits associated with aircraft effectors) or signals received at one or more aircraft effectors of the aircraft (e.g., all aircraft effectors). This may further allow for determining a fault or degraded operation of one or more control circuits of the aircraft (e.g., all control circuits associated with aircraft effectors) or signals received at one or more aircraft effectors of the aircraft (e.g., all aircraft effectors).

Step 1106 of controlling aircraft power distribution may include managing, regulating, and/or directing electrical power from energy sources to one or more aircraft systems, subsystems, or components. For example, based on the selected mode of operation in Step 1002 and the initial or current mode of operation, power may be directed to different systems, subsystems, or components of the aircraft (e.g., as described in FIGS. 4A-6D).

Process 1100 may enable a mode transition and/or control of power distribution based on one or more determinations (e.g., made at step 1104). For example, process 1100 may enable a mode transition and/or control of power distribution based on a measured output of a control circuit to a pilot input corresponding to an expected output. Controlling power distribution may include enabling HV power to an aircraft effector, which may be an aircraft effector associated with the measured control circuit (e.g., the control circuit is communicably coupled to the aircraft effector). In some embodiments, all of the control circuits associated with the aircraft effectors (e.g., EPUs, actuators, non-propulsive loads) may be tested, and based on satisfying the measured output corresponding to the expected output condition, a processor may enable HV power to all the aircraft effectors.

By way of example, process 1100 may use the following Boolean logic (e.g., which may be implemented using conditional logic, consistent with disclosed embodiments): output of control circuit satisfies test→permit mode transition. As another non-mutually exclusive example, process 1100 may use the following Boolean logic: output of first control circuit satisfies test→initiate test for second control circuit (repeatable). As another non-mutually exclusive example, process 1100 may use the following Boolean logic: outputs of multiple control circuit satisfies test→permit mode transition.

In some embodiments, one or more additional conditions may be checked before enabling transition to a fly mode of operation (e.g., Fly Mode 404). Additionally, in some embodiments, there may be an intermediary mode or submode in the transition to the selected fly mode of operation (e.g., Ground Fly Check Submode 407), where HV power is enabled to aircraft effectors, but one or more conditions may be checked before transitioning to a fly mode of operation (e.g., Fly Mode 404). Further, in some embodiments, user control to one or more aircraft effectors may be prevented before enabling HV power to the one or more aircraft effectors.

FIG. 12 illustrates process 1200 of controlling aircraft power distribution based on a measured output to automatic control of an aircraft component, consistent with embodiments of the present disclosure. Process 1200 may be implemented as software (e.g., in at least one module, at least one program, at least one application, and/or at least one function, etc.), hardware (e.g., at least one processor, such as an FCC, controller, etc.), or a combination of both. Some embodiments may include at least one processor that is configured to execute operations to perform process 1200. Some embodiments may include a computer-readable medium (e.g., a non-transitory computer-readable medium) that stores instructions executable by at least one processor to perform operations that include the steps of process 1200. The steps of process 1200 may be combined, rearranged, performed simultaneously, removed, and/or repeated. Process 1200 may include step 1002 (e.g., as described above), step 1204, step 1206, step 1208, step 1210, and/or step 1212. Process 1200 may be implemented by a control system including any of the systems, subsystems, devices, or configurations illustrated in FIGS. 3A-8. Actions described as being carried out by the process itself may also be carried out by a medium configured to carry out the process (e.g., a processor, a computer-readable medium, a system, etc.). Unless otherwise indicated, a step in process 1200 may be performed based on (e.g., in response to, based on a result of, upon completion of, etc.) a step that precedes it, whether or not the prior step is part of process 1200 (as processes described herein, and/or portions thereof, may be combined).

Step 1002 of receiving a selection of one of at least two aircraft modes of operation may refer to receiving a selection of one of at least two aircraft modes of operation as described in reference to FIG. 10 (e.g., using one or more of the modes described with respect to FIG. 4A, the mode transitions described with respect to FIG. 4B, and/or the circuitry described with respect to any of FIGS. 5A-6D). For example, step 1002 of receiving a selection of one of at least two aircraft modes of operation may refer to obtaining an input identifying an aircraft mode of operation to enter or transition to (e.g., based on a pilot, operator, or user request), where the input may indicate a choice between multiple modes (e.g., two or more modes of operation). A selection of one of at least two aircraft modes of operation may be received at a user input device (e.g., a first user input device), which may be at least one of a switch, knob, button, lever, display screen element, or voice receiver.

Step 1204 of preventing user control of an aircraft effector may include restricting, inhibiting, overriding, blocking, or otherwise limiting a pilot's or operator's ability to actuate, command, or influence an aircraft effector (e.g., an EPU, an actuator, a non-propulsive load). Preventing user control of an aircraft effector may be temporary (e.g., user control of an aircraft effector may be enabled or disabled). Step 1204 may include, while preventing user control of an aircraft effector, permitting automatic control of aircraft effectors (e.g., aircraft effectors are only controlled by automatic control).

In some embodiments, an aircraft that includes an aircraft effector may additionally include a fly-by-wire (FBW) control system. An FBW control system may refer to a control system where one or more control inputs from a pilot, operator, or automated system are converted into electrical, digital, or electronic signals that may be processed by a control system (e.g., an FCS, an FCC), which may—in turn—be transmitted to aircraft effectors with electrical links between the input device (e.g., a pilot input device, a user input device) and the effector.

A pilot input device may generate an input signal (e.g., transmittable to at least one downstream effector) based on a manual input by the pilot or operator. The pilot input device may be further configured to generate electronic or automatic inputs based on pilot or operator input to the pilot input device. Preventing user control of an aircraft effector (e.g., step 1204) may include blocking, interrupting, suppressing, scaling, filtering, or overriding user control based on pilot or operator input, which may affect the pilot or operator input device itself or the signals resulting from pilot or operator input.

As an example, as illustrated in FIG. 8, there may be two pilot sticks or inceptors that are communicably coupled to flight control computers (FCCs) or flight control systems (FCSs) (e.g., L FCC, R FCC, FCS 618). As further illustrated, these pilot sticks or inceptors may be configured to control various aircraft effectors (e.g., EPUs, actuators, non-propulsion loads) through the FCCs or FCSs and signal distribution elements (e.g., CAN buses). Preventing user control of an aircraft effector (e.g., step 1204) may include breaking a signal path between the pilot sticks or inceptors and the one or more aircraft effectors. Additionally, preventing user control of an aircraft effector may include disabling (e.g., disabling power to), deactivating, inhibiting, or rendering unresponsive a pilot input device or communication infrastructure connected thereto. Additionally or alternatively, preventing user control of an aircraft effector may include preventing the transmission of signals from the user input device, disregarding signals originating from the associated pilot input device, electrically isolating the associated pilot input device, removing control commands from a signal originating from the associated pilot input device, or any other operation that separates influence of aircraft effectors from pilot or operator input. In some embodiments, the power to other components of the aircraft may be or remain enabled (e.g., other LV power systems of the aircraft).

When user control of an aircraft effector is not prevented, the controller may be configured to receive pilot or operator input or generate control signals to command an aircraft effector (e.g., based on the pilot or operator input). Additionally, preventing user control to an aircraft effector by disabling a control may include disabling reception or transmission of control signals based on pilot inputs, while permitting reception or transmission of control signals based on automatic control. Further, preventing user control of an aircraft effector by disabling a controller may include disabling power to the controller. In some embodiments, power to other components of the aircraft may be enabled or remain enabled (e.g., other LV power systems of the aircraft).

Process 1200 may permit other operations or control signals to reach control effectors of the aircraft or control modify the behavior of control effectors of the aircraft (e.g., while preventing user control to an aircraft effector). Disregarding or removing signals originating from the user input device may include a software of the control system ignoring or not acting upon a control signal based on pilot or operator input. Disregarding or removing signals originating from the user input device may include filtering, extracting, suppressing, or blocking signals based on a pilot or operator input (e.g., prior to the control command reaching an aircraft effector, such that the control commands to not modify the aircraft effector). This may include filtering out signals associated with pilot or operator input or flagging signals associated with pilot or operator input, such that other systems may disregard the signals associated with pilot or operator input. Additionally, a control system (e.g., at least a portion of a control system, such as a processor or subsystem of a control system) may determine that a control signal originated from a user input device by pilot or operator input based on electrical or physical signal characteristics (e.g., signal voltage, signal current, separate wiring paths or inputs, or unique waveform signatures and patterns), digital identification (e.g., a device ID embedded in the signal, unique addressing, a bus ID, or other signal tagging to distinguish a signal generated based on pilot or user input), context-based determination, or another method of determining a source or origination point for a signal from the user input device or based on a pilot or operator input. Disregarding or removing signals originating from the user input device may prevent the control system from actuating, moving, or otherwise controlling the effector based on pilot or operator input.

Preventing user control may include electrically isolating a user input device (e.g., a pilot or operator input to pilot sticks or an inceptor), which may include electrically disconnecting, decoupling, or blocking the user input device from delivering signals to an aircraft control system, control circuit, or controller. Electrical isolation of a user input device may include hardware-based isolation (e.g., opening a relay, circuit breaker, or switching device to isolate the user input device from a bus or other signal distribution element).

Step 1206 may include enabling high-voltage (HV) power to the aircraft effector, which may include supplying, connecting, or making available HV power to an aircraft effector, such as an EPU, actuator, or non-propulsion load. Supplying, connecting, or making power available may be enabled by a switching device (e.g., contactor, relay, solid-state switch, MOSFET, IGBT), power distribution unit, battery management unit (e.g., as illustrated in FIGS.

5A-6A), an HV junction box (HVJB) (e.g., as illustrated in FIGS. 5A-6A), or a power distribution bus. In some embodiments, enabling HV power to the aircraft effector may occur after user control to the aircraft effector is prevented, which may be done to enable the testing of aircraft effectors before enabling the aircraft effectors for a certain aircraft mode of operation, such as flight or takeoff.

In some embodiments, HV power to the aircraft effector is enabled after a pre-flight check of a control system, control circuit, or control device of the aircraft is complete, as described and exemplified in reference to FIG. 11. Additionally, one or more conditions may be checked before enabling HV power to an aircraft effector, and at the time of or after satisfaction of the one or more conditions, HV power may be enabled to an aircraft effector (e.g., after user control of the aircraft effector is prevented).

Step 1208 may include automatically controlling the aircraft effector. Automatic control may refer to any operation, action, or process that is not based on or influenced by, or is distinct from, user input from a human operator (e.g., a pilot or operator of an aircraft). This may include generating commands, transmitting signals, or modifying or actuating an aircraft effector without requiring direct user input. Automatic control may occur continuously, periodically, or under certain operational conditions (e.g., an aircraft mode of operation). Automatic control may be based on sensor feedback, control laws, programmed logic, automated algorithms, operational or testing constraints, operational or testing thresholds, modes of operation, or any other system, subsystem, or element associated with the control system that may be configured to perform operations without input from a pilot or operator of the aircraft.

Automatically controlling the aircraft effector may be part of testing of aircraft effectors through a process of issuing, generating, or applying control instructions to an aircraft effector through automated interaction with the control system—rather than direct pilot input or manipulation—to ensure safe, consistent, or protective operation of the effector. This may include automatic control of the aircraft effector during testing or validation processes where incorrect pilot input could damage the aircraft or a subsystem of the aircraft or present a safety risk. For instance, for an aircraft such as a VTOL or eVTOL aircraft, certain pilot commands may be able to flip the plane or otherwise cause harm to the plane, pilot, and/or passengers while the plane is grounded (e.g., an on-ground status is indicated). This may be avoided through an automatic testing or validation process of the aircraft effectors (e.g., with reliable constraints, known safe outcomes, etc.), which may increase the safety of subsystems of the aircraft, or any crew or passengers that are on-board the aircraft.

An aircraft effector may include an EPU, an aircraft effector, or a non-propulsion load. A non-propulsion load may include any electrical load on the aircraft that consumes power but does not generate propulsive thrust or torque (e.g., aircraft effectors that support control, avionics, environmental systems, safety systems, or auxiliary equipment). For example, as illustrated in FIG. 8, aircraft effectors that may be automatically controlled may include a propeller, blades of a propeller, electric propulsion unit (e.g., including an inverter), tilt propeller actuator (TPAC), control surface actuator (CSA), ruddervator, flaperon, or any other aircraft effector associated with the systems of FIG. 8 or that may be powered based on a battery management system (BMS).

In some embodiments, automatically controlling the aircraft effector (e.g., an EPU, control actuator, or non-propulsion load) may include generating and/or transmitting at least one control instruction to the aircraft effector. A control instruction may be or include a signal supplied to or generated by a control system and/or is configured to cause the aircraft effector to perform a desired action, change a state, or achieve a target condition, without requiring input from a pilot or operator of the aircraft. In some embodiments, automatically controlling the aircraft effector the aircraft effector may include transmitting a sequence of control instructions (e.g., in a specified order) to the aircraft effector. For example, a sequence of control instructions may include an ordered set of control instructions (e.g., predetermined control instructions, adaptive control instructions), where the ordering of control instructions may be defined in advance of initiating a system, automatic control, or a pre-flight check. A sequence may be predetermined to achieve a desired operation, maneuver, or system state (e.g., a sequence may be determined based on a pre-flight check of an aircraft effector to determine validity or performance of the aircraft effector).

In some embodiments, a control instruction may include predetermined control instruction, which may include criteria, states, or parameters that are defined in advance of initiating a system automatic control, or a pre-flight check. Additionally or alternatively, a control instruction may include an adaptive control instruction, which may include a control instruction that is modified or transmitted based on an output based on at least one prior-transmitted control instruction (e.g., a measured output based on at least one prior-transmitted control instruction).

In some embodiments, automatically controlling an aircraft effector may include operating at least one component of the aircraft (e.g., the aircraft effector, a component associated with the aircraft effector) at a specified limit. This may include commanding or causing an aircraft effector to operate at, approach, or maintain a predetermined maximum, minimum, or threshold value, which may include operational parameter values of an allowable range (e.g., an allowable angle, rate, force, speed, or other operational parameter of the aircraft effector).

As further described in reference to step 1210, operating the at least one component of the aircraft at a specified limit may enable the measurement of the minimum or maximum component output capabilities. The measurement may provide data for the calculation of a performance metric the at least one component, as well as the pilot control authority or aircraft operating capability. Additionally, operating the at least one component of the aircraft (e.g., at least one aircraft effector) at a specified limit may enable the measurement of the output of the at least one aircraft effector, as well as the comparison of the output of the at least one aircraft effector to a threshold. A condition for enabling or executing a mode transition may include the output of the at least one aircraft effector exceeding the threshold (e.g., determined component performance or output is above a threshold level for takeoff, flight, or landing).

In some embodiments, the specified limit may be a pre-flight limit (e.g., before a flight, as part of a pre-flight check), which may refer to a maximum, minimum, or threshold value (e.g., a threshold range) of a parameter, position, or performance of an aircraft effector that may be used as part of a test or control instruction (e.g., part of a set of tests). Tests based on the pre-flight limit may enable the determination of aircraft effector performance before flight (e.g., before transitioning to Fly mode 404, takeoff, or enabling or conducting flight operations) or may enable ensuring safe operation during an upcoming flight or mission.

In some embodiments, the specified limit may be configured as a test limit. A test limit may be configured for the evaluation or verification of system performance, which may be used for determining a pilot control authority, an aircraft operating capability, or baseline aircraft performance before field deployment (e.g., post-manufacturing, before operation with passengers).

In some embodiments, the specified operating limit (e.g., for testing or validating an aircraft effector) may be different from a flight operating limit (e.g., a limit imposed on flight operations, an aircraft flight envelope). The specified operating limit may refer to or include a threshold value or range, minimum, or maximum that is defined for the purpose of evaluating, validating, or characterizing the performance of functionality of an aircraft effector under controlled test conditions. Further, the flight operating limit may refer to or include a threshold value or range that is approved or established for use during aircraft operation (e.g., takeoff, flight operations, landing, Fly Mode 404) to ensure safe, reliable, or regulated (e.g., adherence to FAA or air traffic control rules). The different specified operating limit and flight operating limit may allow for testing or validation a greater range of aircraft operational parameters during test, maintenance, or a pre-flight check, such that it is ensured that an aircraft is capable of operating with capabilities greater than what the aircraft is limited to or required to perform during takeoff, landing, or flight operations.

Step 1210 may include measuring an output based on the automatic control (e.g., of step 1208). Measuring the output of an aircraft effector may refer to detecting, sensing, or quantifying any physical, electrical, mechanical, or aerodynamic reaction of an aircraft effector based on control instruction or command received by the control effector. For example, step 1210 may include measuring the output of a control circuit (e.g., similar to as described in reference to FIG. 11) or measuring the output of an aircraft effector, where the output of the control circuit or the aircraft effector is based on an automatic control input to the control circuit or the aircraft effector. In some embodiments the measured output of the control circuit or the aircraft effector may include an electrical parameter, analog signal, digital signal, an output over time, or a figure of merit (e.g., as previously described in reference to FIG. 11).

The output measurement may include determining a direction or distance (e.g., magnitude) of aircraft effector movement, rate of aircraft effector movement, force or torque produced by aircraft effector movement, power consumption of an aircraft effector movement, or any other factor that may determine how the automatic control of an aircraft effector modifies the aircraft or system conditions. Examples of measurements of an output of an aircraft effector may include:

1) measuring a position or deflection, (e.g., by using a position sensor—including a potentiometer, resolver, encoder, or any other type of position sensor—to measure a deflection distance or angle of an elevator, an aileron, a rudder, a flap, a tilt operation of a TPS, a tilt operation associated with an EPU),
2) measuring a speed or rate of movement, (e.g., by measuring the velocity or measuring the deflection over time and deriving the velocity),
3) measuring force, torque, or load (e.g., by measuring output torque, measuring actuator force with load sensors, or measuring an aerodynamic load),
4) measuring electrical output, (e.g., measuring current draw, voltage, power consumption, or another electrical parameter of an aircraft effector),
5) measuring motion of the aircraft caused by the aircraft effector, (e.g., pitch rate, roll rate, yaw rate, acceleration, or flight path deviation),
6) measuring environmental output, (e.g., temperature changes, vibration, strain on the aircraft structure),
7) measuring timing or responsiveness, (e.g., measuring a time delay and latency between issuance of a control instruction and a resulting movement of the aircraft effector, measuring an accuracy or precision of the resulting movement based on the automatic control instruction),
8) measuring operational status (e.g., determining a failure, fault, or degraded operation of an aircraft effector, or
9) any other method of measuring an aircraft based on automatic control that is based on automatic control inputs and not pilot or operator inputs.

Process 1200 may compare a measured output to an expected output (e.g., as described in reference to FIG. 11). In some embodiments, a one or more comparisons may occur as part of a test or set of tests (e.g., as previously defined) to determine the validity of the aircraft effector.

In some embodiments, a plurality of control instructions or a sequence of control instructions may be part of a set of tests to determine the validity or performance of an aircraft effector. Additionally, the set of tests may be configured for determining the validity or performance of at least a portion of the aircraft effectors of an aircraft (e.g., all of the aircraft effectors). For instance, each of these control instructions may correspond to an expected output and an automatic control of an aircraft effector. Each of the control instructions (e.g., in a sequence) may control an aircraft effector, which may enable a measurement of the output of the aircraft effector and a comparison to the expected output. The set of tests including the sequence of control instructions may allow for the determination of an operating capability of one or more aircraft effectors.

For example, in some embodiments, the set of tests may be configured for determining a pilot control authority. This may include determining at least a portion of pilot control authority based on the testing of the aircraft effectors. Additionally, this may include determining at least a portion of the pilot control authority based on the testing of aircraft effectors while the control of the aircraft effectors by pilot or operator input is prevented. Determining the pilot control authority may include measuring the output (e.g., movement) of the aircraft effectors in response to the control instructions of set of tests configured for determining the pilot control authority.

For example, in some embodiments, the set of tests may be configured for determining an aircraft operating capability (e.g., as defined and exemplified in reference to FIG. 11). This may include determining at least a portion of aircraft operating capability based on the testing of aircraft effectors. Additionally, this may include determining at least a portion of the aircraft operating capability based on the testing of aircraft effectors while the control of the aircraft effectors by pilot or operator input is prevented. Determining the aircraft operating capability may include measuring the output (e.g., movement) of the aircraft effectors in response to the control instructions of the set of tests configured for determining the aircraft operating capability.

Based on determining that the measured output corresponds to the expected output (e.g., as described in reference to FIG. 11), process 1200 may enable modification of the aircraft power distribution or pilot or operator control of the aircraft effector. Additionally, based on determining that the measured output corresponds to the expected output, process 1200 may enable a mode transition (e.g., to Fly Mode 404).

By way of example, process 1200 may use the following Boolean logic (e.g., which may be implemented using conditional logic, consistent with disclosed embodiments): output satisfies test→permit mode transition. As another non-mutually exclusive example, process 1200 may use the following Boolean logic: first output satisfies first test→initiate second test (repeatable). As another non-mutually exclusive example, process 1200 may use the following Boolean logic: multiple outputs (e.g., of multiple effectors) satisfies one or more tests→permit mode transition.

Step 1212 may include enabling user control of the aircraft effector. Enabling user control of the aircraft effector may include allowing for pilot or operator input to directly command an aircraft effector based on physical actuation of a pilot input device, which may include directly commanding an effector only after certain conditions are satisfied (e.g., one or more conditions, a pre-flight check as described in step 1002, 1202, 1204, 1206, or 1208). Based on determining that one or more conditions, process 1200 may enable user control to the aircraft effector. The one or more conditions may include the measured output to the automatic control of the aircraft effector corresponding to an expected output. Enabling user control to the aircraft effector may be a part of a mode transition to a flight mode of operation (e.g., to Fly Mode 404).

FIG. 13 illustrates process 1300 of controlling aircraft power distribution based on a measured output of a control circuit based on (e.g., responsive to) an input and a measured output based on automatic control of an aircraft effector, consistent with embodiments of the present disclosure. Process 1300 may be implemented as software (e.g., in at least one module, at least one program, at least one application, and/or at least one function, etc.), hardware (e.g., at least one processor, such as an FCC, controller, etc.), or a combination of both. Some embodiments may include at least one processor that is configured to execute operations to perform process 1300. Some embodiments may include a computer-readable medium (e.g., a non-transitory computer-readable medium) that stores instructions executable by at least one processor to perform operations that include the steps of process 1300. The steps of process 1300 may be combined, rearranged, performed simultaneously, removed, and/or repeated. Actions described as being carried out by the process itself may also be carried out by a medium configured to carry out the process (e.g., a processor, a computer-readable medium, a system, etc.). Unless otherwise indicated, a step in process 1300 may be performed based on (e.g., in response to, based on a result of, upon completion of, etc.) a step that precedes it, whether or not the prior step is part of process 1300 (as processes described herein, and/or portions thereof, may be combined).

Process 1300 may include step 1002 (e.g., as previously described in reference to FIGS. 10-12) and/or step 1104 of measuring an output of a control circuit based on (e.g., responsive to) an input (e.g., as previously described in reference to FIG. 11). The control circuit may be a control circuit that is associated with the control of the aircraft effector (e.g., as described with respect to steps 1204, 1206, 1208, 1210, and 1212). Process 1300 may include step 1204 (e.g., as previously described in reference to FIG. 12), step 1206 (e.g., as previously described in reference to FIG. 12), step 1208 (e.g., as previously described in reference to FIG. 12), step 1210 (e.g., as previously described in reference to FIG. 12), and/or step 1212 (e.g., as previously described in reference to FIG. 12). Process 1300 may be implemented by a control system including any of the systems, subsystems, devices, or configurations illustrated in FIGS. 3A-8.

FIG. 13 may illustrate a process 1300 by which the validity or performance of a control system of an aircraft may be verified, and subsequently, the validity or performance of an aircraft effector of the aircraft may be verified. Process 1300 may include step 1002, 1104, 1204, 1206, 1208, 1210, and 1212, all described above with respect to other figures. The verification of the control system may be based on pilot or operator input with aircraft effectors disabled (e.g., no HV power to aircraft effectors). The verification of the aircraft effector may be initiated based on an output of a control circuit to the pilot or operator input corresponding to an expected output, consistent with disclosed embodiments. The aircraft effector may be controlled by or otherwise associated with the control circuit, as discussed above.

Based on initiation of the verification of the aircraft effector, process 1300 may prevent user control to the aircraft effector. However, the aircraft effector may be controlled by automatic control instructions or commands. Based on this automatic control, the output of the aircraft effector may be measured and compared to an expected output of the control effector, consistent with disclosed embodiments.

Based on determining that the measured and expected outputs correspond to each other, process 1300 may enable user control of the aircraft effector, e.g., such that the pilot or operator may be enabled to implement aircraft operations using the aircraft effector. Additionally, one or more control circuits and/or aircraft effectors may be verified through process 1300. Based on (e.g., after) process 1300 enabling the pilot or operator to implement aircraft operations using the one or more aircraft effectors, the pilot or operator may be enabled to command the aircraft to perform takeoff operations, flight operations, landing operations, or any other aircraft operation involving the aircraft effectors (e.g., aircraft may transition into Fly Mode 404).

FIG. 14 illustrates process 1400 of performing an EPU disconnection operation based on a selection of an aircraft mode of operation, consistent with embodiments of the present disclosure. Process 1400 may be implemented as software (e.g., in at least one module, at least one program, at least one application, and/or at least one function, etc.), hardware (e.g., at least one processor, such as an FCC, controller, etc.), or a combination of both. Some embodiments may include at least one processor that is configured to execute operations to perform process 1400. Some embodiments may include a computer-readable medium (e.g., a non-transitory computer-readable medium) that stores instructions executable by at least one processor to perform operations that include the steps of process 1400. The steps of process 1400 may be combined, rearranged, performed simultaneously, removed, and/or repeated. Unless otherwise indicated, a step in process 1400 may be performed based on (e.g., in response to, based on a result of, upon completion of, etc.) a step that precedes it, whether or not the prior step is part of process 1400 (as processes described herein, and/or portions thereof, may be combined).

Process 1400 may include step 1002 of receiving a selection of one of at least two aircraft modes of operation (described above), step 1404, step 1406, and/or step 1408. Process 1400 may be implemented by a control system including any of the systems, subsystems, devices, or configurations illustrated in FIGS. 3A-8. Actions described as being carried out by the process itself may also be carried out by a medium configured to carry out the process (e.g., a processor, a computer-readable medium, a system, etc.).

Step 1002 of receiving a selection of one of at least two aircraft modes of operation may refer to receiving a selection of one of at least two aircraft modes of operation as described in reference to FIG. 10 (e.g., using one or more of the modes described with respect to FIG. 4A, the mode transitions described with respect to FIG. 4B, and/or the circuitry described with respect to any of FIGS. 5A-6D). For example, step 1002 of receiving a selection of one of at least two aircraft modes of operation may refer to obtaining an input identifying an aircraft mode of operation to enter or transition to (e.g., based on a pilot, operator, or user request), where the input may indicate a choice between multiple modes (e.g., two or more modes of operation). In some embodiments the user input device for mode selection (e.g., a first user input device, mode switch 616). In some embodiments, the user input device (e.g., first user input device, mode switch 616) may be housed within the aircraft or communicatively coupled to the aircraft (e.g., to FCS 618 or another or another control system, which may include a remote connection or remote coupling). Additionally, in some embodiments, the user input device (e.g., first user input device, mode switch 616), may be configured to remotely control the mode selection of the aircraft.

Step 1404 may include disconnecting high-voltage (HV) power to an EPU. Disconnecting HV power may include interrupting, isolating, or otherwise halting delivery of HV power from a power source of the aircraft (e.g., a battery pack) to the EPU. Disconnecting HV power to an EPU may involve electrical, mechanical, or software-based approaches (e.g., or a combination of these) that may remove or block an HV distribution path associated with the EPU and the power source of the aircraft. A process for disconnecting HV power to an EPU may include immediate, sequenced, or condition-dependent, consistent with disclosed embodiments. In some embodiments, a condition that the EPU is connected, enabled, or otherwise receiving HV power may be checked before initiating a disconnection process (e.g., disconnecting HV power to an EPU).

Disconnecting HV power to an EPU may involve a component for electrical isolation (e.g., a modifiable electrical isolation component, a contactor, a relay, solid-state switching devices or power controllers), a software or control command for disconnection (e.g., a processor or controller issuing a "disconnect" command, automated disconnection processes, pilot-requested disconnection), passive or safety-triggered disconnection (e.g., over-temperature, electrical fault, or impact detection-based disconnection processes or systems), mechanical separation (e.g., cutloops for emergency responders, disconnects for service or maintenance, disconnects for test), or any inhibition of an electrical pathway. In some embodiments, disconnecting HV power to the EPU includes controlling at least one switching device (e.g., at least one of a contactor, a relay, or a transistor).

In some embodiments, a disconnection process may be initiated based on (e.g., in response to) a mode selection. A process for disconnecting HV power from an EPU (e.g., step 1404) may be initiated by an event, condition, or command that may cause the system to remove, interrupt, or isolate power or control to an aircraft effector, such as an EPU. For example, upon detecting or receiving an indication of a crash or water landing (e.g., a user indication before the crash or water landing occurs), the aircraft may initiate the process for disconnecting HV power from an EPU (e.g., to reduce a risk associated with HV power due to an impact or interaction with water).

As an example, a disconnection process (e.g., step 1404) may be initiated based on a selection of a ground mode of operation from a fly mode of operation (e.g., the fly mode of operation is the current mode of operation), which may include initiating the disconnection process at the time of or after receiving an aircraft ground mode selection (e.g., while in Fly Mode 404, disconnection is initiated at the time of or after selecting Ground Mode 403). In some embodiments, an aircraft ground mode selection may be received through a user input device (e.g., mode switch 616 of FIGS. 6A-6D). In some embodiments, an aircraft ground mode selection may be determined based on an aircraft status (e.g., an on-ground status or in-flight status). In some embodiments, the disconnection process may be automatically initiated based on the determination of an aircraft on-ground status.

An aircraft on-ground status may include any indicator that the aircraft is on the ground or otherwise not in free flight, which may be based on any detectable condition, signal, measurement, or system state. Determining an aircraft on-ground status may be based on a weight-on-wheels (e.g., strain or load sensors in a landing gear, indicator that landing gear is carrying weight, indicator that a skid is carrying weight), ground proximity sensors (e.g., altimeter reading below a threshold, or radar, sonar, or lidar sensors to detect ground contact or low altitude), motion-based determination (e.g., a speed of the aircraft is equal to zero for a specified duration, accelerometers detect ground contact, or pitch, roll, or yaw are stable for a set amount of time), electrical indicators (e.g., a charger connected, ground power unit connected, maintenance operations engaged), or any other combination or individual method for detecting whether an aircraft is on the ground.

As another example, a disconnection process (e.g., step 1404) may be initiated by a selection of a testing mode of operation from another mode of operation (e.g., the another mode of operation is the current mode of operation), which may include initiating the disconnection process at the time of or after receiving a testing mode selection (e.g., Service Maintenance Submode 405 Ground Maintenance Submode 406 may be configured as a testing mode). As a further example, a disconnection process may be initiated by a selection of an off mode of the aircraft from another mode of operation (e.g., the another mode of operation is the current mode of operation), which may include initiating the disconnection process at the time of or after receiving the off mode selection (e.g., Off Mode 401).

In some embodiments, a disconnection process (e.g., step 1404) may be initiated by an FCS. A disconnection process that is initiated by an FCS may refer to an FCS (e.g., FCS 618 of FIGS. 6A, 6D, 7, and 8) that may generate a command or signal that may initiate a process to disconnect, isolate, or remove power or control from an aircraft effector, such as an EPU. An FCS may initiate a disconnection process based on its logic (e.g., hardware- or software-implemented logic), a detected condition of the aircraft operational environment or the aircraft's subsystems, or an operational mode of the aircraft. An FCS may initiate a disconnection process based on a selected mode of operation from a mode switch that is communicatively coupled to the FCS (e.g., mode switch 616 communicatively coupled to FCS 618 as illustrated in FIG. 6A). Additionally, an FCS may initiate a disconnection process based on surpassing a safety threshold or entering a fault condition (e.g., excessive torque, overspeed, overcurrent, runaway actuator motion, tilt disconnection, loss of sensor feedback, component failure during testing, thermal runaway, avionic fault).

In some embodiments, a disconnection process (e.g., step 1404) may be initiated via a remote controller. A process for disconnecting an EPU that is initiated by a remote controller may include transmitting a command or trigger signal from a device or system that is physically separate from the aircraft (e.g., operating via a networked or wireless interface, outside of the aircraft). The remote controller may initiate a disconnection process via manual disconnection commands, automated disconnection commands, or other signals determined by software or hardware of the remote controller that may be transmitted to a system onboard the aircraft to disconnect the EPU (e.g., via a radio link associated with the aircraft, as described in reference to FIG. 7). A remote controller may be located at a pilot station (e.g., a place from which an aircraft may be remotely piloted), a ground station, a maintenance interface, a service interface, or a test interface.

In some embodiments, a disconnection process (e.g., step 1404) may be initiated from a pilot input device, such as pilot sticks or an inceptor (e.g., a second user input device). In some embodiments, the pilot input device may further include a mode switch (e.g., mode switch 616, first user input device). This may enable a pilot to control the aircraft behavior and the aircraft mode of operation from the same control device (e.g., the pilot input device).

Step 1406 may include confirming disconnection of the EPU. Confirming disconnection may refer to or include verifying, detecting, or otherwise ensuring that HV power or control signals have been isolated or blocked from an EPU. A confirmation of disconnection of an EPU may include performing electrical measurements, sensor feedback, control system signals, or software verification, which may occur based on automatic or manual controls (e.g., local or remote controls). Confirming disconnection of an EPU may include confirming that all HV paths (e.g., buses) or control signals to the EPU are blocked or interrupted.

Confirming disconnection of an EPU may include providing feedback to a pilot or operator, an FCS or control system of the aircraft, or a ground system about a connection status of the EPU (e.g., disconnection was successful). Additionally, the confirmation of disconnection of the EPU may be a part of a pre-flight check, a maintenance procedure, an aircraft testing sequence, a fault response, or a mode transition (e.g., a mode transition in which an EPU may be disconnected or disabled).

Confirming disconnection of an EPU may include electrically confirming a disconnection, which may include measuring a bus voltage, a voltage across the EPU (e.g., lack thereof, voltage below a threshold, etc.), a current flowing to the EPU (e.g., lack thereof, current below a threshold, etc.), a continuity associated with the EPU (e.g., lack thereof, continuity below a threshold, etc.), a confirmed open state of a switching device, or any other electrical parameter that may confirm a disconnection of the EPU. For example, confirming disconnection of an EPU may include determining a lack of continuity between the EPU and the HV power system. Confirming disconnection of an EPU may include comparing measured electrical information to a threshold and/or determining if measured electrical information satisfies at least one discharge parameter.

Confirming disconnection of an EPU may include waiting for a time delay (e.g., a first pre-determined time delay of a disconnection process), and after waiting for at least the time delay, determining that the EPU is disconnected. A time delay for confirming disconnection may be based on a time for a switching device (e.g., contactor, relay, transistor) to fully open or close, and an additional buffer time may be added to the time to fully open or close.

Process 1400 may use conditional logic to confirming disconnection of an EPU, prior to performing a discharge operation (e.g., step 1408). By way of example, process 1400 may use the following Boolean logic (e.g., which may be implemented using conditional logic, consistent with disclosed embodiments): EPU is disconnected→permit discharge operation.

Step 1408 may include performing a discharge operation. Performing a discharge operation may refer to or include executing one or more actions to remove or dissipate stored electrical energy of an electrical system, component, or element of an EPU that may store electrical energy, such as a capacitor. Performing a discharge operation may include automatic, manual, or remote control. Performing a discharge operation may involve passive discharge operations or active discharge operations.

Performing a discharge operation may include discharging a capacitor of the EPU (e.g., a smoothing capacitor, a capacitor across the terminals of the EPU, a capacitor electrically connected to the EPU system). Conducting a discharge operation to discharge the capacitor of the EPU may be initiated at the time of or after confirming disconnection of HV power to the EPU. This may further include discharging the capacitor of the EPU after measuring a loss of continuity between the HV power system (e.g., a battery pack) and the EPU. In some embodiments, discharging the capacitor may include waiting for a time delay, which may be a predetermined time delay for discharge (e.g., a predetermined designated discharge time, a second predetermined time delay).

In some embodiments, discharging the capacitor of the EPU may include passively discharging the capacitor, which may include allowing stored electrical energy of the capacitor of the EPU to dissipate over time through distributed (e.g., inherent) resistive losses of the EPU system (e.g., without applying an active discharge circuit or an additional load to discharge the capacitor). Passively discharging may include discharging based on a time constant of the circuitry associated with the capacitor (e.g., an RC time constant). For example, passively discharging may include discharging the capacitor through distributed resistive losses in electrical buses and components associated with the EPU. Additionally, passively discharging may include waiting for an amount of time (e.g., a predetermined amount of time, a time delay, a second predetermined time delay, predetermined designated discharge time). The length of a time delay for discharge may be determined based on a multiple of the time constant (e.g., for an RC time constant, $\tau$: $5\tau$, $\tau$ to $10\tau$). The length of a time delay for discharge may be determined based on the time constant with an additional buffer (e.g., for an RC time constant: $\tau+t_{buffer}$ to $10\tau+t_{buffer}$). The length of a time delay for discharge may be determined based on empirical data from testing and measurements, where a time to reach a discharge percentage may be measured, and the length of a time delay may be based on the time associated with the desired discharge percentage.

In some embodiments, discharging the capacitor of the EPU may include actively discharging the capacitor, which may include intentionally removing or dissipating stored electrical energy from a capacitor of the EPU by introducing a controlled load, which may—for example—increase the rate of energy dissipation. Current flow through the controlled load may be switched on and off, such that active discharge may be enabled or disabled. An active discharge process may include automatic, manual, or remote control.

Active discharge may enable a controlled reduction of energy (e.g., by controlling a rate of dissipation to increase or decrease based on an active discharge signal). The active discharge process may include controlling current to flow through a resistive element. The active discharge process may include toggling a switch, such that the switching losses of the switch discharge the capacitor of the EPU.

As an example, a resistance may be introduced into a circuit by toggling a switching device, where switching losses arise due to a transition (e.g., toggling) between on and off (e.g., open and closed) states of the switching device. In this example, the switching device may be configured (e.g., by circuitry coupling the capacitor of the EPU and the switching device) to dissipate energy from the capacitor of the EPU. These switching losses may dissipate energy in a manner that may be controlled by an active discharge signal transmitted to the switching device (e.g., a switching signal), where the rate of dissipation may be based on a frequency of switching, rise time, fall time, voltage across the capacitor, current through the switching device, or another electrical parameter of the switching device, capacitor, or associated circuitry (e.g., parasitics).

As another example, a switching device may control current flow through a resistor or a resistive element. The resistor may be configured such that current does not flow through the resistor unless a switching device is turned on (e.g., by an active discharge signal). The switching device and resistor may be configured such that when the switching device is closed, the capacitor is be discharged. By closing the switching device to permit current flow through a resistor, the added resistance may increase the rate of dissipation of energy from the capacitor of the EPU. Current flow through the switching device may be controlled by operating the switching device in a linear region or by using pulse width modulation (PWM) of a signal controlling the switching device state (e.g., on or off, open or closed). The control of current flow may enable the selective increase or decrease of a rate of discharge of the capacitor of the EPU.

Active discharge may terminate once the capacitor of the EPU drops below a threshold voltage for discharge. The threshold voltage for discharge may be a percent or a value of an operating voltage of the EPU or a designated discharged state, which may refer to a state where a discharge condition or a predefined termination condition has been satisfied. At the time of or after reaching this threshold voltage for discharge or designated discharged state, a controller (e.g., an active discharge controller, an FCS) may issue a command to stop the discharge or may stop the transmission of an active discharge signal (e.g., from the controller, from another component such as a gate driver that drives a switching device associated with the active discharge).

Based on a discharge process of the capacitor of the EPU, the discharge of the capacitor of the EPU may be confirmed. The confirmation of the discharge of the capacitor of the EPU may include measuring a voltage (e.g., across the capacitor, across two points in the EPU). For example, a capacitor of the EPU may be a smoothing capacitor or a capacitor that is connected across the terminals of the EPU, and a voltage may be measured at across the terminals of the capacitor or the EPU. When this voltage is below a threshold level or is in a designated discharge state, the discharge of the capacitor may be confirmed.

At the time of or after confirming the discharge of the capacitor, the HV power system of the aircraft may be shut down. For example, based on confirming the discharge of the capacitor, process 1400 may shut down the aircraft's HV power system. Additionally, information about the HV power system shutting down may be transmitted to a ground station, a pilot or operator, or another interested user of the aircraft or a human in the vicinity of the aircraft.

Performing a discharge operation may ensure that the EPU system is de-energized or safe for handling, testing, maintenance, or other aircraft operations (e.g., does not cause harm to components of the aircraft, does not cause harm to humans or users in the vicinity of the aircraft). Performing a discharge operation may ensure compliance with testing limits (e.g., a voltage or another electrical parameter is within a threshold range for testing) or prevention of aircraft or component damage.

FIG. 15 illustrates process 1500 of controlling aircraft power distribution based on mode transition conditions, consistent with embodiments of the present disclosure. Process 1500 may be implemented as software (e.g., in at least one module, at least one program, at least one application, and/or at least one function, etc.), hardware (e.g., at least one processor, such as an FCC, controller, etc.), or a combination of both. Some embodiments may include at least one processor that is configured to execute operations to perform process 1500. Some embodiments may include a computer-readable medium (e.g., a non-transitory computer-readable medium) that stores instructions executable by at least one processor to perform operations that include the steps of process 1500. The steps of process 1500 may be combined, rearranged, performed simultaneously, removed, and/or repeated. Process 1500 may include step 1002 (e.g., as described above), step 1504, step 1506, and/or step 1508 of controlling aircraft power distribution. Process 1500 may be implemented by a control system including any of the systems, subsystems, devices, or configurations illustrated in FIGS. 3A-8. Actions described as being carried out by the process itself may also be carried out by a medium configured to carry out the process (e.g., a processor, a computer-readable medium, a system, etc.). Unless otherwise indicated, a step in process 1500 may be performed based on (e.g., in response to, based on a result of, upon completion of, etc.) a step that precedes it, whether or not the prior step is part of process 1500 (as processes described herein, and/or portions thereof, may be combined).

Step 1002 of receiving a selection of one of at least two aircraft modes of operation may refer to or include receiving a selection of one of at least two aircraft modes of operation as described in reference to FIG. 10 (e.g., using one or more of the modes described with respect to FIG. 4A, the mode transitions described with respect to FIG. 4B, and/or the circuitry described with respect to any of FIGS. 5A-6D). For example, step 1002 of receiving a selection of one of at least two aircraft modes of operation may refer to obtaining an input identifying an aircraft mode of operation to enter or transition to (e.g., based on a pilot, operator, or user request), where the input may indicate a choice between multiple modes (e.g., two or more modes of operation).

Step 1504 may include determining mode transition conditions. Determining mode transition conditions may refer to or include identifying, selecting, or establishing-based on a current aircraft mode of operation and a selected mode of operation-specific system parameters, thresholds, or criteria that may be checked or validated before permitting a mode transition from the current aircraft mode of operation to the selected aircraft mode of operation, such as the conditions discussed above with respect to FIG. 4B, FIG. 9A, FIG. 9B, and FIGS. 10-14. The mode transition conditions may be based on an aircraft configuration, an upcoming flight, pilot commands, environmental factors, and/or any other factors that may modify the safety of the aircraft. Determining mode transition conditions may include defining sensor measurements, system states, or control signals for a testing process associated with checking the mode transition conditions, such that any or all safety, operational, or performance requirements associated with the testing process may be considered before enabling or executing a mode transition.

As an example, in reference to FIG. 7, a mode transition may involve enabling or disabling an EPU. Determining mode transition conditions may include, for example, determining a set of conditions associated with the enabling or disabling of an EPU. In some embodiments, the set of conditions may include at least one of a command and control radio link is functioning as intended, a discharge target of an EPU is achieved, none of a plurality of particular EPU commands exist (e.g., anything other than off or standby), a flight termination system radio link is functioning as intended, a voltage across the EPU is measured to be less than or equal to a threshold, or an aircraft grounded status is present (e.g., the aircraft is on the ground).

Determining mode transition conditions may include determining a subset of the set of conditions associated with the enabling or disabling of an EPU to be checked (e.g., one or more of the conditions in the set of conditions should be checked). For instance, in some embodiments, the one or more conditions may include at least one of a radio link is functioning as intended, a discharge target of an EPU is satisfied, or no EPU warning indicators are present. Further, the one or more conditions may include a radio link is functioning as intended (e.g., a command and control radio link, a flight termination system radio link), a discharge target of an EPU is satisfied, or no EPU warning indicators are present. An EPU warning indicator may refer to a visual indicator, aural indicator, tactile indicator, or electronic signal that may convey to a pilot, operator, or system that an EPU is not in a condition to be enabled or disabled, which may be based on a selected mode or due to a potential reduction of EPU performance or decrease aircraft safety. For example, an EPU warning indicator may be present if a command other than off or standby is transmitted to an EPU when disabling or enabling an EPU. An EPU warning indicator may be generated (e.g., by an FCC) based on a lookup table, rule set, model, or any combination of predetermined conditions or parameters (which may be associated through one or more logical rules).

Step 1506 may include checking the mode transition conditions may refer to verifying, monitoring, or confirming that the determined mode transition conditions are satisfied, where satisfying the determined mode transition conditions may include all determined system parameters, thresholds, or criteria have been met, such that the control system of the aircraft may be enabled to execute a mode transition (e.g., from the current aircraft mode of operation to the selected mode of operation). The transition may occur at the time of or after determining that all determined system parameters, thresholds, or criteria are satisfied, which may promote aircraft safety (e.g., for passengers, crew, and the aircraft) and consistent aircraft operations (e.g., consistent passenger or crew experience in various aircraft modes of operation).

Checking the mode transition conditions may include verifying determined conditions for a testing process, such as sensor readings, control signals, or operational limits (e.g., as discussed in reference to FIG. 4B, FIG. 7, and FIGS. 10-14). Checking the mode transition conditions may include determining that a mode transition will not result in operations that may damage aircraft components, degrade aircraft performance (e.g., pilot control authority or aircraft operating capability), or otherwise harm the aircraft, the crew, the passengers, or other humans that may be in the vicinity of the aircraft.

As an example, in reference to FIG. 7, for a determined mode transition condition to enable or disable an EPU of determining whether a radio link is functioning as intended, the radio link may include a command and control radio link or a flight termination system radio link. The condition that a radio link is functioning as intended may comprise the command and control radio link is functioning as intended, or the flight termination system radio link is functioning as intended. To determine whether the radio link, command and control radio link, or flight termination system radio link is functioning as intended, process 1500, such as by using an FCS or FCC (e.g., FCS 618), may verify a reception, transmission, or performance metric of a radio signal associated with the radio link. Additionally, the performance metric of a radio signal associated with the radio link may include a latency, signal strength, signal integrity, signal distortion, or signal-to-noise ratio (SNR).

In some embodiments, the reception, transmission, or performance metric may be based on communication with a ground station. A ground station may be a facility, system, or device on the ground that is configured to communicate with, monitor, or command an aircraft. In some embodiments, a ground station may provide operational control, telemetry, mission planning, or oversight for safety or operational coordination purposes. In some embodiments, a ground station may communicate or interface with the aircraft (e.g., systems or individuals of the aircraft) by radio waves, satellite, or a wireless communication link. Additionally, a ground station may be used for piloting, monitoring, testing, maintenance, or data collection.

The verification that a radio link is functioning as intended may serve to validate communication systems of the aircraft (e.g., prior to takeoff, landing, or flight operations, as well as prior to enabling or disabling an EPU). The verification that a radio link is functioning as intended may be a single condition that is checked prior to enabling or disabling an EPU, or it may be a part of a set of conditions that are checked prior to enabling or disabling an EPU. By way of example, the radio link verification condition may be expressed as, in Boolean logic: Radio link is functioning as intended→enable EPU.

While certain parts of the description, including the Boolean logic mentioned above, may refer to only a single condition, many embodiments may use multiple conditions instead of a single condition (e.g., as conditions for whether to transition between aircraft modes of operation).

As an additional example, in reference to FIG. 7, a mode transition condition may include an EPU achieving a discharge target (e.g., similar to as described in reference to FIG. 14). A determined condition for mode transition or a condition to enable or disable an EPU may include satisfying an EPU discharge target. For example, the one or more conditions may include at least one of: expiration of a timer set for a time associated with a length of discharge, satisfaction of a discharge target based on a monitored discharge status, or no detection of a fault for a discharge operation.

The expiration of a timer set for a time associated with a length of discharge may be similar to the time delay (e.g., second predetermined time delay, predetermined designated discharge time), as described in reference to FIG. 14. The timer may be set to a length of time based on a time constant of the associated circuitry being discharged (e.g., an RC time constant).

Whether a discharge target is satisfied may be based on a voltage across a capacitor of the EPU. Additionally, the satisfaction of a discharge target based on a monitored discharge status may be similar to discharge monitoring, as described in reference to FIG. 14.

No detection of a fault for a discharge operation may refer to determining that, during the discharge process of a component (e.g., a component of the EPU, a capacitor of the EPU, a HV bus), no abnormal conditions, errors, or failures that could reduce the rate of discharge or prevent discharge (e.g., from proceeding safely, from completing or reaching a discharge target). This may include a voltage of a component decreasing at an expected rate of discharge (e.g., based on a time constant for passive discharge, based on a time constant for active discharge that is modified by the selective insertion of an additional load). Faults for a discharge operation may further include overcurrent, overvoltage, short circuit, overtemperature, sensor malfunctions, or any other error in a discharge process that may diminish the ability to reach a discharge target. Additionally, no detection of a fault for a discharge operation may include that the fault is determined based on at least one of an electrical fault or a degraded discharge operation.

The verification that a discharge target of an EPU is satisfied may serve to ensure that the HV systems are in a condition that does not permit unsafe conditions for the aircraft or humans in the vicinity of the aircraft (e.g., pilot, operator, passenger, crew, maintenance staff). The verification that a discharge target of an EPU is satisfied may be a single condition that is checked prior to enabling or disabling an EPU, or it may be a part of a set of conditions that are checked prior to enabling or disabling an EPU. By way of example, the EPU discharge target condition may be expressed as, in Boolean logic: EPU discharged below target→disable EPU. As another non-exclusive example, the EPU discharge target condition may be expressed as, in Boolean logic: EPU discharge timer has elapsed→disable EPU. As yet another non-exclusive example, the EPU discharge target condition may be expressed as, in Boolean logic: EPU has been discharged below target for a threshold period of time→disable EPU.

As a further example, in reference to FIG. 7, a mode transition condition may include determining that no EPU warning indicators are present. A determined mode transition condition or a condition to enable or disable an EPU may include the EPU warning indicator condition, where a control system may check that none of a plurality of particular EPU commands exist. For example, the presence of EPU warning indicators (e.g., as previously defined) may indicate that an EPU is not in a condition where the EPU can be enabled or disabled without reducing aircraft safety (e.g., EPU integrity) or jeopardizing the safety of humans in the vicinity of the aircraft. Further, based on a current aircraft mode of operation, a selected aircraft mode of operation, or a transition between the current and the selected aircraft modes of operation, there may be certain EPU commands that may reduce integrity of the EPU (e.g., cause fatigue or wear, damage, or catastrophic failure to the EPU) if the EPU were to be enabled or disabled. Additionally, these EPU commands may be dangerous to humans that may be in the vicinity of the aircraft or the EPU (e.g., pilot, operator, passengers, crew, maintenance staff). If any of these particular commands exist, an EPU may be prevented from being enabled or disabled. However, if no EPU warning indicators are present or if none of a plurality of particular EPU commands exist (e.g., based on a current mode, a selected mode, or a transition from the current mode to the selected mode), then an EPU may be enabled or disabled.

The verification that no EPU warning indicators are present or that none of a plurality of particular EPU commands exist may serve to ensure that the EPUs are in a condition that does not permit unsafe conditions for the aircraft or humans in the vicinity of the aircraft (e.g., pilot, operator, passenger, crew, maintenance staff). The verification that a no EPU warning indicators are present or that none of a plurality of particular EPU commands exist may be conditions that are checked prior to enabling or disabling an EPU, or these may be a part of a set of conditions (e.g., including other conditions) that are checked prior to enabling or disabling an EPU. By way of example, the EPU warning indicator condition may be expressed as, in Boolean logic: No EPU warning indicators present→enable EPU.

Another example condition, in reference to FIG. 7, for a determined mode transition condition of an airborne status of an aircraft, if the aircraft is determined to be in the air, the HV power to an EPU is not disconnected (e.g., an EPU is not disabled). An airborne status of an aircraft may be determined based on an on-ground status of the aircraft not being present. Additionally, an airborne status may be determined based on a weight-on-wheels sensor not reporting weight on the wheels of the aircraft, accelerometers indicating flight, air pressure or altitude sensors indicating a positive altitude above the ground, or a combination of multiple criteria to determine airborne status. By way of example, the airborne status condition may be expressed as, in Boolean logic: Aircraft is off ground→do not disable EPU.

In some embodiments, a flight control computer (FCC), or a flight control system (FCS) (e.g., FCS 618) may check these exemplary mode transition conditions. Additionally, an FCC or FCS may check exemplary mode transition conditions as described in reference to FIGS. 10-14. As discussed in FIG. 7, an FCC or an FCS may determine whether one or more conditions (e.g., determined mode transition conditions) are met. Based on the one or more conditions being met, the FCC or FCS may send a signal to a battery management unit (BMU). This signal may be configured to enable or disable EPUs based on the one or more conditions being met.

As described in FIG. 7, an aircraft may comprise a plurality of FCCs, where each of the plurality of FCCs may each be configured to send a signal to a voting component. This signal may be based on the determination by the FCC or FCS of whether the one or more conditions are met. The voting component may be configured to determine whether the one or more conditions are met based on each of the signals received from the plurality of FCCs, where the voting component may determine whether the one or more conditions are met based on how many of the plurality of FCCs determine whether the one or more conditions are met.

Additionally, the system for determining whether the one or more conditions are met may include a monitoring system that is configured to determine whether conditional logic is malfunctioning. The FCCs may be configured as the monitoring system, such that each FCC of the plurality of FCCs may be configured to monitor one or more other FCCs of the plurality of FCCs.

Based on an FCC or FCS, the one or more conditions may be determined to be satisfied, where the FCCs or FCS may be configured to be fault-tolerant to a faulty FCC determination of the one or more conditions being satisfied or not satisfied. This may reduce a single point of failure in mode transition checking and execution processes, which may enable reduced pilot workload and increased aircraft safety, as previously discussed.

Step 1508 of controlling aircraft power distribution may refer to the process of managing, regulating, or directing electrical power from energy sources to one or more aircraft systems, subsystems, or components, such that an EPU may be enabled or disabled (e.g., HV power to the EPU may be enabled or disabled). For example, based on the selected mode of operation in Step 1002 and the initial or current mode of operation, power may be directed to different systems, subsystems, or components of the aircraft (e.g., as described in FIGS. 4A-6D).

For example, as discussed in reference to FIG. 7, the monitoring system (e.g., the FCCs) or the voting component may be configured to determine a faulty command, where a faulty command may be associated controlling power distribution to the aircraft. In the presence of a faulty command, process 1500 may not enable or disable an EPU, or may disregard the faulty command, e.g., based on the fault-tolerant characteristics provided by the monitoring system and the voting component. Thus, a faulty command may not affect the power distribution of the aircraft.

In another example, as discussed in reference to FIG. 7, an aircraft may comprise an FCC (e.g., a plurality of FCCs), a voting component, and a BMU (e.g., a plurality of BMUs), and based on the determination that one or more conditions are satisfied (e.g., met) by the FCC or the voting component, the FCC or the voting component may send a signal to the BMU. The signal may provide an indication to provide HV power to an EPU or to disable HV power to an EPU.

The BMU may receive redundant indicators that may indicate to provide HV power to an EPU or to disable HV power to an EPU. One of the redundant indicators may be received over a CAN line (e.g., from an FCC), and one of the redundant indicators may be received from the voting component. Based on redundant indicators to the BMU (e.g., a first indicator signal and a second indicator signal), if the redundant indicators each indicate an EPU to enable or each indicate an EPU to disable, the BMU will modify the power to an EPU based on the redundant indicators. However, if one of the redundant indicators indicates an EPU to enable and another one of the redundant indicators indicates the EPU to disable, a BMU will not enable or disable the EPU.

Additionally, an aircraft may include a plurality of EPUs and one or more FCS (e.g., FCS 618 of FIG. 7) of the aircraft may check the one or more determined conditions for at least a portion of the plurality of EPUs (e.g., each of the plurality of EPUs). Based on the one or more determined conditions being satisfied, a BMU of the aircraft may modify the power distribution to the at least a portion of the plurality of EPUs. Additionally, a BMU may modify the power distribution for an EPU of the at least a portion of the plurality of EPUs if the redundant indicator signals associated with the EPU both indicate the same modification to the power distribution (e.g., enable or disable the EPU).

FIG. 16 illustrates process 1600 of testing protections of a circuit, consistent with embodiments of the present disclosure. Process 1600 may be implemented as software (e.g., in at least one module, at least one program, at least one application, and/or at least one function, etc.), hardware (e.g., at least one processor, such as an FCC, controller, etc.), or a combination of both. Some embodiments may include at least one processor that is configured to execute operations to perform process 1600. Some embodiments may include a computer-readable medium (e.g., a non-transitory computer-readable medium) that stores instructions executable by at least one processor to perform operations that include the steps of process 1600. The steps of process 1600 may be combined, rearranged, performed simultaneously, removed, and/or repeated. Process 1600 may include step 1602, step 1604, step 1606, and/or step 1608. Process 1600 may include step 1610 of determining whether the gate driver is experiencing a fault.

Process 1600 may be executed by a processor (e.g., processor 902 as described in reference to FIG. 9A), where the processor may be configured or enabled to execute one or more instructions from a non-transitory computer readable medium storing the one or more instructions. The instructions may cause the processor to perform operations for testing protections of a circuit (e.g., as described herein and in reference to FIGS. 9A-9B). Actions described as being carried out by the process itself may also be carried out by a medium configured to carry out the process (e.g., a processor, a computer-readable medium, a system, etc.).

Process 1600 may be executed by a system including a transistor, a gate driver, a power supply, a power supply controller, a processor, and a voltage isolation barrier. Examples of such a system may be described and illustrated in reference to FIGS. 9A-9B. Systems for executing process 1600 may additionally include circuitry for modifying a trigger signals output from the power supply (e.g., comparator 912, amplifier 914, and reference voltage source 916, described in reference to FIG. 9A). For a system configured to execute process 1600, the system may include a processor that is configured to transmit instructions to execute process 1600 or receive signals to determine fault signals or indications of fault signals as part of process 1600 (e.g., step 1602, step 1608, step 1610).

For example, in a system configured to execute process 1600 (e.g., as further described in reference to FIG. 9A), the system may include a voltage isolation barrier, which may be configured to isolate circuitry on a high-voltage (HV) side and a low-voltage (LV) side. Certain components of the system configured to execute process 1600 may be configured to cross the voltage isolation barrier, as discussed above in reference to FIGS. 9A and 9B.

Step 1602 of transmitting an input test signal to a power supply controller may refer to sending a command, stimulus, or control signal from a processor (e.g., processor 902 of FIG. 9A) to a power supply controller (e.g., PSC 904 of FIG. 9A), e.g., such that the power supply controller may perform an action or transmit a signal associated with testing protections of an associated integrated circuit (e.g., gate driver 908 of FIG. 9A). The input test signal may be or include a signal that commands or instructs the power supply controller to output a signal to an associated power supply. In some embodiments, the signal transmitted to the power supply may cause the power supply to generate a signal that provides power to an associated integrated circuit at a first interface of the associated integrated circuit and provides a trigger for testing protections of the associated integrated circuit at a second interface of the associated integrated circuit.

In some embodiments, step 1602 of transmitting an input test signal to a power supply controller may be associated with a preceding step or a user input command to initiate process 1600. For example, the input test signal may be transmitted based on receiving a selection of one of at least two aircraft modes of operation (e.g., step 1002 of FIGS. 10-15, a user selection by mode switch 616 of FIGS. 6A-6D). Additionally, a user selection of an aircraft mode of operation may involve (e.g., implicate, initiate) a transition from a current aircraft mode of operation to the selected mode of operation. In some embodiments, process 1600 may check that one or more conditions are satisfied before controlling aircraft power distribution or enabling the mode transition. For instance, the selection of a fly mode of operation may cause or prompt transmission of an input test signal to a power supply controller to verify expected operation of circuit protections for a gate driver. Additionally, a transition to a fly mode of operation may include a condition that a gate driver is not experiencing a fault, so a selected or commanded transition to a fly mode of operation may involve initiating process 1600 or step 1602 of transmitting an input test signal to a power supply controller. The input test signal may be automatically transmitted from the processor (e.g., processor 902) or to the power supply controller based on the selection of a fly mode of operation or a transition to a fly mode of operation. Additionally, the testing of circuit protections may not occur while the aircraft does not indicate an off-ground status or while the aircraft is conducting flight operations.

For a current or selected aircraft mode of operation that is a maintenance submode of the aircraft (e.g., service maintenance submode 405, ground maintenance submode 406), a user, operator, or maintenance worker associated with the aircraft may initiate the testing of circuit protections. The selection of a maintenance submode or transition to the maintenance submode may result in automatically transmitting an input test signal from the processor or to the power supply controller.

As described in reference to FIGS. 9A-9B, the testing of circuit protections or transmitting an input test signal from the processor to the power supply controller may include testing protections of a circuit within an aircraft mode of operation (e.g., any of the modes or submodes depicted in FIGS. 4A and 4B). This may include automatically or routinely testing protections of a circuit based on transmitting an input test signal, as well as manually commanded testing of circuit protections based on a user, operator, or maintenance worker commanding the transmission of an input test signal (e.g., by a selection at a user interface or user input device, through a testing routine or process). Additionally, for a transition from an off mode of the aircraft (e.g., off mode 401) or for a transition to a fly mode of the aircraft (e.g., fly mode 404), circuit protections may be tested or an input test signal may be transmitted (e.g., process 1600 may be initiated). Further, for a transition between a service mode (e.g., service mode 402), ground mode (e.g., ground mode 403), maintenance mode (e.g., service maintenance submode 405, ground maintenance submode 406), or check mode (e.g., ground fly check submode 407, or fly ground check submode 408), circuit protections may be tested or an input test signal may be transmitted (e.g., process 1600 may be initiated).

Additionally, in some embodiments, step 1602 of transmitting an input test signal to a power supply controller may be associated with a preceding step or a user input command to initiate process 1600, where the preceding step may include determining that a gate driver is not experiencing an initial fault. For instance, if a gate driver is reporting a fault before transmitting an input test signal (e.g., to initiate the injection of an artificial fault), then the gate driver circuit protections may not be functioning properly or there may be a fault that exists that may cause harm to the components of the aircraft (e.g., components of system 900 of FIG. 9A, components of system 901 of FIG. 9B). Thus, if an initial fault exists, the processor may not transmit an input test signal to the power supply controller. However, if an initial fault does not exist, then the processor may transmit an input test signal or initiate process 1600.

As a further example, process 1600 or a process including process 1600 (e.g., process 1600 including a step of initiating testing based on user input or determining that the gate driver is not experiencing an initial fault) may be a part of a pre-flight check to determine aircraft safety or the validity of gate driver circuit protection functionality. This may involve all of the gate drivers (e.g., of an aircraft, of the inverters of an aircraft, of an inverter of the aircraft, of two inverters of the aircraft, of two inverters associated with the same EPU) being tested prior to enabling a transition to a fly mode of operation, enabling propulsive operation of an EPU of the aircraft, or enabling takeoff or flight operations of the aircraft. Thus, process 1600 or a process including process 1600 may be combined with all or part of another process described herein (e.g., process 1000 of FIG. 10, process 1100 of FIG. 11, process 1200 of FIG. 12, process 1300 of FIG. 13, process 1400 of FIG. 14, process 1500 of FIG. 15). A pre-flight check including process 1600 may include checking one or more conditions including determining that a gate driver is not experiencing a fault or that the gate driver's circuit protections are functioning as intended (e.g., all gate drivers of the aircraft, all gate drivers of the inverters of the aircraft).

Step 1604 of generating a trigger signal by a power supply based on the input test signal may refer to the power supply controller (e.g., PSC 904 of FIG. 9A) generating a command or instruction that is transmitted to the power supply (e.g., power supply 906 of FIG. 9A), where the input test signal that was transmitted from the processor (e.g., processor 902 of FIG. 9A) to the power supply controller. The command or instruction transmitted to the power supply may cause the power supply to output a signal that provides power to the gate driver (e.g., gate driver 908 of FIG. 9A) at a first interface of the gate driver (e.g., communication interface, pin, or the like) and provides a trigger signal (e.g., an artificial fault for testing protections of a circuit) at a second interface of the gate driver (e.g., communication interface, pin, or the like).

The first interface of the gate driver may be associated with receiving power to enable the gate driver to perform its configured functionalities, and the second interface of the gate driver may be associated with receiving fault signals from a transistor associated with the gate driver (e.g., transistor 910 of FIG. 9A). The first interface and second interface of the gate driver may be on a HV side of the voltage isolation barrier of the system for testing protections of a circuit (e.g., HV side 922 of voltage isolation barrier 924).

Additionally, the signal transmitted from the power supply (e.g., signal that serves to power the gate driver and trigger an artificial fault condition) may be transmitted on the HV side of the voltage isolation barrier of the system for testing protections of a circuit (e.g., HV side 922 of voltage isolation barrier 924). Further, the signal transmitted from the power supply controller to the power supply may be transmitted and received on the LV side of the voltage isolation barrier of the system for testing protections of a circuit (e.g., LV side 920 of voltage isolation barrier 924). Thus, the power supply may cross over the voltage isolation barrier (e.g., as previously described in reference to FIG. 9A).

For example, in reference to FIG. 9A, step 1604 may include generating, by power supply 906 and on HV side 922 of voltage isolation barrier 924, a trigger signal, where the generation of the trigger signal may be caused by the input test signal. In this example, power supply 906 may power gate driver 908, where the signal powering gate driver 908 may also serve as the trigger signal for testing protections of a circuit of gate driver 908.

The trigger signal generated by the power supply, based on the signal received from the power supply controller, may be transmitted to circuitry for modifying the trigger signal, where the circuitry for modifying the trigger signal may be on the HV side of the voltage isolation barrier (e.g., HV side 922 of voltage isolation barrier 924). For example, the trigger signal may be input to an amplifier (e.g., amplifier 914 of FIG. 9A) or modified by the amplifier. The output of the amplifier may be input to a comparator (e.g., comparator 912 of FIG. 9A), such that the output of the amplifier may be compared to a reference voltage level or signal from a reference voltage source. Based on the comparison between the trigger signal (e.g., trigger signal modified by the amplifier) and the reference voltage, the comparator may output a signal (e.g., a digital signal) that may replicate a fault signal or be interpreted by the gate driver as a fault signal. For instance, if the voltage level of the trigger signal (e.g., modified or amplified trigger signal) is greater than the reference voltage level, then the comparator may output a signal that replicates a fault signal or is interpretable by the gate driver as a fault signal.

Further, the output of the comparator may be transmitted or coupled to a node (e.g., node 918 of FIG. 9A) that is also coupled to the output of a transistor associated with transmitting fault signals to the gate driver. In this configuration, the input test signal may be converted into or result in a signal that is interpretable by the gate driver as a fault signal (e.g., an artificial fault signal), such that the circuit protections of the gate driver may be tested.

Step 1606 may include inputting the trigger signal to an interface of a gate driver (e.g., the second interface of the gate driver as previously described). Inputting the trigger signal may refer to or include delivering, applying, or providing the trigger signal originating from the power supply to a recipient, such as an input interface, port, pin, terminal, or communication path of the gate driver that is associated with receiving fault signals (e.g., from the transistor associated with the gate driver). The inputting of the trigger signal to the interface may enable or permit the gate driver to recognize, process, or respond to the trigger signal, which may involve generating an indication of a fault signal (e.g., an indication of the presence of the fault signal at the interface associated with receiving fault signals from the transistor associated with the gate driver).

Step 1606 may include inputting the trigger signal to a gate driver on the HV side of the voltage isolation barrier (e.g., HV side 922 of voltage isolation barrier 924 of FIG. 9A), at an interface electrically connected to a transistor and associated with receiving fault signals from the transistor (e.g., an interface coupled to node 918 of FIG. 9A). The trigger signal originating from the power supply (e.g., modified by circuitry such as an amplifier or comparator before being transmitted to the gate driver) and fault signals originating from the transistor associated with the gate driver may be combined at a node (e.g., node 918 of FIG. 9A) that is coupled to the gate driver interface associated with receiving fault signals. This may permit signals to be received by the gate driver at this interface, where the signals may originate from the power supply or the transistor.

Step 1608 of receiving an indication of whether the signal was received at the interface may refer to the processor of the system for testing protections of a circuit obtaining, detecting, or observing a signal, flag, or feedback that may confirm whether a signal reached or was received an input interface of the gate driver, where the input interface of the gate driver may be associated with receiving fault signals from the transistor associated with the gate driver. The indication may be a digital, analog, or logical signal. The indication may be real-time, near real-time, delayed, single-shot, or continuous. Step 1608 may include receiving on the LV side of the voltage isolation barrier (e.g., LV side 920 of voltage isolation barrier 924 of FIG. 9A), from the gate driver (e.g., gate driver 908 of FIG. 9A), an indication of whether a signal is received at the interface (e.g., whether a fault signal or trigger signal is received at an interface of the gate driver associated with receiving fault signals from the transistor).

Step 1610 may include determining whether the gate driver is experiencing a fault. A fault may be or include a fault of circuit protections for a gate driver, which may include an overcurrent or undercurrent protection fault, a desaturation protection fault, an overvoltage or undervoltage fault, or an overtemperature fault. A fault of circuit protections may include a state of a gate driver, in which the protective circuitry (e.g., configured to respond to or alert of a fault associated with an associated transistor) fails, triggers incorrectly, or is unable to perform a protective functionality. Based on determining that the gate driver is experiencing a fault, a processor may shut off the gate driver, issue a fault alert, or transmit a signal to a control system of the aircraft (e.g., FCS 618 of FIGS. 6A, 6D-8). For example, transmitting a signal to a control system of the aircraft may result in reporting a fault to a pilot or operator of an aircraft, indicating a maintenance action to an aircraft maintenance team, preventing an aircraft mode transition, or shutting down a gate driver or system associated with a gate driver (e.g., to protect against a unsafe operation or damage to a component of the aircraft).

For example, the gate driver may be configured to report, when a transistor associated with the gate driver transmits a fault signal to the gate driver (e.g., the transistor is in a fault condition), the presence of a fault signal. If the gate driver does not report the presence of the fault signal, then the gate driver is experiencing a fault of its circuit protections.

Determining whether the gate driver is experiencing a fault may refer to or include assessing, detecting, or evaluating the operational or circuit protection status of a gate driver. In some embodiments, the determination may be based on a received indication from the gate driver of a fault signal at an interface of the gate driver associated with receiving fault signals from the associated transistor. The determination may include a status bit, a voltage response, a current response, an output signal from the gate driver exceeding a fault threshold (e.g., a voltage, current, or power threshold), or other feedback from the gate driver. For example, in reference to FIG. 9A, step 1610 may include determining whether gate driver 908 is experiencing a fault, based on an indication received from gate driver 908 at processor 902, where the indication indicates whether a signal was received at an interface of gate driver 908 that is coupled to node 918.

The fault signal from the transistor or the indication from the gate driver may correspond to a particular fault of the transistor, such as a desaturation protection fault, an overvoltage fault, an undervoltage fault, or an overcurrent fault. Additionally, the fault signal or indication may include information corresponding to the particular type of fault. This may enable the processor to determine which type of fault is occurring (e.g., based on an electrical response or a threshold being exceeded). The information associated with the fault type or the determined fault type may be used to inform protective actions taken by the processor or another system of the aircraft (e.g., FCS 618 of FIG. 6A, 6D-8). Additionally, the information associated with the fault type or the determined fault type may be transmitted to a memory of the aircraft, transmitted as an alert, or transmitted to a user, operator, or maintenance worker of the aircraft for further processing or actions responsive to the aircraft status information (e.g., status of circuit protections of gate drivers used to control inverters or drive an EPU).

As used herein, at least one processor may include any physical device or group of devices having electric circuitry that performs a logic operation on an input or inputs. For example, the at least one processor may include one or more integrated circuits (IC), including application-specific integrated circuits (ASIC), microchips, microcontrollers, microprocessors, all, or part of a central processing unit (CPU), digital signal processors (DSP), field-programmable gate arrays (FPGA), or other circuits suitable for executing instructions or performing logic operations. In some embodiments, the at least one processor may include a remote processing unit accessible via a communications network.

As used herein, the term "computer-readable medium" refers to any computer program product, apparatus, and/or device (e.g., memory, Programmable Logic Devices (PLDs)) used to provide machine instructions and/or data to a programmable processor. Computer-readable media containing instructions refers to any storage mechanism that contains program code instructions, for example to be executed by a computer processor. Examples of computer-readable media are further described elsewhere in this disclosure. Instructions executed by at least one processor may include implementing one or more program code instructions in hardware, in software (including in one or more signal processing and/or application-specific integrated circuits), in firmware, or in any combination thereof, as described earlier. Causing a processor to perform operations may involve causing the processor to calculate, execute, or otherwise implement one or more arithmetic, mathematic, logic, reasoning, or inference steps.

Implementation of the method and system of the present disclosure may involve performing or completing certain selected tasks or steps manually, automatically, or a combination thereof. Moreover, according to actual instrumentation and equipment of preferred embodiments of the method and system of the present disclosure, several selected steps may be implemented by hardware (HW) or by software (SW) on any operating system of any firmware, or by a combination thereof. For example, as hardware, selected steps of the disclosure could be implemented as a chip or a circuit. As software or algorithm, selected steps of the disclosure could be implemented as a plurality of software instructions being executed by a computer using any suitable operating system. In any case, selected steps of the method and system of the disclosure could be described as being performed by a data processor, such as a computing device for executing a plurality of instructions.

The computing units and other functional units described in the present disclosure can be implemented by hardware, or software, or a combination of hardware and software. One of ordinary skill in the art will also understand that multiple ones of the above-described modules/units can be combined as one module or unit, and each of the above-described modules/units can be further divided into a plurality of sub-modules or sub-units.

Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the inventions disclosed herein.

Embodiments of the present disclosure may further be described by the following clauses:

Clause 1: A method of controlling aircraft power distribution for propulsive operation of an electric propulsion unit (EPU), comprising: receiving a selection of one of at least two aircraft modes of operation from a user input device; determining, using conditional logic, if one or more conditions are met at the time of or after receiving the selection of the one selected mode, wherein the one or more conditions comprise at least one temperature of the EPU being within an associated temperature range; and controlling, at the time of or after determining the one or more conditions are met, power distribution within the aircraft based on the selected mode of operation, wherein controlling power distribution based on the selected mode of operation comprises controlling power distribution to enable propulsion by the EPU.

Clause 2: The method of clause 1, wherein at least one temperature of the EPU is measured.

Clause 3: The method of clause 1 or 2, wherein at least one temperature of the EPU is estimated.

Clause 4: The method of any of clauses 1-3, wherein at least one temperature of the EPU is measured and at least one temperature of the EPU is estimated.

Clause 5: The method of any of clauses 1-4, wherein the temperature of the EPU comprises a temperature of a component of the EPU.

Clause 6: The method of any of clauses 1-5, wherein the temperature of the EPU comprises a temperature of a heat transfer fluid.

Clause 7: The method of any of clauses 1-6, wherein the temperature of the EPU comprises an ambient temperature of the EPU.

Clause 8: The method of any of clauses 1-7, wherein the temperature of the EPU is a composite temperature.

Clause 9: The method of any of clauses 1-8, wherein the composite temperature is determined by a most-limiting temperature of the EPU.

Clause 10: The method of any of clauses 1-9, wherein the most-limiting temperature is determined by the temperature that is the farthest outside the associated temperature range.

Clause 11: The method of any of clauses 1-10, wherein the most-limiting temperature is determined by a temperature of the EPU and a rate of change of the temperature of the EPU.

Clause 12: The method of any of clauses 1-11, wherein the composite temperature is determined from a plurality of temperatures of the EPU.

Clause 13: The method of any of clauses 1-12, wherein each of the plurality of temperatures of the EPU is associated with a separate associated temperature range.

Clause 14: The method of any of clauses 1-13, wherein the most-limiting temperature is associated with a component of the EPU.

Clause 15: The method of any of clauses 1-14, wherein the EPU receives high-voltage power and is not enabled for propulsive operation.

Clause 16: The method of any of clauses 1-15, wherein each temperature of the EPU is associated with a location within the EPU.

Clause 17: The method of any of clauses 1-16, wherein the location within the EPU comprises different points on a same component of the EPU.

Clause 18: The method of any of clauses 1-17, further comprising cross-validating the measured and estimated temperatures associated with a same location within the EPU.

Clause 19: The method of any of clauses 1-18, wherein the associated temperature range comprises a minimum and maximum rated temperature.

Clause 20: The method of any of clauses 1-19, wherein each of the at least one temperature of the EPU is associated with a separate associated temperature range.

Clause 21: The method of any of clauses 1-20, wherein the associated temperature range comprises a minimum and maximum operating temperature.

Clause 22: The method of any of clauses 1-21, wherein each of the at least one temperature of the EPU is associated with a separate associated temperature range.

Clause 23: The method of any of clauses 1-22, wherein the controlling power distribution comprises powering the EPU.

Clause 24: The method of any of clauses 1-23, wherein the at least two modes of operation comprise a fly mode of operation and a test mode of operation.

Clause 25: A system for controlling aircraft power distribution for propulsive operation of an electric propulsion unit (EPU), the system comprising: at least one EPU; a user input device configured to receive an input indicating a mode of operation; a power switching device configured to provide power to a controller upon receiving a signal from the user input device; a controller configured to control power to one or more subsystems of the aircraft for propulsive operation of the at least one EPU; and wherein the controller is configured to perform the method of any of clauses 1-24.

Clause 26: A non-transitory computer-readable medium storing one or more instructions that, when executed by at least one processor, cause the at least one processor to perform the method of any of clauses 1-24.

Clause 27: A method of controlling aircraft power distribution for propulsive operation of an electric propulsion unit (EPU), comprising: receiving a selection of one of at least two aircraft modes of operation from a user input device; determining, using conditional logic, if one or more conditions are met at the time of or after receiving the selection of the one selected mode, wherein the one or more conditions comprise at least one temperature of the EPU being within an associated temperature range; and controlling, at the time of or after determining that the temperature of the EPU is not within the range, power to a temperature modification system to bring the temperature of the EPU within the range; and based on determining that the temperature of the EPU is in the range, enabling the EPU for propulsive operation.

Clause 28: The method of clause 27, wherein at least one temperature of the EPU is measured.

Clause 29: The method of clause 27 or 28 wherein at least one temperature of the EPU is estimated.

Clause 30: The method of any of clauses 27-29, wherein at least one temperature of the EPU is measured and at least one temperature of the EPU is estimated.

Clause 31: The method of any of clauses 27-30, wherein the temperature of the EPU comprises a temperature of a component of the EPU.

Clause 32: The method of any of clauses 27-31, wherein the temperature of the EPU comprises a temperature of a heat transfer fluid.

Clause 33: The method of any of clauses 27-32, wherein the temperature of the EPU comprises an ambient temperature of the EPU.

Clause 34: The method of any of clauses 27-33, wherein the temperature of the EPU is a composite temperature.

Clause 35: The method of any of clauses 27-34, wherein the composite temperature is determined by a most-limiting temperature of the EPU.

Clause 36: The method of any of clauses 27-35, wherein the most-limiting temperature is determined by the temperature that is the farthest outside the associated temperature range.

Clause 37: The method of any of clauses 27-36, wherein the most-limiting temperature is determined by a temperature of the EPU and a rate of change of the temperature of the EPU.

Clause 38: The method of any of clauses 27-37, wherein the composite temperature is determined from a plurality of temperatures of the EPU.

Clause 39: The method of any of clauses 27-38, wherein each of the plurality of temperatures of the EPU is associated with a separate associated temperature range.

Clause 40: The method of any of clauses 27-39, wherein the most-limiting temperature is associated with a component of the EPU.

Clause 41: The method of any of clauses 27-40, wherein the EPU receives high-voltage power and is not enabled for propulsive operation.

Clause 42: The method of any of clauses 27-41, wherein each temperature of the EPU is associated with a location within the EPU.

Clause 43: The method of any of clauses 27-42, wherein the location within the EPU comprises different points on a same component of the EPU.

Clause 44: The method of any of clauses 27-43, further comprising cross-validating the measured and estimated temperatures associated with a same location within the EPU.

Clause 45: The method of any of clauses 27-44, wherein the associated temperature range comprises a minimum and maximum rated temperature, and wherein at least two temperatures of the EPU are associated with a separate associated temperature range.

Clause 46: The method of any of clauses 27-45, wherein the associated temperature range comprises a minimum and maximum operating temperature, and wherein at least two temperatures of the EPU are associated with a separate associated temperature range.

Clause 47: The method of any of clauses 27-46, wherein the power to the temperature modification system is high-voltage power.

Clause 48: The method of any of clauses 27-47, wherein the EPU receives high-voltage power and is not enabled for propulsive operation until the at least one temperature of the EPU is within the associated temperature range.

Clause 49: The method of any of clauses 27-48, wherein: the temperature modification system is the EPU, and controlling power to the temperature modification system comprises modifying an operational parameter of the EPU.

Clause 50: The method of any of clauses 27-49, wherein the modifying an operational parameter of the EPU induces a reduced efficiency mode or an increased efficiency mode of non-propulsive EPU operation.

Clause 51: The method of any of clauses 27-50, wherein the operational parameter comprises a current to the EPU.

Clause 52: The method of any of clauses 27-51, wherein the temperature modification system includes a heater thermomechanically coupled to the EPU.

Clause 53: The method of any of clauses 27-52, wherein the temperature modification system includes a heat exchanger thermomechanically coupled to the EPU.

Clause 54: The method of any of clauses 27-53, wherein the at least two modes of operation comprise a fly mode of operation and a test mode of operation.

Clause 55: A system for controlling aircraft power distribution for propulsive operation of an electric propulsion unit (EPU), the system comprising: at least one EPU; a user input device configured to receive an input indicating a mode of operation; a power switching device configured to provide power to a controller upon receiving a signal from the user input device; a controller configured to control power to one or more subsystems of the aircraft for propulsive operation of the at least one EPU; and wherein the controller is configured to perform the method of any of clauses 27-54.

Clause 56: A non-transitory computer-readable medium storing one or more instructions that, when executed by at least one processor, cause the at least one processor to perform the method of any of clauses 27-54.

Clause 57: A method of controlling aircraft power distribution, comprising: receiving a selection of one of at least two aircraft modes of operation from a first user input device; measuring an output of a control circuit based on an input, wherein the input is transmitted from a second user input device; determining, using conditional logic, whether one or more conditions are met at the time of or after receiving the selection of the one selected mode, wherein the one or more conditions comprise the measured output corresponding to an expected output; and controlling, at the time of or after determining the one or more conditions are met, power distribution within the aircraft based on the selected mode of operation, wherein controlling power distribution comprises controlling high-voltage power to an electric propulsion unit, an actuator, or a non-propulsion load.

Clause 58: The method of clause 57, wherein the first user input device is at least one of: a switch, a knob, a button, a lever, a display screen element, or a voice receiver.

Clause 59: The method of clause 57 or 58, wherein the second user input device is at least one of: a switch, a knob, a button, a lever, a display screen element, or a voice receiver.

Clause 60: The method of any of clauses 57-59, wherein the second user input device comprises an inceptor.

Clause 61: The method of any of clauses 57-60, wherein the second user input device comprises the first user input device.

Clause 62: The method of any of clauses 57-61, wherein the aircraft comprises a fly-by-wire control system.

Clause 63: The method of any of clauses 57-62, wherein the control circuit is associated with the fly-by-wire control system.

Clause 64: The method of any of clauses 57-63, wherein the measured output comprises an electrical parameter.

Clause 65: The method of any of clauses 57-64, wherein the measured output comprises an analog signal.

Clause 66: The method of any of clauses 57-65, wherein the measured output comprises a digital signal.

Clause 67: The method of any of clauses 57-66, wherein the one or more conditions comprise the measured output corresponding to the expected output over a duration of time.

Clause 68: The method of any of clauses 57-67, wherein the measured output comprises a figure of merit.

Clause 69: The method of any of clauses 57-68, wherein the control circuit is associated with the flight control system of the aircraft.

Clause 70: The method of any of clauses 57-69, wherein the control circuit is associated with an electric propulsion unit (EPU) of the aircraft.

Clause 71: The method of any of clauses 57-70, wherein the control circuit is associated with an actuator of the aircraft.

Clause 72: The method of any of clauses 57-71, wherein the control circuit is associated with a non-propulsion load of the aircraft.

Clause 73: The method of any of clauses 57-72, wherein the input to the second user input device is part of a set of tests to determine pilot control authority.

Clause 74: The method of any of clauses 57-73, wherein the input to the second user input device is part of a set of tests to determine aircraft operating capability.

Clause 75: The method of any of clauses 57-74, wherein the input comprises a set of commands interpretable to control at least one aircraft effector.

Clause 76: The method of any of clauses 57-75, wherein determining the set of preconditions is satisfied further comprises: measuring an output of a control circuit to each command of the set of commands; and determining that each of the measured outputs correspond to a respective expected output.

Clause 77: The method of any of clauses 57-76, wherein the set of commands is a sequence of predetermined commands.

Clause 78: The method of any of clauses 57-77, wherein determining the set of preconditions is satisfied further comprises: measuring an output of a control circuit to a subset of the set of commands; and determining that each of the measured outputs correspond to a respective expected output.

Clause 79: The method of any of clauses 57-78, wherein the subset comprises an adaptive sequence that is determined based on a prior determination of whether a prior measured output corresponds to a respective, prior expected output.

Clause 80: The method of any of clauses 57-79, further comprising transmitting, to a pilot interface, a request for the input.

Clause 81: The method of any of clauses 57-80, wherein the request includes at least one of a visual indicator, an aural indicator, or a tactile indicator.

Clause 82: A system for controlling aircraft power distribution, the system comprising: a first user input device; a second user input device; a control circuit responsive based on an input from the second user input device; and wherein the control circuit for controlling aircraft power distribution is configured to perform the method of any of clauses 57-81.

Clause 83: A non-transitory computer-readable medium storing one or more instructions that, when executed by at least one processor, cause the at least one processor to perform the method of any of clauses 57-81.

Clause 84: A method of controlling aircraft power distribution, comprising: receiving a selection of one of at least two aircraft modes of operation from a user input device; preventing user control of at least one of an electric propulsion unit (EPU), a control actuator, or a non-propulsion load of the aircraft; enabling high-voltage power to at least one component of the aircraft, the at least one component including at least one of the EPU, the control actuator, or the non-propulsion load; automatically controlling the at least one component; measuring an output of the at least one component to the automatic control; determining, using conditional logic, whether one or more conditions are met at the time of or after receiving the selection of the one selected mode, wherein the one or more conditions comprise the measured output corresponding to an expected output; and at the time of or after determining the one or more conditions are met, enabling user control of the EPU, the control actuator, or the non-propulsion load or controlling power distribution within the aircraft based on the selected mode of operation, wherein controlling power distribution comprises controlling high-voltage power to the EPU or the control actuator.

Clause 85: The method of clause 84, wherein the user input device is at least one of: a switch, a knob, a button, a lever, a display screen element, or a voice receiver.

Clause 86: The method of clause 84 or 85, wherein preventing user control includes disabling power to a user input device.

Clause 87: The method of any of clauses 84-86, wherein preventing user control includes disabling power to a controller.

Clause 88: The method of any of clauses 84-87, wherein preventing user control includes disregarding any signals originating from a user input device.

Clause 89: The method of any of clauses 84-88, wherein preventing user control includes electrically isolating a user input device.

Clause 90: The method of any of clauses 84-89, wherein preventing user control includes removing user control commands from a signal.

Clause 91: The method of any of clauses 84-90, wherein the automatic control comprises a pre-flight limit.

Clause 92: The method of any of clauses 84-91, wherein the automatic control comprises a test limit.

Clause 93: The method of any of clauses 84-92, wherein automatically controlling at least one of the EPU, the control actuator, or the non-propulsion load includes transmitting at least one predetermined control instruction.

Clause 94: The method of any of clauses 84-93, wherein automatically controlling at least one of the EPU, the control actuator, or the non-propulsion load includes transmitting at least one adaptive control instruction.

Clause 95: The method of any of clauses 84-94, wherein automatically controlling at least one of the EPU, the control actuator, or the non-propulsion load includes transmitting at least one predetermined sequence of control instructions.

Clause 96: The method of any of clauses 84-95, wherein the automatic control comprises a specified operating limit, and wherein the specified operating limit is different from a flight operating limit.

Clause 97: The method of any of clauses 84-96, wherein the measured output comprises an electrical parameter.

Clause 98: The method of any of clauses 84-97, wherein the measured output comprises an analog signal.

Clause 99: The method of any of clauses 84-98, wherein the measured output comprises a digital signal.

Clause 100: The method of any of clauses 84-99, wherein the one or more conditions comprise the measured output corresponding to the expected output over a duration of time.

Clause 101: The method of any of clauses 84-100, wherein the measured output comprises a figure of merit.

Clause 102: The method of any of clauses 84-101, wherein the aircraft comprises a fly-by-wire control system.

Clause 103: The method of any of clauses 84-102, wherein the automatic control is part of a set of tests to determine pilot control authority.

Clause 104: The method of any of clauses 84-103, wherein the automatic control is part of a set of tests to determine aircraft operating capability.

Clause 105: A system for controlling aircraft power distribution, comprising: a first user input device; at least one of an electric propulsion unit (EPU), a control actuator, or a non-propulsive load; a control circuit for controlling aircraft power distribution; and wherein the control circuit for controlling aircraft power distribution is configured to perform the method of any of clauses 84-104.

Clause 106: A non-transitory computer-readable medium storing one or more instructions that, when executed by at least one processor, cause the at least one processor to perform the method of any of clauses 84-104.

Clause 107: A method of controlling aircraft power distribution for safe shutdown of an electric propulsion unit (EPU) of an aircraft, comprising: receiving a selection of one of at least two aircraft modes of operation from a first user input device; determining, using conditional logic, whether one or more conditions are met at the time of or after receiving the selection of the one selected mode and via the control circuit, wherein the one or more conditions comprise disconnection of the EPU; initiating, if the one or more conditions are not met, a process for disconnection, the process comprising: disconnecting high-voltage power to the EPU, the high-voltage power supplied by a high-voltage power system; confirming disconnection of the high-voltage power to the EPU; initiating, at the time of or after confirming disconnection, discharge of a capacitor of the EPU; performing a discharge operation including at least one of: confirming the discharge of the capacitor of the EPU; or waiting for a predetermined designated discharge time.

Clause 108: The method of clause 107, wherein initiating the disconnection process occurs at the time of or after receiving an aircraft ground mode selection.

Clause 109: The method of clause 107 or 108, wherein initiating the disconnection process occurs at the time of or after receiving an aircraft testing mode selection.

Clause 110: The method of any of clauses 107-109, wherein initiating the disconnection process occurs at the time of or after receiving an aircraft off mode selection.

Clause 111: The method of any of clauses 107-110, wherein the confirming disconnection of the high-voltage power to the EPU comprises waiting for a first pre-determined time delay.

Clause 112: The method of any of clauses 107-111, wherein the confirming disconnection of the high-voltage power comprises determining a lack of continuity between the EPU and the high-voltage power system.

Clause 113: The method of any of clauses 107-112, wherein the confirming discharge of the capacitor associated with the EPU comprises waiting for a second pre-determined time delay.

Clause 114: The method of any of clauses 107-113, wherein the confirming discharge of the capacitor associated with the EPU comprises measuring a voltage.

Clause 115: The method of any of clauses 107-114, wherein the measuring the voltage comprises measuring the voltage across the capacitor of the EPU.

Clause 116: The method of any of clauses 107-115, wherein disconnecting high-voltage power to the EPU comprises controlling at least one switching device.

Clause 117: The method of any of clauses 107-116, wherein the switching device is at least one of a contactor, relay, or transistor.

Clause 118: The method of any of clauses 107-117, wherein discharging the capacitor of the EPU happens after measuring loss of continuity between the high-voltage power system and the EPU and waiting for a second predetermined time delay.

Clause 119: The method of any of clauses 107-118, wherein shutting down the high-voltage power system happens after confirming discharge of the capacitor and waiting for a second predetermined time delay.

Clause 120: The method of any of clauses 107-119, wherein discharging the capacitor of the EPU is enabled by passive discharge.

Clause 121: The method of any of clauses 107-120, wherein passive discharge comprises discharge through distributed resistive losses and waiting for an amount of time.

Clause 122: The method of any of clauses 107-121, wherein discharging the capacitor of the EPU is enabled by an active discharge process.

Clause 123: The method of any of clauses 107-122, wherein the active discharge process comprises toggling a switch such that the switching losses of the switch discharge the capacitor of the EPU.

Clause 124: The method of any of clauses 107-123, wherein the active discharge process comprises controlling current to flow through a resistive element.

Clause 125: The method of any of clauses 107-124, wherein the first user input device is housed within the aircraft.

Clause 126: The method of any of clauses 107-126, wherein the first user input device is communicatively coupled to the aircraft.

Clause 127: The method of any of clauses 107-126, wherein the first user input device can remotely control the mode selection of the aircraft.

Clause 128: The method of any of clauses 107-127, wherein the disconnection process may be initiated by a second user input device.

Clause 129: The method of any of clauses 107-128, wherein the first user input device is the second user input device.

Clause 130: The method of any of clauses 107-129, wherein the mode selection initiates the disconnection process.

Clause 131: The method of any of clauses 107-130, wherein the disconnection process is initiated by a flight control system.

Clause 132: The method of any of clauses 107-131, wherein the disconnection process is initiated via a remote controller.

Clause 133: The method of any of clauses 107-132, wherein the mode selection is determined based on a determined aircraft ground status.

Clause 134: The method of any of clauses 107-133, wherein the disconnection process is automatically initiated based on the determination of aircraft ground status.

Clause 135: A system for controlling aircraft power distribution for safe shutdown of an electric propulsion unit (EPU) of an aircraft, the system comprising: the EPU; a first user input device; a high-voltage power system; a control circuit in the aircraft, wherein the control circuit is configured to perform the method of any of clauses 107-134.

Clause 136: A non-transitory computer-readable medium storing one or more instructions that, when executed by at least one processor, cause the at least one processor to perform the method of any of clauses 107-134.

Clause 137: A method of controlling power distribution of an aircraft, comprising: receiving a selection of one of at least two aircraft modes of operation from a user input device; determining, using conditional logic, if one or more conditions are met after receiving the selection of the one selected mode, the one or more conditions comprising at least one of: a command and control radio link is functioning as intended, a discharge target of an electric propulsion unit (EPU) is achieved, none of a plurality of particular EPU commands exist, a flight termination radio link is functioning as intended, voltage across the EPU is measured to be less than or equal to a threshold, voltage across a capacitor of the EPU is measured to be less than or equal to a threshold, or an aircraft grounded status is present; and controlling, after determining the one or more conditions are met, power distribution within the aircraft based on the selected mode of operation, wherein controlling power distribution comprises controlling high-voltage power to the EPU or to at least one non-propulsion load.

Clause 138: The method of clause 137, wherein the one or more conditions comprise at least one of: a radio link is functioning as intended, a discharge target of an electric propulsion unit (EPU) is satisfied, or none of a plurality of particular EPU commands exist.

Clause 139: The method of clause 137 or 138, wherein the radio link comprises a command and control radio link, and the condition of a radio link functioning as intended comprises the command and control radio link is functioning as intended.

Clause 140: The method of any of clauses 137-139, wherein the radio link comprises a flight termination system radio link, and the condition of a radio link functioning as intended comprises the flight termination system radio link is functioning as intended.

Clause 141: The method of any of clauses 137-140, wherein determining that a radio link is functioning as intended comprises at least one of: verifying a reception, transmission, or performance metric of a radio signal associated with the radio link.

Clause 142: The method of any of clauses 137-141, wherein a performance metric comprises at least one of: a latency, signal strength, signal integrity, signal distortion, or signal-to-noise ratio.

Clause 143: The method of any of clauses 137-142, wherein verifying the reception, transmission, or performance metric is based on communication with a ground station.

Clause 144: The method of any of clauses 137-143, wherein determining that a discharge target of an EPU is satisfied comprises at least one of: expiration of a timer set for a time associated with a length of discharge, satisfaction of a discharge target based on a monitored discharge status, or no detection of a fault for a discharge operation.

Clause 145: The method of any of clauses 137-144, wherein the discharge target is based on a voltage differential measured across two points of the EPU.

Clause 146: The method of any of clauses 137-145, wherein the discharge target is based on a voltage across a capacitor of the EPU.

Clause 147: The method of any of clauses 137-146, wherein the fault is determined based on at least one of an electrical fault or a degraded discharge operation.

Clause 148: The method of any of clauses 137-147, wherein a particular EPU command is based on the one selected mode or an initial mode of operation.

Clause 149: The method of any of clauses 137-148, wherein a particular EPU command is based on a mode transition from an initial mode of operation to the one selected mode.

Clause 150: The method of any of clauses 137-149, wherein a flight control computer determines whether the one or more conditions are met.

Clause 151: The method of any of clauses 137-150, wherein the flight control computer sends a signal to a battery management unit based on whether the one or more conditions are met.

Clause 152: The method of any of clauses 137-151, wherein the aircraft comprises a plurality of flight control computers, and the plurality of flight control computers each send a signal to a voting component based on whether the one or more conditions are met.

Clause 153: The method of any of clauses 137-152, wherein the voting component determines whether the one or more conditions are met based on each of the signals received from the plurality of flight control computers.

Clause 154: The method of any of clauses 137-153, further comprising determining, by a monitoring system, whether conditional logic is malfunctioning.

Clause 155: The method of any of clauses 137-154, wherein the aircraft comprises a plurality of flight control computers, and a flight control computer of the plurality of flight control computers is configured as the monitoring system and is configured to monitor one or more other flight control computers of the plurality of flight control computers.

Clause 156: The method of any of clauses 137-155, wherein the monitoring system is configured to detect a faulty command, wherein the faulty command is associated with controlling power distribution of the aircraft.

Clause 157: The method of any of clauses 137-156, wherein the aircraft comprises a voting component, and wherein the voting component is configured to prevent a faulty command, wherein the faulty command is associated with controlling power distribution of the aircraft.

Clause 158: The method of any of clauses 137-157, wherein the aircraft comprises a flight control computer, a voting component, and a battery management unit, and based on the determination that the one or more conditions are met by the flight control computer or the voting component, the flight control computer or the voting component send a signal to the battery management unit, and wherein the signal to the battery management unit comprises an indication to provide or to disable high-voltage power to an EPU.

Clause 159: The method of any of clauses 137-158, wherein the one or more conditions further comprise a first indicator signal to a battery management unit and a second indicator signal to the battery management unit both indicating an EPU to be powered or both indicating an EPU to be depowered, and wherein the power to an EPU is not modified until the first indicator signal and the second indicator signal both indicate an EPU to be powered or both indicate an EPU to be depowered.

Clause 160: The method of any of clauses 137-159, wherein the battery management unit is configured to receive the first indicator signal over a CAN line and receive the second indicator signal from a voting component.

Clause 161: The method of any of clauses 137-160, wherein the aircraft comprises a plurality of EPUs, and the one or more conditions are checked for at least one EPU of the plurality of EPUs, and wherein the power distribution to the at least one EPU is controlled based on whether the one or more conditions are met for the at least one EPU.

Clause 162: The method of any of clauses 137-161, wherein the one or more conditions include an airborne status of the aircraft, and for a determined airborne status of the aircraft, high-voltage power to an EPU is not disconnected.

Clause 163: A system for controlling power distribution of an aircraft, comprising: an electric propulsion unit (EPU); an inverter configured to provide power to the EPU; a battery configured to provide power to the inverter, wherein the battery is associated with a battery management unit (BMU); a voting component communicatively coupled to the BMU; a plurality of flight control computers communicatively coupled to the voting component and a CAN link, wherein the CAN line is communicatively coupled to the BMU, and wherein the flight control computers are configured to perform the method of any of clauses 137-162.

Clause 164: The system of clause 163, wherein the one or more conditions comprise at least one of: a radio link is functioning as intended, a discharge target of an electric propulsion unit (EPU) is satisfied, or none of a plurality of particular EPU commands exist.

Clause 165: A non-transitory computer-readable medium storing one or more instructions, that when executed by at least one processor cause the at least one processor to perform the method of any of clauses 137-162.

Clause 166: The non-transitory computer-readable medium of clause 165, wherein the one or more conditions comprise at least one of: a radio link is functioning as intended, a discharge target of an electric propulsion unit (EPU) is satisfied, or none of a plurality of particular EPU commands exist.

Clause 167: A method for testing protections of a circuit, the method comprising: transmitting, on a low-voltage side of a voltage isolation barrier, an input test signal to a power supply controller, wherein: the input test signal causes a power supply to generate, on a high-voltage side of the voltage isolation barrier, a trigger signal, and the trigger signal is input to a gate driver on the high-voltage side of the voltage isolation barrier, at an interface electrically connected to a transistor and associated with receiving fault signals from the transistor; after transmitting the input test signal, receiving on the low-voltage side of the voltage isolation barrier, from the gate driver, an indication of whether a signal is received at the interface; and determining, based on the received indication of whether a signal was received at the interface, whether the gate driver is experiencing a fault.

Clause 168: The method of clause 167, further comprising determining that the gate driver is not experiencing an initial fault, wherein the input test signal is transmitted after determining that the gate driver is not experiencing an initial fault.

Clause 169: The method of clause 167 or clause 168, wherein the gate driver is configured to control a transistor gate, and wherein the transistor gate is part of an inverter.

Clause 170: The method of any of clauses 167-179, wherein the inverter is configured to drive an electric propulsion unit (EPU) of an aircraft.

Clause 171: The method of any of clauses 167-170, wherein the inverter is one of two inverters configured to drive an electric propulsion unit (EPU) of an aircraft.

Clause 172: The method of any of clauses 167-171, wherein the input test signal is transmitted at the time of or after receiving a selection of one of at least two aircraft modes of operation from a user input device.

Clause 173: The method of any of clauses 167-172, wherein the one selected mode is a fly mode.

Clause 174: The method of any of clauses 167-173, wherein one or more conditions for transitioning to the fly mode comprise determining the gate driver is not experiencing a fault.

Clause 175: The method of any of clauses 167-174, wherein a pre-flight check of the gate driver comprises transmitting the input test signal to the power supply controller and determining the gate driver is not experiencing a fault.

Clause 176: The method of any of clauses 167-175, wherein the one selected mode is a maintenance submode.

Clause 177: The method of any of clauses 167-176, wherein the testing of circuit protections does not occur during flight operations of an aircraft.

Clause 178: The method of any of clauses 167-177, wherein the fault comprises at least one of a desaturation protection fault, an overvoltage fault, an undervoltage fault, or an overcurrent fault.

Clause 179: A system for testing protections of a circuit, the system comprising: a voltage isolation barrier, configured to isolate circuitry on a high-voltage side and a low-voltage side; a power supply controller; a power supply communicatively coupled to the power supply controller and configured to generate a trigger signal; a gate driver configured to be powered by the power supply; a transistor configured to be driven by the gate driver and to transmit fault signals to the gate driver; and a processor configured to: transmit, on the low-voltage side, an input test signal to the power supply controller, wherein: the input test signal causes the power supply to generate on the high-voltage side, a trigger signal, and the trigger signal is input to the gate driver on the high-voltage side at an interface electrically connected to the transistor and associated with receiving the fault signals from the transistor; receive, after transmitting the input test signal and on the low-voltage side, from the gate driver, an indication of whether a signal is received at the interface; and determine, based on the received indication of whether a signal was received at the interface, whether the gate driver is experiencing a fault.

Clause 180: The system of clause 179, wherein the processor is further configured to determine that the gate driver is not experiencing an initial fault, wherein the input test signal is transmitted after determining that the gate driver is not experiencing an initial fault.

Clause 181: The system of clause 179 or 180, wherein the gate driver is configured to control a transistor gate, wherein the transistor gate is part of an inverter.

Clause 182: The system of any of clauses 179-181, further comprising an amplifier configured to modify the trigger signal.

Clause 183: The system of any of clauses 179-182, further comprising a comparator configured to output a signal when the trigger signal is greater than a voltage threshold, wherein the modified trigger signal is an input to the comparator.

Clause 184: The system of any of clauses 179-183, wherein the output of the comparator is coupled to a node that receives an output of the transistor associated with transmitting the fault signals.

Clause 185: The system of any of clauses 179-184, further comprising a plurality of transistors, each of the plurality of transistors associated with a gate driver, a power supply, and a processor, wherein each processor associated with a transistor of the plurality of transistors is configured to: transmit an input test signal to the power supply controller associated with the transistor, wherein the input test signal causes the power supply to generate a trigger signal, and the trigger signal is input to the gate driver at an interface electrically connected to the transistor and associated with receiving fault signals from the transistor; receive, from the gate driver, an indication of whether the trigger signal is received at the interface; and determine, based on the received indication of whether a signal was received at the interface, whether the gate driver is experiencing a fault.

Clause 186: The system of any of clauses 179-185, wherein each of the plurality of transistors is associated with one gate driver and one power supply.

Clause 187: The system of any of clauses 179-186, further comprising an inverter, wherein the inverter comprises the plurality of transistors.

Clause 188: The system of any of clauses 179-187, further comprising two inverters, wherein the two inverters collectively comprise the plurality of transistors.

Clause 189: The system of any of clauses 179-188, wherein the power supply powers the gate driver.

Clause 190: A non-transitory computer readable medium storing one or more instructions, that when executed by at least one processor cause the at least one processor to perform the method of any of clauses 167-178.

Clause 191: The computer-readable medium of clause 190, wherein the processor is further configured to determine that the gate driver is not experiencing an initial fault, wherein the input test signal is transmitted after determining that the gate driver is not experiencing an initial fault.

Clause 192: The computer-readable medium of clause 190 or 191, wherein the gate driver is configured to control a transistor gate, wherein the transistor gate is part of an inverter.

The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the inventions disclosed herein.

The features and advantages of the disclosure are apparent from the detailed specification, and thus, it is intended that the appended claims cover all systems and methods falling within the true spirit and scope of the disclosure. As used herein, the indefinite articles “a” and “an” mean “one or more.” Similarly, the use of a plural term does not necessarily denote a plurality unless it is unambiguous in the given context. Words such as “and” or “or” mean “and/or” unless specifically directed otherwise. As used herein, unless specifically stated otherwise, being “based on” may include being dependent on, being interdependent with, being associated with, being defined at least in part by, being derived from, being influenced by, being correlated with, being proportional to, being temporally after, occurring with, or being responsive to. As used herein, “related to” may include being inclusive of, being expressed by, being indicated by, or being based on. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

Other embodiments will be apparent to those skilled in the art from consideration of the specification and practice of the implementations disclosed herein. It is intended that the architectures and circuit arrangements shown in figures are only for illustrative purposes and are not intended to be limited to the specific arrangements and circuit arrangements as described and shown in the figures. It is also intended that the specification and examples be considered as exemplary only, with the true scope and spirit of the invention being indicated by the following claims. The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the inventions disclosed herein. It is also intended that the sequence of steps shown in figures is only for illustrative purposes and is not intended to be limited to any particular sequence of steps. As such, those skilled in the art can appreciate that these steps can be performed in a different order while implementing the same method.

The invention claimed is:

1. A method for testing protections of a circuit, the method comprising:

transmitting, on a low-voltage side of a voltage isolation barrier, an input test signal to a power supply controller, wherein:

the power supply controller is configured to receive the input test signal on the low-voltage side of the voltage isolation barrier and control a power supply to generate an output signal on a high-voltage side of the voltage isolation barrier and based on the input test signal, and the output signal is input to a gate driver on the high-voltage side of the voltage isolation barrier, at an interface electrically connected to a transistor and associated with receiving fault signals from the transistor;

after transmitting the input test signal, receiving on the low-voltage side of the voltage isolation barrier, from the gate driver, an indication of whether the output signal is received at the interface; and determining, based on the received indication of whether the output signal was received at the interface, whether the gate driver is experiencing a fault.

2. The method of claim 1, further comprising determining that the gate driver is not experiencing an initial fault, wherein the input test signal is transmitted after determining that the gate driver is not experiencing an initial fault.

3. The method of claim 1, wherein the gate driver is configured to control a transistor gate, and wherein the transistor gate is part of an inverter.

4. The method of claim 3, wherein the inverter is configured to drive an electric propulsion unit (EPU) of an aircraft.

5. The method of claim 3, wherein the inverter is one of two inverters configured to drive an electric propulsion unit (EPU) of an aircraft.

6. The method of claim 1, wherein the input test signal is transmitted at the time of or after receiving a selection of one of at least two aircraft modes of operation from a user input device.

7. The method of claim 6, wherein the one selected mode is a fly mode.

8. The method of claim 7, wherein one or more conditions for transitioning to the fly mode comprise determining the gate driver is not experiencing a fault.

9. The method of claim 7, wherein a pre-flight check of the gate driver comprises transmitting the input test signal to the power supply controller and determining the gate driver is not experiencing a fault.

10. The method of claim 6, wherein the one selected mode is a maintenance submode.

11. The method of claim 1, wherein the testing of circuit protections does not occur during flight operations of an aircraft.

12. The method of claim 1, wherein the fault comprises at least one of a desaturation protection fault, an overvoltage fault, an undervoltage fault, or an overcurrent fault.

13. A system for testing protections of a circuit, the system comprising:

a voltage isolation barrier, configured to isolate circuitry on a high-voltage side and a low-voltage side;

a power supply controller;

a power supply communicatively coupled to the power supply controller;

a gate driver configured to be powered by the power supply;

a transistor configured to be driven by the gate driver and to transmit fault signals to the gate driver; and a processor configured to:

transmit, on the low-voltage side, an input test signal to the power supply controller, wherein:

the power supply controller is configured to receive the input test signal on the low-voltage side of the voltage isolation barrier and control the power supply to generate an output signal on the high-voltage side of the voltage isolation barrier and based on the input test signal, and the output signal is input to the gate driver on the high-voltage side at an interface electrically connected to the transistor and associated with receiving the fault signals from the transistor;

receive, after transmitting the input test signal and on the low-voltage side, from the gate driver, an indication of whether the output signal is received at the interface; and determine, based on the received indication of whether the output signal was received at the interface, whether the gate driver is experiencing a fault.

14. The system of claim 13, wherein the processor is further configured to determine that the gate driver is not experiencing an initial fault, wherein the input test signal is transmitted after determining that the gate driver is not experiencing an initial fault.

15. The system of claim 13, wherein the gate driver is configured to control a transistor gate, wherein the transistor gate is part of an inverter.

16. The system of claim 13, further comprising an amplifier configured to output a first modified signal.

17. The system of claim 16, further comprising a comparator configured to output a second modified signal when the first modified signal is greater than a voltage threshold, wherein the first modified signal and a reference voltage associated with the voltage threshold are inputs to the comparator.

18. The system of claim 17, wherein the output of the comparator is coupled to a node that receives an output of the transistor associated with transmitting the fault signals.

19. The system of claim 13, further comprising a plurality of transistors, each of the plurality of transistors associated with a gate driver, a power supply, and a processor, wherein each processor associated with a transistor of the plurality of transistors is configured to:

transmit an input test signal to the power supply controller associated with the transistor, wherein the power supply controller is configured to receive the input test signal on the low-voltage side of the voltage isolation barrier and control the power supply to generate the output signal on the high-voltage side of the voltage isolation barrier and based on the input test signal, and the output signal is input to the gate driver at an interface electrically connected to the transistor and associated with receiving fault signals from the transistor;

receive, from the gate driver, an indication of whether the output signal is received at the interface; and determine, based on the received indication of whether the output signal was received at the interface, whether the gate driver is experiencing a fault.

20. The system of claim 19, wherein each of the plurality of transistors is associated with one gate driver and one power supply.

21. The system of claim 19, further comprising an inverter, wherein the inverter comprises the plurality of transistors.

22. The system of claim 19, further comprising two inverters, wherein the two inverters collectively comprise the plurality of transistors.

23. The system of claim 13, wherein the power supply powers the gate driver.

24. A non-transitory computer-readable medium storing one or more instructions, that when executed by at least one processor cause the at least one processor to perform operations, comprising:

transmitting, on a low-voltage side of a voltage isolation barrier, an input test signal to a power supply controller, wherein:

the power supply controller is configured to receive the input test signal on the low-voltage side of the voltage isolation barrier and control a power supply to generate an output signal on a high-voltage side of the voltage isolation barrier and based on the input test signal, and the output signal is input to a gate driver on the high-voltage side of the voltage isolation barrier, at an interface electrically connected to a transistor and associated with receiving fault signals from the transistor;

after transmitting the input test signal, receiving on the low-voltage side of the voltage isolation barrier, from the gate driver, an indication of whether the output signal is received at the interface; and determining, based on the received indication of whether the output signal was received at the interface, whether the gate driver is experiencing a fault.

25. The computer-readable medium of claim 24, wherein the processor is further configured to determine that the gate driver is not experiencing an initial fault, wherein the input test signal is transmitted after determining that the gate driver is not experiencing an initial fault.

26. The computer-readable medium of claim 24, wherein the gate driver is configured to control a transistor gate, wherein the transistor gate is part of an inverter.

27. The method of claim 1, wherein the output signal is configured to test protections of the gate driver and to provide power to the gate driver.

28. The system of claim 13, wherein at least one of the power supply controller or the power supply is external to the gate driver.

29. The system of claim 13, wherein the power supply crosses the voltage isolation barrier, and the gate driver crosses the voltage isolation barrier.

* * * * *